US005751232A

United States Patent [19]

Inoue et al.

[11] Patent Number: 5,751,232

[45] Date of Patent: May 12, 1998

[54] HIGH-EFFICIENCY ENCODING APPARATUS AND HIGH-EFFICIENCY DECODING APPARATUS

[75] Inventors: Sadayuki Inoue; Junko Ishimoto; Ken Onishi, all of Nagaokakyo, Japan

[73] Assignee: Mitsubishi Denki Kabushiki Kaisha, Tokyo, Japan

[21] Appl. No.: 704,276

[22] Filed: Aug. 28, 1996

Related U.S. Application Data

[62] Division of Ser. No. 282,570, Jul. 29, 1994.

[30] Foreign Application Priority Data

| | | | |
|---|---|---|---|
| Jul. 30, 1993 | [JP] | Japan | 5-208348 |
| Oct. 18, 1993 | [JP] | Japan | 5-284519 |
| Nov. 16, 1993 | [JP] | Japan | 5-311141 |
| Jan. 17, 1994 | [JP] | Japan | 6-17787 |
| Apr. 28, 1994 | [JP] | Japan | 6-92705 |
| Apr. 28, 1994 | [JP] | Japan | 6-92706 |
| Jun. 21, 1994 | [JP] | Japan | 6-139030 |

[51] Int. Cl.$^6$ ...... H03M 7/40

[52] U.S. Cl. ...... 341/63; 341/59; 341/67

[58] Field of Search ...... 341/63, 67, 59; 348/405, 408

[56] References Cited

U.S. PATENT DOCUMENTS

| | | | |
|---|---|---|---|
| 4,704,628 | 11/1987 | Chen et al. . | |
| 5,166,987 | 11/1992 | Kageyama . | |
| 5,291,282 | 3/1994 | Nakagawa et al. . | |
| 5,337,087 | 8/1994 | Mishima | 348/405 |
| 5,432,555 | 7/1995 | Park . | |

FOREIGN PATENT DOCUMENTS 62-222783 9/1987 Japan .

OTHER PUBLICATIONS

IEEE Transactions on Consumer Electronics, "An Experimental Digital VCR with 40 MM Drum, Single Actuator and DCT-Based Bit-Rate Reduction", vol. 34, No. 3, pp. 597–605 (Aug. 1988).

*Primary Examiner*—Brian K. Young

[57] ABSTRACT

A high-efficiency encoding apparatus having a data division circuit which applies 1-dimensional scanning to the orthogonal-transformed data obtained by applying orthogonal transformation to blocked digital data in the unit of block and divides the data into run-length data and coefficient data, an encoding circuit which applies run-length encoding to the divided run-length data by employing data of the highest probability of occurrence (for example 0), and an encoding circuit which applies run-length encoding to the divided coefficient data by employing data of the highest probability of occurrence (for example 1), thereby reduces the amount of the digital data.

10 Claims, 113 Drawing Sheets

FIG. 3
PRIOR ART

SEQUENCE NUMBER

| | | | | | | | |
|---|---|---|---|---|---|---|---|
| 0 | 1 | 5 | 6 | 14 | 15 | 27 | 28 |
| 2 | 4 | 7 | 13 | 16 | 26 | 29 | 42 |
| 3 | 8 | 12 | 17 | 25 | 30 | 41 | 43 |
| 9 | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

FIG. 5
PRIOR ART

QUANTIZATION TABLE VALUE T(u, v)

→ v

↓ u

| | | | | | | | |
|---|---|---|---|---|---|---|---|
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |
| 16 | 16 | 16 | 16 | 16 | 16 | 16 | 16 |

FIG. 7
PRIOR ART

| INPUT VALUE | GENERATION PROBABILITY | ASSIGNMENT CODE |
|---|---|---|
| 0 | 50% | 0 |
| 10 | 30% | 10 |
| 20 | 10% | 110 |
| 30 | 10% | 111 |

FIG. 8
PRIOR ART

COEFFICIENT DATA →

0-RUN LENGTH DATA ↓

| | | | | | | | | | | | | | | | | | | | | | | | | | |
|---|---|---|---|---|---|---|---|---|---|---|---|---|---|---|---|---|---|---|---|---|---|---|---|---|---|
| 5088 | 43720 | 15974 | 7868 | 4787 | 3258 | 2190 | 1656 | 1219 | 960 | 723 | 588 | 500 | 404 | 353 | 306 | 304 | | | | | | | | | |
| 0 | 15109 | 3251 | 1093 | 547 | 270 | 173 | 132 | 85 | 72 | 49 | 36 | 28 | 25 | 19 | 7 | 11 | 7 | 7 | 9 | 4 | 7 | 8 | 3 | 3 | 2 |
| 0 | 6569 | 929 | 219 | 121 | 60 | 35 | 20 | 15 | 5 | 5 | 4 | 4 | 5 | 0 | 1 | 1 | 3 | 0 | 1 | 1 | 1 | 0 | 0 | 0 | 0 |
| 0 | 4044 | 407 | 80 | 42 | 18 | 24 | 16 | 12 | 6 | 3 | 2 | 2 | 2 | 0 | 2 | 1 | 0 | 0 | 0 | 1 | 1 | 0 | 1 | 2 | 0 |
| 0 | 2716 | 232 | 63 | 18 | 9 | 3 | 3 | 1 | 2 | 1 | 0 | 2 | 0 | 0 | 0 | 0 | 1 | 0 | 1 | 0 | 0 | 0 | 0 | 0 | 0 |
| 0 | 2074 | 156 | 38 | 23 | 5 | 6 | 1 | 1 | 0 | 1 | 0 | 0 | 0 | 0 | 0 | 0 | 0 | 1 | 0 | 0 | 0 | 0 | 0 | 0 | |
| 0 | 1529 | 134 | 31 | 6 | 3 | 4 | 4 | 1 | 0 | 0 | 1 | 0 | 0 | 0 | 0 | 0 | 0 | 1 | 0 | 0 | 0 | 0 | 0 | 0 | |
| 0 | 1131 | 108 | 18 | 13 | 0 | 7 | 6 | 1 | 1 | 1 | 1 | 3 | 1 | 0 | 0 | 0 | 0 | 0 | 0 | 0 | 0 | 0 | 0 | 0 | 0 |
| 0 | 873 | 57 | 20 | 12 | 5 | 0 | 0 | 0 | 2 | 0 | 0 | 0 | 0 | 0 | 0 | 1 | 0 | 0 | 0 | 0 | 0 | 0 | 0 | 0 | 0 |
| 0 | 569 | 53 | 18 | 4 | 1 | 1 | 1 | 4 | 1 | 0 | 0 | 1 | 0 | 1 | 0 | 0 | 0 | 1 | 1 | 0 | 0 | 0 | 0 | 0 | 0 |
| 0 | 482 | 33 | 13 | 2 | 1 | 1 | 1 | 3 | 0 | 1 | 0 | 0 | 0 | 0 | 0 | 0 | 0 | 3 | 12 | 0 | 0 | 0 | 0 | 0 | 0 |
| 0 | 322 | 29 | 16 | 5 | 4 | 4 | 3 | 3 | 0 | 0 | 0 | 0 | 1 | 0 | 0 | 0 | 0 | 0 | 0 | 0 | 0 | 0 | 0 | 0 | 0 |
| 0 | 205 | 10 | 3 | 0 | 1 | 0 | 3 | 0 | 0 | 0 | 0 | 0 | 0 | 0 | 0 | 1 | 0 | 0 | 0 | 0 | 0 | 0 | 0 | 0 | 0 |
| 0 | 139 | 6 | 0 | 1 | 0 | 1 | 0 | 0 | 0 | 0 | 0 | 0 | 0 | 0 | 4 | 16 | 0 | 0 | 0 | 0 | 0 | 0 | 0 | 0 | 0 |
| 0 | 97 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 83 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 64 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 49 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 55 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 45 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 9
PRIOR ART

COEFFICIENT DATA →

0-RUN LENGTH DATA ↓

| | | | | | | | | | | | | |
|---|---|---|---|---|---|---|---|---|---|---|---|---|
| 6 | 3 | 4 | 5 | 6 | 6 | 7 | 7 | 8 | 8 | 8 | 8 | 9 |
| 101 | 4 | 6 | 8 | 9 | 10 | 11 | 11 | 12 | 12 | 12 | 13 | 13 |
| 101 | 5 | 8 | 10 | 11 | 12 | 13 | 14 | 26 | 26 | 26 | 26 | 26 |
| 101 | 6 | 9 | 12 | 13 | 14 | 13 | 26 | 26 | 26 | 26 | 26 | 26 |
| 101 | 7 | 10 | 12 | 14 | 26 | 26 | 26 | 26 | 26 | 26 | 26 | 26 |
| 101 | 7 | 11 | 13 | 13 | 26 | 26 | 26 | 26 | 26 | 26 | 26 | 26 |
| 101 | 7 | 11 | 13 | 26 | 26 | 26 | 26 | 26 | 26 | 26 | 26 | 26 |
| 101 | 8 | 11 | 14 | 26 | 26 | 26 | 26 | 26 | 26 | 26 | 26 | 26 |
| 101 | 8 | 12 | 14 | 26 | 26 | 26 | 26 | 26 | 26 | 26 | 26 | 26 |
| 101 | 9 | 12 | 14 | 26 | 26 | 26 | 26 | 26 | 26 | 26 | 26 | 26 |
| 101 | 9 | 13 | 26 | 26 | 26 | 26 | 26 | 26 | 26 | 26 | 26 | 26 |
| 101 | 10 | 13 | 26 | 26 | 26 | 26 | 26 | 26 | 26 | 26 | 26 | 26 |
| 101 | 10 | 26 | 26 | 26 | 26 | 26 | 26 | 26 | 26 | 26 | 26 | 26 |
| 101 | 11 | 26 | 26 | 26 | 26 | 26 | 26 | 26 | 26 | 26 | 26 | 26 |
| 101 | 11 | 26 | 26 | 26 | 26 | 26 | 26 | 26 | 26 | 26 | 26 | 26 |
| 101 | 12 | 26 | 26 | 26 | 26 | 26 | 26 | 26 | 26 | 26 | 26 | 26 |
| 101 | 12 | 26 | 26 | 26 | 26 | 26 | 26 | 26 | 26 | 26 | 26 | 26 |
| 101 | 12 | 26 | 26 | 26 | 26 | 26 | 26 | 26 | 26 | 26 | 26 | 26 |
| 101 | 12 | 26 | 26 | 26 | 26 | 26 | 26 | 26 | 26 | 26 | 26 | 26 |
| 101 | 12 | 26 | 26 | 26 | 26 | 26 | 26 | 26 | 26 | 26 | 26 | 26 |

FIG. 16A

| 0-RUN LENGTH DATA | COEFFICIENT DATA |
|---|---|
| ( 0 | , 25 ) |
| ( 0 | , −18 ) |
| ( 1 | , 7 ) |
| ( 2 | , 5 ) |
| ( 3 | , 1 ) |
| ⋮ | ⋮ |
| ( 7 | , 1 ) |
| ( 0 | , 0 ) ← EOB |

FIG. 16B (0,0,1,2,3 ⋯,7,0) → 0-RUN LENGTH CODING (25,-18,7,5,1 ⋯,1,0) → 1-RUN LENGTH CODING

FIG. 17

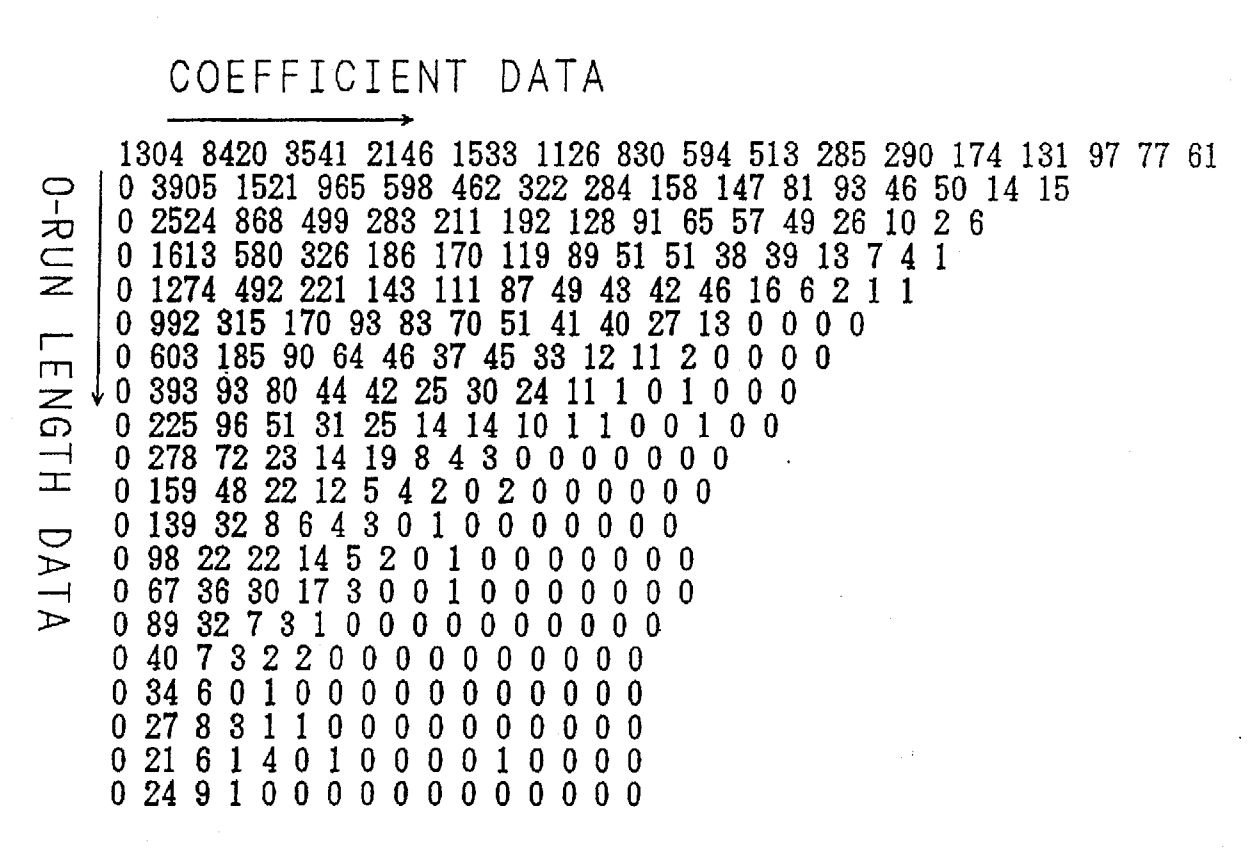

COEFFICIENT DATA →

0-RUN LENGTH DATA ↓

| | | | | | | | | | | | | | | | |
|---|---|---|---|---|---|---|---|---|---|---|---|---|---|---|---|
| 1304 | 8420 | 3541 | 2146 | 1533 | 1126 | 830 | 594 | 513 | 285 | 290 | 174 | 131 | 97 | 77 | 61 |
| 0 | 3905 | 1521 | 965 | 598 | 462 | 322 | 284 | 158 | 147 | 81 | 93 | 46 | 50 | 14 | 15 |
| 0 | 2524 | 868 | 499 | 283 | 211 | 192 | 128 | 91 | 65 | 57 | 49 | 26 | 10 | 2 | 6 |
| 0 | 1613 | 580 | 326 | 186 | 170 | 119 | 89 | 51 | 51 | 38 | 39 | 13 | 7 | 4 | 1 |
| 0 | 1274 | 492 | 221 | 143 | 111 | 87 | 49 | 43 | 42 | 46 | 16 | 6 | 2 | 1 | 1 |
| 0 | 992 | 315 | 170 | 93 | 83 | 70 | 51 | 41 | 40 | 27 | 13 | 0 | 0 | 0 | 0 |
| 0 | 603 | 185 | 90 | 64 | 46 | 37 | 45 | 33 | 12 | 11 | 2 | 0 | 0 | 0 | 0 |
| 0 | 393 | 93 | 80 | 44 | 42 | 25 | 30 | 24 | 11 | 1 | 0 | 1 | 0 | 0 | 0 |
| 0 | 225 | 96 | 51 | 31 | 25 | 14 | 14 | 10 | 1 | 1 | 0 | 0 | 1 | 0 | 0 |
| 0 | 278 | 72 | 23 | 14 | 19 | 8 | 4 | 3 | 0 | 0 | 0 | 0 | 0 | 0 | 0 |
| 0 | 159 | 48 | 22 | 12 | 5 | 4 | 2 | 0 | 2 | 0 | 0 | 0 | 0 | 0 | 0 |
| 0 | 139 | 32 | 8 | 6 | 4 | 3 | 0 | 1 | 0 | 0 | 0 | 0 | 0 | 0 | 0 |
| 0 | 98 | 22 | 22 | 14 | 5 | 2 | 0 | 1 | 0 | 0 | 0 | 0 | 0 | 0 | 0 |
| 0 | 67 | 36 | 30 | 17 | 3 | 0 | 0 | 1 | 0 | 0 | 0 | 0 | 0 | 0 | 0 |
| 0 | 89 | 32 | 7 | 3 | 1 | 0 | 0 | 0 | 0 | 0 | 0 | 0 | 0 | 0 | 0 |
| 0 | 40 | 7 | 3 | 2 | 2 | 0 | 0 | 0 | 0 | 0 | 0 | 0 | 0 | 0 | 0 |
| 0 | 34 | 6 | 0 | 1 | 0 | 0 | 0 | 0 | 0 | 0 | 0 | 0 | 0 | 0 | 0 |
| 0 | 27 | 8 | 3 | 1 | 1 | 0 | 0 | 0 | 0 | 0 | 0 | 0 | 0 | 0 | 0 |
| 0 | 21 | 6 | 1 | 4 | 0 | 1 | 0 | 0 | 0 | 0 | 1 | 0 | 0 | 0 | 0 |
| 0 | 24 | 9 | 1 | 0 | 0 | 0 | 0 | 0 | 0 | 0 | 0 | 0 | 0 | 0 | 0 |

FIG. 18

COEFFICIENT DATA →

1-RUN LENGTH DATA ↓

| | | | | | | | | | | | | | | | |
|---|---|---|---|---|---|---|---|---|---|---|---|---|---|---|---|
| 5400 | 0 | 10932 | 6081 | 3932 | 2798 | 1924 | 1483 | 1100 | 879 | 656 | 546 | 461 | 373 | 330 | 288 |
| 0 | 0 | 4144 | 1592 | 848 | 428 | 262 | 188 | 126 | 85 | 79 | 51 | 40 | 35 | 19 | 19 |
| 0 | 0 | 2341 | 787 | 349 | 186 | 126 | 65 | 64 | 35 | 22 | 18 | 17 | 18 | 12 | 8 |
| 0 | 0 | 1426 | 429 | 200 | 106 | 66 | 56 | 28 | 23 | 13 | 7 | 8 | 6 | 6 | 2 |
| 0 | 0 | 951 | 256 | 124 | 46 | 35 | 30 | 10 | 12 | 7 | 7 | 7 | 6 | 2 | 1 |
| 0 | 0 | 586 | 151 | 70 | 40 | 18 | 15 | 13 | 8 | 2 | 2 | 4 | 0 | 2 | 1 |
| 0 | 0 | 348 | 85 | 28 | 19 | 12 | 5 | 2 | 5 | 5 | 1 | 1 | 0 | 2 | 0 |
| 0 | 0 | 232 | 41 | 15 | 4 | 3 | 1 | 1 | 1 | 0 | 0 | 1 | 0 | 0 | 1 |
| 0 | 0 | 153 | 21 | 5 | 3 | 3 | 0 | 1 | 0 | 0 | 0 | 1 | 0 | 0 | 0 |
| 0 | 0 | 83 | 13 | 3 | 1 | 0 | 2 | 0 | 1 | 0 | 0 | 0 | 0 | 0 | 0 |
| 0 | 0 | 61 | 10 | 0 | 2 | 0 | 1 | 0 | 0 | 0 | 0 | 0 | 0 | 0 | 0 |
| 0 | 0 | 43 | 6 | 1 | 0 | 0 | 0 | 0 | 0 | 0 | 0 | 0 | 0 | 0 | 0 |
| 0 | 0 | 22 | 3 | 4 | 0 | 0 | 0 | 0 | 0 | 0 | 0 | 0 | 0 | 0 | 0 |
| 0 | 0 | 22 | 2 | 0 | 0 | 0 | 0 | 0 | 0 | 0 | 0 | 0 | 0 | 0 | 0 |
| 0 | 0 | 11 | 0 | 1 | 0 | 0 | 0 | 0 | 0 | 0 | 0 | 0 | 0 | 0 | 0 |
| 0 | 0 | 14 | 1 | 1 | 1 | 0 | 0 | 0 | 0 | 0 | 0 | 0 | 0 | 0 | 0 |
| 0 | 0 | 4 | 1 | 0 | 1 | 0 | 0 | 0 | 0 | 0 | 0 | 0 | 0 | 0 | 0 |
| 0 | 0 | 3 | 0 | 0 | 0 | 0 | 0 | 0 | 0 | 0 | 0 | 0 | 0 | 0 | 0 |
| 0 | 0 | 3 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 |

FIG. 19

COEFFICIENT DATA →

0-RUN LENGTH DATA ↓

| | | | | | | | | | | | | |
|---|---|---|---|---|---|---|---|---|---|---|---|---|
| 5 | 3 | 4 | 4 | 5 | 5 | 6 | 6 | 6 | 7 | 7 | 8 | 8 |
| 101 | 4 | 5 | 5 | 6 | 7 | 7 | 7 | 8 | 8 | 9 | 9 | 10 |
| 101 | 4 | 6 | 6 | 7 | 8 | 8 | 8 | 9 | 9 | 10 | 10 | 11 |
| 101 | 5 | 6 | 7 | 8 | 8 | 8 | 9 | 10 | 10 | 10 | 10 | 12 |
| 101 | 5 | 7 | 8 | 8 | 9 | 9 | 10 | 10 | 10 | 10 | 11 | 19 |
| 101 | 5 | 7 | 8 | 9 | 9 | 9 | 10 | 10 | 10 | 11 | 12 | 19 |
| 101 | 6 | 8 | 9 | 9 | 10 | 10 | 10 | 10 | 12 | 12 | 19 | 19 |
| 101 | 7 | 9 | 9 | 10 | 10 | 11 | 11 | 11 | 12 | 19 | 19 | 19 |
| 101 | 7 | 9 | 10 | 10 | 11 | 12 | 12 | 12 | 19 | 19 | 19 | 19 |
| 101 | 7 | 9 | 11 | 12 | 11 | 12 | 19 | 19 | 19 | 19 | 19 | 19 |
| 101 | 8 | 10 | 11 | 12 | 19 | 19 | 19 | 19 | 19 | 19 | 19 | 19 |
| 101 | 8 | 10 | 12 | 19 | 19 | 19 | 19 | 19 | 19 | 19 | 19 | 19 |
| 101 | 9 | 11 | 11 | 12 | 19 | 19 | 19 | 19 | 19 | 19 | 19 | 19 |
| 101 | 9 | 10 | 11 | 11 | 19 | 19 | 19 | 19 | 19 | 19 | 19 | 19 |
| 101 | 9 | 10 | 13 | 19 | 19 | 19 | 19 | 19 | 19 | 19 | 19 | 19 |
| 101 | 10 | 13 | 19 | 19 | 19 | 19 | 19 | 19 | 19 | 19 | 19 | 19 |
| 101 | 10 | 19 | 19 | 19 | 19 | 19 | 19 | 19 | 19 | 19 | 19 | 19 |
| 101 | 11 | 12 | 19 | 19 | 19 | 19 | 19 | 19 | 19 | 19 | 19 | 19 |
| 101 | 11 | 19 | 19 | 19 | 19 | 19 | 19 | 19 | 19 | 19 | 19 | 19 |
| 101 | 11 | 12 | 19 | 19 | 19 | 19 | 19 | 19 | 19 | 19 | 19 | 19 |

FIG. 20

COEFFICIENT DATA →

1-RUN LENGTH DATA ↓

| | | | | | | | | | | | | |
|---|---|---|---|---|---|---|---|---|---|---|---|---|
| 4 | 101 | 4 | 4 | 5 | 5 | 6 | 6 | 7 | 7 | 8 | 8 | 8 |
| 101 | 101 | 5 | 6 | 7 | 8 | 9 | 9 | 10 | 10 | 10 | 11 | 11 |
| 101 | 101 | 6 | 7 | 8 | 9 | 10 | 11 | 11 | 12 | 12 | 13 | 13 |
| 101 | 101 | 6 | 8 | 9 | 10 | 11 | 11 | 12 | 12 | 13 | 14 | 14 |
| 101 | 101 | 7 | 9 | 10 | 11 | 12 | 12 | 14 | 13 | 14 | 14 | 26 |
| 101 | 101 | 8 | 10 | 11 | 12 | 13 | 13 | 13 | 14 | 26 | 26 | 26 |
| 101 | 101 | 8 | 10 | 12 | 13 | 13 | 26 | 26 | 26 | 26 | 26 | 26 |
| 101 | 101 | 9 | 11 | 13 | 26 | 26 | 26 | 26 | 26 | 26 | 26 | 26 |
| 101 | 101 | 10 | 12 | 26 | 26 | 26 | 26 | 26 | 26 | 26 | 26 | 26 |
| 101 | 101 | 10 | 13 | 26 | 26 | 26 | 26 | 26 | 26 | 26 | 26 | 26 |
| 101 | 101 | 11 | 14 | 26 | 26 | 26 | 26 | 26 | 26 | 26 | 26 | 26 |
| 101 | 101 | 11 | 26 | 26 | 26 | 26 | 26 | 26 | 26 | 26 | 26 | 26 |
| 101 | 101 | 12 | 26 | 26 | 26 | 26 | 26 | 26 | 26 | 26 | 26 | 26 |
| 101 | 101 | 12 | 26 | 26 | 26 | 26 | 26 | 26 | 26 | 26 | 26 | 26 |
| 101 | 101 | 13 | 26 | 26 | 26 | 26 | 26 | 26 | 26 | 26 | 26 | 26 |
| 101 | 101 | 13 | 26 | 26 | 26 | 26 | 26 | 26 | 26 | 26 | 26 | 26 |
| 101 | 101 | 26 | 26 | 26 | 26 | 26 | 26 | 26 | 26 | 26 | 26 | 26 |
| 101 | 101 | 26 | 26 | 26 | 26 | 26 | 26 | 26 | 26 | 26 | 26 | 26 |
| 101 | 101 | 26 | 26 | 26 | 26 | 26 | 26 | 26 | 26 | 26 | 26 | 26 |
| 101 | 101 | 26 | 26 | 26 | 26 | 26 | 26 | 26 | 26 | 26 | 26 | 26 |

FIG. 23

| COEFFICIENT DATA | NUMBER OF EVENTS |
|---|---|
| 0 | 207210 |
| 1 | 80079 |
| 2 | 21382 |
| 3 | 9480 |
| 4 | 5581 |
| 5 | 3635 |
| 6 | 2449 |
| 7 | 1846 |
| 8 | 1435 |
| 9 | 1049 |
| ⋮ | |

TOTAL 340200

FIG. 25

COEFFICIENT DATA →

O-RUN LENGTH DATA ↓

| | | | | | | | | | | | | | | | |
|---|---|---|---|---|---|---|---|---|---|---|---|---|---|---|---|
| 3272 | 5162 | 3292 | 2257 | 1838 | 1467 | 900 | 578 | 385 | 370 | 222 | 173 | 155 | 145 | 124 | 52 |
| 0 | 2096 | 1113 | 701 | 497 | 320 | 168 | 138 | 68 | 45 | 29 | 18 | 6 | 7 | 8 | 2 |
| 0 | 825 | 398 | 246 | 158 | 85 | 46 | 22 | 13 | 5 | 3 | 2 | 1 | 2 | 0 | 0 |
| 0 | 403 | 140 | 59 | 31 | 18 | 13 | 6 | 3 | 1 | 0 | 0 | 1 | 0 | 0 | 0 |
| 0 | 146 | 56 | 19 | 8 | 3 | 0 | 0 | 0 | 0 | 0 | 0 | 1 | 0 | 0 | 0 |
| 0 | 75 | 22 | 13 | 3 | 1 | 1 | 0 | 0 | 0 | 0 | 0 | 0 | 0 | 0 | 0 |
| 0 | 35 | 11 | 5 | 0 | 0 | 0 | 0 | 0 | 0 | 0 | 0 | 0 | 0 | 0 | 0 |
| 0 | 11 | 6 | 1 | 0 | 1 | 0 | 0 | 0 | 0 | 0 | 0 | 0 | 0 | 0 | 0 |
| 0 | 2 | 1 | 1 | 0 | 0 | 0 | 0 | 0 | 0 | 0 | 0 | 0 | 0 | 0 | 0 |
| 0 | 2 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

FIG. 26

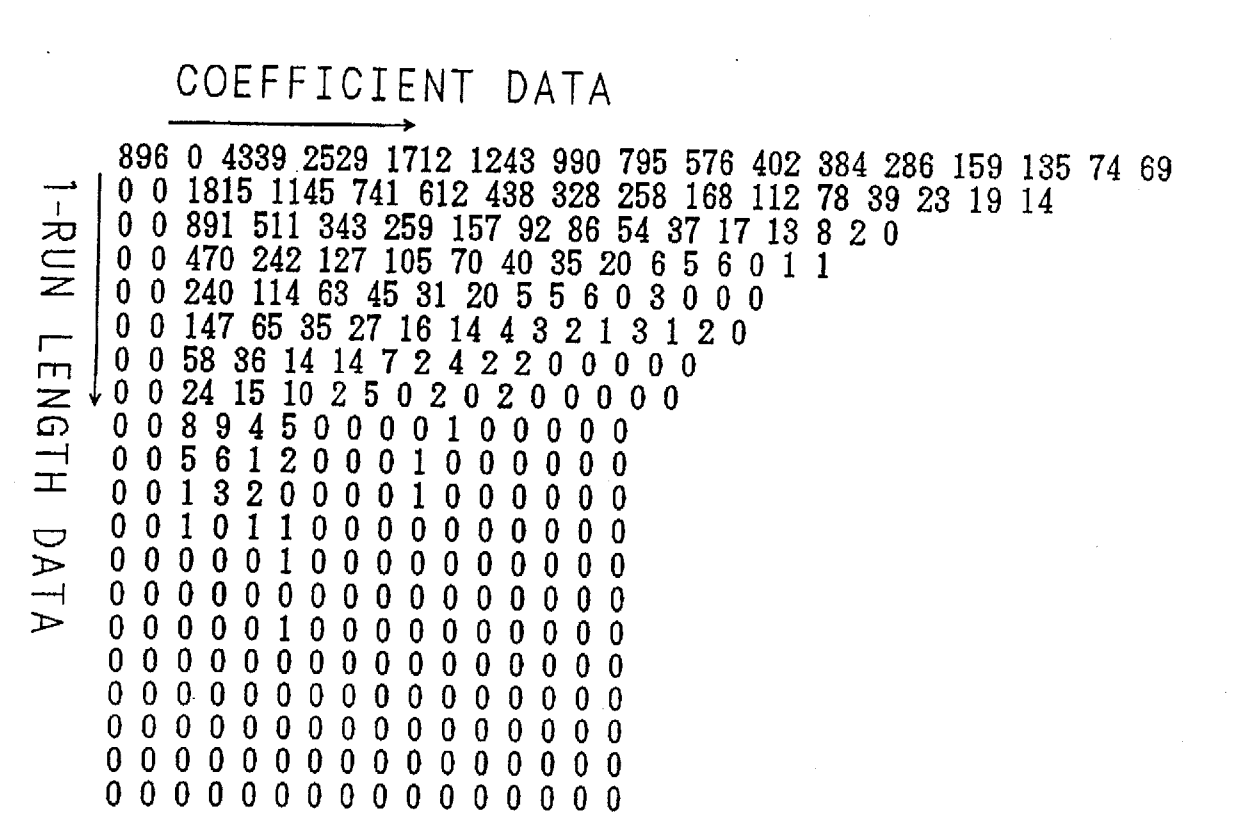

COEFFICIENT DATA →

1-RUN LENGTH DATA ↓

| | | | | | | | | | | | | | | | |
|---|---|---|---|---|---|---|---|---|---|---|---|---|---|---|---|
| 896 | 0 | 4339 | 2529 | 1712 | 1243 | 990 | 795 | 576 | 402 | 384 | 286 | 159 | 135 | 74 | 69 |
| 0 | 0 | 1815 | 1145 | 741 | 612 | 438 | 328 | 258 | 168 | 112 | 78 | 39 | 23 | 19 | 14 |
| 0 | 0 | 891 | 511 | 343 | 259 | 157 | 92 | 86 | 54 | 37 | 17 | 13 | 8 | 2 | 0 |
| 0 | 0 | 470 | 242 | 127 | 105 | 70 | 40 | 35 | 20 | 6 | 5 | 6 | 0 | 1 | 1 |
| 0 | 0 | 240 | 114 | 63 | 45 | 31 | 20 | 5 | 5 | 6 | 0 | 3 | 0 | 0 | 0 |
| 0 | 0 | 147 | 65 | 35 | 27 | 16 | 14 | 4 | 3 | 2 | 1 | 3 | 1 | 2 | 0 |
| 0 | 0 | 58 | 36 | 14 | 14 | 7 | 2 | 4 | 2 | 2 | 0 | 0 | 0 | 0 | 0 |
| 0 | 0 | 24 | 15 | 10 | 2 | 5 | 0 | 2 | 0 | 2 | 0 | 0 | 0 | 0 | 0 |
| 0 | 0 | 8 | 9 | 4 | 5 | 0 | 0 | 0 | 0 | 1 | 0 | 0 | 0 | 0 | 0 |
| 0 | 0 | 5 | 6 | 1 | 2 | 0 | 0 | 0 | 1 | 0 | 0 | 0 | 0 | 0 | 0 |
| 0 | 0 | 1 | 3 | 2 | 0 | 0 | 0 | 0 | 1 | 0 | 0 | 0 | 0 | 0 | 0 |
| 0 | 0 | 1 | 0 | 1 | 1 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

FIG. 27

COEFFICIENT DATA →

O-RUN LENGTH DATA ↓

| | | | | | | | | | | | | | | | |
|---|---|---|---|---|---|---|---|---|---|---|---|---|---|---|---|
| 1771 | 3409 | 1492 | 857 | 571 | 384 | 220 | 158 | 95 | 61 | 40 | 27 | 13 | 14 | 7 | 9 |
| 0 | 1586 | 882 | 521 | 323 | 176 | 116 | 59 | 50 | 19 | 18 | 12 | 6 | 6 | 2 | 3 |
| 0 | 1085 | 509 | 325 | 210 | 147 | 64 | 47 | 30 | 9 | 5 | 4 | 5 | 2 | 0 | 3 |
| 0 | 623 | 399 | 284 | 164 | 104 | 63 | 20 | 8 | 6 | 4 | 3 | 4 | 1 | 1 | 1 |
| 0 | 533 | 420 | 198 | 95 | 43 | 27 | 8 | 3 | 6 | 3 | 2 | 0 | 1 | 0 | 0 |
| 0 | 333 | 142 | 66 | 46 | 21 | 12 | 2 | 1 | 1 | 2 | 0 | 0 | 0 | 0 | 1 |
| 0 | 133 | 49 | 34 | 32 | 10 | 3 | 1 | 1 | 0 | 1 | 1 | 0 | 0 | 0 | 0 |
| 0 | 119 | 41 | 28 | 13 | 4 | 3 | 2 | 0 | 0 | 1 | 0 | 0 | 0 | 1 | 0 |
| 0 | 81 | 56 | 24 | 19 | 10 | 1 | 1 | 0 | 0 | 0 | 1 | 1 | 0 | 0 | 0 |
| 0 | 62 | 22 | 17 | 7 | 8 | 1 | 1 | 0 | 0 | 0 | 0 | 0 | 0 | 0 | 0 |
| 0 | 30 | 16 | 8 | 7 | 5 | 1 | 0 | 0 | 1 | 0 | 0 | 0 | 0 | 0 | 0 |
| 0 | 35 | 20 | 12 | 3 | 2 | 2 | 0 | 0 | 0 | 0 | 0 | 0 | 0 | 1 | 0 |
| 0 | 23 | 5 | 4 | 4 | 0 | 1 | 0 | 0 | 0 | 0 | 0 | 0 | 0 | 0 | 0 |
| 0 | 22 | 9 | 4 | 0 | 0 | 0 | 0 | 0 | 0 | 0 | 0 | 0 | 0 | 0 | 0 |
| 0 | 11 | 3 | 3 | 2 | 1 | 0 | 0 | 0 | 0 | 0 | 0 | 0 | 0 | 0 | 0 |
| 0 | 6 | 3 | 2 | 0 | 0 | 0 | 1 | 0 | 0 | 0 | 0 | 0 | 0 | 0 | 0 |
| 0 | 5 | 2 | 0 | 1 | 0 | 0 | 1 | 0 | 0 | 0 | 0 | 0 | 0 | 0 | 0 |
| 0 | 5 | 1 | 1 | 0 | 0 | 0 | 0 | 0 | 0 | 0 | 0 | 0 | 0 | 0 | 0 |
| 0 | 4 | 0 | 0 | 0 | 0 | 0 | 0 | 0 | 0 | 0 | 0 | 0 | 0 | 0 | 0 |
| 0 | 1 | 2 | 0 | 0 | 0 | 0 | 0 | 0 | 0 | 0 | 0 | 0 | 0 | 0 | 0 |

FIG. 28

COEFFICIENT DATA →

2-RUN LENGTH DATA ↓

| | | | | | | | | | | | | | | | |
|---|---|---|---|---|---|---|---|---|---|---|---|---|---|---|---|
| 5400 | 0 | 0 | 6049 | 3859 | 2736 | 1921 | 1470 | 1096 | 873 | 667 | 535 | 458 | 378 | 338 | 284 |
| 0 | 0 | 0 | 2017 | 1112 | 580 | 341 | 256 | 178 | 124 | 81 | 68 | 61 | 36 | 29 | 28 |
| 0 | 0 | 0 | 835 | 407 | 205 | 127 | 78 | 47 | 33 | 28 | 22 | 13 | 16 | 4 | 7 |
| 0 | 0 | 0 | 334 | 106 | 65 | 42 | 29 | 16 | 16 | 4 | 3 | 6 | 5 | 1 | 1 |
| 0 | 0 | 0 | 136 | 55 | 35 | 13 | 5 | 7 | 2 | 1 | 3 | 1 | 2 | 1 | 0 |
| 0 | 0 | 0 | 60 | 29 | 4 | 3 | 5 | 1 | 1 | 3 | 1 | 1 | 1 | 0 | 0 |
| 0 | 0 | 0 | 31 | 6 | 6 | 1 | 2 | 0 | 0 | 0 | 0 | 0 | 0 | 0 | 0 |
| 0 | 0 | 0 | 12 | 5 | 3 | 1 | 0 | 0 | 0 | 0 | 0 | 0 | 0 | 0 | 0 |
| 0 | 0 | 0 | 3 | 1 | 1 | 0 | 1 | 0 | 0 | 0 | 0 | 0 | 0 | 0 | 0 |
| 0 | 0 | 0 | 3 | 1 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

FIG. 29

COEFFICIENT DATA →

0-RUN LENGTH DATA ↓

| | | | | | | | | | | | | | | | |
|---|---|---|---|---|---|---|---|---|---|---|---|---|---|---|---|
| 4415 | 9227 | 4078 | 2472 | 1712 | 1304 | 1001 | 757 | 605 | 374 | 353 | 234 | 162 | 139 | 80 | 72 |
| 0 | 4264 | 1634 | 990 | 594 | 449 | 335 | 268 | 175 | 126 | 120 | 95 | 48 | 22 | 15 | 10 |
| 0 | 2450 | 819 | 443 | 294 | 220 | 164 | 103 | 77 | 68 | 44 | 42 | 10 | 5 | 3 | 1 |
| 0 | 1555 | 491 | 310 | 167 | 137 | 83 | 71 | 61 | 41 | 21 | 13 | 3 | 1 | 0 | 0 |
| 0 | 1081 | 344 | 196 | 98 | 84 | 65 | 46 | 27 | 34 | 13 | 2 | 0 | 0 | 0 | 0 |
| 0 | 838 | 240 | 104 | 90 | 55 | 32 | 22 | 19 | 10 | 1 | 1 | 0 | 0 | 0 | 1 |
| 0 | 504 | 143 | 65 | 48 | 38 | 19 | 16 | 5 | 3 | 0 | 0 | 0 | 0 | 0 | 0 |
| 0 | 360 | 93 | 40 | 27 | 18 | 11 | 6 | 0 | 0 | 0 | 0 | 0 | 0 | 0 | 0 |
| 0 | 220 | 59 | 26 | 13 | 10 | 1 | 1 | 0 | 0 | 0 | 0 | 0 | 0 | 0 | 0 |
| 0 | 175 | 40 | 10 | 6 | 1 | 3 | 0 | 1 | 0 | 0 | 0 | 0 | 0 | 0 | 0 |
| 0 | 103 | 20 | 8 | 4 | 0 | 0 | 1 | 0 | 0 | 0 | 0 | 0 | 0 | 0 | 0 |
| 0 | 62 | 8 | 4 | 0 | 1 | 0 | 0 | 0 | 0 | 0 | 0 | 0 | 0 | 0 | 0 |
| 0 | 35 | 11 | 4 | 0 | 0 | 0 | 0 | 0 | 0 | 0 | 0 | 0 | 0 | 0 | 0 |
| 0 | 34 | 7 | 0 | 0 | 0 | 0 | 0 | 0 | 0 | 0 | 0 | 0 | 0 | 0 | 0 |
| 0 | 21 | 6 | 1 | 0 | 0 | 0 | 0 | 0 | 0 | 0 | 0 | 0 | 0 | 0 | 0 |
| 0 | 20 | 2 | 1 | 0 | 0 | 0 | 0 | 0 | 0 | 0 | 0 | 0 | 0 | 0 | 0 |
| 0 | 13 | 2 | 0 | 0 | 0 | 0 | 0 | 0 | 0 | 0 | 0 | 0 | 0 | 0 | 0 |
| 0 | 10 | 0 | 0 | 0 | 0 | 0 | 0 | 0 | 0 | 0 | 0 | 0 | 0 | 0 | 0 |
| 0 | 13 | 0 | 0 | 0 | 0 | 0 | 0 | 0 | 0 | 0 | 0 | 0 | 0 | 0 | 0 |
| 0 | 14 | 0 | 1 | 0 | 0 | 0 | 0 | 0 | 0 | 0 | 0 | 0 | 0 | 0 | 0 |

FIG. 32

| | 0-RUN LENGTH DATA | | COEFFICIENT DATA | |
|---|---|---|---|---|
| EMBODIMENT 1 | 245020 | | 343700 | |
| | 245020 | | 423779 | |
| EMBODIMENT 2 | 125158 | 125429 | 99898 | 207095 |
| | 250587 | | 408454 | |

FIG. 36A

| | | | | | | | |
|---|---|---|---|---|---|---|---|
| DC | -1 | 7 | 1 | 1 | · | · | · |
| 0 | 1 | 1 | 0 | · | · | · | · |
| -18 | 0 | 5 | · | · | · | · | · |
| 1 | 1 | · | · | · | · | · | · |
| 1 | · | · | · | · | · | · | · |
| · | · | · | · | · | · | · | 1 |
| · | · | · | · | · | 0 | 2 | 1 |
| · | · | · | · | 1 | 1 | 0 | 0 |

FIG. 36D

| 0-RUN LENGTH DATA | COEFFICIENT DATA | |
|---|---|---|
| ( 0 | 1 ) | |
| ( 1 | 1 ) | |
| ( 0 | 2 ) | |
| ( 0 | 3 ) | |
| ⋮ | ⋮ | |
| ( · | 2 ) | |
| ( 0 | 2 ) | |
| ( 0 | 0 ) | ← EOB |

FIG. 36B

| 1-RUN LENGTH DATA | COEFFICIENT DATA | |
|---|---|---|
| ( 1 | 0 ) | |
| ( 0 | −18 ) | |
| ( 1 | 7 ) | |
| ( 2 | 0 ) | |
| ( 3 | 5 ) | |
| ( 0 | 0 ) | |
| ⋮ | ⋮ | |
| ( · | 0 ) | |
| ( 2 | 2 ) | |
| ( 2 | 0 ) | |
| ( 0 | 0 ) | |
| ( 0 | 1 ) | ← EOB |

FIG. 36E

| 0-RUN LENGTH DATA | COEFFICIENT DATA |
|---|---|
| ( 1 | −18 ) |
| ( 0 | 7 ) |
| ( 1 | 5 ) |
| ⋮ | ⋮ |
| ( · | 2 ) |
| ( 2 | 1 ) |

FIG. 36C

1-RUN LENGTH DATA (1,0,1,2,3,0,…,·,2,2,0,0) → 0-RUN LENGTH CODING

COEFFICIENT DATA (0,-18,7,0,5,0,…,0,2,0,0,1) → 0-RUN LENGTH CODING

FIG. 38A

| | | | | | | | |
|---|---|---|---|---|---|---|---|
| DC | 5 | 4 | 2 | 1 | 2 | 1 | 0 |
| 3 | 3 | 1 | 0 | 1 | 1 | 0 | 0 |
| 2 | 0 | 0 | 1 | 0 | 0 | 0 | 0 |
| 1 | 2 | 2 | 0 | 1 | 0 | 2 | 1 |
| 1 | 1 | 0 | 1 | 0 | 1 | 0 | 0 |
| 1 | 1 | 0 | 0 | 1 | 0 | 0 | 1 |
| 0 | 2 | 0 | 1 | 2 | 0 | 1 | 1 |
| 1 | 0 | 1 | 1 | 0 | 1 | 1 | 1 |

FIG. 38B

| 1-RUN LENGTH DATA | COEFFICIENT DATA | |
|---|---|---|
| ( 0 | 5 ) | |
| ( 0 | 3 ) | |
| ( 0 | 2 ) | |
| ( 0 | 3 ) | |
| ( 0 | 4 ) | |
| ( 0 | 2 ) | |
| ( 1 | 0 ) | |
| ( 2 | 2 ) | |
| ( 0 | 0 ) | |
| ( 0 | 0 ) | |
| ( 1 | 2 ) | |
| ( 2 | 2 ) | |
| ( 2 | 0 ) | |
| ( 1 | 0 ) | |
| ( 0 | 0 ) | |
| ( 0 | 0 ) | |
| ( 2 | 0 ) | |
| ( 0 | 0 ) | |
| ( 0 | 0 ) | |
| ( 2 | 0 ) | |
| ( 0 | 2 ) | |
| ( 1 | 0 ) | |
| ( 0 | 0 ) | |
| ⋮ | ⋮ | |
| ( 0 | 0 ) | |
| ( 0 | 2 ) | |
| ( 5 | 2 ) | |
| ( 0 | 0 ) | |
| ( 0 | 0 ) | |
| ( 1 | 0 ) | |
| ( 0 | 0 ) | |
| ( 0 | 0 ) | |
| ( 0 | 0 ) | |
| ( 0 | 1 ) | ← EOB |

FIG. 38C

| 0-RUN LENGTH DATA | COEFFICIENT DATA | |
|---|---|---|
| ( 6 | 1 ) | |
| ( 0 | 2 ) | |
| ( 2 | 1 ) | |
| ( 0 | 2 ) | |
| ( 0 | 2 ) | |
| ( 0 | 1 ) | |
| ( 2 | 2 ) | |
| ( 2 | 2 ) | |
| ( 1 | 1 ) | |
| ( 8 | 5 ) | |
| ( 2 | 1 ) | |
| ( 0 | 0 ) | ← EOB |

FIG. 38D

| 0-RUN LENGTH DATA | COEFFICIENT DATA | |
|---|---|---|
| ( 0 | 5 ) | |
| ( 0 | 3 ) | |
| ( 0 | 2 ) | |
| ( 0 | 3 ) | |
| ( 0 | 4 ) | |
| ( 0 | 2 ) | |
| ( 1 | 2 ) | |
| ( 2 | 2 ) | |
| ( 0 | 2 ) | |
| ( 8 | 2 ) | |
| ( 8 | 2 ) | |
| ( 0 | 2 ) | |
| ( 0 | 0 ) | ← EOB |

FIG. 39A

| 1-RUN LENGTH DATA (FROM FIG. 38C) | COEFFICIENT DATA (FROM FIG. 38D) |
|---|---|
| 0 | 5 |
| 0 | 3 |
| 0 | 2 |
| 0 | 3 |
| 0 | 4 |
| 0 | 2 |
| 1 | 0 |
| 2 | 2 |
| 0 | 0 |
| 0 | 0 |
| 1 | 2 |
| 2 | 2 |
| 2 | 0 |
| 1 | 0 |
| 0 | 0 |
| 0 | 0 |
| 2 | 0 |
| 0 | 0 |
| 0 | 0 |
| 2 | 0 |
| 0 | 2 |
| 1 | 0 |
| 0 | 0 |
| 0 | 0 |
| 0 | 0 |
| 0 | 0 |
| 0 | 0 |
| 0 | 0 |
| 0 | 0 |
| 0 | 2 |
| 5 | 2 |
| 0 | 0 |
| 0 | 0 |
| 1 | 0 |

FIG. 39B

| | | | | | | | |
|---|---|---|---|---|---|---|---|
| DC | 5 | 4 | 2 | 1 | 2 | 1 | 0 |
| 3 | 3 | 1 | 0 | 1 | 1 | 0 | 0 |
| 2 | 0 | 0 | 1 | 0 | 0 | 0 | 0 |
| 1 | 2 | 2 | 0 | 1 | 0 | 2 | 1 |
| 1 | 1 | 0 | 1 | 0 | 1 | 0 | 0 |
| 1 | 1 | 0 | 0 | 1 | 0 | | |
| 0 | 0 | 0 | 1 | 2 | | | |
| 2 | 1 | 1 | 1 | | | | |

FIG. 39C

| | | | | | | | |
|---|---|---|---|---|---|---|---|
| DC | 5 | 4 | 2 | 1 | 2 | 1 | 0 |
| 3 | 3 | 1 | 0 | 1 | 1 | 0 | 0 |
| 2 | 0 | 0 | 1 | 0 | 0 | 0 | 0 |
| 1 | 2 | 2 | 0 | 1 | 0 | 2 | 1 |
| 1 | 1 | 0 | 1 | 0 | 1 | 0 | 0 |
| 1 | 1 | 0 | 0 | 1 | 0 | 0 | 1 |
| 0 | 0 | 0 | 1 | 2 | 0 | 1 | 1 |
| 2 | 1 | 1 | 1 | 0 | 1 | 1 | 1 |

FIG. 40A

| | | | | | | | |
|---|---|---|---|---|---|---|---|
| DC | 3 | 4 | 2 | 0 | 1 | 0 | 0 |
| 5 | 1 | 1 | 2 | 1 | 0 | 2 | 1 |
| 2 | 0 | 1 | 1 | 0 | 0 | 0 | 0 |
| 1 | 1 | 1 | 0 | 1 | 1 | 1 | 1 |
| 0 | 1 | 0 | 1 | 1 | 1 | 0 | 2 |
| 1 | 2 | 0 | 2 | 1 | 0 | 1 | 0 |
| 0 | 1 | 0 | 1 | 1 | 0 | 0 | 1 |
| 1 | 2 | 0 | 0 | 2 | 0 | 0 | 0 |

FIG. 40B

| 1-RUN LENGTH DATA | COEFFICIENT DATA | |
|---|---|---|
| 0 | 3 | |
| 0 | 5 | |
| 0 | 2 | |
| 1 | 4 | |
| 0 | 2 | |
| 1 | 0 | |
| 1 | 0 | |
| 2 | 2 | |
| 0 | 0 | |
| 6 | 0 | |
| 0 | 2 | |
| 0 | 0 | |
| 0 | 0 | |
| 0 | 0 | |
| 0 | 0 | |
| 0 | 0 | |
| 0 | 0 | |
| 0 | 2 | |
| 0 | 0 | |
| 2 | 0 | |
| 2 | 2 | |
| 0 | 0 | |
| 0 | 2 | |
| 2 | 0 | |
| 1 | 0 | |
| 4 | 0 | |
| 0 | 0 | |
| 1 | 0 | |
| 0 | 0 | |
| 1 | 2 | |
| 1 | 0 | |
| 0 | 2 | |
| 0 | 0 | |
| 0 | 0 | |
| 0 | 0 | |
| 1 | 0 | |
| 0 | 0 | ← EOB |

FIG. 40C

| 0-RUN LENGTH DATA | COEFFICIENT DATA | |
|---|---|---|
| 3 | 1 | |
| 1 | 1 | |
| 0 | 1 | |
| 0 | 2 | |
| 1 | 6 | |
| 9 | 2 | |
| 0 | 2 | |
| 2 | 2 | |
| 0 | 1 | |
| 0 | 4 | |
| 1 | 1 | |
| 1 | 1 | |
| 0 | 1 | |
| 4 | 1 | |
| 0 | 0 | ← EOB |

FIG. 40D

| 0-RUN LENGTH DATA | COEFFICIENT DATA | |
|---|---|---|
| 0 | 3 | |
| 0 | 5 | |
| 0 | 2 | |
| 0 | 4 | |
| 0 | 2 | |
| 2 | 2 | |
| 2 | 2 | |
| 6 | 2 | |
| 2 | 2 | |
| 1 | 2 | |
| 6 | 2 | |
| 1 | 2 | |
| 0 | 0 | ← EOB |

FIG. 41A

| 1-RUN LENGTH DATA (FROM FIG.40C) | COEFFICIENT DATA (FROM FIG.40D) |
|---|---|
| 0 | 3 |
| 0 | 5 |
| 0 | 2 |
| 1 | 4 |
| 0 | 2 |
| 1 | 0 |
| 1 | 0 |
| 2 | 2 |
| 0 | 0 |
| 6 | 0 |
| 0 | 2 |
| 0 | 0 |
| 0 | 0 |
| 0 | 0 |
| 0 | 0 |
| 0 | 0 |
| 0 | 0 |
| 0 | 2 |
| 0 | 0 |
| 2 | 0 |
| 2 | 2 |
| 0 | 0 |
| 0 | 2 |
| 2 | 0 |
| 1 | 0 |
| 4 | 0 |
| 0 | 0 |
| 1 | 0 |
| 0 | 0 |
| 1 | 2 |
| 1 | 0 |
| 0 | 2 |
| 0 | 0 |
| 0 | 0 |
| 0 | 0 |
| 1 | 0 |

FIG. 41B

| | | | | | | | |
|---|---|---|---|---|---|---|---|
| DC | 3 | 4 | 2 | 0 | 1 | 0 | 0 |
| 5 | 1 | 1 | 2 | 1 | 0 | 2 | 1 |
| 2 | 0 | 1 | 1 | 0 | 0 | 0 | 0 |
| 1 | 1 | 1 | 0 | 1 | 1 | 1 | 1 |
| 0 | 1 | 0 | 1 | 1 | 1 | 0 | 2 |
| 1 | 2 | 0 | 2 | 1 | 0 | 1 | 0 |
| 0 | 1 | 0 | 1 | 1 | 0 | 0 | 1 |
| 1 | 2 | 0 | 0 | 2 | 0 | 0 | |

FIG. 41C

| | | | | | | | |
|---|---|---|---|---|---|---|---|
| DC | 3 | 4 | 2 | 0 | 1 | 0 | 0 |
| 5 | 1 | 1 | 2 | 1 | 0 | 2 | 1 |
| 2 | 0 | 1 | 1 | 0 | 0 | 0 | 0 |
| 1 | 1 | 1 | 0 | 1 | 1 | 1 | 1 |
| 0 | 1 | 0 | 1 | 1 | 1 | 0 | 2 |
| 1 | 2 | 0 | 2 | 1 | 0 | 1 | 0 |
| 0 | 1 | 0 | 1 | 1 | 0 | 0 | 1 |
| 1 | 2 | 0 | 0 | 2 | 0 | 0 | 0 |

INPUT OF EOB INFORMATION DATA

NO INPUT OF EOB INFORMATION DATA

FIG. 47A: | EOB' | NUMBER OF 2 AFTER EOB | SIGN BIT OF 2 |

FIG. 47B: | EOB'' | NUMBER OF 1 AFTER EOB |

FIG. 47C: | EOB''' | NUMBER OF 2 AFTER EOB | SIGN BIT OF 2 | NUMBER OF 1 AFTER EOB |

FIG. 47D: | EOB |

FIG. 56A

DATA AFTER ZIGZAG SCANNING

O-POSITION DATA 4,0,1,1,0,0,2,1,··· ,0,0

FIG. 56C

COEFFICIENT DATA

| | | | | | | | |
|---|---|---|---|---|---|---|---|
| 16 | 16 | 17 | 18 | 18 | 19 | 21 | 22 |
| 16 | 17 | 18 | 18 | 19 | 19 | 21 | 23 |
| 17 | 18 | 19 | 19 | 20 | 20 | 23 | 24 |
| 18 | 18 | 19 | 20 | 20 | 21 | 23 | 25 |
| 18 | 19 | 20 | 20 | 21 | 22 | 24 | 25 |
| 19 | 19 | 20 | 21 | 22 | 22 | 25 | 26 |
| 21 | 21 | 23 | 23 | 24 | 25 | 27 | 29 |
| 22 | 23 | 24 | 25 | 25 | 26 | 29 | 31 |

FIG. 65A

DATA AFTER ZIGZAG SCANNING

VALUE POSITION DATA 0, 0, 0, 0, 2, 1, 3, 0, 1, ··· , 0,

FIG. 65C

COEFFICIENT DATA

| z | x' | y' | x | y |
|---|---|---|---|---|
| −9 | −1 | −1 | −1 | 3 |
| −8 | −1 | 0 | −1 | −2 |
| −7 | −1 | 1 | −1 | 2 |
| −6 | −1 | 2 | −1 | −1 |
| −5 | −1 | 3 | −1 | 1 |
| −4 | 0 | −4 | 0 | −4 |
| −3 | 0 | −3 | 0 | −3 |
| −2 | 0 | −2 | 0 | −2 |
| −1 | 0 | −1 | 0 | −1 |
| 0 | 0 | 0 | — | 0 |
| 1 | 0 | 1 | 0 | 1 |
| 2 | 0 | 2 | 0 | 2 |
| 3 | 0 | 3 | 0 | 3 |
| 4 | 0 | 4 | 0 | 4 |
| 5 | 1 | −3 | 1 | 1 |
| 6 | 1 | −2 | 1 | −1 |
| 7 | 1 | −1 | 1 | 2 |
| 8 | 1 | 0 | 1 | −2 |
| 9 | 1 | 1 | 1 | 3 |
| ⋮ | ⋮ | ⋮ | ⋮ | ⋮ |
| 12 | 1 | 4 | 1 | −4 |
| 13 | 2 | −3 | 2 | 1 |

FIG. 75 a = 8

| z | x ' | y ' | x | y |
|---|---|---|---|---|
| −9 | −1 | −1 | −1 | −3 |
| −8 | −1 | 0 | −1 | 2 |
| −7 | −1 | 1 | −1 | −2 |
| −6 | −1 | 2 | −1 | 1 |
| −5 | −1 | 3 | −1 | −1 |
| −4 | 0 | −4 | 0 | −4 |
| −3 | 0 | −3 | 0 | −3 |
| −2 | 0 | −2 | 0 | −2 |
| −1 | 0 | −1 | 0 | −1 |
| 0 | 0 | 0 | — | 0 |
| 1 | 0 | 1 | 0 | 1 |
| 2 | 0 | 2 | 0 | 2 |
| 3 | 0 | 3 | 0 | 3 |
| 4 | 0 | 4 | 0 | 4 |
| 5 | 1 | −3 | 1 | 1 |
| 6 | 1 | −2 | 1 | −1 |
| 7 | 1 | −1 | 1 | 2 |
| 8 | 1 | 0 | 1 | −2 |
| 9 | 1 | 1 | 1 | 3 |
| ⋮ | ⋮ | ⋮ | ⋮ | ⋮ |
| 12 | 1 | 4 | 1 | −4 |
| 13 | 2 | −3 | 2 | 1 |

FIG. 80 a = 9

| z | x′ | y′ | x | y |
|---|---|---|---|---|
| −11 | −1 | 7 | −2 | 1 |
| −10 | −1 | 8 | −2 | 0 |
| −9 | 0 | 0 | −1 | −4 |
| −8 | 0 | 1 | −1 | 4 |
| −7 | 0 | 2 | −1 | −3 |
| −6 | 0 | 3 | −1 | 3 |
| −5 | 0 | 4 | −1 | −2 |
| −4 | 0 | 5 | −1 | 2 |
| −3 | 0 | 6 | −1 | −1 |
| −2 | 0 | 7 | −1 | 1 |
| −1 | 0 | 8 | −1 | 0 |
| 0 | 0 | 0 | 0 | — |
| 1 | 0 | −8 | 1 | 0 |
| 2 | 0 | −7 | 1 | 1 |
| 3 | 0 | −6 | 1 | −1 |
| 4 | 0 | −5 | 1 | 2 |
| 5 | 0 | −4 | 1 | −2 |
| 6 | 0 | −3 | 1 | 3 |
| 7 | 0 | −2 | 1 | −3 |
| 8 | 0 | −1 | 1 | 4 |
| 9 | 0 | 0 | 1 | −4 |
| 10 | 1 | −8 | 2 | 0 |
| 11 | 1 | −7 | 2 | 1 |
| 12 | 1 | −6 | 2 | −1 |

FIG. 81 a = 9

| z | x′ | y′ | x | y |
|---|---|---|---|---|
| −11 | −1 | 7 | −2 | −1 |
| −10 | −1 | 8 | −2 | 0 |
| −9 | 0 | 0 | −1 | 4 |
| −8 | 0 | 1 | −1 | −4 |
| −7 | 0 | 2 | −1 | 3 |
| −6 | 0 | 3 | −1 | −3 |
| −5 | 0 | 4 | −1 | 2 |
| −4 | 0 | 5 | −1 | −2 |
| −3 | 0 | 6 | −1 | 1 |
| −2 | 0 | 7 | −1 | −1 |
| −1 | 0 | 8 | −1 | 0 |
| 0 | 0 | 0 | 0 | — |
| 1 | 0 | −8 | 0 | 0 |
| 2 | 0 | −7 | 1 | 1 |
| 3 | 0 | −6 | 1 | −1 |
| 4 | 0 | −5 | 1 | 2 |
| 5 | 0 | −4 | 1 | −2 |
| 6 | 0 | −3 | 1 | 3 |
| 7 | 0 | −2 | 1 | −3 |
| 8 | 0 | −1 | 1 | 4 |
| 9 | 0 | 0 | 1 | −4 |
| 10 | 1 | −8 | 2 | 0 |
| 11 | 1 | −7 | 2 | 1 |
| 12 | 1 | −6 | 2 | −1 |

FIG. 84

| Z | X1 | Y1 | X | Y |
|---|---|---|---|---|
| −16 | −1 | 0 | −1 | −4 |
| −15 | −1 | 1 | −1 | 4 |
| −14 | −1 | 2 | −1 | −3 |
| −13 | −1 | 3 | −1 | 3 |
| −12 | −1 | 4 | −1 | −2 |
| −11 | −1 | 5 | −1 | 2 |
| −10 | −1 | 6 | −1 | −1 |
| −9 | −1 | 7 | −1 | 1 |
| −8 | 0 | −8 | 0 | −8 |
| −7 | 0 | −7 | 0 | −7 |
| −6 | 0 | −6 | 0 | −6 |
| −5 | 0 | −5 | 0 | −5 |
| −4 | 0 | −4 | 0 | −4 |
| −3 | 0 | −3 | 0 | −3 |
| −2 | 0 | −2 | 0 | −2 |
| −1 | 0 | −1 | 0 | −1 |
| 0 | 0 | 0 | — | 0 |
| 1 | 0 | 1 | 0 | 1 |
| 2 | 0 | 2 | 0 | 2 |
| 3 | 0 | 3 | 0 | 3 |
| 4 | 0 | 4 | 0 | 4 |
| 5 | 0 | 5 | 0 | 5 |
| 6 | 0 | 6 | 0 | 6 |
| 7 | 0 | 7 | 0 | 7 |
| 8 | 0 | 8 | 0 | 8 |
| 9 | 1 | −7 | 1 | 1 |
| 10 | 1 | −6 | 1 | −1 |
| 11 | 1 | −5 | 1 | 2 |
| 12 | 1 | −4 | 1 | −2 |
| 13 | 1 | −3 | 1 | 3 |
| 14 | 1 | −2 | 1 | −3 |
| 15 | 1 | −1 | 1 | 4 |
| 16 | 1 | 0 | 1 | −4 |
| 17 | 1 | 1 | 1 | 5 |
| 18 | 1 | 2 | 1 | −5 |
| 19 | 1 | 3 | 1 | 6 |
| 20 | 1 | 4 | 1 | −6 |

FIG. 88 amp(COEFFICIENT DATA)

| run(0-RUN LENGTH DATA) | 1 | 2 | 3 | 4 | 5 ··· 16 |
|---|---|---|---|---|---|
| 0 | 3 | 6 | 8 | | |
| 1 | 3 | 7 | 10 | | |
| 2 | 4 | 8 | 10 | | |
| 3 | 4 | 9 | | | |
| 4 | 5 | | | | |
| 5 | 6 | | | | |
| 6 | 7 | | | | |
| 7 | 7 | | | | |
| 8 | 7 | | 17 (ESC) | | |
| 9 | 8 | | | | |
| 10 | 9 | | | | |
| 11 | 9 | | | | |
| 12 | 9 | | | | |
| 13 | 10 | | | | |
| 14 | 10 | | | | |
| 15 | | | | | |
| : | | | | | |
| 63 | | | | | |

(Sign bit is not included)

EOB:1
ESC:7

FIG. 89 amp(COEFFICIENT DATA)

run(0-RUN LENGTH DATA)

| run \ amp | 1 | 2 | 3 | 4 | 5 | 6 | 7 | 9 | ··· | 63 |
|---|---|---|---|---|---|---|---|---|---|---|
| 0 | 3 | 5 | 7 | 9 | 10 | 12 | | | | |
| 1 | 3 | 5 | 7 | 9 | 11 | | | | | |
| 2 | 4 | 6 | 8 | 10 | 11 | | | | | |
| 3 | 4 | 6 | 8 | 10 | 12 | | | | | |
| 4 | 5 | 7 | 9 | 11 | | | | | | |
| 5 | 5 | 7 | 10 | 12 | | | | | | |
| 6 | 5 | 8 | 10 | 12 | | | | | | |
| 7 | 6 | 8 | 10 | | | | | | | |
| 8 | 6 | 9 | 11 | | | | | | | |
| 9 | 6 | 9 | 11 | | | | | | | |
| 10 | 6 | 9 | 11 | | | | | | | |
| 11 | 7 | 9 | 12 | | | | | | | |
| 12 | 7 | 10 | | | | | | | | |
| 13 | 7 | 10 | | | | | | | | |
| 14 | 8 | 11 | | | | | | | | |
| 15 | 8 | 11 | | | | | | | | |
| 16 | 9 | 12 | | | | | | | | |
| 17 | 9 | 12 | | | | | | | | |
| 18 | 9 | 12 | | | | | | | | |
| 19 | 9 | 12 | | | | | | | | |
| 20 | 10 | | | | | | | | | |
| 21 | 10 | | | | | | | | | |
| 22 | 10 | | | | | | | | | |
| 23 | 10 | | | | | | | | | |
| 24 | 11 | | | | | | | | | |
| 25 | 11 | | | | | | | | | |
| 26 | 11 | | | | | | | | | |
| 27 | 11 | | | | | | | | | |
| 28 | 11 | | | | | | | | | |
| 29 | 11 | | | | | | | | | |
| 30 | 12 | | | | | | | | | |
| 31 | 12 | | | | | | | | | |
| 32 | 12 | | | | | | | | | |
| 33 | | | | | | | | | | |
| ⋮ | | | | | | | | | | |
| 63 | | | | | | | | | | |

20
(ESC)

EOB:2
ESC:8

FIG. 90 amp (COEFFICIENT DATA)

| run (0-RUN LENGTH DATA) | 2 | 3 | 4 | 5 | 6 | 7 | 8 | 9 10 ··· 255 |
|---|---|---|---|---|---|---|---|---|
| 0 | 2 | 3 | 4 | 4 | 5 | 6 | 6 | |
| 1 | 4 | 5 | 6 | 6 | 7 | 7 | 8 | |
| 2 | 5 | 6 | 7 | 8 | 9 | 9 | 9 | |
| 3 | 6 | 7 | 8 | 9 | 10 | 11 | 12 | |
| 4 | 7 | 8 | 9 | 10 | 11 | 11 | 12 | |
| 5 | 7 | 9 | 10 | 11 | | | | |
| 6 | 7 | 9 | 11 | | | | | |
| 7 | 8 | 10 | 11 | | | | | |
| 8 | 8 | 10 | 11 | | | | | |
| 9 | 8 | 10 | 11 | | | | | |
| 10 | 8 | 10 | 11 | | | | | |
| 11 | 9 | 10 | 12 | | | | | |
| 12 | 9 | 11 | | | | | | |
| 13 | 9 | 11 | | | | | | |
| 14 | 10 | | | | | | | |
| 15 | 11 | | | | | | | |
| 16 | 12 | | | | | | | |
| 17 | | | | | | | | |
| 18 | | | | | | | | |
| : | | | | | | | | |
| 63 | | | | | | | | |

18 (ESC1) ①

23 (ESC2) ②

(Sign bit is not included)

EOB:3
ESC1:9
ESC2:9

FIG. 96 amp(COEFFICIENT DATA)

| run(0-RUN LENGTH DATA) | 0 | 1 | 2 | 3 | 4 | 5 | ··· | 16 |
|---|---|---|---|---|---|---|---|---|
| 0 | 14 | 3 | 6 | 8 | 12 | 12 | ··· | 12 |
| 1 | 14 | 3 | 7 | 10 | | | | |
| 2 | 14 | 4 | 8 | 10 | | | | |
| 3 | 14 | 4 | 9 | | | | | |
| 4 | 14 | 5 | | | | | | |
| 5 | 14 | 6 | | | | | | |
| 6 | 14 | 7 | | | | | | |
| 7 | 14 | 7 | | | | | | |
| 8 | 14 | 7 | | | | | | |
| 9 | 14 | 8 | | (*) | | | | |
| 10 | 14 | 9 | | | | | | |
| 11 | 14 | 9 | | | | | | |
| 12 | 14 | 9 | | | | | | |
| 13 | 14 | 10 | | | | | | |
| 14 | 14 | 10 | | | | | | |
| 15 | 14 | | | | | | | |
| : | : | | | | | | | |
| 61 | 14 | | | | | | | |

(Sign bit is not included. EOB=1)

ESC1:8
ESC2:8

Code length (run, amp) in (*) is given as (run−1, 0)+(0, amp)

FIG. 97 amp (COEFFICIENT DATA)

| run (0-RUN LENGTH DATA) | 0 | 1 | 2 | 3 | 4 | 5 | 6 | 7 | ··· | 63 |
|---|---|---|---|---|---|---|---|---|---|---|
| 0 | 15 | 3 | 5 | 7 | 9 | 10 | 12 | 15 | ··· | 15 |
| 1 | 15 | 3 | 5 | 7 | 9 | 11 | | | | |
| 2 | 15 | 4 | 6 | 8 | 10 | 11 | | | | |
| 3 | 15 | 4 | 6 | 8 | 10 | 12 | | | | |
| 4 | 15 | 5 | 7 | 9 | 11 | | | | | |
| 5 | 15 | 5 | 7 | 10 | 12 | | | | | |
| 6 | 15 | 5 | 8 | 10 | 12 | | | | | |
| 7 | 15 | 6 | 8 | 10 | | | | | | |
| 8 | 15 | 6 | 9 | 11 | | | | | | |
| 9 | 15 | 6 | 9 | 11 | | | | | | |
| 10 | 15 | 6 | 9 | 11 | | | | | | |
| 11 | 15 | 7 | 9 | 12 | | | | | | |
| 12 | 15 | 7 | 10 | | | | | | | |
| 13 | 15 | 7 | 10 | | | | | | | |
| 14 | 15 | 8 | 11 | | | | | | | |
| 15 | 15 | 8 | 11 | | | | | | | |
| 16 | 15 | 9 | 12 | | | | | | | |
| 17 | 15 | 9 | 12 | | | (*) | | | | |
| 18 | 15 | 9 | 12 | | | | | | | |
| 19 | 15 | 9 | 12 | | | | | | | |
| 20 | 15 | 10 | | | | | | | | |
| 21 | 15 | 10 | | | | | | | | |
| 22 | 15 | 10 | | | | | | | | |
| 23 | 15 | 10 | | | | | | | | |
| 24 | 15 | 11 | | | | | | | | |
| 25 | 15 | 11 | | | | | | | | |
| 26 | 15 | 11 | | | | | | | | |
| 27 | 15 | 11 | | | | | | | | |
| 28 | 15 | 11 | | | | | | | | |
| 29 | 15 | 11 | | | | | | | | |
| 30 | 15 | 12 | | | | | | | | |
| 31 | 15 | 12 | | | | | | | | |
| 32 | 15 | 12 | | | | | | | | |
| 33 | 15 | | | | | | | | | |
| ⋮ | ⋮ | | | | | | | | | |
| 63 | 15 | | | | | | | | | (EOB=2) |

ESC1:9
ESC2:9

Code length (run, amp) in (*) is given as (run−1, 0)+(0, amp)

FIG. 98 amp(COEFFICIENT DATA)

| run(0-RUN LENGTH DATA) | 0 | 2 | 3 | 4 | 5 | 6 | 7 | 8 | 9 | ··· | 255 |
|---|---|---|---|---|---|---|---|---|---|---|---|
| 0 | 15 | 2 | 3 | 4 | 4 | 5 | 6 | 6 | 15 | ··· | 15 |
| 1 | 15 | 4 | 5 | 6 | 6 | 7 | 7 | 8 | | | |
| 2 | 15 | 5 | 6 | 7 | 8 | 9 | 9 | 9 | | | |
| 3 | 15 | 6 | 7 | 8 | 9 | 10 | 11 | 12 | | | |
| 4 | 15 | 7 | 8 | 9 | 10 | 11 | 11 | 12 | | | |
| 5 | 15 | 7 | 9 | 10 | 11 | | | | | | |
| 6 | 15 | 7 | 9 | 11 | | | | | | | |
| 7 | 15 | 8 | 10 | 11 | | | | | | | |
| 8 | 15 | 8 | 10 | 11 | | | | | | | |
| 9 | 15 | 8 | 10 | 11 | | | | | | | |
| 10 | 15 | 8 | 10 | 11 | | | | | | | |
| 11 | 15 | 9 | 10 | 12 | | (*) | | | | | |
| 12 | 15 | 9 | 11 | | | | | | | | |
| 13 | 15 | 9 | 11 | | | | | | | | |
| 14 | 15 | 10 | | | | | | | | | |
| 15 | 15 | 11 | | | | | | | | | |
| 16 | 15 | 12 | | | | | | | | | |
| 17 | 15 | | | | | | | | | | |
| 18 | 15 | | | | | | | | | | |
| ⋮ | ⋮ | | | | | | | | | | |
| 63 | 15 | | | | | | | | | | |

(Sign bit is not included. EOB=3)

ESC1:9
ESC2:7

Code length (run, amp) in (*) is given as (run−1, 0)+(0, amp)

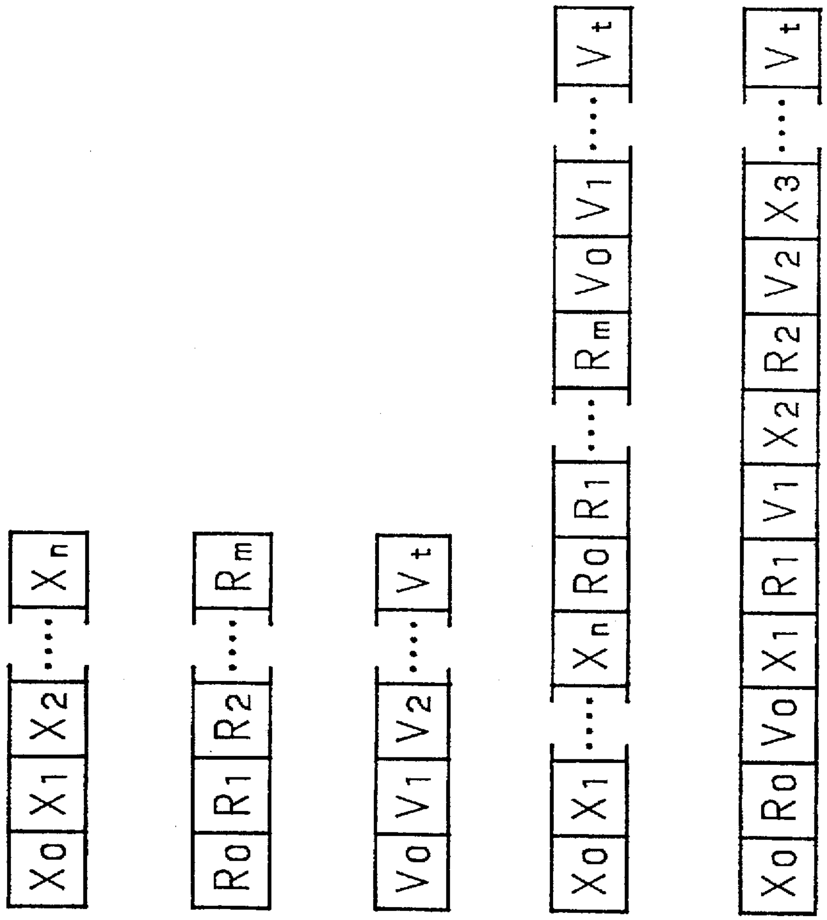
FIG. 99A OUTPUT X OF ENCODER 74
FIG. 99B OUTPUT R OF ENCODER 114
FIG. 99C OUTPUT V OF ENCODER 115
FIG. 99D SYNTHESIS RESULT IN PRIOR ART
FIG. 99E OUTPUT OF SYNTESIS CIRCUIT 69

SYNTHESIS RESULT IN PRIOR ART

OUTPUT OF SYNTHESIS CIRCUIT 69

1-RUN LENGTH DATA R

COEFFICIENT DATA V

SYNTHESIS DATA OUTPUT

FIG. 111

| X | Y | Y' | Z |
|---|---|---|---|
| −1 | −4 | 0 | −16 |
| −1 | 4 | 1 | −15 |
| −1 | −3 | 2 | −14 |
| −1 | 3 | 3 | −13 |
| −1 | −2 | 4 | −12 |
| −1 | 2 | 5 | −11 |
| −1 | −1 | 6 | −10 |
| −1 | 1 | 7 | −9 |
| 0 | −8 | −8 | −8 |
| 0 | −7 | −7 | −7 |
| 0 | −6 | −6 | −6 |
| 0 | −5 | −5 | −5 |
| 0 | −4 | −4 | −4 |
| 0 | −3 | −3 | −3 |
| 0 | −2 | −2 | −2 |
| 0 | −1 | −1 | −1 |
| — | 0 | 0 | 0 |
| 0 | 1 | 1 | 1 |
| 0 | 2 | 2 | 2 |
| 0 | 3 | 3 | 3 |
| 0 | 4 | 4 | 4 |
| 0 | 5 | 5 | 5 |
| 0 | 6 | 6 | 6 |
| 0 | 7 | 7 | 7 |
| 0 | 8 | 8 | 8 |
| 1 | 1 | −7 | 9 |
| 1 | −1 | −6 | 10 |
| 1 | 2 | −5 | 11 |
| 1 | −2 | −4 | 12 |
| 1 | 3 | −3 | 13 |
| 1 | −3 | −2 | 14 |
| 1 | 4 | −1 | 15 |
| 1 | −4 | 0 | 16 |
| 1 | 5 | 1 | 17 |
| 1 | −5 | 2 | 18 |
| 1 | 6 | 3 | 19 |
| 1 | −6 | 4 | 20 |

HIGH-EFFICIENCY ENCODING APPARATUS AND HIGH-EFFICIENCY DECODING APPARATUS

This application is a divisional of copending application Ser. No. 08/282,570 filed on Jul. 29, 1994, the entire contents of which are hereby incorporated by reference.

BACKGROUND OF THE INVENTION

1. Field of the Invention

The present invention relates to a high-efficiency encoding apparatus used in a digital signal recording/reproduction apparatus such as a digital video tape recorder (called digital VTR hereafter) which records digital video information, and more particularly to a high-efficiency encoding apparatus which encodes digital data while compressing the amount of data, and to a high-efficiency decoding apparatus which corresponds to the high-efficiency encoding apparatus.

2. Description of Related Art

FIG.1 is a block diagram illustrative of a high-efficiency encoding apparatus of the prior art. In FIG. 1, numeral 1 denotes a shuffling circuit whereto digital video data including a luminance signal and two kinds of color difference signals are input. The shuffling circuit 1 arranges the digital video data, namely the luminance signal and the two kinds of color difference signals, into a block structure with each block including 8 pixels×8 lines (the block will be called the DCT block hereafter), then shuffles the data in units of DCT blocks in a predetermined order and outputs the resultant data to a DCT transformer 2. The DCT transformer 2 applies discrete cosine transformation (called DCT transformation hereafter) to the incoming DCT blocks and outputs the DCT coefficients to a quantizer 3. The quantizer 3 quantizes the DCT coefficients with a predetermined value and outputs the DCT data to a data division circuit 7. The data division circuit 7 separates the DCT data received from the quantizer 3 into 0-run length data and coefficient data, and outputs them to a variable-length encoder 4. The variable-length encoder 4 applies variable-length encoding to the output of the data division circuit 7 and outputs the encoded data to a buffer 5. The buffer 5 temporarily stores the variable-length encoded data. A rate control circuit 6 measures the amount of data which is inputted to the buffer 5, and controls the quantization level of the quantizer 3 according to the amount of measured data.

Now the operation will be described below. Input digital video data is structured by the shuffling circuit 1 into DCT blocks each comprising 8 lines vertically and 8 pixels per line, then shuffled in the unit of the DCT block. In the description that follows, the value of data located at line i, column j in a DCT block will be represented by f(i, j) where i and j are spatial coordinates. 64 pixels of data in a DCT block which has been shuffled are DCT-transformed in the DCT transformer 2. DCT transformation will be briefly described below. The transform is carried out by calculating the following equation.

$$F(u,v)=\frac{1}{4}\cdot c(u)\cdot c(v)\cdot\sum_{x=0}^{7}\sum_{y=0}^{7}f(x,y)\cdot\cos\left(\frac{\pi(2x+1)u}{16}\right)\cdot\cos\left(\frac{\pi(2y+1)v}{16}\right)$$

where x, y are spatial coordinates, u, v are Fourier transformation coordinates, $$\begin{aligned}c(u)\cdot c(v) &= \frac{1}{\sqrt{2}}\ (\text{when } u, v=0)\\ &= 1\ (\text{otherwise})\end{aligned}$$

Results of the transformation are obtained in the form of 8×8 data blocks as shown in FIG. 2 or FIG. 3. Data of line u, column v is denoted as F(u, v). In a data block, data of sequence No.0 located at the top left corner is called the DC coefficient, data from sequences 1 through 63 are called AC coefficients, of which those of smaller sequence numbers are called the low-frequency coefficients and those of larger sequence numbers are called the high-frequency coefficients. DCT-transformed data generally has a power spectrum concentrated in low-frequency components. Coefficients obtained in the DCT transformation are output from the DCT transformer 2 successively in order starting with the data in the low-frequency region where the power spectrum is concentrated, while being scanned in a method called zig-zag scanning in the order of sequence numbers shown in FIG. 3. The order of output is shown by arrows in FIG. 2. Data is outputted successively from sequence 0 to sequence 63 as shown in the drawing.

Data after orthogonal transformation is input to the quantizer 3 where it is quantized. FIG. 4 is a block diagram illustrative of the quantizer 3. In FIG. 4, the quantizer 3 has an input terminal 3*a* for the DCT coefficients F(u, v) which are output from the DCT transformer 2, an input terminal 3*b* to receive quantization table values T(u, v), a multiplier 3*c*, a divider 3*d*, a rounding circuit 3*e* to round off the output from the divider 3*d* to a specified number of bits, and an output terminal 3*f*. The quantization table is a table containing 8×8 predetermined values as shown in FIG. 5. Similarly to the case of the DCT coefficients, value contained at line u, column v of the table will be denoted as T(u, v).

The operation of the quantizer 3 will now be described below with reference to FIG. 4. First, in the multiplier 3*c*, the quantization table value T(u, v) which is input from the input terminal 3*b* is multiplied with a rate control variable K which is output from the rate control circuit 6. The DCT transform coefficient F(u, v) which is input to the input terminal 3*a* is divided in the divider 3*d* by the result of multiplication by the multiplier 3*c*. The result of the dividing operation is rounded to an appropriate number of significant digits in the rounding circuit 3*e*. The rounding circuit 3*e* outputs the result to the output terminal 3*f*. This operation can be mathematically represented as follows.

$$\text{round}\left(\frac{F(u,v)}{T(u,v)\times K}\right)$$

where round (x) represents the operation of rounding the value x to a specified number of significant digits.

The operation of the data division circuit 7 will be described below. In a high-efficiency encoding apparatus commonly used in the compression of video data, 2-dimensional Huffman coding technique is used in the variable length encoder 4. In the 2-dimensional Huffman coding, DCT data which is read from the DCT transformer 2 by zig-zag scanning and then quantized is divided into non-zero coefficients and the number of 0's terms (0-run length) before being encoded. This means that coding is carried out by preparing a coding table which gives an appropriate code length (the number of bits) according to the occurrence probability of an event represented by the number of 0's (0-run length) between two non-zero coefficients, and the coefficient following the zero, then the events of the 0-run length data and the coefficient data are subjected to variable-length encoding, thereby to obtain 2-dimensional Huffman-coded data. In this process, shorter codes are assigned to more frequently appearing events and longer codes are assigned to less frequently appearing events. Thus the data division circuit 7 converts the incoming DCT data into an event of 0-run length data and coefficient data. In the description that follows, an operation to separate the data into a length of the runs of a particular coefficient A and other coefficients other than A such as in the data division circuit 7 will be called A-run length coding.

The event of 0-run length data and coefficient data separated in the data division circuit 7 is input to the variable length encoder 4. The variable length encoder 4 will be described below. FIG. 6 is a block diagram illustrative of a conventional variable length encoder commonly used. In FIG. 6, the variable length encoder 4 includes an encoder **4*a* and a coding table 4*b* which are connected to each other by signal lines 4*c*, 4*d*. The 0-run length data and coefficient data which are output from the data division circuit 7 are read by the encoder 4*a* so that codes are obtained via the signal line 4*c* while making reference to the coding table 4*b* via the signal line 4*d*** according to the input data, to thereby output digital signals. It is assumed here that 2-dimensional Huffman codes are recorded in advance in the coding table.

The principle of reducing the amount of codes by variable length codes (Huffman codes) used in this example of the prior art will be described briefly below. The coding table **4*b*** is prepared to make the bit length of coded data variable according to the occurrence probability of the input data. That is, assuming the occurrence probability of data Di be Pi and the code length after encoding in the case of Pi be Li, then when occurrence probabilities of input data Dj, Dk are in the relation of inequality Pj>Pk, the total amount of encoded data can be reduced from that of the input data by making the code lengths after encoding satisfy the inequality;

Lj≦Lk

Suppose a case where four kinds of input data having fixed length of 6 bits; 0, 10, 20, 30, have occurrence probabilities of 50%, 30%, 10% and 10%, respectively, and the code given in FIG. 7 is assigned to each piece of data in the ascending order of occurrence probability. While an input data stream of 0, 20, 0, 0, 30, 10, 0, 10, 0, 10, for example, requires total number of bits of 6 bits/word×10 words=60 bits, use of the table shown in FIG. 7 enables it to encode the entire data stream with 17 bits, thereby reducing the total amount of data.

Coded data thus compressed is then fed to the buffer 5 which stores the coded data temporarily. On the other hand, the rate control circuit 6 measures the amount of coded data which has been stored in the buffer 5 up to that time. And accordingly sends a rate control variable K to the quantizer 3 so that the final amount of codes becomes an appropriate value.

A high-efficiency encoding apparatus of the prior art is described above. The result of a simulation of high-efficiency encoding operation on 1-frame video data using the high-efficiency encoding apparatus will be described below with reference to FIG. 8 and FIG. 9.

FIG. 8 is a drawing illustrative of an array of data obtained through simulation of 0-run length coding, showing the 2-dimensional distribution of the 0-run length data and coefficients of a luminance signal. The description that follows will be restricted to the luminance signal. In FIG. 8, coefficients are arranged from left to right, and 0-run length data is arranged from top to bottom. The element having a coefficient of 0 and 0-run length data of 0 is EOB (end of block). In FIG. 8, terms having both positive and negative values are counted for the coefficient data. For example, a number of coefficients having a value 1 is given by adding the number of terms having a value 1 and the number of terms having a value −1. Huffman code length data obtained by transforming the 2-dimensional data array shown in FIG. 8 into 2-dimensional Huffman code array is shown in FIG. 9. In FIG. 9, coefficient data is arranged from left to right, and 0-run length data is arranged from top to bottom. This simulation was conducted by using quantization table values shown in FIG. 5 and a rate control variable fixed to 43. Huffman codes are represented by assigning 1 codeword to each term of data occupying 99.4% of all events and assigning escape codes to the rest of terms. FIG. 9 shows the result of simulation conducted on AC coefficients only. The code denoted by numeral 101 is a dummy code merely filling the space which is empty for the reason of 0-run length data.

The simulation showed that the transmitted data required for the transmission of luminance signal data for one frame used in the test image was 701,771 bits in the case of handling AC coefficients only. Because Huffman coding of DC coefficients generally does not lead to significant reduction of the amount of data, DC coefficients are often sent directly in the form of raw values. In this example of the prior art too, they are also assumed to be sent in the form of raw values.

In the high-efficiency encoding apparatus of the prior art, as described above, while the amount of transmitted codes of incoming video signals for one frame is reduced by using DCT transformation and variable length encoding, the recording capacity of storage media such as digital VTR is limited and recording of high-quality video signals with a limited recording capacity requires further reduction of the amount of data. Transmission of AC coefficients, in particular, requires as much as 701,771 bits for one frame as described above, and further reduction of the amount of data is called for.

Now a high-efficiency decoding apparatus of the prior art will be described below. FIG. 10 is a block diagram illustrative of a conventional high-efficiency decoding apparatus. In FIG. 10, numeral 301 denotes a variable-length decoder which applies variable length decoding to the input data. The variable length decoder 301 feeds the decoded data (run-length data and coefficient data) to a data synthesis circuit 302. The data synthesis circuit 302 synthesizes the run-length data and the coefficient data and sends DCT data to an inverse quantizer 303. The inverse quantizer 303 inverse-quantizes the DCT data and sends the DCT coefficients to an inverse DCT transformer 304. The inverse DCT transformer 304 applies inverse DCT transformation to the DCT coefficients and sends the original video data to a deshuffling circuit 305. The deshuffling circuit 305 arranges the DCT blocks into the original order and outputs the original video signals.

FIG. 11 is a block diagram illustrative of the variable length decoder 301 shown in FIG. 10. The variable-length decoder 301 has an input terminal 310 for data input, an input terminal 311 for a variable-length decoding start signal which indicates the start point of the incoming variable-length codes, a shift register 312, a code conversion ROM table 313 to convert the incoming 2-dimensional Huffman codes into the original run-length data and the coefficient data, a code length ROM table 314 which outputs the code length data of the incoming 2-dimensional Huffman codes, a register control circuit 315 which controls the shift amount of the shift register 312 according to the code length information supplied by the code length ROM table 314, an output terminal 316 for the run length data, an output terminal 317 for the coefficient data, and an output terminal 318 which is used for the output of the run length data and the coefficient data supplied through the output terminals 316 and 317, a control signal to indicate the effective area of the run-length data and the coefficient data, a control signal to indicate the start point of the DCT block detected from the 2-dimensional Huffman codes and other signals (collectively called data synthesis control signal hereafter).

FIG. 12 is a block diagram illustrative of the inner constitution of the data synthesis circuit 302 shown in FIG. 10. The data synthesis circuit 302 has an input terminal 320 for the coefficient data, an input terminal 321 for the run-length data, an input terminal 322 for the data synthesis control signal, a memory 323, a memory control circuit 324 to control write/read operation of the memory 323 and an output terminal 325 for data.

Now the operation of the variable-length decoding apparatus of the prior art described above will be described below. A 1-bit serial data stream is input to the variable-length decoder 301. The variable-length decoder 301 transforms the incoming 1-bit serial data stream into run-length data and coefficient data. The 1-bit serial data which is input via the input terminal 310 is input to the shift register 312 where it is converted to parallel data. The output of the shift register 312 is input to the code conversion ROM table 313 and to the code length ROM table 314. The code conversion ROM table 313 converts the variable length code which is output from the shift register 312 to the original run-length data and the coefficient data. On the other hand, the code length ROM table 314 outputs the code length information of the incoming variable length code to the register control circuit 315. The register control circuit 315 controls the shift amount of the shift register 312 according to the code length information and, at the same time, outputs the data synthesis signal (a signal indicating the effective area of output data from the output terminals 316 and 317, a signal indicating the start point of the DCT block, etc.).

The output of the variable length decoder 301 is input to the data synthesis circuit 302. The operation of data synthesis will be described below. All data in a specified memory block in the memory 323 is set to zero according to the DCT block start point signal included in the data synthesis control signals which are input via the input terminal 322. In this example, it is assumed that two 64-byte memory blocks make a pair (128 bytes), and a plurality (generally equals the number of DCT blocks handled in controlling the amount of codes) of pairs constitute the memory 323. This constitution is employed so that, when data of a DCT block is being synthesized in one memory block, synthesized data is read in another memory block. The memory control circuit 324 writes the coefficient data to the address which indicates the run-length data according to the effective area signal incoming through the input terminal 322.

FIG. 13 is a drawing illustrating the variable-length decoding operation of the prior art. FIG. 13A shows an event of run-length data and coefficient data, and FIG. 13B shows the result of synthesizing the data stream shown in FIG. 13A by the memory. The memory control circuit 324 generates the address of writing the coefficient data other than zeros shown in FIG. 13B according to the incoming run-length data, thereby carrying out the decoding operation.

The DCT data synthesized in the above operation is inverse-quantized in the inverse quantizer 303. The rate control variable K is generally transmitted together with the DCT data. The inverse DCT transformer 304 applies inverse DCT transform to restore the original video data. The deshuffling circuit 305 deshuffles the incoming DCT block to cancel the block structure and outputs the video signals.

In the high-efficiency encoding apparatus of the prior art, because it is constituted as described above, the amount of codes during high-efficiency coding has been suppressed by increasing the value of the rate control variable K which is input to the quantizer 3. However, although increasing the rate control variable K reduces the amount of codes, it also causes degradation of the picture quality. This is because the amount of codes after high-efficiency coding is greater than necessary in the high-efficiency encoding apparatus of the prior art.

SUMMARY OF THE INVENTION

The present invention has been made for the purpose of solving the above-mentioned problem, and has an object of providing a high-efficiency encoding apparatus capable of further reducing the amount of codes without allowing the picture quality to degrade.

Another object of the invention is to provide a high-efficiency encoding apparatus which enables it to employ code compression method having higher efficiency without increasing the memory capacity requirement, in contrast to such a problem of the prior art that the use of a high-efficient method of reducing the amount of codes without allowing the picture quality to degrade may lead to an increase in the memory capacity requirement which results in a cost increase.

Further another object of the invention is to provide a high-efficiency encoding and/or decoding apparatus capable of producing good picture quality when errors occur or during high-speed reproduction.

Further another object of the invention is to provide a high-efficiency decoding apparatus which is capable of decoding data which has been coded by the high-efficiency encoding apparatus of the invention, such that an increase in the memory capacity requirement is minimized.

The high-efficiency encoding apparatus of the invention carries out 1-dimensional scanning of digital data which is structured in blocks thereby separating the digital data into run length data and coefficient data, then applies run-length encoding to the run-length data by employing data (for example 0) of the highest probability of occurrence as the run, and similarly applies run-length encoding to the coefficient data by employing data (for example 1) of the highest probability of occurrence as the run.

Another high-efficiency encoding apparatus of the invention carries out 1-dimensional scanning of blocked digital data which has undergone orthogonal transformation thereby separating the digital data into position data at the time of 1-dimensional scanning of data having the highest probability of occurrence and coefficient data, and applies variable-length encoding separately to the separated position data and the coefficient data.

Further another high-efficiency encoding apparatus of the invention detects the maximum amplitude of data in a block after applying orthogonal transformation to the digital data which has been structured into blocks, and divides the orthogonal-transformed data into two parts in the direction of amplitude and encodes the respective data when the maximum amplitude is not less than a specified level, or encodes the orthogonal-transformed data by another encoding method when the maximum amplitude is below the specified level.

In further another high-efficiency encoding apparatus of the invention, data which has undergone orthogonal transformation in the unit of block is classified into predetermined classes by detecting the maximum amplitude of the data so that the orthogonal-transformed data is divided into X data and Y data in the direction of amplitude, while the separated X data is subjected to run-length encoding employing 0 as the run followed by variable-length encoding, while the separated Y data and the orthogonal-transformed data are selected by switching according to the result of classification, the output is subjected to 1-dimensional scanning and run-length encoding with 1 as the run so that it is divided into run length data and coefficient data, and the run-length data is further subjected to run-length encoding with 0 as the run to variable-length encode it, then the coefficient data is also subjected to run-length encoding with 0 as the run followed by variable-length encoding, and variable-length encoded data is synthesized according to the result of classification.

In the high-efficiency encoding apparatus of the invention as described above, further reduction of the amount of encoded information is made possible in a reversible process based on a simple algorithm, compared to the high-efficiency encoding apparatus of the prior art. As a result, it is made possible to keep the rate control variable K which determines the reproduced picture quality to a small value and a remarkable improvement of the decoded picture quality can be expected.

In further another high-efficiency encoding apparatus of the invention, orthogonal-transformed data is divided into a plurality of groups of data, with each group of data being subjected to variable-length encoding by using different variable-length encoding tables, while a data stream is synthesized by switching the variable-length codes alternately starting at the code located at the head, when transmitting or recording the variable-length encoded codes within a block. Thus the amount of data can be effectively reduced in a reversible process when the data stream is recorded in a storage medium such as the digital VTR, thereby making it possible to obtain good reproduced picture during special reproduction operation (high-speed reproduction) or when errors are detected.

The high-efficiency decoding apparatus of the invention separates variable-length codes from a data stream synthesized by the high-efficiency encoding apparatus described above, decodes the separated variable-length codes and controls the operation of synthesizing the separated data so that the separated data is synthesized at the time when all data of at least one block has been decoded, thereby decoding the encoded data. Therefore memory capacity requirement used in the variable-length decoding and the circuit size of the peripheral circuits are reduced.

The above and further objects and features of the invention will more fully be apparent from the following detailed description with accompanying drawings.

BRIEF DESCRIPTION OF THE DRAWINGS

FIG. 3 is a drawing illustrating of the sequence numbers of DCT coefficients.

FIG. 5 is a drawing illustrative of the quantization table used in the quantizer.

FIG. 7 is a drawing explanatory of the concept of reducing the amount of encoded information by variable-length encoding.

FIG. 8 is a drawing illustrative of the array of events in 0-run length coding of the prior art obtained by simulation.

FIG. 9 is a drawing illustrative of the Huffman code length of events in 0-run length coding of the prior art (result of simulation).

FIG. 16A, B are drawings explanatory of the operation of the first embodiment.

FIG. 17 is a drawing illustrative of the array of events in R0-run length coding in the first embodiment obtained by simulation.

FIG. 18 is a drawing illustrative of the distribution of events in V1-run length coding in the first embodiment obtained by simulation.

FIG. 19 is a drawing illustrative of the Huffman code length of events in R0-run length coding in the first embodiment (the result of simulation).

FIG. 20 is a drawing illustrative of the Huffman code length of events in V1-run length coding of in the first embodiment (the result of simulation).

FIG. 23 is a drawing illustrative of the number of events in 1 frame for the explanation of the second embodiment.

FIG. 25 is a drawing illustrative of the array of events in RR0-run length coding in the second embodiment obtained by simulation.

FIG. 26 is a drawing illustrative of the array of events in RV1-run length coding in the second embodiment obtained by simulation.

FIG. 27 is a drawing illustrative of the array of events in VR0-run length coding in the second embodiment obtained by simulation.

FIG. 28 is a drawing illustrative of the array of events in VV2-run length coding in the second embodiment obtained by simulation.

FIG. 29 is a drawing illustrative of the array of events in R0-run length coding in the third embodiment of the invention obtained by simulation.

FIG. 32 is a drawing comparing the amount of encoded information between the first embodiment and the second embodiment for the explanation of the fourth embodiment.

FIG. 36A, B, C, D, E are drawings explanatory of the operation of the fifth embodiment.

FIG. 38A, B, C, D, are drawings explanatory of the operation of the seventh embodiment.

FIG. 39A, B, C, are drawings explanatory of the operation of the seventh embodiment.

FIG. 40A, B, C, D are drawings explanatory of the operation of the seventh embodiment.

FIG. 41A, B, C are drawings illustrative of the DCT block data for specified explanation of the operation of the seventh embodiment.

FIG. 56A, B, C are drawings explanatory of the operation of the twelfth embodiment.

FIG. 62 is a block diagram illustrative of the weighting factors for the explanation of the operation of the scan order change circuit in thirteenth embodiment.

FIG. 65A, B, C are drawings explanatory of the operation of the fourteenth embodiment.

FIG. 74 is a drawing illustrative of an example of the result of the operation of the data division circuit of the eighteenth embodiment.

FIG. 75 is a drawing illustrative of an example of the result of the operation of the data division circuit of the eighteenth embodiment.

FIG. 80 is a drawing illustrative of an example of the result of the operation of the data division circuit of the nineteenth embodiment.

FIG. 81 is a drawing illustrative of an example of the result of the operation of the data division circuit of the nineteenth embodiment.

FIG. 84 is a drawing illustrative of an example of the result of the operation of the data division circuit of the twentieth embodiment.

FIG. 88 is a drawing illustrative of the code length of the first Huffman code used in the variable-length encoder of the constitution shown in FIG. 87.

FIG. 89 is a drawing illustrative of the code length of the second Huffman code used in the variable-length encoder of the constitution shown in FIG. 87.

FIG. 90 is a drawing illustrative of the code length of the third Huffman code used in the variable-length encoder of the constitution shown in FIG. 87.

FIG. 96 is a drawing illustrative of the code length of the fourth Huffman code used in the variable-length encoder of in FIG. 95.

FIG. 97 is a drawing illustrative of the code length of the fifth Huffman code used in the variable-length encoder of in FIG. 95.

FIG. 98 is a drawing illustrative of the code length of the sixth Huffman code used in the variable-length encoder of in FIG. 95.

FIG. 99A, B, C, D, E are drawings for the explanation of the data synthesis operation in the twentieth embodiment.

FIG. 111 is a drawing illustrative of the operation of the data synthesis circuit in the twenty-fourth embodiment.

DESCRIPTION OF THE PREFERRED EMBODIMENTS

Now the invention will be described in detail below with reference to the accompanying drawings explanatory of the preferred embodiments.

EMBODIMENT 1

Figure 14:
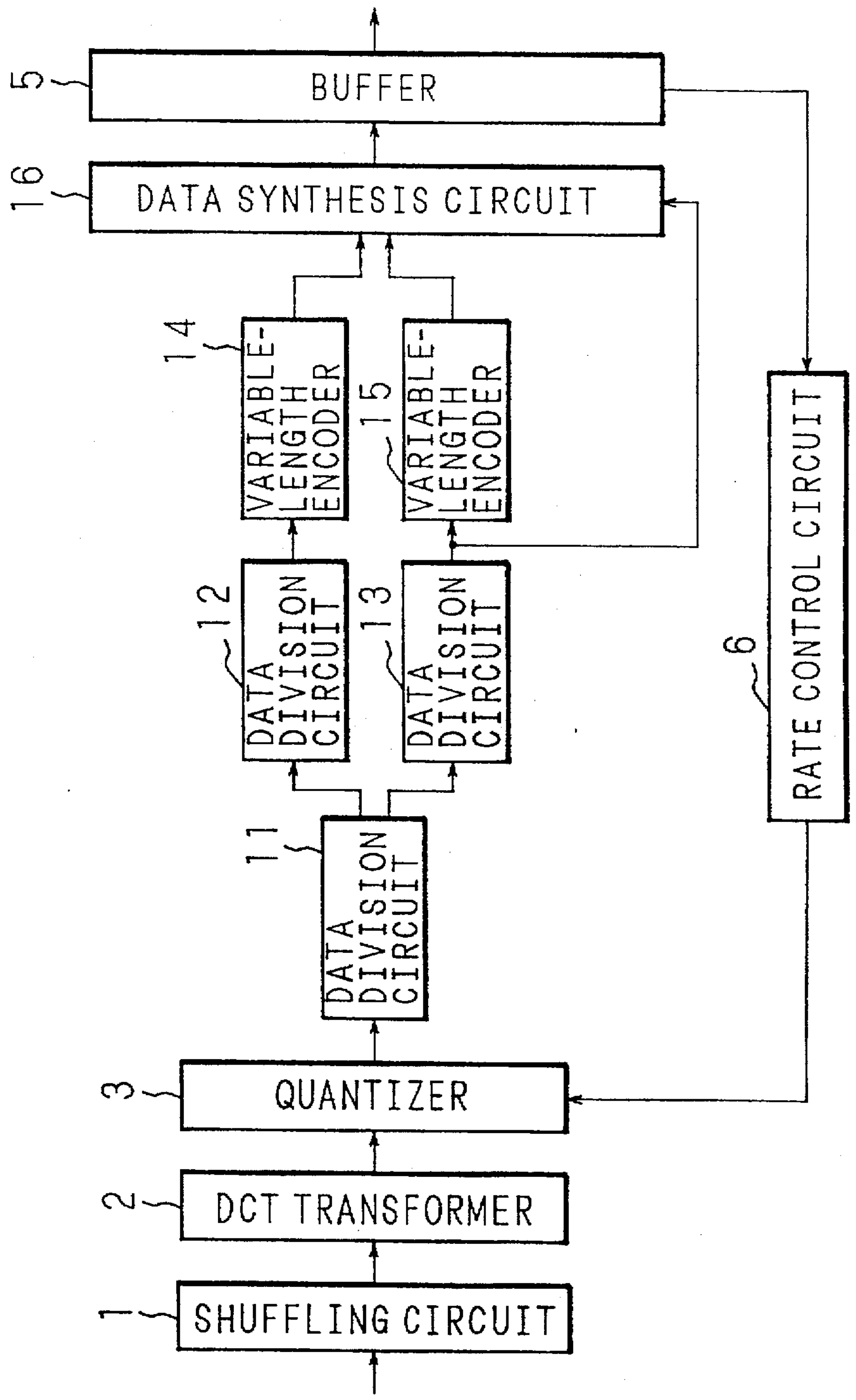
FIG. 14 is a block diagram illustrative of the high-efficiency encoding apparatus of the first embodiment of the invention.

The first embodiment of the high-efficiency encoding apparatus having the run-length coding apparatus of the invention will be described below. FIG. 14 is a block diagram illustrative of a high-efficiency encoding apparatus according to the first embodiment of the invention. In FIG. 14, components which are identical with those of the prior art are denoted by the same numerals. Numeral 1 denotes a shuffling circuit whereto digital video data comprising luminance signal and two kinds of color difference signal are input. The shuffling circuit 1 rearranges the digital video data, namely the luminance signal and the two kinds of color difference signal, into a structure of DCT blocks with each block consisting of 8 pixels×8 lines, then shuffles the data in the unit of DCT blocks in a predetermined order and outputs the resultant data to a DCT transformer 2. The DCT transformer 2 applies DCT transformation to the incoming DCT blocks and outputs the DCT coefficients to a quantizer 3. The quantizer 3 quantizes the DCT coefficients with a predetermined value and outputs the DCT data to a data division circuit 11. The data division circuit 11 separates the input data into 0-run length data and coefficient data, and outputs the 0-run length data to a data division circuit 12 and the coefficient data to a data division circuit 13. The data division circuit 12 separates the input data into 0-run length data and coefficient data, and outputs them to a variable length encoder 14. The data division circuit 13 separates the input data into 1-run length data and coefficient data, and outputs them to a variable length encoder 15. The data division circuit 13 also outputs the code data indicating sign signal of ±1 data (1-run length data) to a data synthesis circuit 16. The data synthesis circuit 16 synthesizes the outputs of variable length encoders 14 and 15 and the output of the data division circuit 13 and outputs the synthesized data to a buffer 5. The buffer 5 temporarily stores the variable-length encoded data. A rate control circuit 6 measures the amount of data which is input to the buffer 5, and controls the quantization level of the quantizer 3 according to the amount of data measured.

Prior to the description of the operation of the high-efficiency encoding apparatus of the first embodiment, the working principle of the first embodiment will be described. When reducing the amount of encoded data by using variable-length code such as the Huffman code (2-dimensional Huffman coding shown in the description of the prior art) in general, important parameters which determine the amount of coded data after variable-length coding are the array of the 0-run length data and the coefficient data, and the number of terms of these kinds of data which are actually subjected to coding.

The first embodiment is to reduce the amount of coded data during variable length encoding in a reversible process by reducing the number of events when applying Huffman coding. The outline of the first embodiment will be described below with reference to FIG. 8. Data will be denoted in the description that follows such that an event with 0-run length data of value 1 and coefficient data of value 2 in FIG. 8, for example, is represented by the event (1, 2). The following description will be restricted to the case of luminance signal. Two kinds of color difference signals will not be dealt with because similar results are obtained for these signals.

The video data which has been separated into the 0-run length data and coefficient data shown in FIG. 8 includes 138,078 events in all. Attention is focused on (0, X) (X=0, 1, 2, 3, . . . ) namely events having 0-run length data of value 0, and (X, 1) (X=0, 1, 2, 3,. . . ) namely events having coefficient data of value 1. There are 87,372 events of (0, X) (except EOB) and 80,079 events of (X, 1) in the video image of this simulation. They account for 63.3% (87,372/138,078) and 58.0% (80,079/138,078) of the total number of events of data, respectively. This means that reducing the number of events during variable length coding requires efficiently reducing the number of events having value 0 for the 0-run length data and the number of events having value 1 for the coefficient data. The first embodiment will be described below with reference to the encoding algorithm shown in FIG. 15.

Incoming digital video data is subjected to DCT transformation, zig-zag scanned to change the order of output, then quantization. Quantization and zig-zag scanning may be applied in reverse order. Zig-zag scanned data is separated into 0-run length data (the number of successive 0's) and coefficient data similarly to the prior art. FIG. 16A shows the data included in one DCT block separated into the 0-run length data and coefficient data. In FIG. 16A, the event (0, 0) represents the EOB. The data included in one DCT block separated into the 0-run length data and coefficient data is then separated into events of 0-run length data and coefficient data (FIG. 16B). For the 0-run length data, run-length coding with value 0 which has a very high probability of occurrence is applied once again. Similarly, run-length coding with value 1 having a very high probability of occurrence is applied to the coefficient data.

The data which has undergone the two run-length coding operations is Huffman-encoded by the Huffman code tables provided for the respective data, then synthesized and output. Then the amount of encoded data is measured and the rate control variable K is output to the quantizer 3. In the description that follows, the 0-run length coding applied first will be called the first 0-run length coding, the 0-run length coding applied for the second time the second R0-run length encoding, and the 1-run length coding applied for the second time the second V1-run length coding, in order to distinguish the 0-run length coding operation applied first and the 0- and 1-run length coding operations applied later.

Events of data arrayed as shown in FIG. 8 are once divided into two data groups of 0-run length data and coefficient data (the first 0-run length coding). For the 0-run length data, run-length coding with value 0 which has the highest probability of occurrence is applied once again (the second R0-run length coding). Similarly, run-length coding with value 1 having the highest probability of occurrence is applied to the coefficient data (the second V1-run length coding). This reduces the number of events to approximately 138,078−87,372=50,706 in the second R0-run length coding, and to 138,078−80,079=57,999 in the second V1-run length coding.

Figure 15:
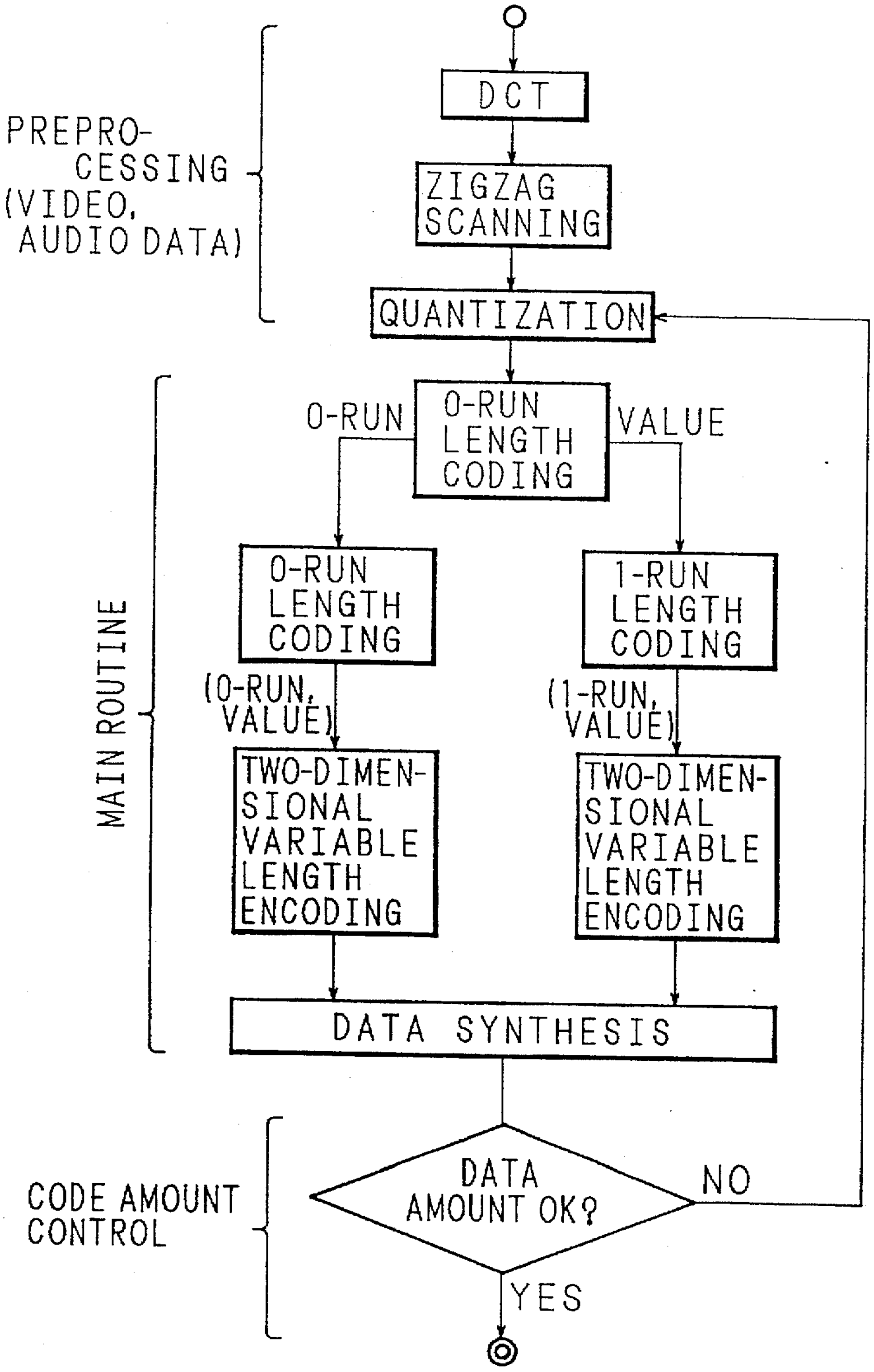
FIG. 15 is a drawing illustrative of the encoding algorithm in the first embodiment.

The result of computer simulation conducted with the algorithm shown in FIG. 15 based on the above-mentioned result will be described below. For the conditions of the simulation, the quantization table values shown in FIG. 5 and the rate control variable K fixed to 43 are used similarly to the prior art. The simulation resulted in 46,922 events (the second R0-run length coding) and 58,311 events (the second V1-run length coding) for the respective cases. Slight differences in the numbers from the calculation described previously are attributed to the number of blocks where EOB occurs. In the run-length coding with 1, +1 and −1 are not distinguished and instead the same number of sign bits as the number of 1 and −1 terms are added after coding.

This makes the total number of events 46,922+58,311=105,233 which is 32,845 events less than the first result. FIG. 17 shows the array of 0-run length data and coefficient data generated in the second R0-run length coding, and FIG. 18 shows the array of 1-run length data and coefficient data generated in the second V1-run length coding. In these drawings, coefficient data is arranged from left to right and 0- or 1-run length data is arranged from top to bottom, with the position where the coefficient data is 0 and the run length data is 0 being the EOB. Also similarly to the prior art, the number of events of the coefficient data is given by counting both the positive and negative events. For example, the number of events having coefficient 2 is given by adding the numbers of +2 and −2 events. The simulation dealt with AC coefficients only, similarly to the prior art.

FIG. 19 and FIG. 20 show the Huffman code length in the case where 2-dimensional Huffman code is generated according to the 2-dimensional data array shown in FIG. 17 and FIG. 18. The coefficient data is arranged from left to right and 0-or 1-run length data is arranged from top to bottom, as in the case of the prior art. Huffman code is represented by assigning one code word to each event of data occupying 99.4% of all events and assigning escape code (called ESC hereafter) to the rest of events.

In the simulation, the amount of coded data for one frame of picture after the second R0-run length coding is 245,020 bits, and that after the second V1-run length coding is 343,700 bits. This means that the total amount of coded data is 245,020+343,700+80,079=688,799 bits, decreasing to 95.3% (668,799/701,711).

Because the amount of coded data is reduced by using variable length coding which is a reversible process in the above operation, it is possible to reduce the amount of transmitted signals without any degradation of the picture quality in contrast to the high-efficiency encoding apparatus of the prior art.

Figure 4:
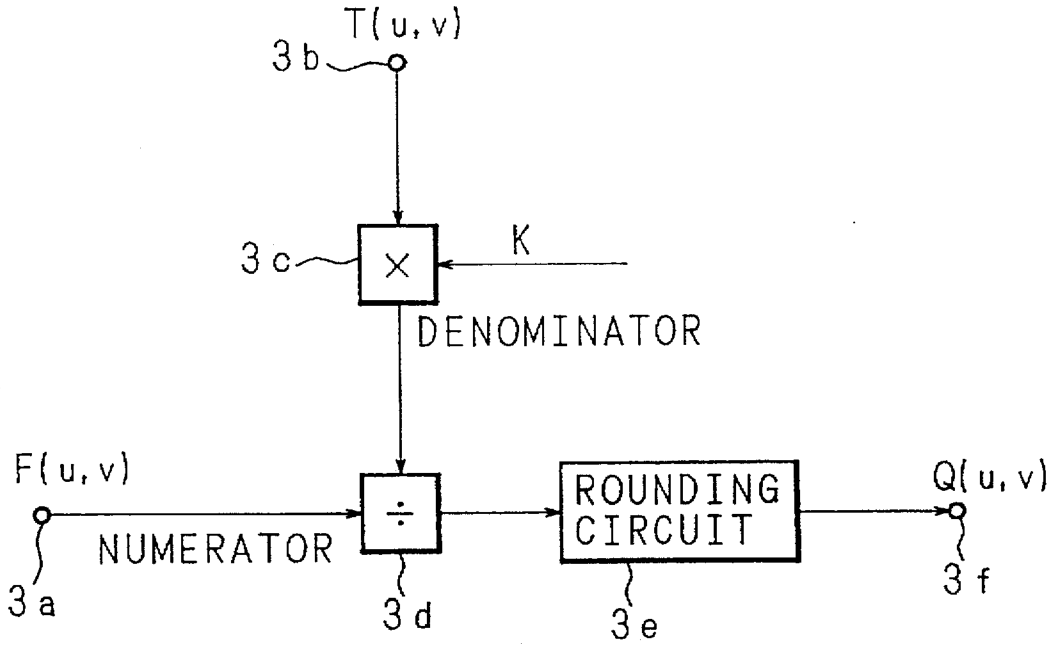
FIG. 4 is a block diagram illustrative of the quantizer.

Now the operation of the high-efficiency encoding apparatus which employs such a run-length encoder will be described below with reference to FIG. 14. Incoming digital video data is structured by the shuffling circuit 1 into DCT blocks each comprising 8 lines vertically and 8 pixels per line, then shuffled in the unit of the DCT block. The data of the 64 pixels in one shuffled DCT block is DCT transformed in the DCT transformer 2. The transformed coefficients obtained through the DCT transformation are zig-zag scanned and output from the DCT transformer 2 successively in order starting with the data in the low-frequency region where the power spectrum is concentrated. The output of the DCT transformer 2 is fed to the quantizer 3 where it is quantized. The quantizer 3 is the same as that of the prior art (FIG. 4).

Output of the quantizer 3 is fed to the data division circuit 11. The data division circuit 11 separates the zig-zag scanned data into events of 0-run length data and coefficient data similarly to the prior art. The 0-run length data and the coefficient data which have been separated in the data division circuit 11 are supplied to the data division circuit 12 and the data division circuit 13, respectively. The data division circuit 12 applies the second R0-run length coding to the incoming 0-run length data, and outputs events of 0-run length data and coefficient data. Similarly the data division circuit 13 applies the second V1-run length coding to the incoming coefficient data and separates the data into 1-run length data and coefficient data.

Figure 6:
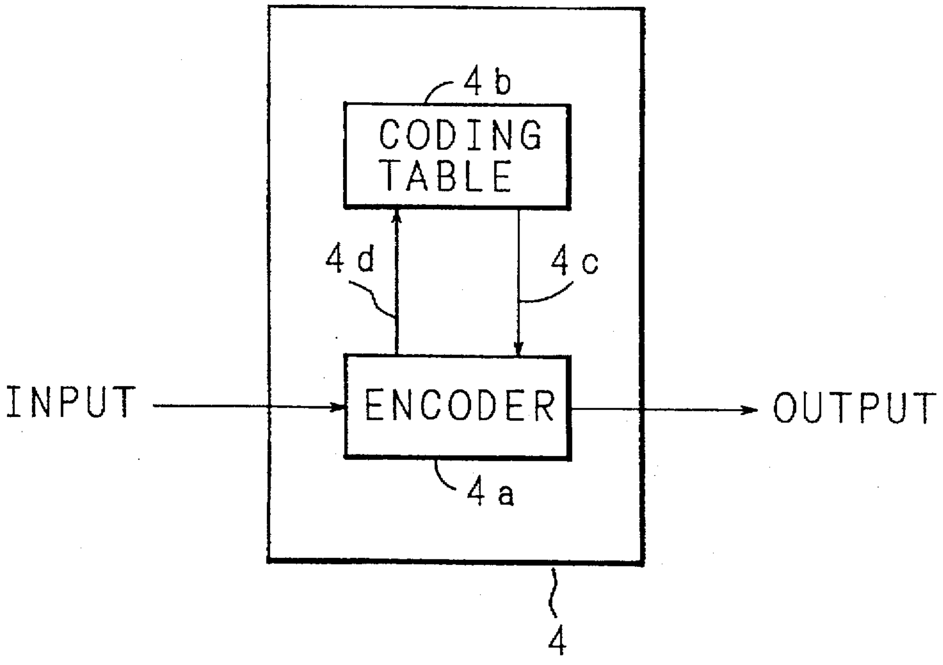
FIG. 6 is a block diagram illustrative of the variable-length encoder.

The events of 0-run length data and coefficient data which have been separated in the data division circuit 12 are input to the variable length encoder 14 where they are subjected to variable length encoding according to a predetermined table data. Similarly, the events of 1-run length data and coefficient data which have been separated in the data division circuit 13 are input to the variable length encoder 15 where they are subjected to variable length encoding according to a predetermined table data. The variable length encoders 14, 15 are the same as that of a variable length encoder 4 of the prior art shown in FIG. 6. In the first embodiment, the contents of the Huffman code in the coding table **4*b* is different between the cases of the variable length encoder 14 and the variable length encoder 15**.

Figure 21:
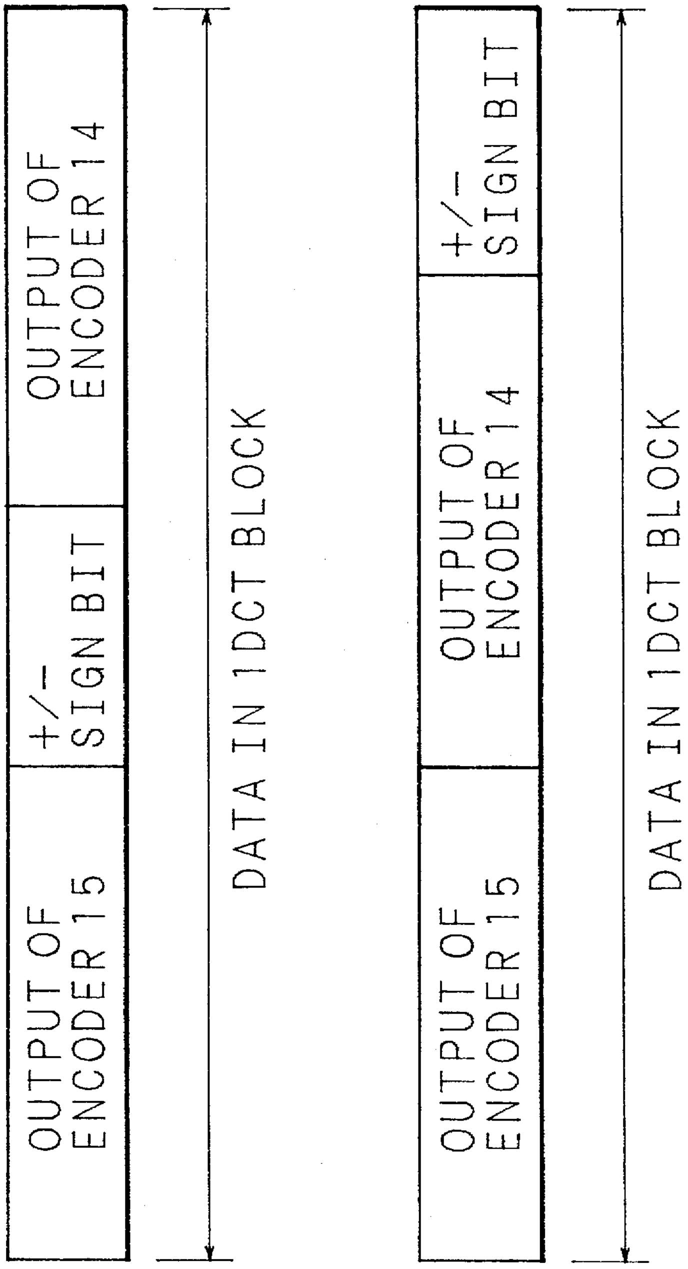
FIG. 21 is a drawing illustrative of the recording format for data to be recorded in one DCT block in the first embodiment.

Outputs of the variable length encoder 14 and the variable length encoder 15 are fed to the data synthesis circuit 16. The data synthesis circuit 16 synthesizes the output data of the variable-length encoder 15, code data indicating positive/negative of one piece of output data from the data division circuit 13, and the output data of the variable-length encoder 14 in the unit of one DCT block, as shown in FIG. 21. Although FIG. 21 shows the order of synthesizing data in two examples, the invention is not restricted to these schemes.

Encoded data thus compressed is then fed to the buffer 5 which stores the encoded data temporarily similarly to the prior art. On the other hand, the rate control circuit 6 measures the amount of encoded data which has been stored in the buffer 5 up to that time, and accordingly sends a rate control variable K to the quantizer 3 so that the final amount of encoded information becomes an appropriate value.

The high-efficiency encoding apparatus described above reduces the amount of recorded data from that of the conventional high-efficiency encoding apparatus by about 5% through a reversible process, similarly to the simulation described above. This makes it possible to improve the reproduced picture quality without increasing the amount of recorded data, when this method is employed in storage media such as digital VTR, compared to a case of encoding by the conventional high-efficiency encoding apparatus. This means that the rate control variable K which is output from the rate control circuit 6 can be made less than that of the prior art to the extent corresponding to the reduction in the amount of the encoded data, thus improving the S/N ratio of the decoded picture.

EMBODIMENT 2

Figure 22:
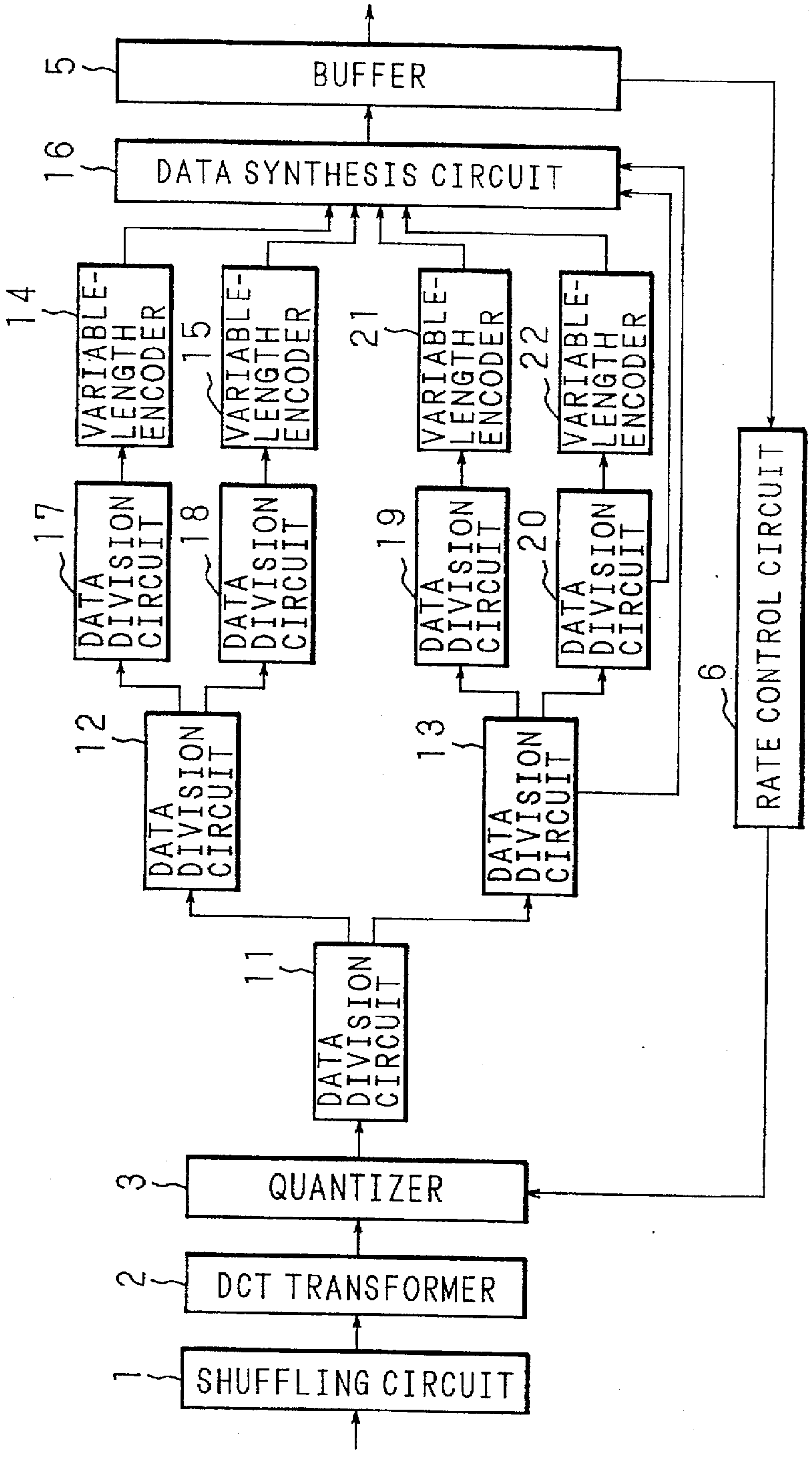
FIG. 22 is a block diagram illustrative of the high-efficiency encoding apparatus of the second embodiment of the invention.

A second embodiment of the high-efficiency encoding apparatus having the run-length encoding apparatus of the invention will be described below. FIG. 22 is a block diagram illustrative of the high-efficiency encoding apparatus according to the second embodiment of the invention. In FIG. 22, components which are identical with those of the first embodiment (FIG. 14) are denoted by the same numerals and the description thereof will be omitted. Numerals 17, 18, 19, 20 denote data division circuits and numerals 21, 22 denote variable-length encoders.

Before describing the operation of the second embodiment, the outline of the second embodiment will be described below. FIG. 23 shows the numbers of coefficient data of AC components of the luminance signals obtained after DCT transformation and quantization of 1-frame picture. The picture used in this embodiment is the same as that was simulated in the prior art, and the values of quantization table and the rate control variable K are also the same as those used in the simulation of the prior art. As in the first embodiment, coefficients having the same absolute values with opposite signs are not distinguished.

As shown in FIG. 23, the numbers of terms 0, 1 and 2 are 207,210 and 80,079 and 21,382, respectively. This indicates that coefficient 2 accounts for a substantial portion of the coefficients obtained by the second V1-run length coding. Now the second embodiment will be described in detail below with reference to the coding algorithm shown in FIG. 24.

The incoming digital video data is, after being subjected to DCT transformation, zig-zag scanned to change the order of output, and then quantized. Zig-zag scanned data is separated into 0-run length data and coefficient data similarly to the case of the first embodiment, and is subjected to the second R0-run length coding and V1-run length coding once again. Then the result of the second R0-run length coding of one DCT block data is separated again into 0-run length data and coefficient data. For the 0-run length data, run-length coding with value 0 which has a very high probability of occurrence is applied once again. Similarly, run-length coding with value 1 having a very high probability of occurrence is applied to the coefficient data. Again the result of the second V1-run length coding of one-DCT block data is separated into 1-run length data and coefficient data. For the 1-run length data, run-length coding with value 0 which has a very high probability of occurrence is applied once again. To the coefficient data, run-length coding with value 2 having a very high probability of occurrence is applied as described previously.

The four kinds of data which have been subjected to three run-length coding operations are Huffman-coded by means of the respective Huffman code tables prepared there-for, and are synthesized and output. The 0-run length coding operation applied to the 0-run length data of the R0-run length coding will be called the third RR0-run length coding, and the 1-run length coding operation applied to the coefficient data of R0-run length coding will be called the third RV1-run length coding. Similarly, the 0-run length coding operation applied to the 1-run length data of the V1run length coding will be called the third VR0-run length coding, and the 2-run length coding operation applied to the coefficient data of V1-run length coding will be called the third VV2-run length coding.

Figure 24:
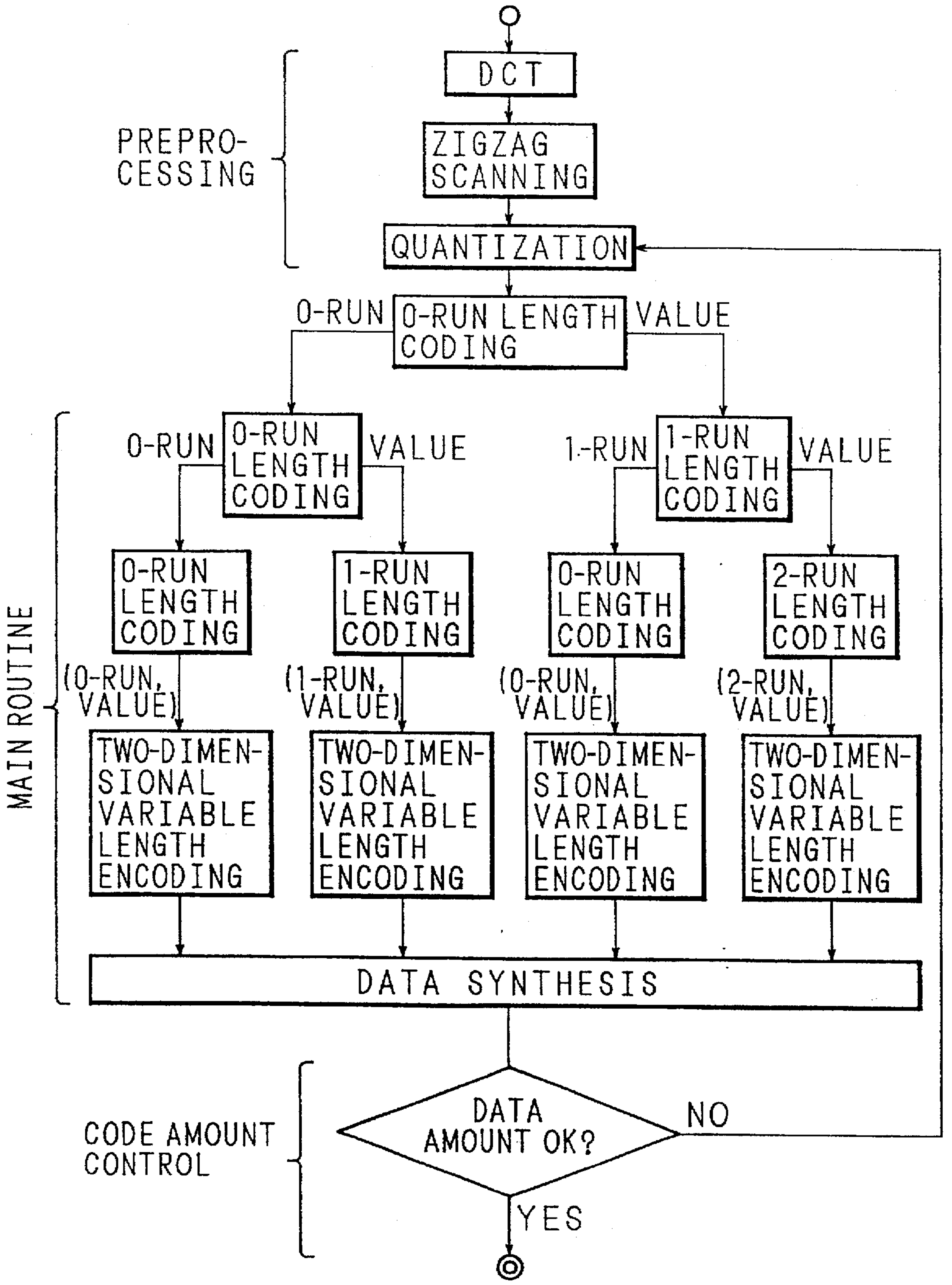
FIG. 24 is a drawing illustrative of the encoding algorithm in the second embodiment.

The result of computer simulation conducted with the algorithm shown in FIG. 24 will be described below. The conditions of the simulation are the same as those of the first embodiment. The simulation resulted in 28,794 events (the third RR0-run length coding), 25,500 events (the third RV1-run length coding), 20,096 events (the third VR0-run length coding) and 36,929 events (the third VV2-run length coding) for the respective cases. In the run-length coding with 1, +1 and −1 are not distinguished and instead the same number of sign bits as the number of +1 and −1 terms are added after encoding. Events of coefficient 2 are handled similarly by adding code bits.

FIG. 25 shows the array of the 0-run length data and coefficient data generated by the third RR0-run length coding. FIG. 26 shows the array of the 1-run length data and coefficient data generated by the third RV1-run length coding. FIG. 27 shows the array of the 0-run length data and coefficient data generated by the third VR0-run length coding. FIG. 28 shows the array of the 2-run length data and coefficient data generated by the third VV2-run length coding. In each drawing, coefficient data is arranged from left to right and run-length data of 0, 1 or 2 is arranged from top to bottom. The position where the coefficient data is 0 and the run-length data is 0 is the EOB. Also similarly to the prior art, the number of terms of the coefficient data is given by counting both positive and negative terms. For example, number of terms of coefficient 3 is given by adding the number of +3 and −3 terms. The simulation dealt with AC coefficients only, similarly to the prior art.

In the simulation, the amount of coded data for one frame of picture after the third RR0-run length coding is 125,158 bits, while 125,429 bits after the third RV1-run length coding, 99,898 bits after the third VR0-run length coding, and 207,095 bits after the third VV2-run length coding. This means that the total amount of codes data is 125,158+125,429+99,898+207,095+80,079+21,382=659,041 bits, decreasing to 93.1%.

Because the amount of coded data is reduced by using variable length coding which is a reversible process in the above operation as in the case of the first embodiment, it is possible to reduce the transmitted signals without any degradation of picture quality in contrast to the high-efficiency encoding apparatus of the prior art.

Now the operation of the high-efficiency encoding apparatus which employs such a run-length encoder will be described below with reference to FIG. 22. Similar to the first embodiment, the incoming digital video data is structured by the shuffling circuit 2 into DCT blocks each comprising 8 lines vertically and 8 pixels per line, then shuffled and DCT transformed in the DCT transformer 2. The transformed coefficients obtained through the DCT transformation are zig-zag scanned from the DCT transformer 2 and are output successively in order starting with the data in the low-frequency region where the power spectrum is concentrated. The output of the DCT transformer 2 is fed to the quantizer 3 where it is quantized.

The data division circuit 11 separates the zig-zag scanned data into 0-run length data and coefficient data. The 0-run length data and the coefficient data which have been separated in the data division circuit 11 are input to the data division circuit 12 and the data division circuit 13, respectively. The data division circuit 12 applies the second R0-run length coding to the incoming 0-run length data and outputs events of the second 0-run length data and coefficient data. Similarly, the coefficient data input to the data division circuit 13 is subjected to the second V1-run length coding so that events of 1-run length data and coefficient data are output.

The 0-run length data and the coefficient data which have been separated in the data division circuit 12 are input to the data division circuit 17 and the data division circuit 18, respectively. The data division circuit 17 applies the third RR0-run length coding to the incoming 0-run length data and outputs events of 0-run length data and coefficient data. Similarly, the data division circuit 18 applies the third RV1-run length coding to the incoming coefficient data thereby to output events of 1-run length data and coefficient data. Similarly, the 1-run length data and the coefficient data which have been separated in the data division circuit 13 are input to the data division circuit 19 and the data division circuit 20, respectively. The data division circuit 19 applies the third VR0-run length coding to the input 1-run length data and outputs events of the 0-run length data and coefficient data. Similarly, coefficient data input to the data division circuit 20 is subjected to the third VV2-run length coding to output events of 2-run length data and coefficient data.

The events of 0-run length data and coefficient data which have been separated in the data division circuit 17 are input to the variable length encoder 14 where they are subjected to variable length encoding according to predetermined table data. Similarly, the events of 1-run length data and coefficient data which have been separated in the data division circuit 18 are input to the variable length encoder 15, the events of 0-run length data and coefficient data which have been separated in the data division circuit 19 are input to the variable length encoder 21, and the events of 2-run length data and coefficient data which have been separated in the data division circuit 20 are input to the variable length encoder 22, where they are subjected to variable length encoding according to predetermined table data, respectively. The the variable length encoders 14, 15, 21, 22 are the same as that of the prior art shown in FIG. 6. In the second embodiment, the contents of the Huffman code in the encoding table **4*b* is different between the cases of the variable length encoders 14, 15, 21, 22**.

Outputs of the variable length encoders 14, 15, 21, 22 are fed to the data synthesis circuit 16. The data synthesis circuit 16 arranges the output data of the variable-length encoder 14, the output data of the variable-length encoder 15, the output data of the variable-length encoder 21, the output data of the variable-length encoder 22, +/− code data of one event of output data from the data division circuit 13, and +/− code data of two events of output data from the data division circuit 20 in a predetermined order, to thereby synthesize the data to be recorded in the unit of one DCT block.

Encoded data thus compressed is then fed to the buffer 5 which stores the encoded data temporarily, similar to the first embodiment. On the other hand, the rate control circuit 6 measures the amount of encoded data which has been stored in the buffer 5 up to that time, and accordingly sends a rate control variable K to the quantizer 3 so that the final amount of coded information becomes an appropriate value.

The high-efficiency encoding apparatus described above reduces the amount of recorded data from that of the conventional high-efficiency encoding apparatus by about 6% through a reversible process, similarly to the simulation described above. This makes it possible to improve the reproduced picture quality when this method is employed in storage media such as digital VTR without increasing the amount of recorded information, compared to a case of encoding by means of the conventional high-efficiency encoding apparatus. This means that the rate control variable K which is outputted from the rate control circuit 6 can be made less than that of the prior art to the extent corresponding to the reduction in the amount of encoded information, thereby improving the S/N ratio of the reproduced picture.

EMBODIMENT 3

Now the concept of the third embodiment will be described below. As mentioned in relation to the prior art, power spectrum of the video data is generally concentrated in the low frequency region. Consequently the 0-run length data and coefficient data which are separated in the data division circuit 11 have such characteristics as follows. Because relatively high proportion of the power spectrum is concentrated in the low frequency region as described above, the low frequency region includes less 0-run length terms which means a lower probability of consecutive 0's existing in the low frequency region. For the coefficient data, on the other hand, the high frequency region includes much runs of consecutive 1's which means a higher probability of consecutive 1's in the high frequency region.

As mentioned previously, when reducing the amount of encoded data by using a variable-length coding system such as the Huffman code, important parameters which determine the amount of coded data after variable-length coding are the array of the 0-run length data and the coefficient data, and the number of events of these kinds of data which are actually subjected to coding. Therefore, given a number of events, further reduction of the amount of information requires to efficiently rearrange the 0-run length data and coefficient data by using the characteristic of the data to be encoded. Now the third embodiment will be described below with reference to FIG. 17. FIG. 17 shows the distribution of data obtained through R0-run length coding as described above. Because a lot of data having 0-run length of value 0 is concentrated in the low frequency region, a lot of data having long 0-run lengths exists. Consequently, data is not excessively concentrated and the number of Huffman codes used in encoding increases. A simulation shows that 162 kinds of Huffman code are generated for the case of data array shown in FIG. 17.

In the third embodiment, when applying additional 0-run length coding to the run-length data by using the characteristic of the picture, the direction of scanning is reversed so that the high frequency region is scanned first proceeding to the lower frequency region. This causes an event having relatively long 0-run length located in the low frequency region to become the EOB. FIG. 29 shows the data array obtained in a simulation taking this fact into consideration. While the number of events has increased to 50,033 by the amount corresponding to the EOB (3,111 events), the array has higher concentration at the top left corner.

Figure 30:
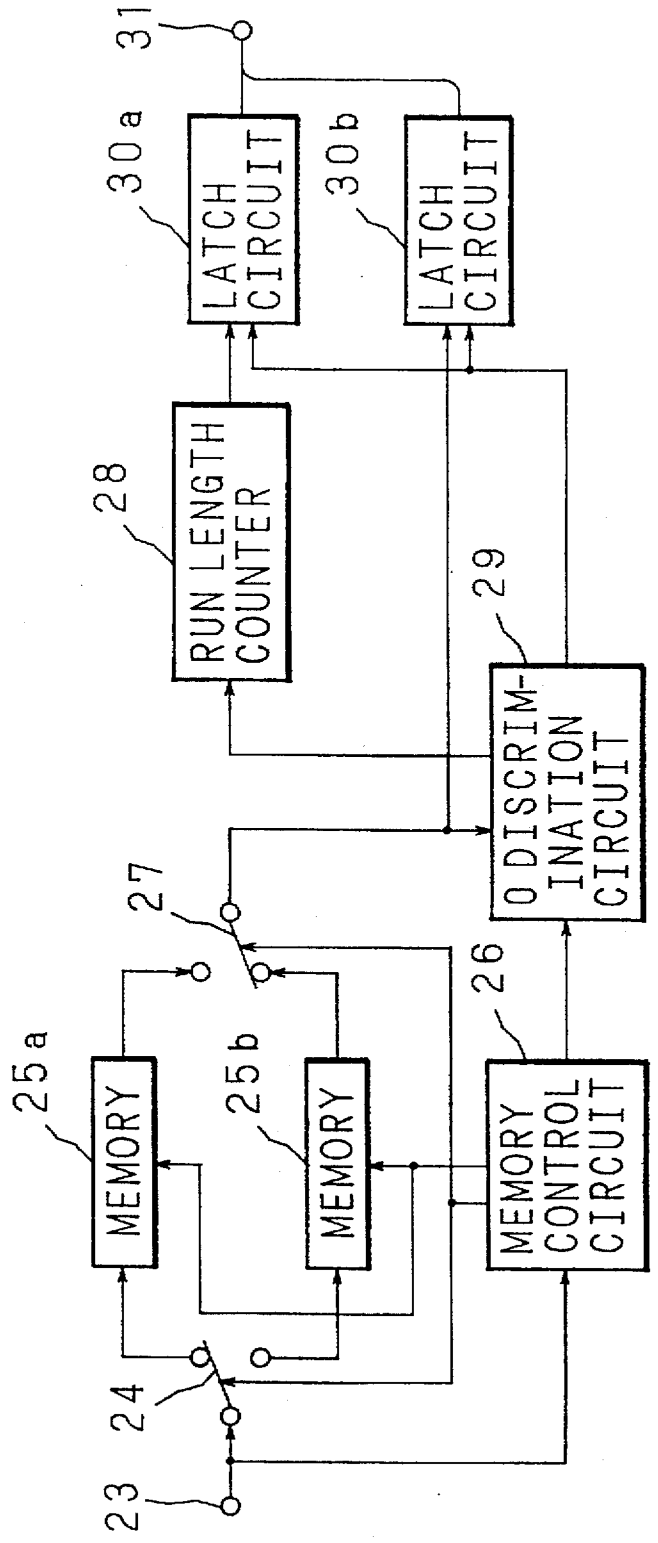
FIG. 30 is a block diagram illustrative of the data division circuit of the third embodiment.

However, the number of Huffman codes has decreased to 108 kinds. The amount of data after R0-run length coding of one frame has also decreased to 242,361 bits, which is 2,659 bits less than the case of the first embodiment. FIG. 30 shows a block diagram illustrative of the inner constitution of the data division circuit 12 in the third embodiment. The entire constitution of the third embodiment is similar to that of the first embodiment (FIG. 14). The data division circuit 12 comprises an input terminal 23 for the 0-run length data, memories **25*a*, 25*b*, a switch 24 to select the memory 25*a* or 25*b* to write data, a memory control circuit 26 to control the writing and reading of data to and from the memories 25*a*, 25*b*, a switch 27 to select the memory 25*a* or 25*b* to read data therefrom for output, a run length counter 28 to count the 0-run length, a 0- discrimination circuit 29 which determines whether the input data is 0 or not, latch circuits 30*a*, 30*b* and an output terminal 31**.

Now the operation will be described below. 0-run length data which is input through the input terminal 23 is supplied to the switch 24. The memory control circuit 26 makes the switches 24, 27 select the memories other than those currently selected, upon detection of the first data of the DCT block. The operation in the case where the switches are connected as shown in FIG. 30, for example, will be described below. In the memory **25*a*, incoming 0-run length data is written at the address which is output from the memory control circuit 26. In the memory 25*b*, on the other hand, 0-run length data is read from the address provided by the memory control circuit 26. At this time, the memory control circuit 26 generates the read addresses in an order opposite to that of the write addresses, thereby to switch the direction of scanning the 0-run length data. The data read from the memory 25*b* is inputted to the 0-discrimination circuit 29. The 0-discrimination circuit 29 outputs a count-up control signal to the run length counter 28 when the data is 0 and, in the case where the data is not 0, outputs latch pulses to latch circuits 30*a*, 30*b* and, at the same time, outputs a reset pulse to the run length counter 28. Outputs of the latch circuits 30*a*, 30*b* are supplied to the output terminal 31**.

The constitution described above enables it to reduce the R0-run length data by about 1% compared to the case of the first embodiment. The constitution also makes it easy to detect the end of the DCT block because the number of EOBs on the 0-run length data side increases.

EMBODIMENT 4

Figure 31:
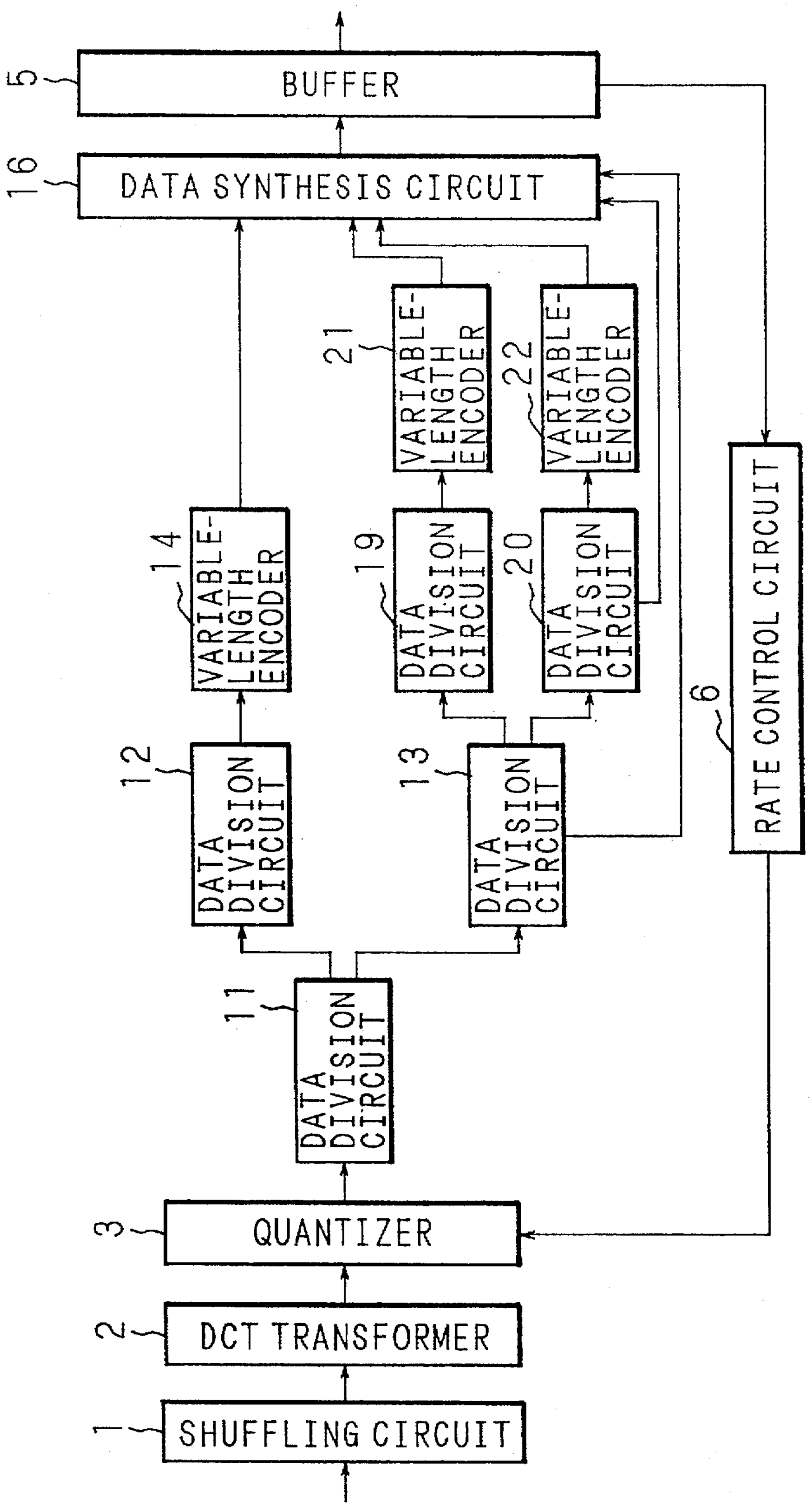
FIG. 31 is a block diagram illustrative of the high-efficiency encoding apparatus of the fourth embodiment of the invention.

FIG. 31 is a block diagram illustrative of the constitution of a high-efficiency encoding apparatus according to the fourth embodiment of the invention. In FIG. 31, components which are identical with those shown in FIG. 14 and FIG. 22 are denoted by the same numerals and the description thereof will be omitted. FIG. 32 shows a comparison of the amount of encoded data between the first embodiment and the second embodiment. The amount of encoded information which results when the coefficient data is subjected to the second V1-run length coding, then to the third VR0-run length coding and the third VV2-run length coding as shown in FIG. 32 is 408,454 bits (+/− code bits for coefficients 1 and 2 included), showing a reduction in the amount of encoded information, although further division of the result of the second R0-run length coding leads to a slight increase in the amount of encoded information.

Figure 33:
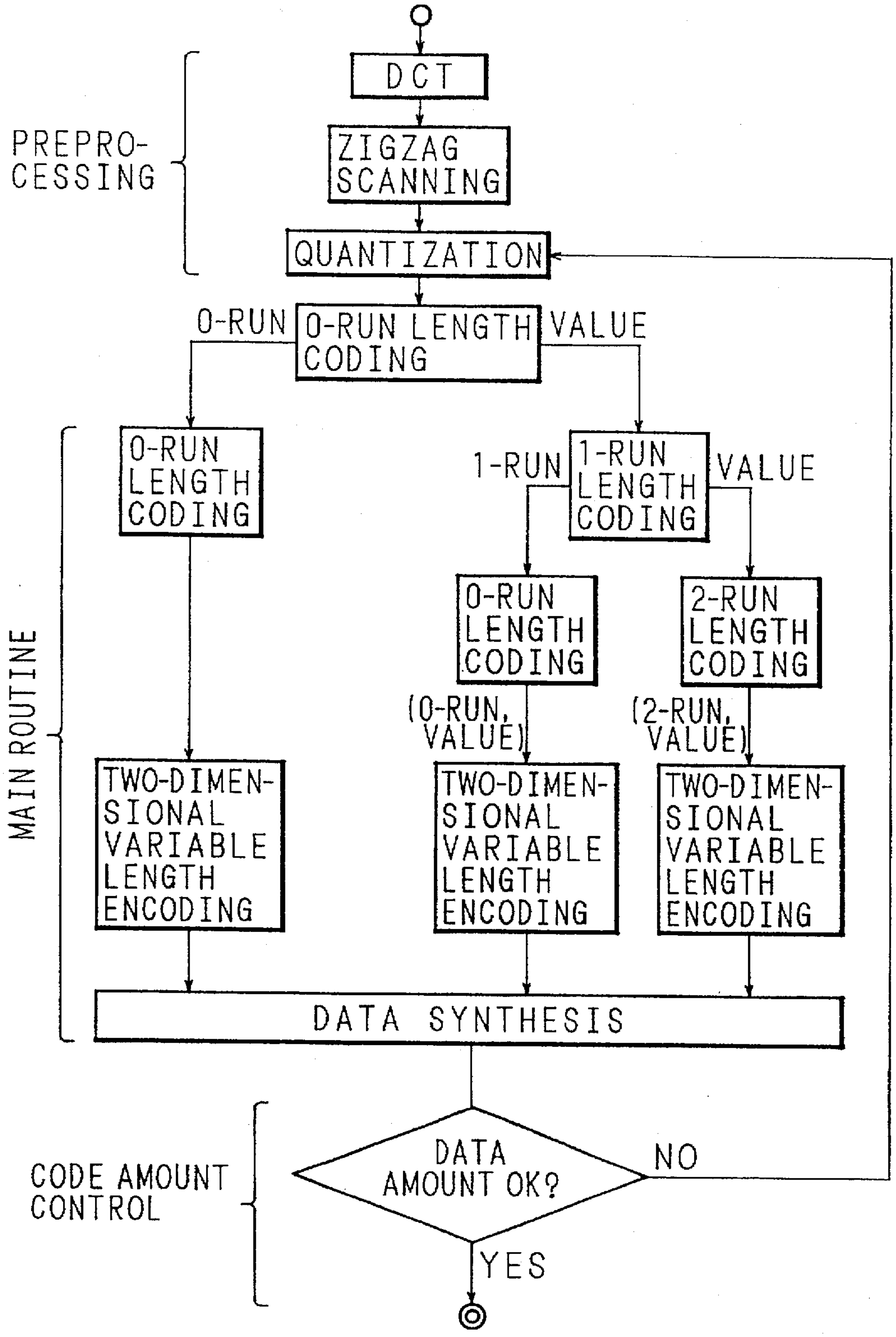
FIG. 33 is a drawing illustrative of the encoding algorithm in the fourth embodiment.

FIG. 33 shows the encoding algorithm of the fourth embodiment. The description that follows deals with a characteristic portion of the fourth embodiment. Incoming digital video data is DCT transformed, then zig-zag scanned to change the order of output and is quantized. The zig-zag scanned data is separated into 0-run length data and coefficient data, which are subjected again to the second R0-run length coding and V1-run length coding. The result of the second R0-run length coding is directly subjected to Huffman encoding. The data resulting from the second V1-run length coding is separated into 1-run length data and coefficient data, while the 1-run length data is subjected to run length coding with value 0 which has a very high rate of occurrence and the coefficient data is subjected to run length coding with value 2 which has a very high rate of occurrence, and is then Huffman-encoded. Such an algorithm efficiently reduces the amount of encoded information compared to the prior art.

EMBODIMENT 5

Figure 34:
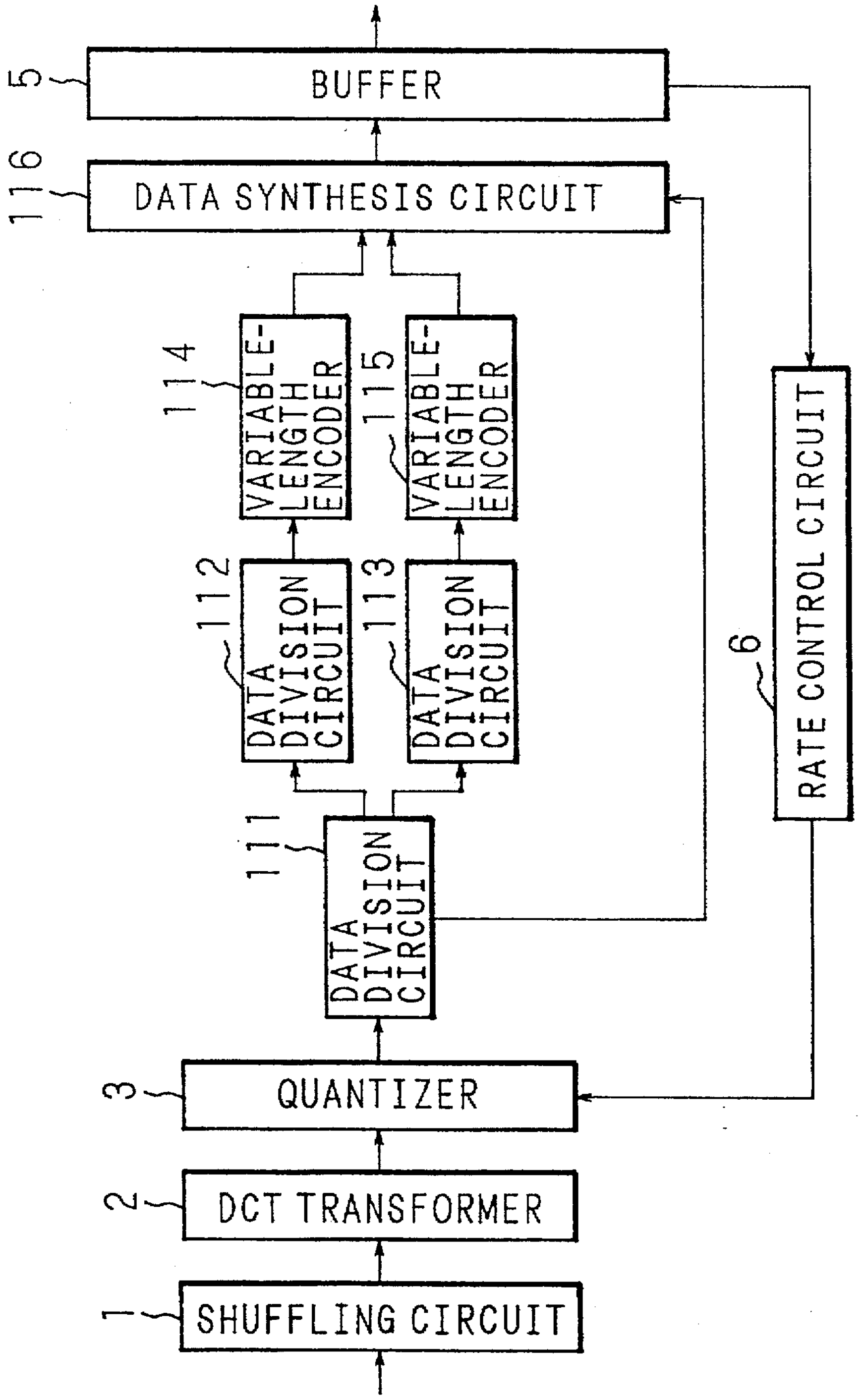
FIG. 34 is a block diagram illustrative of the high-efficiency encoding apparatus of the fifth embodiment of the invention.

FIG. 34 is a block diagram illustrative of the constitution of the high-efficiency encoding apparatus according to the fifth embodiment of the invention. The constitution of the fifth embodiment is basically the same as that of the first embodiment (FIG. 14), although it employs a kind of run length coding in the data division circuits different from that of the latter. In the first embodiment, output of the quantizer 3 is subjected to 0-run length coding in the data division circuit 11 to separate the data into 0-run length data and coefficient data, with the separated 0-run length data being further subjected to 0-run length coding in the data division circuit 12 to separate the data into events of the 0-run length data and coefficient data, while the separated coefficient data being subjected to 1-run length coding in the data division circuit 13 to separate the data into events of 1-run length data and coefficient data.

In the fifth embodiment, output of the quantizer 3 is subjected to run length coding with data 1 which has the second highest probability of occurrence next to 0 (this coding operation will be called the first 1-run length coding hereafter) in a data division circuit 111 to separate the data into 1-run length data and coefficient data. A data division circuit 112 applies run length coding with data 0 which has the highest probability of occurrence (this coding operation will be called the second R0-run length coding hereafter) to the separated 1-run length data to make events of 0-run length data and coefficient data. A data division circuit 113 applies run length coding with data 0 which has the highest probability of occurrence (this coding operation will be called the second V0-run length coding hereafter) to the separated coefficient data to make events of 0-run length data and coefficient data.

Outputs of variable-length encoders 114, 115 and +/− code data of one piece of data from the data division circuit 111 are synthesized in a data synthesis circuit 116. Other operations in the fifth embodiment are basically the same as those of the first embodiment, and therefore the description thereof will be omitted.

Figure 35:
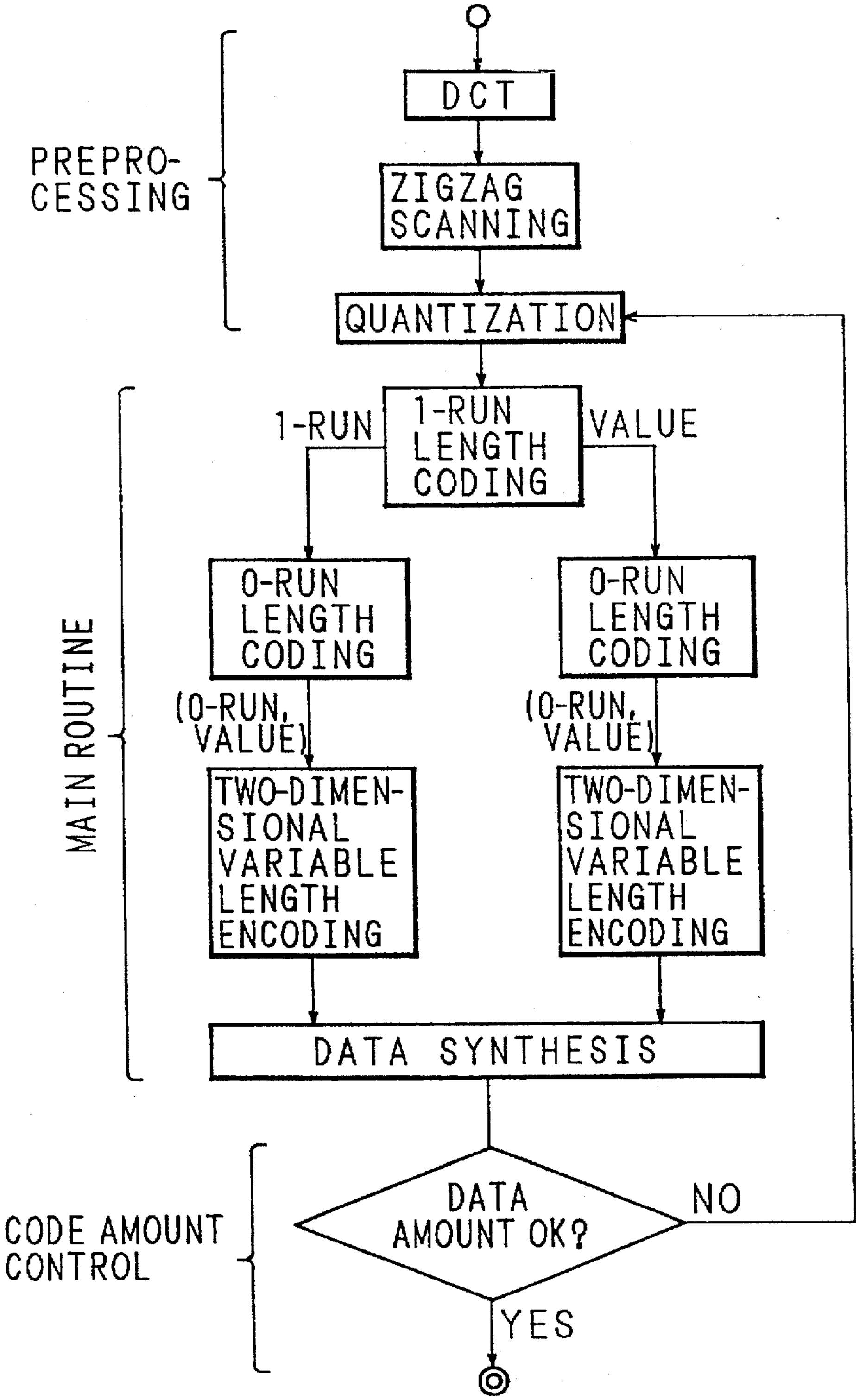
FIG. 35 is a drawing illustrative of the encoding algorithm in the fifth embodiment.

In the fifth embodiment, the amount of encoded information is reduced during variable length coding in a reversible process by reducing the number of events and changing the data array to be Huffman-coded, when applying the Huffman coding. FIG. 35 shows the encoding algorithm employed in the fifth embodiment. FIG. 36A shows an example of the data of one DCT block, FIG. 36B, C show examples of output from the data division circuit 111, FIG. 36D shows an example of output from the data division circuit 112, and FIG. 36E shows an example of output from the data division circuit 113.

In the fifth embodiment, reduction in the amount of encoded information of recorded data after encoding in a reversible process by about 3.2% is made possible when compared to the high-efficiency encoding apparatus of the prior art. The encoding method of the fifth embodiment will be called the 1-run, 0-run run-length encoding method hereafter.

EMBODIMENT 6

The sixth embodiment of the invention will be described below. The high-efficiency encoding apparatus of the sixth embodiment is an application of the third embodiment to the fifth embodiment. Because the power spectrum of the video data is concentrated in the low frequency region, data of value 0 is concentrated in the low frequency region of the 1-run length data separated in the data division circuit 111 in the sixth embodiment. Therefore, in the sixth embodiment, when applying 0-run length coding to the 1-run length data, the direction of scanning is reversed so that the high frequency region is scanned first proceeding to the lower frequency region, as in the case of the third embodiment. The constitution of the data division circuit 112 in the sixth embodiment is the same as the data division circuit 12 (FIG. 30) of the third embodiment, and the operation and effects thereof are also the same as those of the third embodiment, and the description thereof will be omitted.

EMBODIMENT 7

Figure 37:
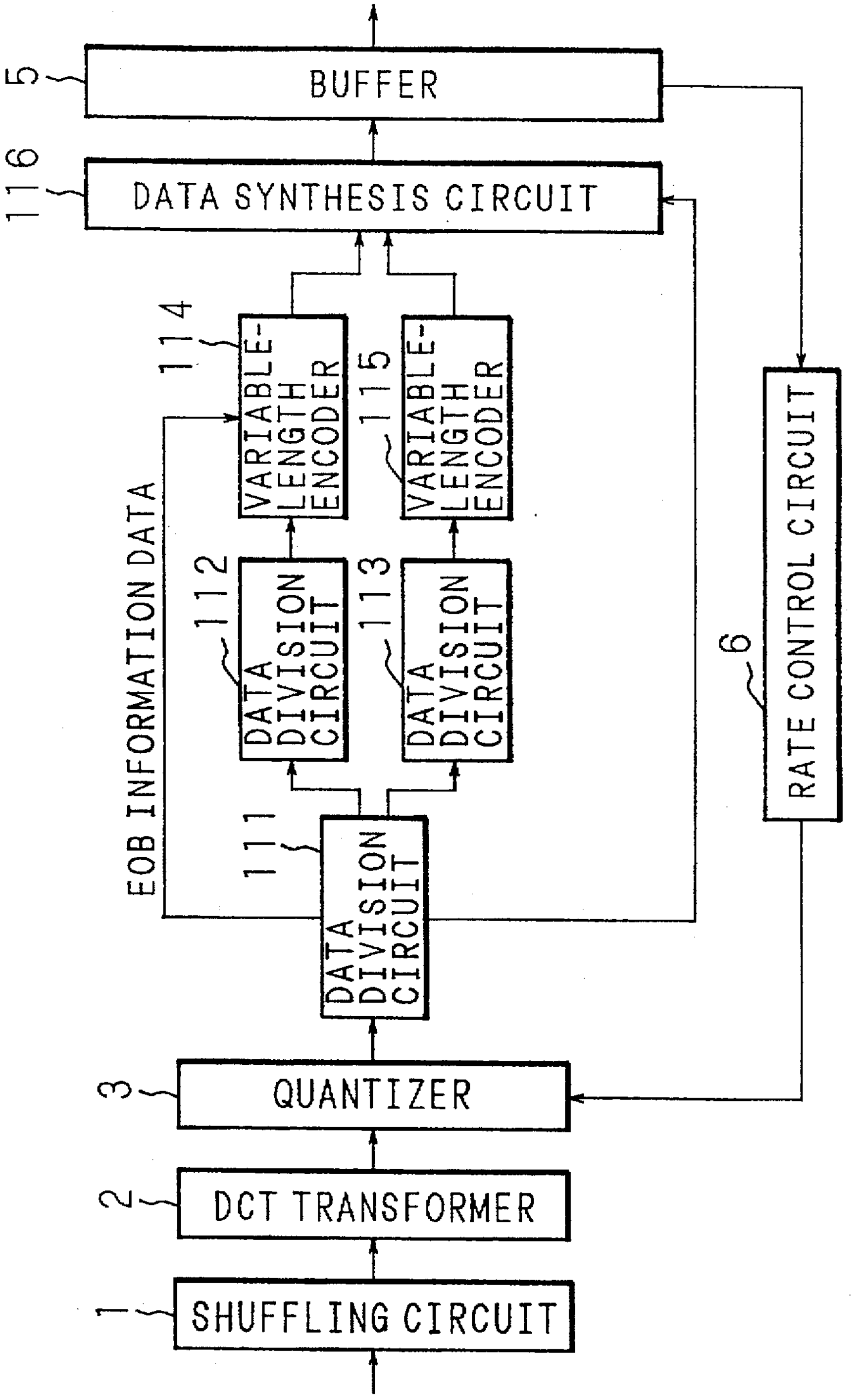
FIG. 37 is a block diagram illustrative of the high-efficiency encoding apparatus of the seventh embodiment of the invention.

FIG. 37 is a block diagram illustrative of the constitution of the high-efficiency encoding apparatus according to the seventh embodiment of the invention. In FIG. 37, components which are identical with those shown in FIG. 34 are denoted by the same numerals and description thereof will be omitted. In the fifth embodiment, in the case where the EOB is followed by consecutive terms of 1 in the data obtained by the first 1-run length coding, it is necessary to transmit the run length of the 1's in order to restore all data included in one DCT block by decoding the encoded data, when applying the second R0-run length coding and the second V0-run length coding after the first 1-run length coding. The seventh embodiment is an example indicating that, when encoding data in the fifth embodiment, the run length of the 1's is necessary for the restoration of all data included in one DCT block in the case where the EOB is followed by consecutive 1's in the data obtained by the first 1-run length coding.

FIG. 38 is a drawing illustrative of the concept of the seventh embodiment. FIG. 38A shows an example of data included in one DCT block. FIG. 38B shows events of 1-run length data and coefficient data separated by applying the first 1-run length coding to the data of FIG. 38A. The event (0, 1) in the drawing represents the EOB. FIG. 38C shows events of 0-run length data and coefficient data separated by applying the second R0-run length coding to the 1-run length data of FIG. 38B. The event (0, 0) in the drawing represents the EOB. FIG. 38D shows events of 0-run length data and coefficient data obtained by applying the second V0-run length coding to the coefficient data of FIG. 38B. The event (0, 0) in the drawing represents the EOB.

Figure 1:
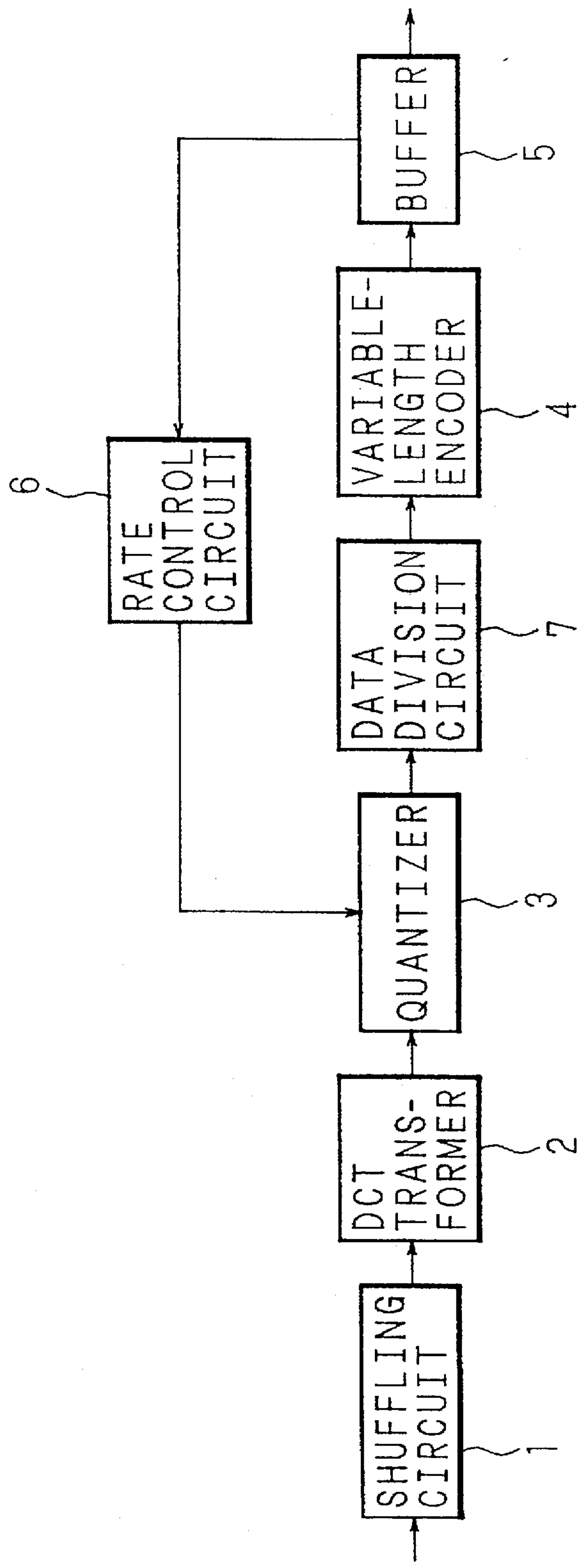
FIG. 1 is a block diagram illustrating a high-efficiency encoding apparatus of the prior art.
Figure 2:
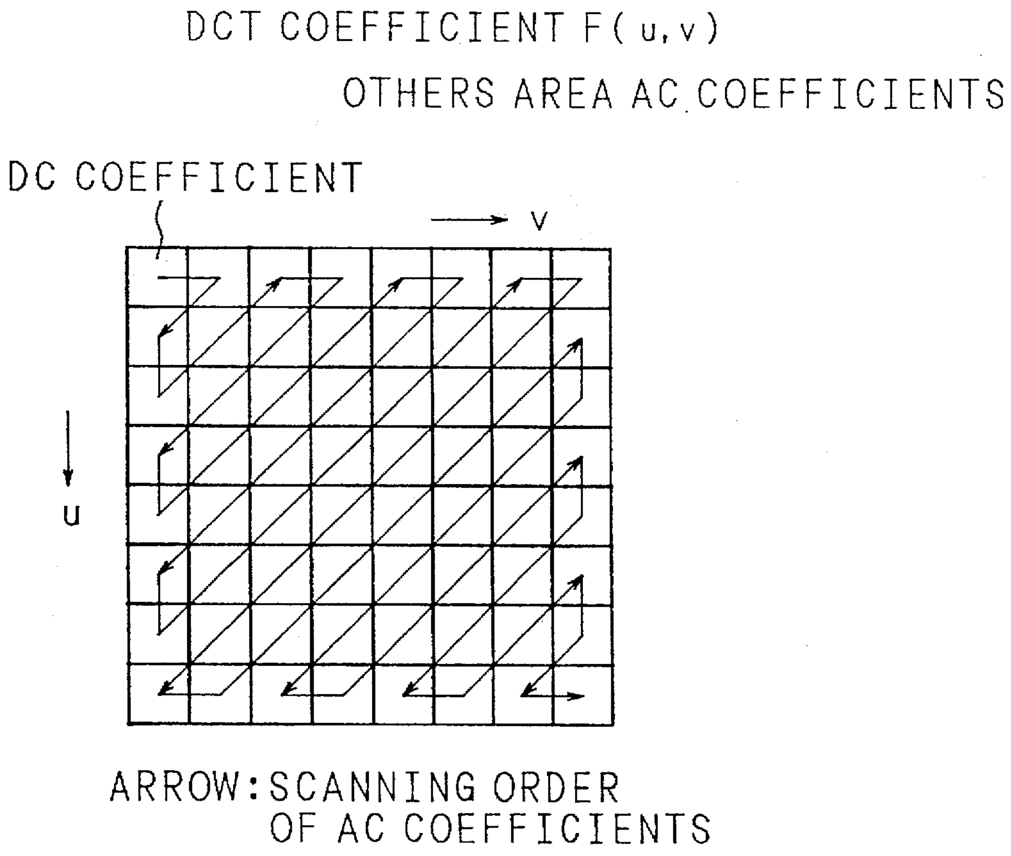
FIG. 2 is a drawing illustrating of the order of output of DCT coefficients.

Now the process of restoring FIG. 38A from the data separated into events of 0-run length data and coefficient data shown in FIG. 38C, D will be described below with reference to FIG. 39. FIG. 39A shows an intermediate process of restoring the events of 1-run length data and coefficient data which have been subjected to the first 1-run length coding as shown in FIG. 38B by expanding the events of 0-run length data and coefficient data shown in FIG. 38B starting with the first set. In FIG. 38C, 1-run length data generated by the first 1-run length coding is shown as expanded from the first event (6, 1) of 0-run length data and coefficient data to the event (2, 1) which precedes the EOB. The expansion results in a data string 0, 0, 0, . . . , 5, 0, 0, 1. On the other hand, coefficient data generated by the first 1-run length coding is shown in FIG. 38D as expanded from the first event (0, 5) of 0-run length data and coefficient data to the event (0, 2) which precedes the EOB. The expansion results in a data string 5, 3, 2, 3, . . . , 0, 2, 2. While each EOB is followed by 0's, the number of 0's is unknown because the information is not sent similarly to the property of EOB in general. However, expanded data comprises the 1-run length data and coefficient data obtained by 1-run length coding, and therefore there always exist the same number of coefficient data as the number of the 1-run length data before EOB. That is, when the coefficient data is shorter than the 1-run length data, there exist the same numbers of 1-run length data and coefficient data while the coefficient data in this case is 0. Specifically in this example, expanded coefficient data stream 5, 3, 2, 3, . . . , 0, 2, 2 is followed by the same number of coefficients 0 as the number of 1-run length data, thus to be expanded as 5, 3, 2, 3, . . . , 0, 2, 2, 0, 0, 0.

FIG. 39B shows the process of restoring the original DCT data by expanding the data from the first event of 1-run length data and coefficient data (0, 5) successively by using FIG. 39A. Restored data stream is 5, 3, 2, 3, 4, 2, . . . , 2, 0, 0, 1, 0. This is followed by the data 0 which has been omitted in the second V0-run length coding or data 1 which has been omitted in the first 1-run length coding. Starting at the last pixel in the sequence of the zig-zag scanning of one DCT block, there are the same number of 1's as the number of 1's which follow the EOB after the 1-run length coding, and the rest of pixels are 0.

This means that restoration of all data requires that the number of 1's which follow the EOB after the 1-run length coding be known. If it is known, the number of 0's that follow the EOB after the second V0-run length coding applied to the coefficients obtained by the first 1-run length coding can be determined. That is, it can be determined whether the DCT data of a portion not restored is 0's omitted in the second V0-run length coding or 1's omitted in the first 1-run length coding. In the example taken in this embodiment, the EOB generated in the first 1-run length coding is followed by six 1's. FIG. 39C shows all data of one DCT block, restored on the basis of the fact described above. There are nine data which are not restored, among which six data at the end of the block are 1's and the three that remain are 0's.

FIG. 40 is a drawing explanatory of the concept of the seventh embodiment. FIG. 40A shows an example of data included in one DCT block. FIG. 40B shows events of 1-run length data and coefficient data separated by applying the first 1-run length coding to the data shown in FIG. 40A. In the data of this example, the last data of one DCT block is 0 and the 1-run length coding does not produce any EOB. FIG. 40C shows events of 0-run length data and coefficient data separated by applying the second R0-run length coding to the 1-run length data shown in FIG. 40B. The event (0, 0) in the drawing represents EOB. FIG. 40D shows events of separated 0-run length data and coefficient data obtained by the second R0-run length coding of the 1-run length data of FIG. 40B. The event (0, 0) in the drawing represents EOB.

Now the process of restoring the data shown in FIG. 40A from the events of separated data of 0-run length data and coefficient data shown in FIG. 40C, D will be described below with reference to FIG. 41. FIG. 41A shows an intermediate process to restore the events of 1-run length data and coefficient data which have undergone the first 1-run length coding shown in FIG. 40B by expanding the events of 0-run length data and coefficient data shown in FIG. 40C, D starting with the first set. Data from the event (3, 1) of the first 0-run length data and coefficient data through the event (4, 1) which precedes the EOB is shown as expanded in FIG. 40C which is for the 1-run length data generated by the first 1-run length coding. The expansion results in a data stream of 0, 0, 0, 1, . . . , 0, 0, 0, 1. Data from the event (0, 3) of the first 0-run length data and coefficient data through the event (1, 2) which precedes the EOB is shown as expanded in FIG. 40D which is for the coefficient data generated by the first 1-run length coding. The expansion results in a data stream of 3, 5, 2, 4, . . . , 2, 0, 2. While each EOB is followed by a succession of 0's, the number of 0's is not known because it is not transmitted as information as in the case of general property of EOB. However, because the expanded data comprises the 1-run length data and coefficient data generated by the 1-run length coding, there always exist the same number of coefficients as the number of the 1-run length data preceding the EOB. This means that, when the coefficient data is shorter than the 1-run length data, the same number of coefficients as the number of terms of the 1-run length data exist, and the coefficient data at this time is 0. Specifically in this example, expanded coefficient data stream of 3, 5, 2, 4, . . . , 2, 0, 2 is followed by the same number of coefficients 0 as the number of 1-run length data, to be expanded as 5, 3, 2, 3, . . . , 2, 0, 2, 0, 0, 0, 0.

FIG. 41B shows the process of restoring the original DCT data by expanding the data from the event (0, 3) of the first 1-run length data and coefficient data successively by using FIG. 41A. Restored data stream is 3, 5, 2, 1, 4, 2, . . . , 2, 0, 0, 0, 0, 1. Values of the empty portion of the DCT block is determined as described below. Although the example of data shown in FIG. 38 and FIG. 39 includes a succession of 1's following the EOB generated during the first 1-run length coding and therefore it is necessary to distinguish whether it is data of value 0 which is omitted in the second V0-run length coding or data of value 1 which is omitted in the first 1-run length coding, no EOB results in the first 1-run length coding in the case of the example of data shown in FIG. 40 and FIG. 41, namely there is no data of value 1 following the EOB, and therefore all the values corresponding to the empty positions are 0's which are omitted in the second V0-run length coding. This means that, because the entire data is restored, information on the number of 1's following the EOB is not necessary when no EOB exists at the time of the first 1-run length coding, that is when the number of 1's following the EOB is 0.

The seventh embodiment is one that shows the conditions required to restore data in case of encoding in the fifth embodiment. In such cases as shown in FIG. 38 and FIG. 39 when EOB results from the first 1-run length coding, as described previously, restoration of the data is enabled by the number of 1's following the EOB generated in the first 1-run length coding and the EOB generated in the second R0-run length coding. As for the EOB generated in the second V0-run length coding, restoration is possible without adding it because it can be expressed by the number of 1's following the EOB generated in the first 1-run length coding and the EOB generated in the second R0-run length coding. In such cases as shown in FIG. 40 and FIG. 41 when no EOB results from the first 1-run length coding, restoration of the data is enabled by only the EOB generated in the second R0-run length coding.

Figure 42:
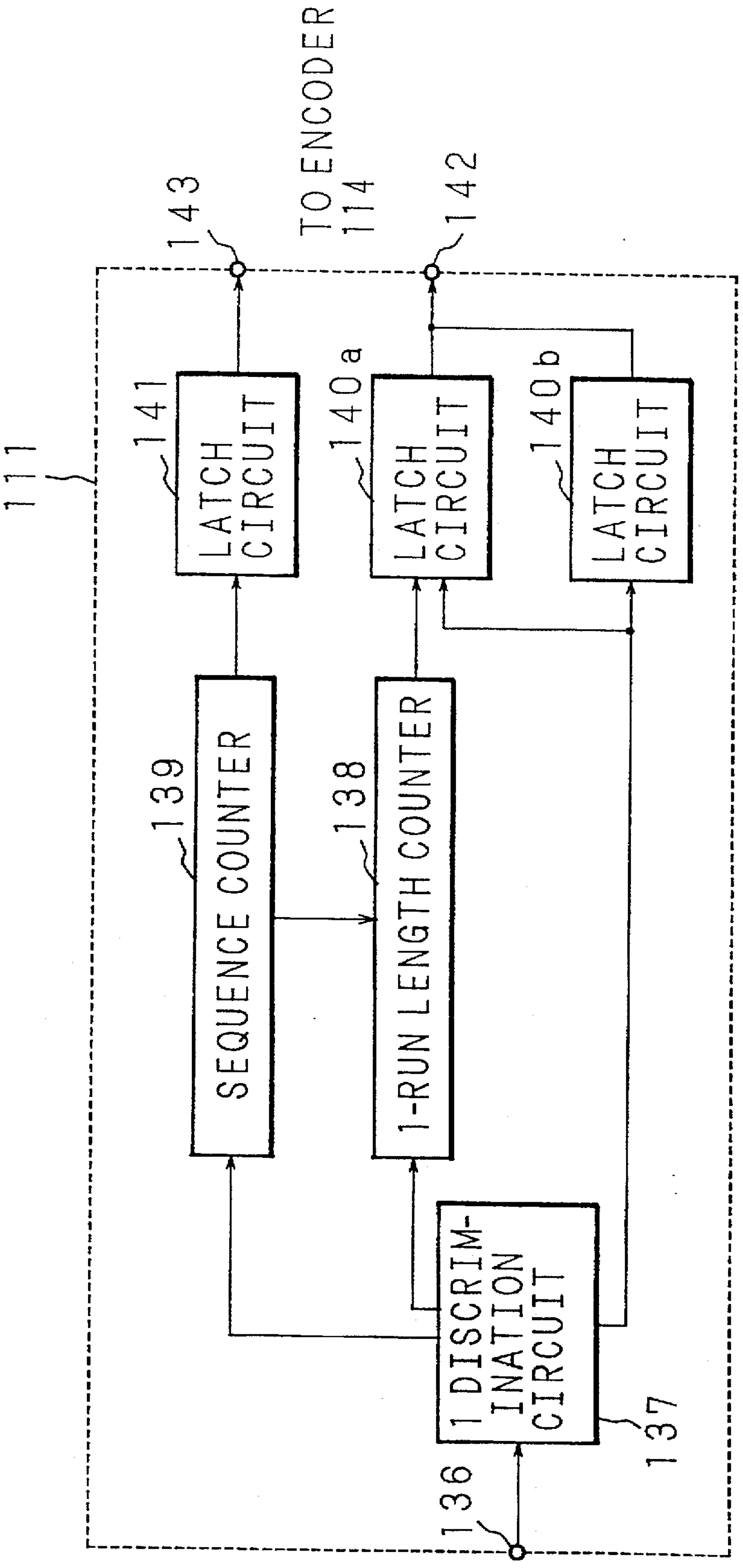
FIG. 42 is a block diagram illustrative of the data division circuit of FIG. 37.

FIG. 42 is a block diagram illustrative of the inner constitution of the data division circuit 111 in the seventh embodiment. In FIG. 42, numeral 136 denotes an input terminal for data which is quantized in the quantization circuit 3. Numeral 142 denotes an output terminal for data other than the EOB information, and 143 denotes an output terminal for the EOB information. The data division circuit 111 has a 1-discrimination circuit 137 which checks the input data to see whether it is 1 or not, a 1-run length counter 138 which counts the 1-run length, a sequence counter 139 which counts the number of input data, and latch circuits 140*a*, 140*b*, 141 which latch the input data.

Now the operation of the data division circuit 111 will be described below. Input data received at the input terminal 136 is sent to the 1-discrimination circuit 137. The 1-discrimination circuit 137 sends a count-up control signal to the 1-run length counter 138 when the input data is 1, or sends latch pulses to the latch circuits 140*a*, 140*b* and sends a reset pulse to the 1-run length counter 138 when the input data is not 1. Outputs of the latch circuits 140*a*, 140*b* are sent to the output terminal 142. The 1-discrimination circuit 137 also sends the count-up control signal to the sequence counter 139 every time input data is received. When the count of the number of input data in the sequence counter 139 reaches 64 sequences corresponding to the number of pixels in one DCT block, an EOB information pulse is sent to the 1-run length counter 138, a latch pulse is sent to the latch circuit 141, and reset pulses are sent to the 1-run length counter 138 and to the sequence counter 139. Output of the latch circuit 141 is sent to the output terminal 143 as the EOB information.

Values +1 and −1 are not distinguished during the first 1-run length coding. In order to specify whether the sign of the counted 1-run length is positive or negative in the data division circuit 111, a +/− sign bit is sent to the data synthesis circuit 116. However, information on consecutive 1's following the EOB is sent separately as the EOB information. The EOB information to be sent consists of the number of 1's following the EOB during the first 1-run length coding and the sign bits representing whether the 1's following the EOB are positive or negative.

Basic operation of the high-efficiency encoding apparatus in this embodiment is the same as that of the fifth embodiment and therefore the description thereof will be omitted, and only the operation related to the flow of EOB information will be briefly described. The EOB information output from the data division circuit 111 is inputted to the variable-length encoder 114.

While the variable-length encoder 114 applies variable length encoding to the data which has undergone the second R0-run length coding in the data division circuit 112, it replaces the EOB generated by the second R0-run length coding with EOB' which is different from the EOB and encoded data of the number of 1's following the EOB generated by the first 1-run length coding, in the case where the EOB information is inputted from the data division circuit 111. That is, when the EOB information is inputted, the variable-length encoder 114 replaces the EOB with EOB'+(the number of 1's following the EOB generated by the first 1-run length coding). When the EOB information is not inputted from the data division circuit 111, the EOB generated by the second R0-run length coding is used as the EOB. Output of the variable-length encoder 114 is sent to the data synthesis circuit 116 to be synthesized with the output from the variable-length encoder 115.

Figure 43A:
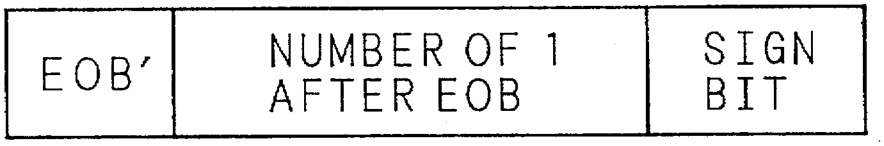
FIG. 43A, B are drawings illustrative of the method of adding EOB in the seventh embodiment.
Figure 43B:
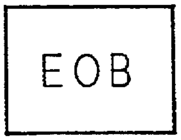

FIG. 43 is a drawing explanatory of the method of adding EOB in the seventh embodiment, showing the constitution of the EOB when the EOB information is inputted (FIG. 43A) and the constitution of the EOB when the EOB information is not input (FIG. 43B). The order of constitution is not limited to this scheme.

The number of 1's following the EOB generated by the first 1-run length coding may be either subjected to 1-dimensional Huffman encoding or left to remain as it is.

The seventh embodiment, with the constitution as described above, is capable of efficiently adding EOB and correctly restoring the data by means of the encoding procedure of the fifth embodiment.

EMBODIMENT 8

Figure 44:
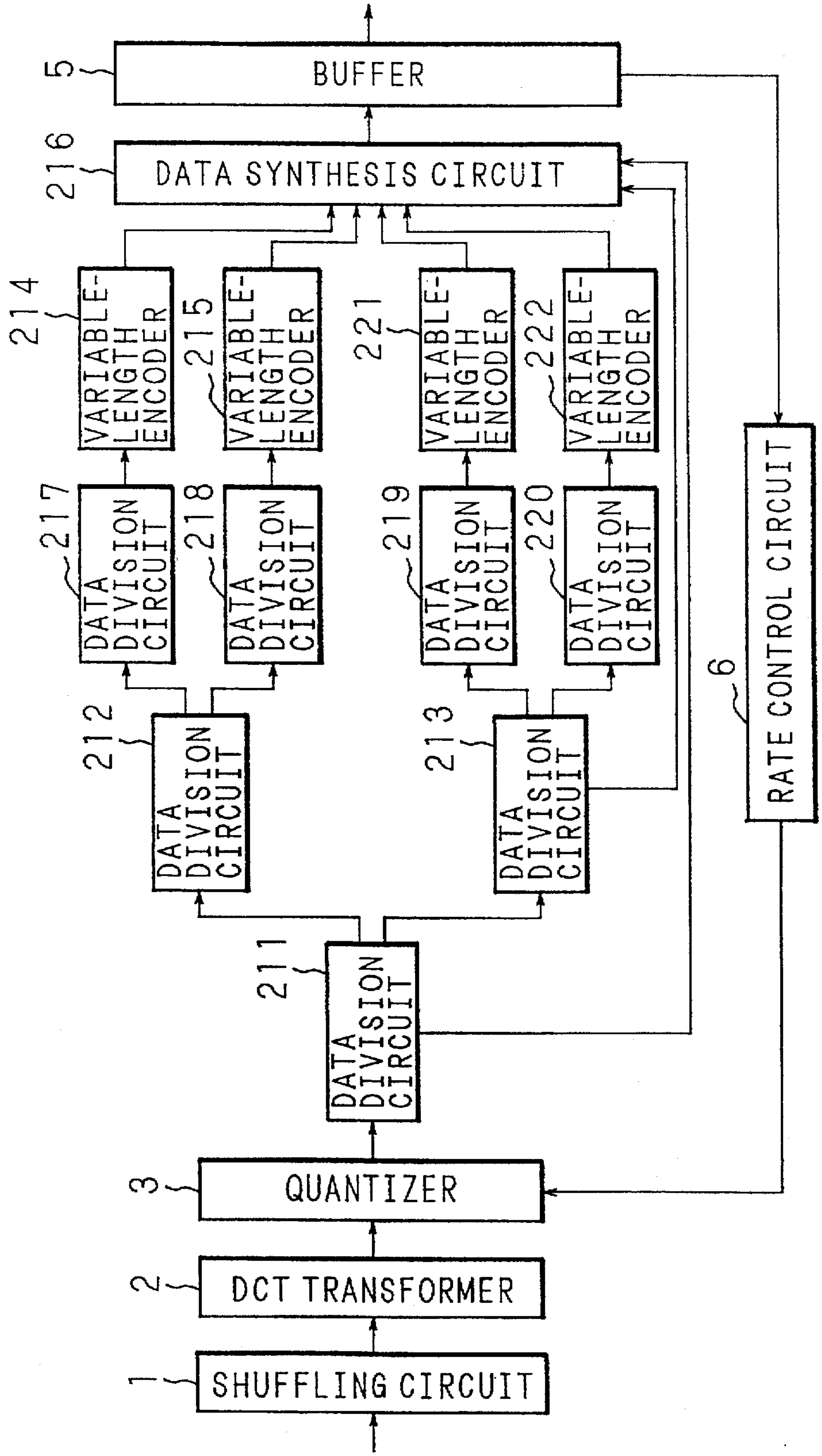
FIG. 44 is a block diagram illustrative of the constitution of the high-efficiency encoding apparatus of the eighth embodiment of the invention.

FIG. 44 is a block diagram illustrative of the constitution of the high-efficiency encoding apparatus according to the eighth embodiment of the invention. Although the constitution of the eighth embodiment is basically the same as that of the second embodiment (FIG. 22), a type of the run-length coding carried out in each data division circuit is different. In the second embodiment, output of the quantizer 3 is subjected to 0-run length coding in the data division circuit 11 to be separated into 0-run length data and coefficient data. The separated 0-run length data is further subjected to 0-run length coding in the data division circuit 12 to be separated into events of 0-run length data and coefficient data. The separated 0-run length data is further subjected to 0-run length coding in the data division circuit 17 to be separated into 0-run length data and coefficient data. The separated coefficient data is subjected to 1-run length coding in the data division circuit 18 to be converted into events of 1-run length data and coefficient data. On the other hand, the coefficient data separated in the data division circuit 11 is subjected to 1-run length coding in the data division circuit 13 to be separated into 1-run length data and coefficient data, while the separated 1-run length data is further subjected to 0-run length coding in the data division circuit 19 to be converted into events of 0-run length data and coefficient data. The separated coefficient data is subjected to 2-run length coding in the data division circuit 20 to be converted into events of 2-run length data and coefficient data.

In the eighth embodiment, output of the quantizer 3 is subjected to 2-run length coding (hereafter called the first 2-run length coding) with data 2 which has a high probability of occurrence in a data division circuit 211 to be separated into 2-run length data and coefficient data. Then data division circuits 212, 213 apply 1-run length coding with data 1 which has a high probability of occurrence to the separated 2-run length data and the coefficient data (hereafter called the second R1-run length coding and the second V1-run length coding, respectively) in order to convert them into events of 1-run length data and coefficient data. The 1-run length data separated in the data division circuit 212 is subjected to 0-run length coding (hereafter called the third RR0-run length coding) in a data division circuit 217 to be converted into 0-run length data and coefficient data. The coefficient data separated in the data division circuit 212 is subjected to 0-run length coding (hereafter called the third RV0-run length coding) in a data division circuit 218 to be converted into events of 0-run length data and coefficient data. The 1-run length data separated in the data division circuit 213 is subjected to 0-run length coding (hereafter called the third VR0-run length coding) in a data division circuit 219 to be converted into events of 0-run length data and coefficient data. The coefficient data separated in the data division circuit 213 is subjected to 0-run length coding (hereafter called the third VV0-run length coding) in a data division circuit 220 to be converted into events of 0-run length data and coefficient data.

Outputs of variable-length encoders 214, 215, 216, 217, +/− sign bits of two pieces of data from the data division circuit 211 and a +/− sign bit of one piece of data from the data division circuit 213 are synthesized in the data synthesis circuit 216. Other operations of the eighth embodiment are basically the same as those of the second embodiment, and therefore the description thereof will be omitted.

Figure 45:
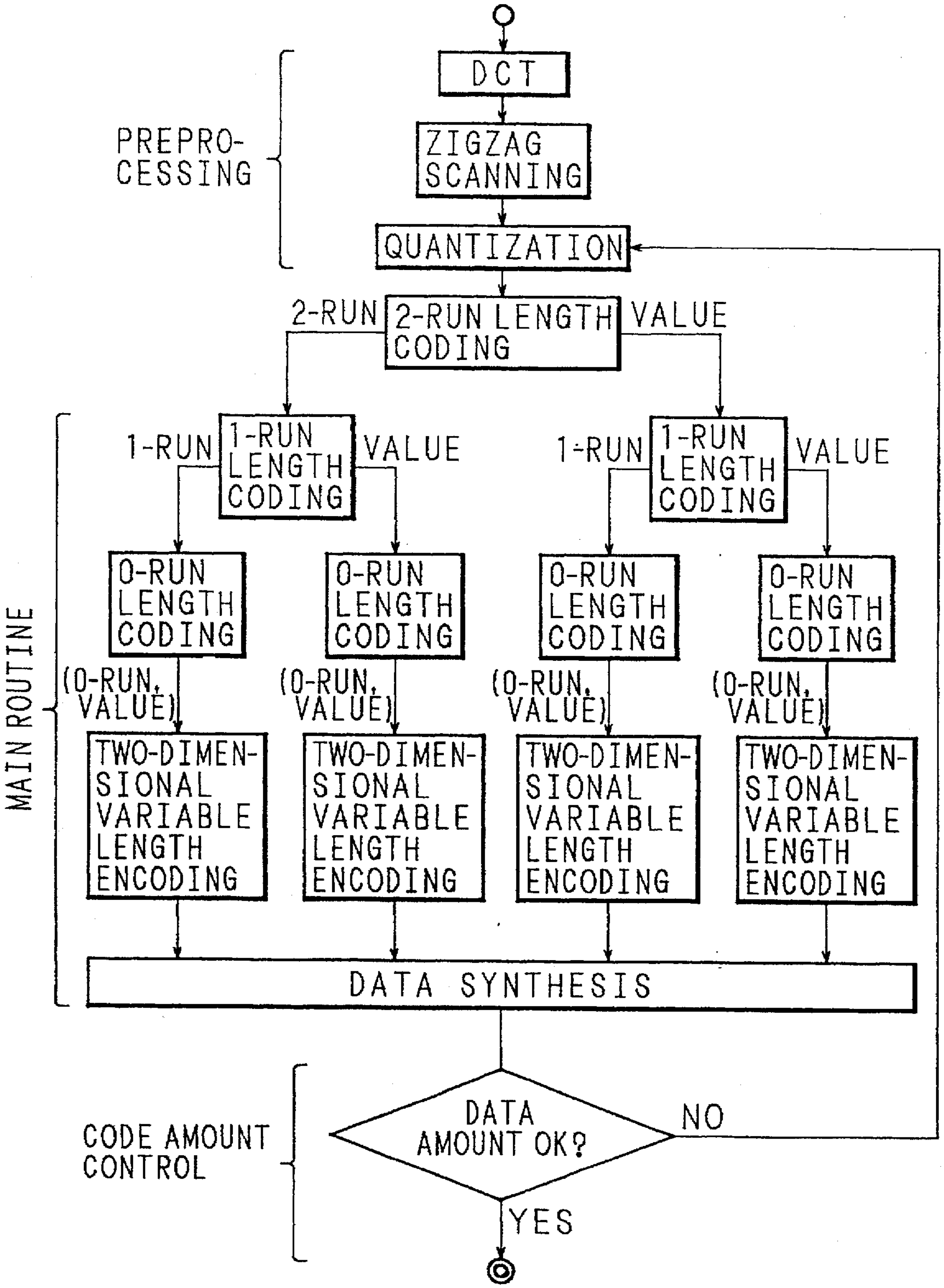
FIG. 45 is a drawing illustrative of the encoding algorithm in the eighth embodiment.

FIG. 45 shows the algorithm of encoding in the eighth embodiment. The eighth embodiment enables it to reduce the amount of data to be recorded after encoding in a reversible process by about 3.5% compared to the conventional high-efficiency encoding apparatus. Four different Huffman code tables are used in the eighth embodiment. The method of encoding in the eighth embodiment will be called the 2-run 1-run 0-run run-length 4-table encoding, hereafter.

EMBODIMENT 9

Figure 46:
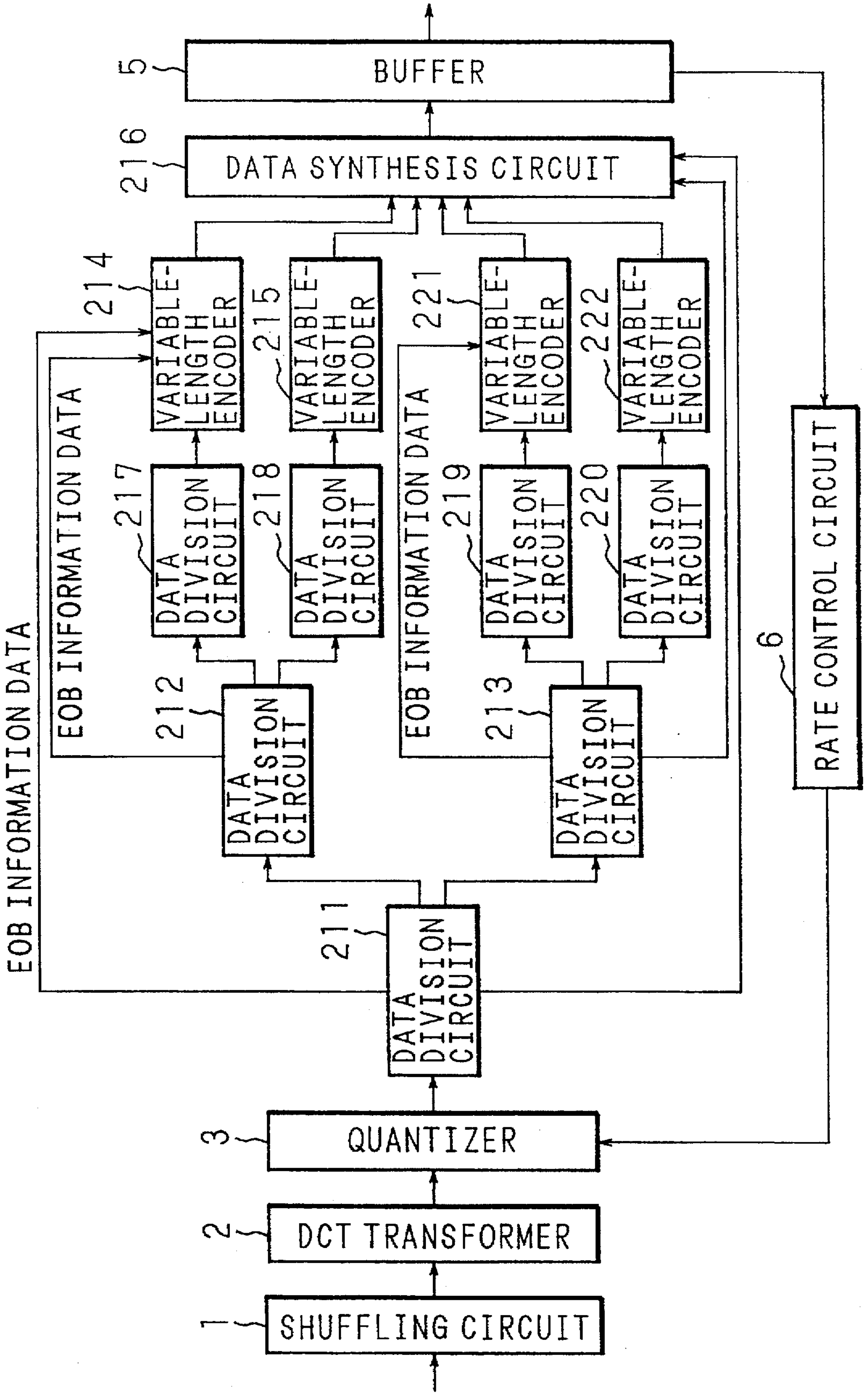
FIG. 46 is a block diagram illustrative of the high-efficiency encoding apparatus of the ninth embodiment of the invention.

FIG. 46 is a block diagram illustrative of the constitution of the high-efficiency encoding apparatus according to the ninth embodiment of the invention. In FIG. 46, components which are identical with those shown in FIG. 44 are denoted by the same numerals and the description thereof will be omitted.

As in the case of the fifth embodiment where the first 1-run length coding requires the number of 1's following the EOB as the information necessary to restore the data, restoration of data in the eighth embodiment also requires the number of 2's following the EOB when the EOB is generated in the first 2-run length coding, the number of 1's following the EOB when the EOB is generated in the second R1-run length coding and the number of 1's following the EOB when the EOB is generated in the second V1-run length coding, as the EOB information. The EOB information is not required when no EOB is generated.

Now the operation of the ninth embodiment will be described below. Basic operations such as encoding in this embodiment are the same as those of the eighth embodiment and therefore the detailed description thereof will be omitted, and the description will be centered around the operations related to the flow of EOB information.

In the data division circuit 211, EOB information is generated when the first 2-run length coding is applied. The EOB information indicates the number of 2's following the EOB and the +/− sign bit to distinguish whether a 2 following the EOB is +2 or −2. The EOB information generated in the data division circuit 211 is inputted to the variable-length encoder 214. In the data division circuit 212, EOB information is generated when the second R1-run length coding is applied. The EOB information indicates the number of 1's following the EOB and the +/− sign bit to distinguish +1 and −1. The EOB information generated in the data division circuit 212 is inputted to the variable-length encoder 214. Further in the data division circuit 213, EOB information is generated when the second V1-run length coding is applied. The EOB information indicates the number of 1's following the EOB and the +/− sign bit-to distinguish +1 and −1. The EOB information generated in the data division circuit 213 is input to a variable-length encoder 221.

The events of 0-run length data and coefficient data which are inputted to the variable-length encoders 214, 215, 221, 222 are subjected to the variable-length encoding according to the table data specified respectively, while the method of encoding the EOB aries depending on whether the EOB information exists or not as in the case of the seventh embodiment. The operations of the variable-length encoder 214 and the variable-length encoder 221 will be described below in the cases where the EOB information is inputted and where it is not inputted.

The variable-length encoder 214 applies the variable-length encoding to the data which has undergone the third RR0-run length coding in the data division circuit 217. While the EOB information is inputted from the data division circuit 211 and the data division circuit 212, the variable-length encoder 214 replaces the EOB generated during the third RR0-run length coding with a code different from the EOB, and converts it into the encoded number of 2's following the EOB generated during the first 2-run length coding and the encoded number of 1's following the EOB generated during the second R1-run length coding. The conversion is carried out in the following three cases.

First, in the case where the EOB information (EOB information generated during the first 2-run length coding) is inputted from the data division circuit 211 only and no EOB information (EOB information generated during the second R1-run length coding) is inputted from the data division circuit 212, the EOB generated during the third RR0-run length coding in the data division circuit 217 is converted into EOB' which is different from the EOB and the encoded number of 2's following the EOB generated during the first 2-run length coding. That is, when the EOB information is inputted from the data division circuit 211 only, the variable-length encoder 214 converts the EOB into EOB'+ (the number of 2's following the EOB generated during the first 2-run length coding).

When the EOB information is not inputted from the data division circuit 211 but is input from the data division circuit 212 only, the EOB generated during the third RR0-run length coding in the data division circuit 217 is converted into EOB" which is different from the EOB and the encoded number of 1's following the EOB generated during the second R1-run length coding. That is, when the EOB information is inputted from the data division circuit 212 only, the variable-length encoder 214 converts the EOB to EOB"+ (the number of 1's following the EOB generated during the second R1-run length coding).

Last, when the EOB information is inputted from both the data division circuit 211 and the data division circuit 212, the EOB generated during the third RR0-run length coding in the data division circuit 217 is converted into EOB'" which is different from the EOB, the encoded number of 2's following the EOB generated during the first 2-run length coding and the encoded number of 1's following the EOB generated during the second R1-run length coding. That is, when the EOB information is inputted from both the data division circuit 211 and the data division circuit 212, the variable-length encoder 214 converts the EOB to EOB'"+ (the number of 2's following the EOB generated by the first 2-run length coding)+(the number of 1's following the EOB generated during the second R1-run length coding).

The EOB" and the EOB'" have different codes from that of the EOB'.

On the other hand, when no EOB information is inputted from either the data division circuit 211 or the data division circuit 212, the EOB generated during the third RR0-run length coding in the data division circuit 217 is used as the EOB.

The variable-length encoder 221 applies the variable-length encoding to the data which has undergone the third VR0-run length coding in the data division circuit 219. When the EOB information is inputted from the-data division circuit 213, the variable-length encoder 221 converts the EOB generated during the third VR0-run length coding to a code different from the EOB and the encoded number of 1's following the EOB generated during the second V1-run length coding. The method of conversion will be described below.

In the case where the EOB information (EOB information generated during the second V1-run length coding) is inputted from the data division circuit 213, the EOB generated during the third VR0-run length coding in the data division circuit 219 is converted into EOB' which is different from the EOB and the encoded number of 1's following the EOB generated during the second V1-run length coding. That is, when the EOB information is input from the data division circuit 219, the variable-length encoder 221 converts the EOB into EOB'+(the number of 1's following the EOB generated during the second V1-run length coding). When the EOB information is not inputted from the data division circuit 213, the EOB generated during the third VR0-run length coding in the data division circuit 219 is used as the EOB.

During the first 2-run length coding, +2 and −2 are not distinguished. Therefore information on 2's following the EOB generated during the first 2-run length coding is transmitted by adding the same number of sign bits as the number of terms +2 and −2. Similarly during the second V1-run length coding, +1 and −2 are not distinguished. Therefore information on 1's following the EOB generated during the second V1-run length coding is transmitted by adding the same number of sign bits as the number of terms +1 and −1. For the second R1-run length coding, it is not necessary to distinguish +1 and −1 because the data on the 2-run length side (positive data) by the first 2-run length coding is subjected to the 1-run length coding.

Figures 47A, 47B, 47C, 47D:
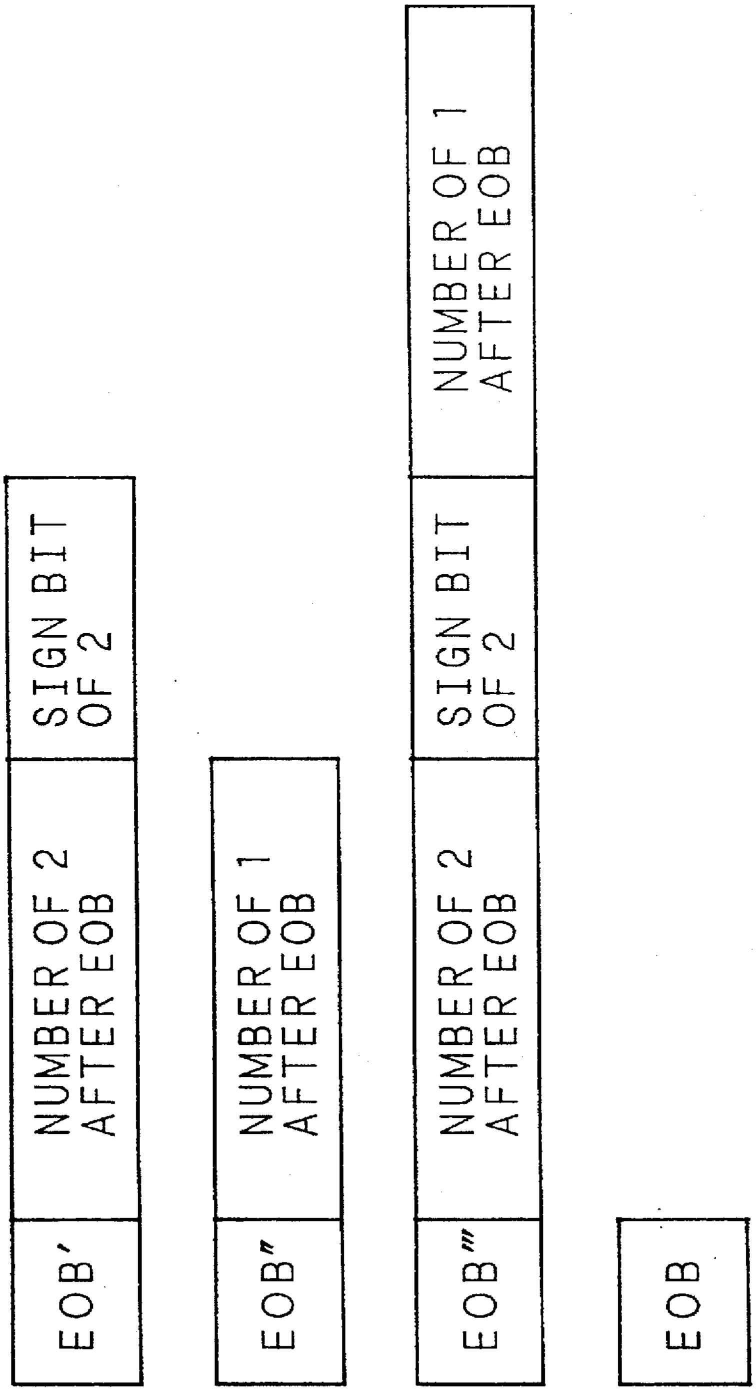
FIG. 47A, B, C, D are drawings illustrative of the method of adding EOB in the ninth embodiment.

FIG. 47 is a drawing explanatory of the method of adding EOB in the ninth embodiment, showing the constitution of the EOB encoded in the variable-length encoder 214 in three cases where the EOB information is inputted from the data division circuit 211 and/or the data division circuit 212, and in the case where the EOB information is not inputted at all. FIG. 47A shows the constitution of the EOB in case the EOB information is inputted only from the data division circuit 211. FIG. 47B shows the constitution of the EOB in case the EOB information is inputted only from the data division circuit 212. FIG. 47C shows the constitution of the EOB in case the EOB information is inputted from both the data division circuit 211 and the data division circuit 212. FIG. 47D shows the constitution of the EOB in the case where the EOB information is not inputted from the data division circuit 211 nor the data division circuit 212. The order of constitution is not limited to this scheme.

Figure 48A:
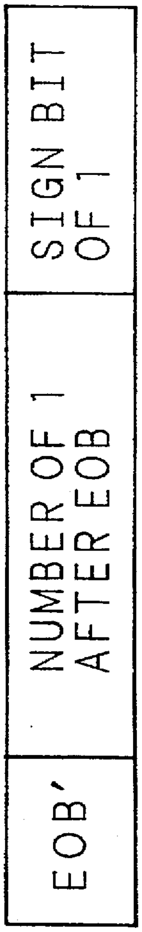
FIG. 48A, B are drawings illustrative of the method of adding EOB in the ninth embodiment.
Figure 48B:
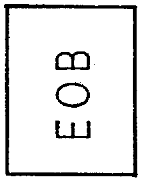

Similarly, FIG. 48 is a drawing explanatory of the method of adding EOB in the ninth embodiment, showing the constitution of the EOB encoded in the variable-length encoder 221 where the EOB information is inputted from the data division circuit 213. Specifically, FIG. 48A shows the constitution of the EOB in the case where the EOB information is inputted from the data division circuit 213, and FIG. 48B shows the constitution of the EOB in the case where the EOB information is not input from the data division circuit 213. The order of constitution is not limited to this scheme.

The number of 2's following the EOB of the first 2-run length coding, the number of 1's following the EOB of the second R1-run length coding, and the number of 1's following the EOB of the second V1-run length coding may be either encoded by the 1-dimensional Huffman coding or used as they are.

With the constitution described above, the ninth embodiment enables it to efficiently add the EOB for correct restoration of data, and reduce the amount of data to be recorded after encoding in a reversible process by about 3.5% compared to the conventional high-efficiency encoding apparatus, similarly to the simulation described above.

EMBODIMENT 10

Figure 49:
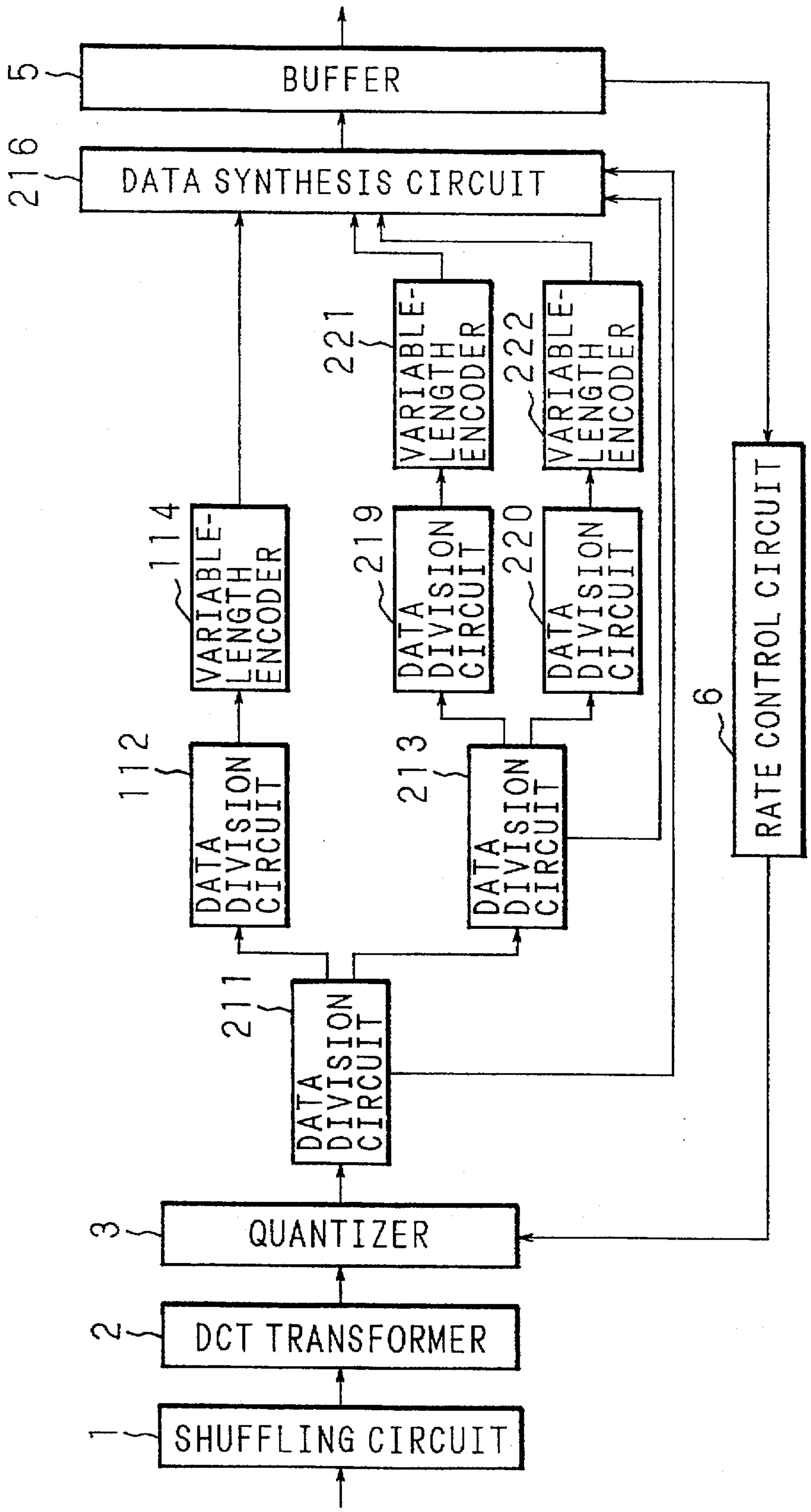
FIG. 49 is a block diagram illustrative of the constitution of the high-efficiency encoding apparatus of the tenth embodiment of the invention.
Figure 50:
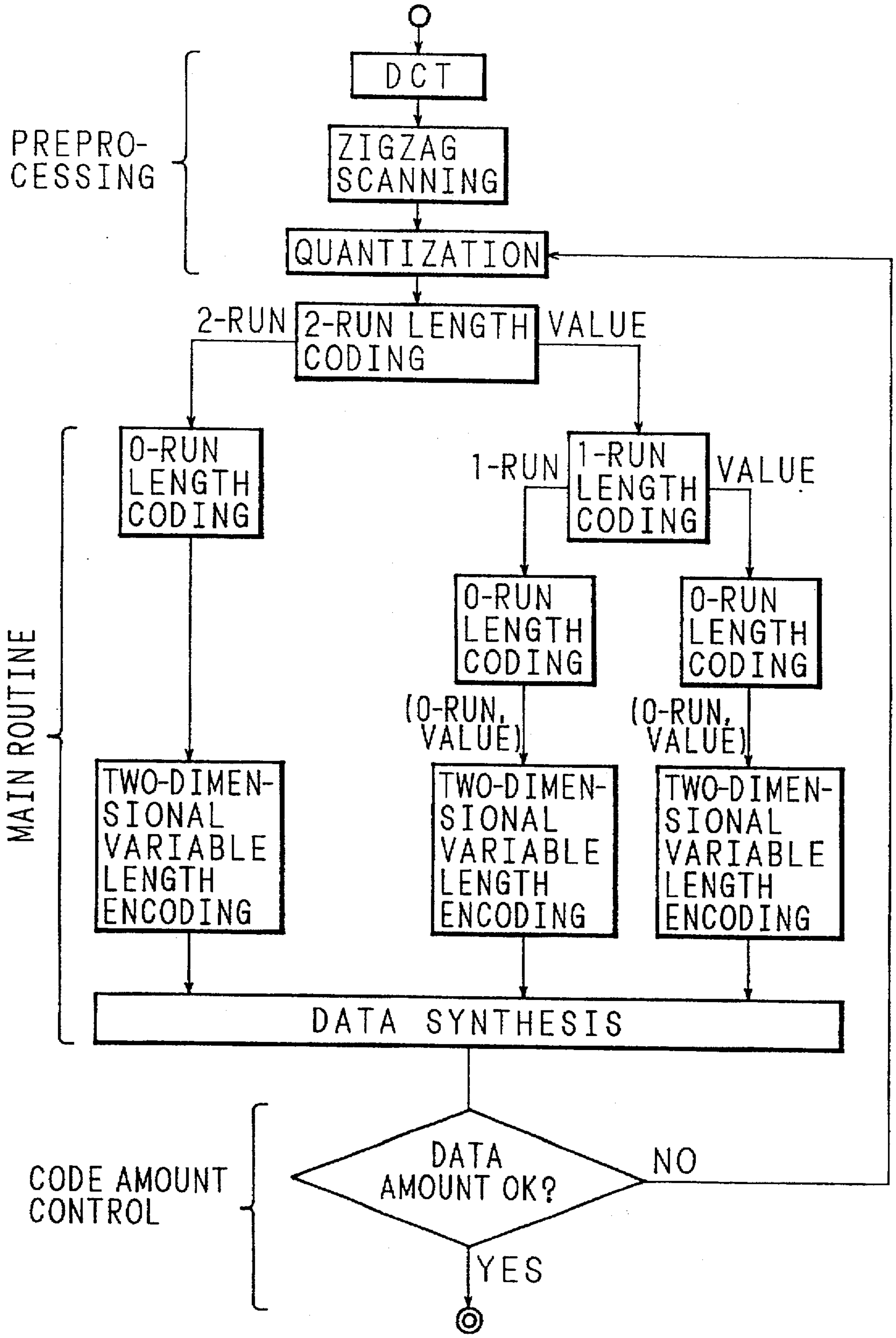
FIG. 50 is a drawing illustrative of the encoding algorithm in the tenth embodiment.

FIG. 49 is a block diagram illustrative of the constitution of the high-efficiency encoding apparatus according to the tenth embodiment of the invention. In FIG. 49, components which are identical with those shown in FIG. 34 and FIG. 45 are denoted by the same numerals and the description thereof will be omitted. The high-efficiency encoding apparatus of the tenth embodiment is an application of the principle described in the fourth embodiment, while the ninth embodiment is an application of the eighth embodiment. FIG. 50 shows the algorithm of encoding in the tenth embodiment. As will be understood by comparing the encoding algorithm with that of the eighth embodiment shown in FIG. 45, 2-run length data separated in the first 2-run length coding (the first 2-run length coding) is subjected to 0-run length coding (the second R0-run length coding) only once, thereby to convert it to events of 0-run length data and coefficient data. The coefficient data separated in the first 2-run length coding is subjected to the same processes (the second V1-run length coding, third VR0-run length coding and third VV0-run length coding) as those of the eighth embodiment.

The tenth embodiment enables it to reduce the amount of data to be recorded after encoding in a reversible process by about 3.6% compared to the conventional high-efficiency encoding apparatus. Three different Huffman code tables are used in the tenth embodiment. The method of encoding in the tenth embodiment will be called the 2-run 1-run 0-run run-length 3-table encoding, hereafter.

EMBODIMENT 11

Figure 51:
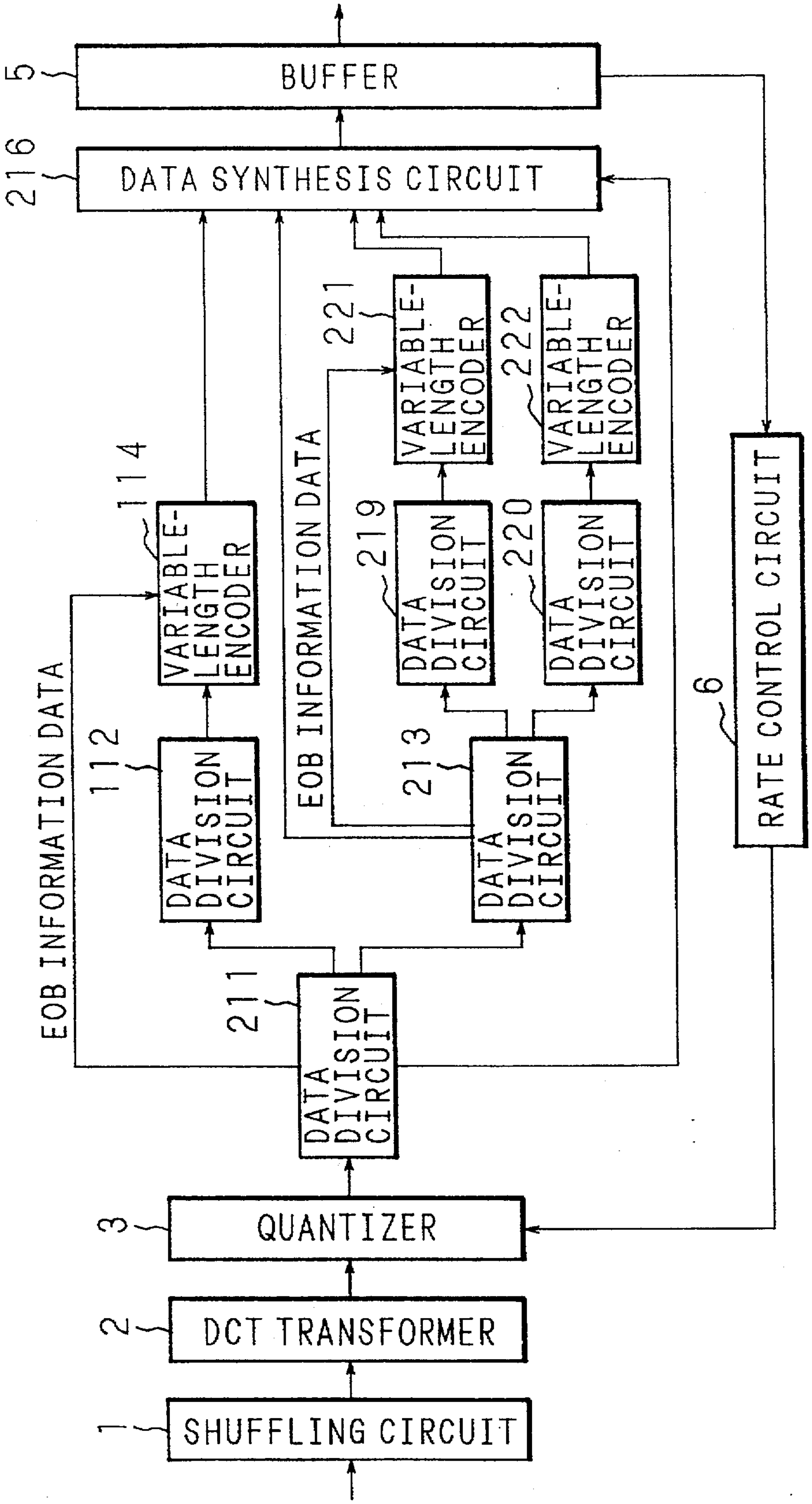
FIG. 51 is a block diagram illustrative of the constitution of the high-efficiency encoding apparatus of the eleventh embodiment of the invention.

FIG. 51 is a block diagram illustrative of the constitution of a high-efficiency encoding apparatus according to the eleventh embodiment of the invention. In FIG. 51, components which are identical with those shown in FIG. 49 are denoted by the same numerals and the description thereof will be omitted.

As in the case of the fifth embodiment, restoration of data in the tenth embodiment also requires the number of 2's following the EOB when the EOB is generated during the first 2-run length coding and the number of 1's following the EOB when the EOB is generated during the second V1-run length coding, as the EOB information. The EOB information is not required when no EOB is generated.

Now the operation of the eleventh embodiment will be described below. The basic operations such as encoding in this embodiment are the same as those of the tenth embodiment and therefore the detailed description thereof will be omitted, and the description will be centered around the operations related to the flow of EOB information.

In the data division circuit 211, EOB information is generated when the first 2-run length coding is applied. The EOB information indicates the number of 2's following the EOB and the +/− sign bit to distinguish whether a 2 following the EOB is +2 or −2, similarly to the ninth embodiment. The EOB information generated in the data division circuit 211 is input to the variable-length encoder 114. Further in the data division circuit 213, EOB information is generated when the second V1-run length coding is applied, and the EOB information indicates the number of 1's following the EOB and the +/− sign bit to distinguish +1 and −1. The EOB information generated in the data division circuit 213 is inputted to the variable-length encoder 221.

The events of 0-run length data and coefficient data which are inputted to the variable-length encoders 114, 221, 222 are subjected to the variable-length encoding according to the table data specified respectively, while the method of encoding the EOB varies depending on whether the EOB information exists or not, as in the case of the seventh and ninth embodiments. The operations of the variable-length encoder 114 and the variable-length encoder 221 will be described below in the cases where the EOB information is inputted and when it is not inputted.

The variable-length encoder 114 applies the variable-length encoding to the data which has undergone the second R0-run length coding in the data division circuit 112. When the EOB information is inputted from the data-division circuit 211, the variable-length encoder 114 converts the EOB generated during the second R0-run length coding into EOB' which is different from the EOB and the encoded number of 2's following the EOB generated during the first 2-run length coding. That is, when the EOB information is inputted from the data division circuit 211, the variable-length encoder 114 replaces the EOB with EOB'+(the number of 2's following the EOB generated by the first 2-run length coding). When no EOB information is inputted from the data division circuit 211, the EOB generated during the second R0-run length coding in the data division circuit 112 is used as the EOB.

On the other hand, the variable-length encoder 221 applies the variable-length encoding to the data which has undergone the third VR0-run length coding in the data division circuit 219. When the EOB information is inputted from the data division circuit 213, the variable-length encoder 221 converts the EOB generated during the third VR0-run length coding into EOB' which is different from the EOB and the encoded number of 1's following the EOB generated during the second V1-run length coding. That is, when the EOB information is inputted from the data division circuit 219, the variable-length encoder 221 converts the EOB into EOB'+(the number of 1's following the EOB generated during the second V1-run length coding). When no EOB information is inputted from the data division circuit 213, on the other hand, the EOB generated during the third VR0-run length coding in the data division circuit 219 is used as the EOB.

During the first 2-run length coding, +2 and −2 are not distinguished. Therefore information on 2's following the EOB generated during the first 2-run length coding is transmitted by adding the same number of sign bits as the number of terms +2 and−2. Similarly during the second V1-run length coding, +1 and −1 are not distinguished. Therefore information on 1's following the EOB generated during the second V1-run length coding is transmitted by adding the same number of code bits as the number of terms +1 and −1.

Figure 52A:
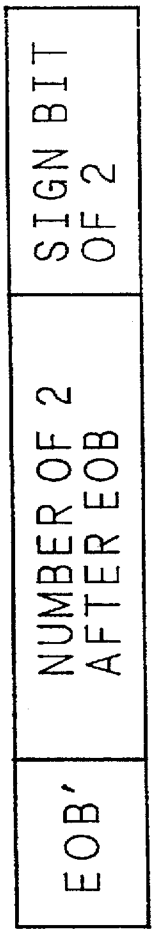
FIG. 52A, B are drawings illustrative of the method of adding EOB in the eleventh embodiment.
Figure 52B:
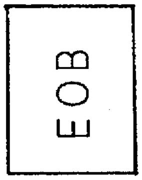
Figure 53A:
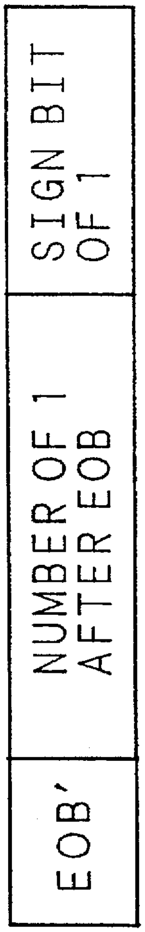
FIG. 53A, B are drawings illustrative of the method of adding EOB in the eleventh embodiment.
Figure 53B:
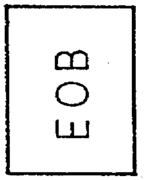

FIG. 52 and FIG. 53 are drawings explanatory of the method of adding EOB in the eleventh embodiment. FIG. 52A shows the constitution of the EOB when the EOB information is inputted from the data division circuit 211. FIG. 52B shows the constitution of the EOB when the EOB information is not input from the data division circuit 211. FIG. 53A shows the constitution of the EOB when the EOB information is inputted from the data division circuit 213. FIG. 53B shows the constitution of the EOB when the EOB information is not input from the data division circuit 213. The order of constitution is not limited to this scheme.

The number of 2's following the EOB of the first 2-run length coding, the number of 1's following the EOB of the second R1-run length coding, and the number of 1's following the EOB of the second V1-run length coding may either encoded by 1-dimensional Huffman coding or used as they are.

With the constitution described above, it is made possible to reduce the amount of data to be recorded after encoding in a reversible process by about 3.4% compared to the conventional high-efficiency encoding apparatus, similarly to the simulation described above.

EMBODIMENT 12

Figure 54:
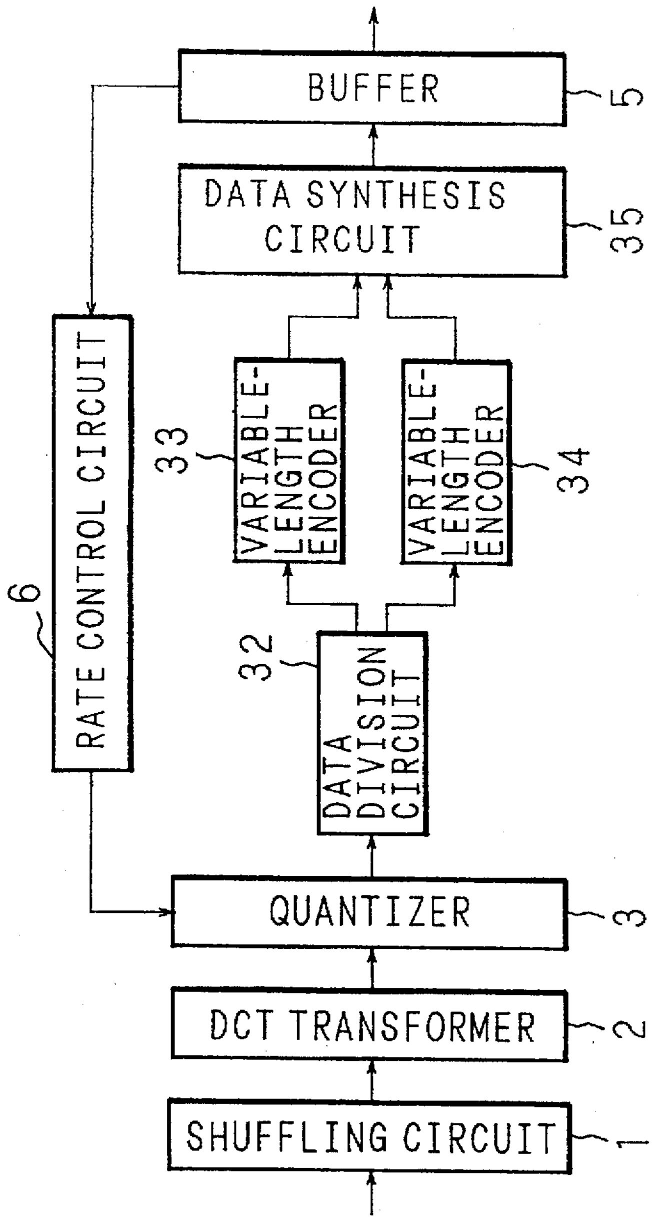
FIG. 54 is a block diagram illustrative of the high-efficiency encoding apparatus of the twelfth embodiment of the invention.

FIG. 54 is a block diagram illustrative of the constitution of the high-efficiency encoding apparatus according to the 12th embodiment of the invention. In FIG. 54, components which are identical with those of FIG. 14 are denoted with the same numerals and description thereof will be omitted. Numeral 32 denotes a data division circuit which separates the input data into 0-position data and coefficient data. Numeral 33 denotes a variable-length encoder which applies variable-length encoding to the 0-position data. Numeral 34 denotes a variable-length encoder which applies variable-length encoding to the coefficient data. Numeral 35 denotes a data synthesis circuit which synthesizes the output data of the variable-length encoders 33, 34.

In the 12th embodiment, similarly to the first embodiment, the amount of coded information is reduced during the variable-length encoding in a reversible process by both reducing the number of events of data and changing the array of data to be Huffman-encoded, at the time of applying the Huffman encoding. The algorithm of encoding in the 12th embodiment will be described below with reference to FIG. 55. Incoming digital video data is DCT-transformed, zig-zag scanned, and rearranged to change the order of output, then quantized. The order of applying quantization and zig-zag scanning may be reversed. The zig-zag scanned data is separated into 0-position data and coefficient data. The 0-position data is separated by measuring the run length of coefficients other than 0 existing between 0's in the DCT coefficient data which has been read by zig-zag scanning and quantized, in a procedure similar to the 0-run length coding of the prior art. Similarly, coefficient data is separated by discarding 0 values from the DCT coefficient data which has been read by zig-zag scanning and quantized.

The separating operation will be described below by using specific numerical values. FIG. 56A shows a data stream in one DCT block which has been read by zig-zag scanning. First, the 0-position data is separated from the data stream by measuring the run length of coefficients other than 0 existing between two 0's. The result of separation is shown in FIG. 56B. Similarly, coefficient data is separated by discarding 0 values from the data which has been read by zig-zag scanning. The result of the separation is shown in FIG. 56C.

Then the 0-position data separated in the above procedure is subjected to run-length coding with value 0 which has a very high frequency of occurrence among the separated data. Similarly the coefficient data separated in the above procedure is subjected to run-length coding with value 1 which has a very high frequency of occurrence. The data which has been subjected to run-length coding is Huffman-encoded by means of Huffman code table provided separately, then synthesized and outputted. Encoded data is measured to determine the amount of information and rate control variable K is outputted to the quantizer 3.

Figure 55:
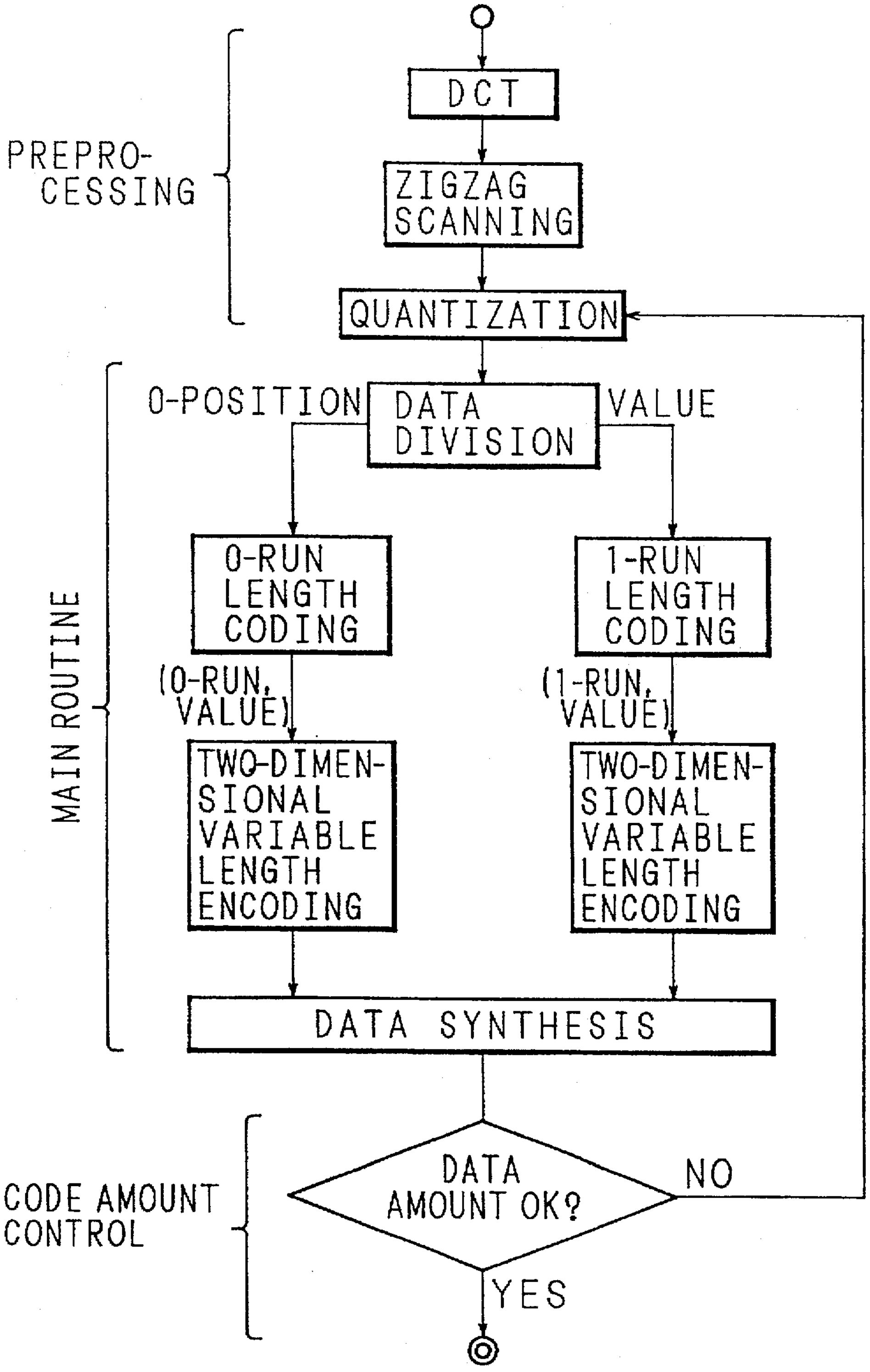
FIG. 55 is a drawing illustrative of the encoding algorithm in the twelfth embodiment.

Computer simulation by the algorithm shown in FIG. 55 showed a reduction of about 15% in the entire number of events compared to the prior art, resulting in reduction of the amount of data by about 2.5% in a reversible process. During run-length coding of the coefficient data with value 1, +1 or −1 are not distinguished while the data resulting from 1-run length coding and the same number of sign bits as the number of +1 and −1 values are transmitted. In this simulation, only the AC coefficients in the DCT blocks were handled.

In the operations described above, because the amount of encoded information is reduced by means of the variable-length encoding which is a reversible process, it is made possible to reduce the amount of transmitted information without any deterioration of the picture quality in comparison to the high-efficiency encoding apparatus of the prior art.

The operation of the high-efficiency encoding apparatus in the 12th embodiment will be described below with reference to FIG. 54. The operations of the shuffling circuit 1 to the quantizer 3 are the same as those in the first embodiment, and a description thereof will be omitted. Output of the quantizer 3 is inputted to the data division circuit 32. The data division circuit 32 separates the input data into the 0-position data and coefficient data in the procedure described above. The 0-position data separated in the data division circuit 32 is inputted to the variable-length encoder 33. The variable-length encoder 33 applies run-length coding with value 0 which has the highest frequency of occurrence to the incoming 0-position data, thereby reducing the total number of events. Then the result of the 0-run length coding is subjected to variable-length encoding by means of predetermined table data (2-dimensional Huffman encoding in this embodiment).

The variable-length encoder 34 similarly applies run-length coding with value 1 which has the highest frequency of occurrence to the incoming coefficient data, thereby reducing the total number of events. Then the result of the 1-run length coding is subjected to the variable-length encoding by means of predetermined table data. During 1-run length coding in this embodiment, +1 or −1 are not distinguished while the data resulting from 1-run length coding and the same number of sign bits as the number of +1 and −1 values are transmitted. The constitution of the part performing variable-length encoding of the variable-length encoders 33, 34 is the same as that of the prior art shown in FIG. 6. In the 12th embodiment, the content of the Huffman code of the encoding table **4*b* of the variable-length encoder 33 is different from that of the variable-length encoder 34**.

Figure 57:
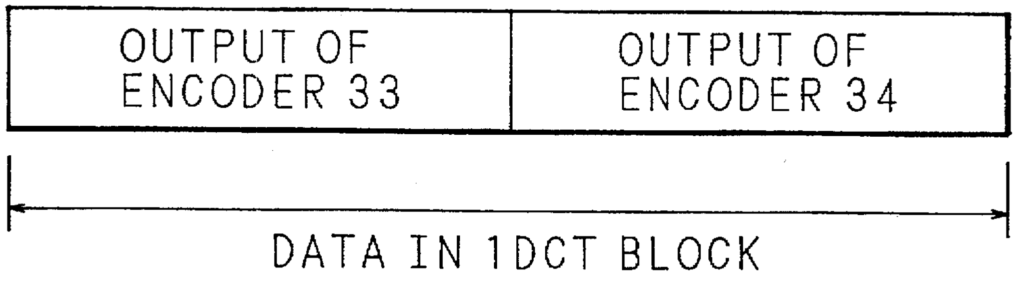
FIG. 57 is a drawing illustrative of the recording format for data to be recorded in one DCT block in the twelfth embodiment.

Outputs of the variable-length encoders 33, 34 are sent to the data synthesis circuit 35. The data synthesis circuit 35 synthesizes the output data of the variable-length encoder 33 and the output data including the sign bits of events 1 in the coefficient data which is inputted to the variable-length encoder 34, in the unit of DCT block. The order of synthesizing the data is not limited to that shown in FIG. 57. The operations of the buffer 5 and the rate control circuit 6 that follow are the same as those of the first embodiment, and a description thereof will be omitted.

The constitution described above enables it to reduce the amount of encoded information to be recorded by about 2.5% in a reversible process compared to the high-efficiency encoding apparatus of the prior art, as in the case of the simulation described above. This makes it possible, when this system is employed in the storage media such as digital VTR, to improve the picture quality without increasing the amount of encoded information to be recorded compared to the case of encoding by means of the high-efficiency encoding apparatus of the prior art. More specifically, the rate control variable K which is outputted from the rate control circuit 6 can be set to a smaller value than that of the prior art, corresponding to the reduction in the amount of encoded information, thereby making it possible to improve the S/N ratio of the decoded pictures.

EMBODIMENT 13

Figure 58:
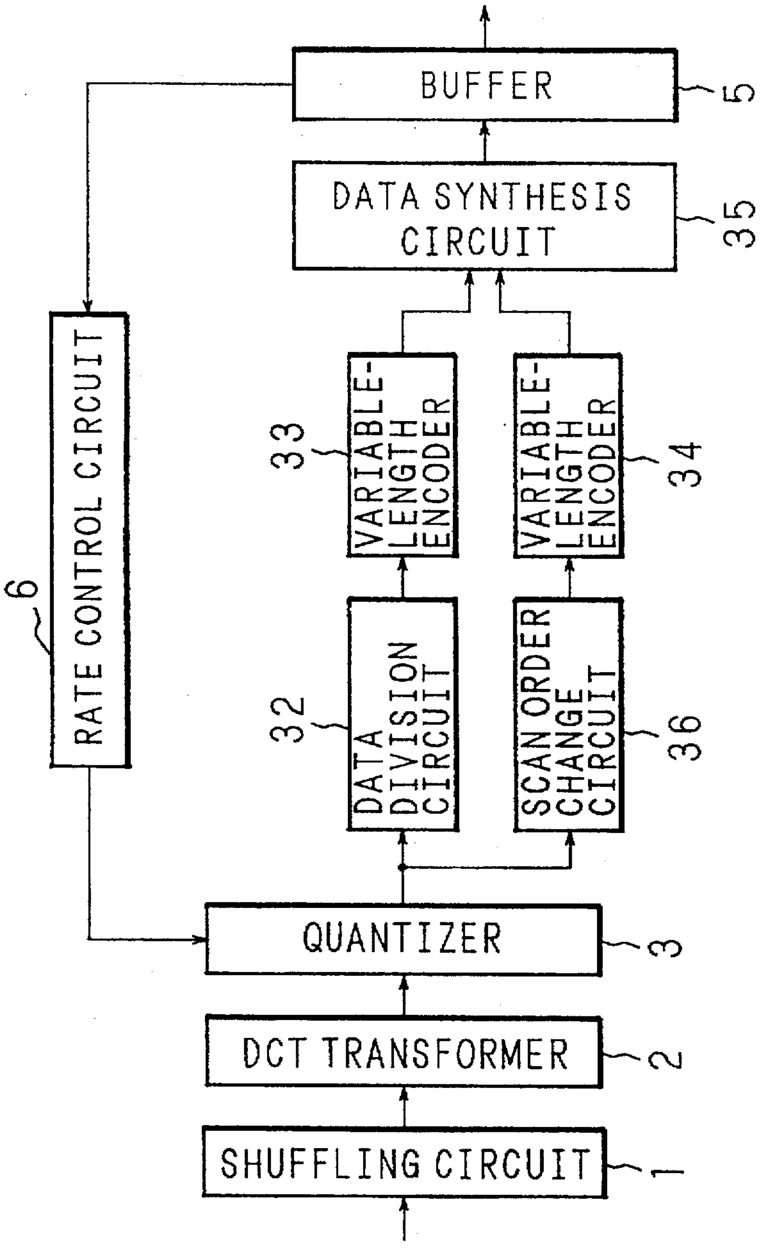
FIG. 58 is a block diagram illustrative of the high-efficiency encoding apparatus of the thirteenth embodiment of the invention.
Figure 59:
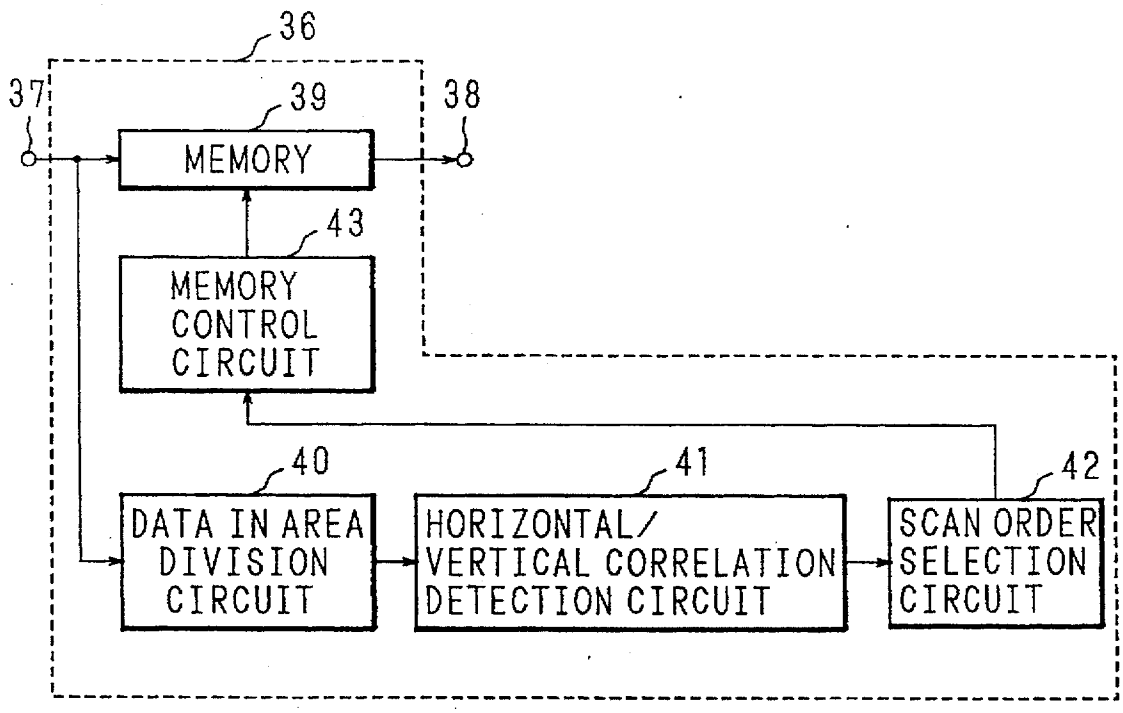
FIG. 59 is a block diagram illustrative of the scan order change circuit of FIG. 58.

FIG. 58 is a block diagram illustrative of the high-efficiency encoding apparatus in the 13th embodiment of the invention. In FIG. 58, the same numerals as in the 12th embodiment (FIG. 54) denote identical components. Numeral 36 denotes a scan order change circuit which changes the scanning order. FIG. 59 is a block diagram illustrative of the inner constitution of the scan order change circuit 36 shown in FIG. 58. In FIG. 59, numeral 37 denotes an input terminal, numeral 38 denotes an output terminal. The scan order change circuit 36 comprises a memory 39, an data in-area division circuit 40, a horizontal/vertical correlation detection circuit 41, a scan order selection circuit 42 and a memory control circuit 43.

Figure 60:
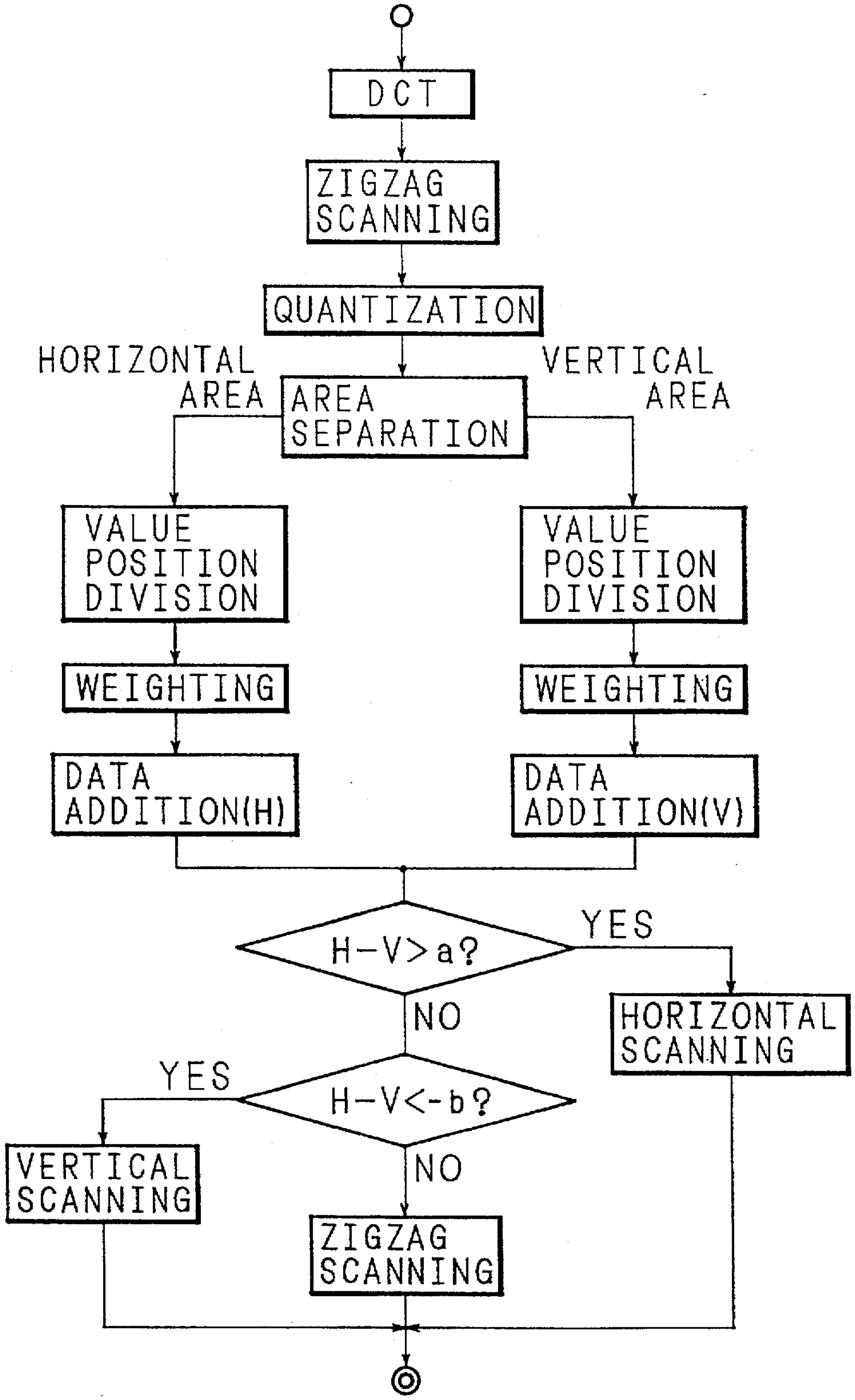
FIG. 60 is a drawing illustrative of the encoding algorithm in the thirteenth embodiment.
Figure 61:
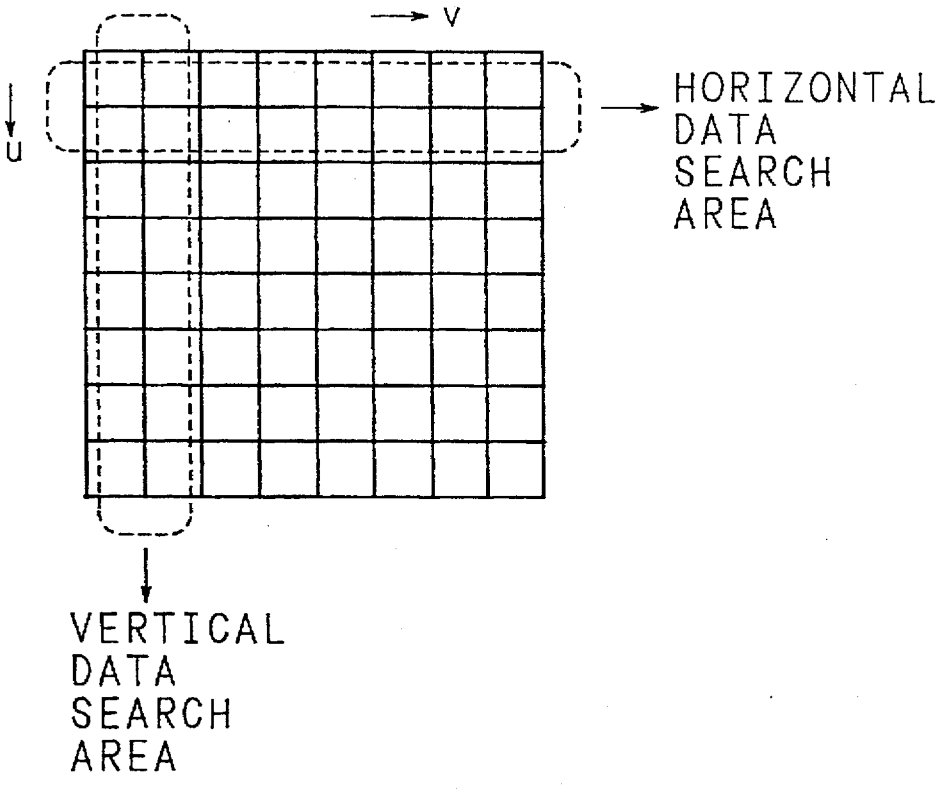
FIG. 61 is a block diagram illustrative of the horizontal/vertical data search areas for the explanation of the operation of the scan order change circuit in thirteenth embodiment.

Prior to the description of the circuit operation in the 13th embodiment, the encoding algorithm thereof will be described below with reference to FIG. 60. Incoming digital video data is DCT-transformed, zig-zag scanned and arranged to change the order of output, then quantized. In the 13th embodiment, data in the incoming DCT block is separated into a horizontal data search area and a vertical data search area as shown in FIG. 61, in order to determine whether the data in the DCT block has higher correlation in the horizontal direction or in the vertical direction when encoding the coefficient data. The search areas are not restricted to those shown in FIG. 61. Positions of coefficients in the search areas are separated according to whether they are 0 or not 0. Value 0 when the separated data is 0, or value 1 for coefficient other than 0, is output and weighted according to the positions. An example of weighting is shown in FIG. 62. Weighted data in each area is summed up and output. In FIG. 60, summation in the horizontal data search area is denoted with H and summation in the vertical data search area is denoted with V. Difference between the results of summation in both areas is compared to predetermined thresholds a and −b to select from predetermined orders of scanning. Values of a and b may be identical.

Figure 63A:
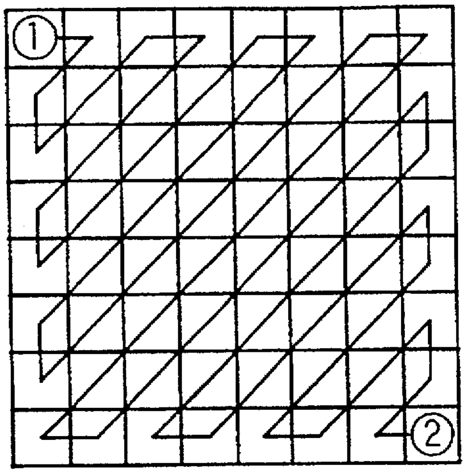
FIG. 63A, B, C are drawings illustrative of the changing patterns of the scanning order in the thirteenth embodiment.
Figure 63B:
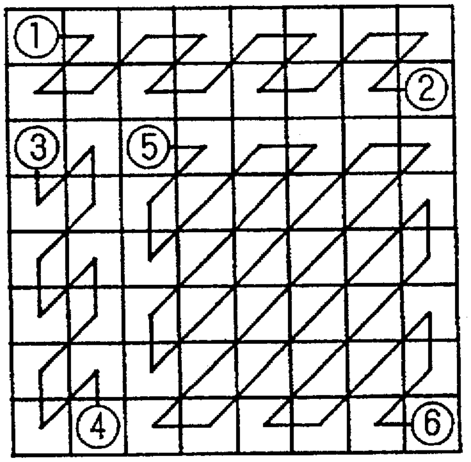
Figure 63C:
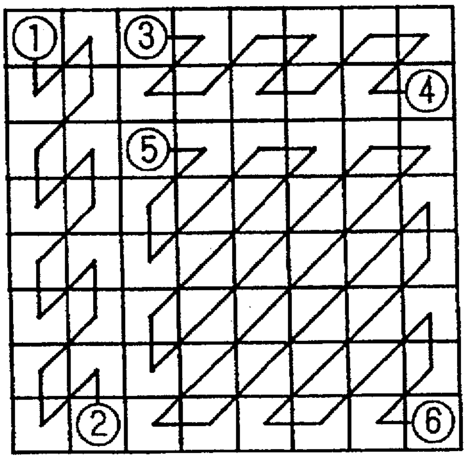

FIG. 63 shows three examples of the order of scanning. FIG. 63A shows zig-zag scanning which is selected when there is no outstanding correlation in either the horizontal or the vertical direction. FIG. 63B shows an example of order of scanning which is selected when higher correlation is found in the horizontal direction. Scanning is carried out in the order of ① to ②, ③ to ④, ⑤ to ⑥. FIG. 63C shows an example of order of scanning which is selected when higher correlation is found in the vertical direction. Scanning is carried out in the order of ① to ②, ③ to ④, ⑤ to ⑥.

Coefficient data which has undergone 1-dimensional scanning in the above procedure and processed to discard 0 events therefrom is then subjected to run-length coding with value 1 which has a very high frequency of occurrence and to 2-dimensional variable-length encoding (2-dimensional Huffman encoding).

Computer simulation by the algorithm shown in FIG. 60 showed a reduction in the amount of data by about 3.5%. During run-length coding of the coefficient data with value 1, +1 or −1 are not distinguished while the data resulting from 1-run length coding and the same number of sign bits as the number of +1 and −1 values are transmitted. In this simulation, only the AC coefficients in the DCT blocks were handled.

In the operations described above, because the amount of encoded information is reduced by means of the variable-length encoding which is a reversible process, it is made possible to reduce the amount of transmitted information without any deterioration of the picture quality in comparison to the high-efficiency encoding apparatus of the prior art.

The operation of the high-efficiency encoding apparatus in the 13th embodiment will be described below. The operations in the 13th embodiment are the same those in the 12th embodiment except for the operation of the scan order change circuit 36, and therefore the description that follows will be centered around the operation of the scan order change circuit 36. Output of the quantizer 3 is temporarily stored in the memory 39. The data in-area division circuit 40 separates the data which is included in the horizontal data search area and the data in the vertical data search area shown in FIG. 61, and separates the positions of data included in each area into 0 events and coefficient data having values not 0. Value 0 when the separated data is 0, or value 1 for coefficient other than 0, is outputted and weighted according to the positions as shown in FIG. 62. Specifically, output data 0 or 1 from each position is multiplied by the weight factor assigned to the position.

In the horizontal/vertical correlation detection circuit 41, weighted data in each area is summed up to determine the correlation in the horizontal and vertical directions. Specifically, as shown in FIG. 60, summation H in the horizontal data search area and summation V in the vertical data search area are calculated, and subtraction H−V is compared to specified the thresholds to determine the horizontal and vertical correlation. Based on the output from the horizontal/vertical correlation detection circuit 41, the scan order selection circuit 42 chooses one of several orders of scanning provided in advance, and informs the memory control circuit 43 of the selection. The memory control circuit 43 reads coefficient data from the memory 39 to the variable-length encoder 34 according to the output from the scan order selection circuit 42. In the 13th embodiment, separation of zero data from the coefficients after changing the order of scanning is carried out in the input stage of the variable-length encoder 34 which is provided in the latter stage. The coefficients which are output from the scan order changing circuit 36 is subjected to the separation of zero data from the coefficients in the input stage of the variable-length encoder 34 as described above, then subjected to run-length coding with value 1 which has the highest frequency of occurrence among the coefficients, thereby to reduce the total number of events. The operations that follows are the same as those in the 12th embodiment.

The constitution described above optimizes the order of scanning the coefficients, and makes it possible to reduce the amount of encoded information to be transmitted by about 3.5% in a reversible process compared to the high-efficiency encoding apparatus of the prior art, similarly to the simulation described above. This makes it possible, when this system is employed in the storage media such as digital VTR, to improve the picture quality without increasing the amount of information to be recorded compared to the case of encoding by means of the high-efficiency encoding apparatus of the prior art. That is, the rate control variable K which is outputted from the rate control circuit 6 can be set to a smaller value than that of the prior art, corresponding to the reduction in the amount of encoded information, making it possible to improve the S/N ratio of the decoded pictures.

Although horizontal and vertical data search areas to determine the horizontal/vertical correlation are set as shown in FIG. 61 in the 13th embodiment, the invention is not limited to this scheme and provides similar effects when narrower or wider search areas are set. Although weight factors to determine the horizontal/vertical correlation are set as shown in FIG. 62, the invention is not limited to this arrangement and provides the similar effects even when weight factor is not assigned to each position. Although three patterns as shown in FIG. 63 are provided for the order of scanning to reduce the amount of data, the invention is not limited to this arrangement and provides the similar effects when more patterns are provided and switched according to the horizontal/vertical correlation detection circuit 41. Also the invention is not limited to the scanning pattern shown in FIG. 63.

EMBODIMENT 14

The constitution of the high-efficiency encoding apparatus in the 14th embodiment of the invention is identical with that of the 12th embodiment (FIG. 54), and a description thereof will be omitted. In the 12th embodiment, quantized data is separated into 0-position data and coefficient data, and encoded data is transmitted. In the 14 embodiment, quantized data is separated into value position data and coefficient data, then encoded separately.

Figure 64:
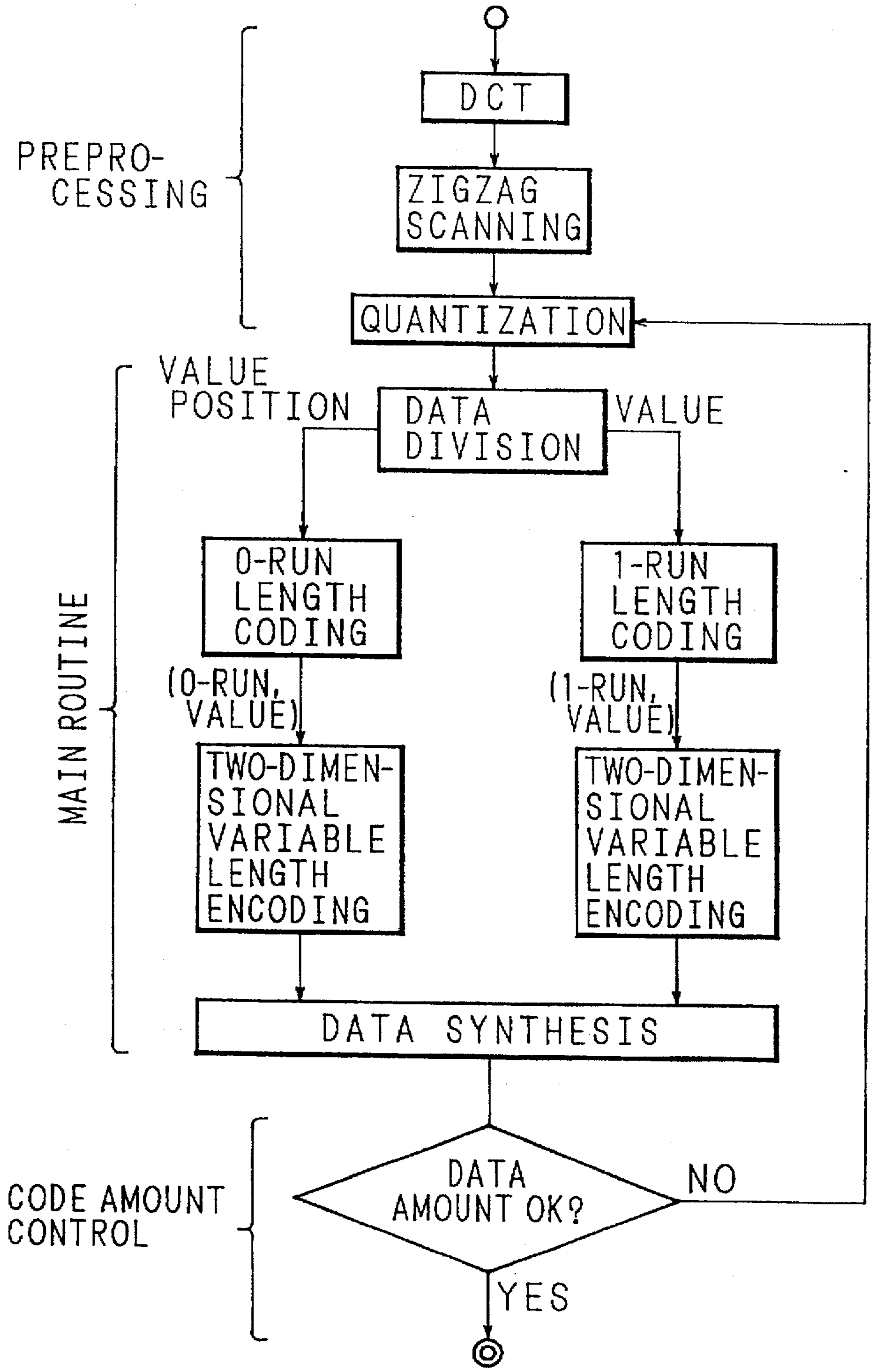
FIG. 64 is a drawing illustrative of the encoding algorithm in the fourteenth embodiment of the invention.

FIG. 64 is a drawing explanatory of the encoding algorithm in the 14 embodiment. Similarly to the 12th embodiment, incoming digital video data is DCT-transformed, zig-zag scanned, and rearranged to change the order of output, then quantized. The zig-zag scanned data is separated into value position data and coefficient data. The value position data is separated by measuring the run length of 0 numerical values existing between non-0 numerical values in the DCT coefficient data which has been read by zig-zag scanning and quantized. Coefficient data is separated similarly to the 12th embodiment.

The separating operation will be described below by using specific numerical values. FIG. 65A shows data stream in one DCT block which has been read by zig-zag scanning. Value position data separated from this data stream is shown in FIG. 65B. The result of separating the coefficient data from the data stream is shown in FIG. 65C.

Then the value position data separated in the above procedure is subjected to run-length coding with value 0 which has a very high frequency of occurrence among the separated data. Similarly the coefficient data separated in the above procedure is subjected to run-length coding with value 1 which has a very high frequency of occurrence. The data which has been subjected to run-length coding is Huffman-encoded by means of Huffman code tables provided separately, then synthesized and outputted. Encoded data is measured to determine the amount of encoded information and the rate control variable K is outputted to the quantizer.

Computer simulation by the algorithm shown in FIG. 64 showed a reduction in the amount of data by about 2.0% in a reversible process. During run-length coding of the coefficient data with value 1, +1 or −1 are not distinguished while the data resulting from the run-length coding is combined with the same number of sign bits as the number of +1 and −1 values. In this simulation, only the AC coefficients in the DCT block were handled. In the operations described above, because the amount of encoded information is reduced by means of the variable-length encoding which is a reversible process, it is made possible to reduce the amount of transmitted information without any deterioration of the picture quality in comparison to the high-efficiency encoding apparatus of the prior art.

The operation of the high-efficiency encoding apparatus in the 14 embodiment will be described below, which is similar to that of the 12th embodiment except for the fact that the 0-position data is replaced with the value position data. That is, the data division circuit 32 separates the input data into value position data and coefficient data in the procedure described above, and the separated value position data is subjected to run-length coding with value 0 which has the highest frequency of occurrence thereby to reduce the total number of events, then subjected to the variable-length encoding by means of the predetermined table data. Operations other than the above are the same as those in the 12th embodiment, and therefore description thereof will be omitted.

The constitution described above makes it possible to reduce the amount of encoded information to be recorded by about 2.0% in a reversible process compared to the high-efficiency encoding apparatus of the prior art, similarly to the simulation described above. This makes it possible, when this system is employed in the storage media such as digital VTR, to improve the picture quality without increasing the amount of encoded information to be recorded compared to the case of encoding by means of the high-efficiency encoding apparatus of the prior art. That is, the rate control variable K which is output from the rate control circuit 6 can be set to a smaller value than that of the prior art, corresponding to the reduction in the amount of encoded information, making it possible to improve the S/N ratio of the decoded pictures.

EMBODIMENT 15

The high-efficiency encoding apparatus according to the 15th embodiment of the invention is an application of the horizontal/vertical correlation detection system, described in conjunction with the 13th embodiment, to the fourteenth embodiment. Therefore, the constitution and the operation of the 15th embodiment can be easily understood by referring to the 13th and the 14 embodiments described above, and a description thereof will be omitted. In the 15th embodiment, the amount of encoded information to be recorded can be reduced by about 2.5% compared to the high-efficiency encoding apparatus of the prior art.

EMBODIMENT 16

Figure 66:
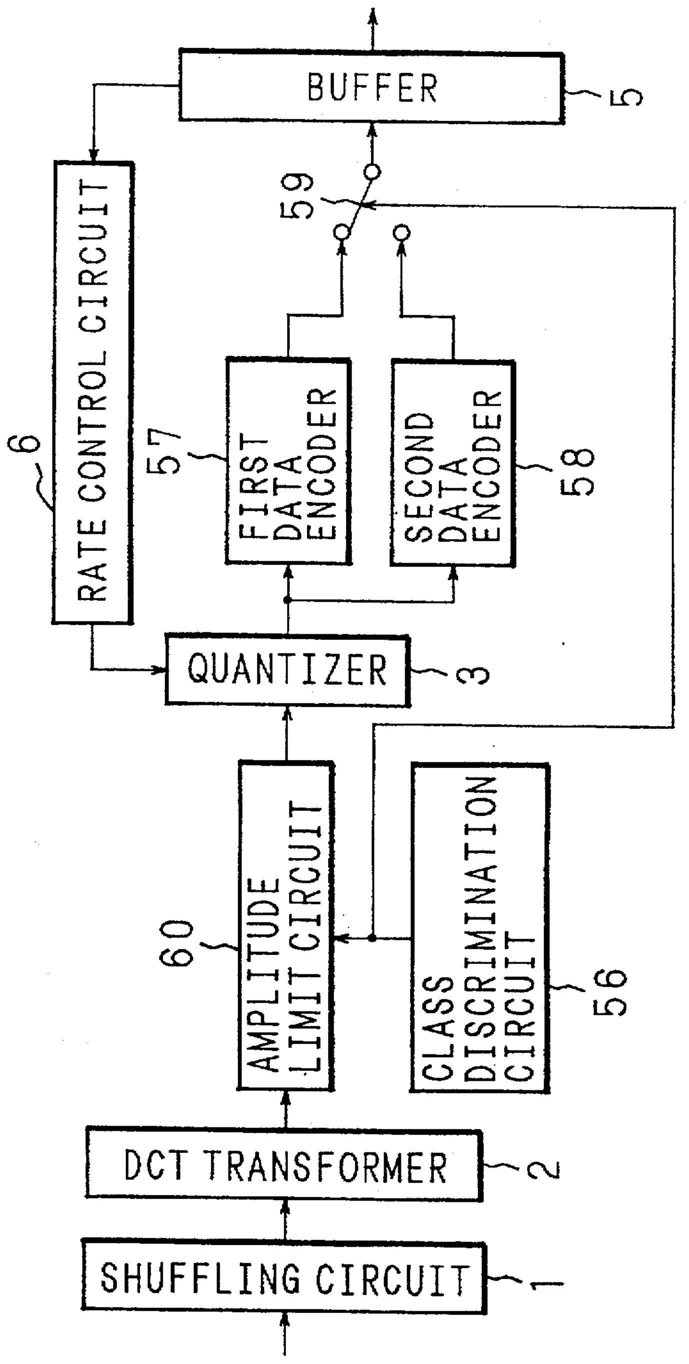
FIG. 66 is a block diagram illustrative of the high-efficiency encoding apparatus of the sixteenth embodiment of the invention.

FIG. 66 is a block diagram illustrative of the high-efficiency encoding apparatus in the 16th embodiment of the invention. In FIG. 66, components identical with those in the first embodiment (FIG. 14) are assigned with the same numerals, and a description thereof will be omitted. Numeral 56 denotes a class discrimination circuit which detects the amplitudes of the coefficients after DCT transformation, and classifies the coefficients by the amplitudes into predetermined classes. Numeral 60 denotes an amplitude limit circuit which limits the amplitude of the input data according to the class information supplied from the class discrimination circuit 56. Numerals 57, 58 denote a first data encoder and a second encoder which encode the input data. Numeral 59 denotes a switch which selects from among the outputs of the first and the second data encoders 57, 58.

Figure 67:
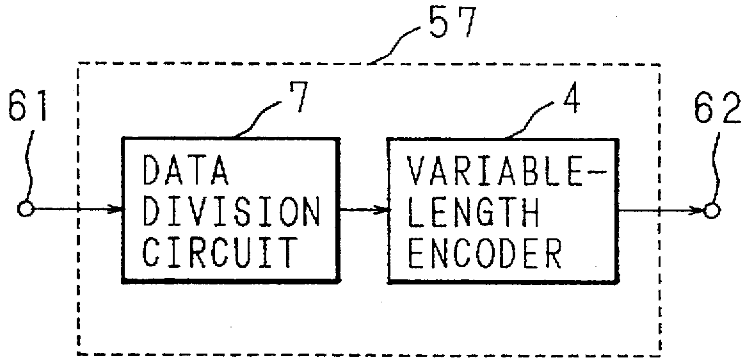
FIG. 67 is a block diagram illustrative of the data encoder of FIG. 66.
Figure 68:
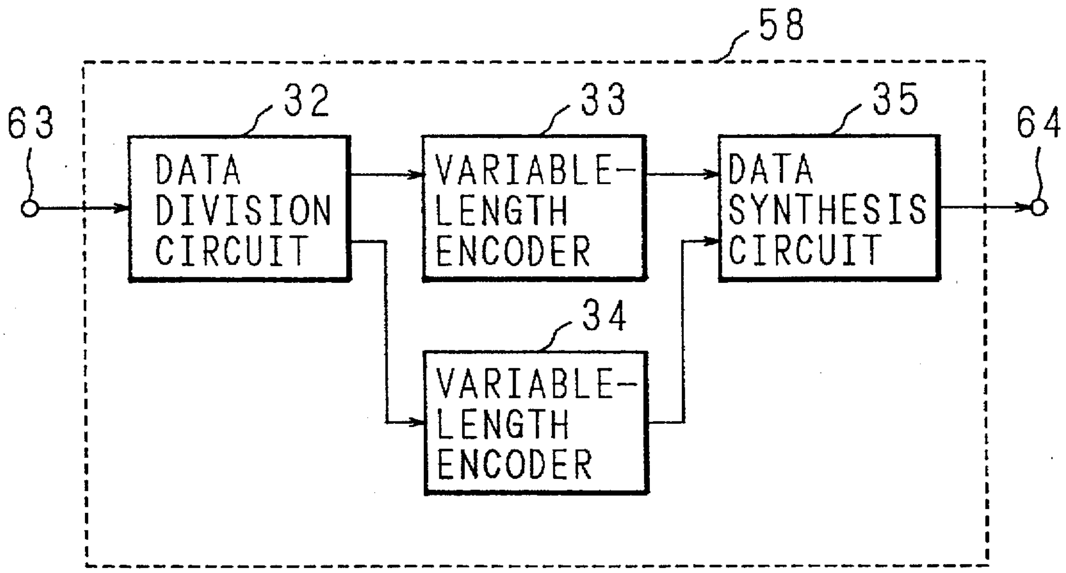
FIG. 68 is a block diagram illustrative of the data encoder of FIG. 66.

FIG. 67 is a block diagram illustrative of the inner constitution of the first data encoder 57 shown in FIG. 66. The first data encoder 57 has the data division circuit 7 and the variable-length encoder 4 which are similar to those of the prior art. FIG. 68 is a block diagram illustrative of the inner constitution of the second data encoder 58 shown in FIG. 66. The second data encoder 58 has the data division circuit 32, the variable-length encoder 33, the variable-length encoder 34 and the data synthesis circuit 35 which are similar to those in the 12th embodiment. In FIG. 67 and FIG. 68, numerals 61 and 63 denote input terminals, and numerals 62 and 64 denote output terminals.

The division encoding process described above is capable of reducing the amount of data by dividing data as described above. However, a monotonous picture results in small amplitudes of AC components in a DCT block, and such a case may arise where most or all of the AC components in one DCT block are 0. The division encoding process of such a DCT block may lead to increased amount of data contrary to the intention. The 16th embodiment has been conceived in consideration of the above problem.

The operation of the 16th embodiment will be described below. The operations of the shuffling circuit 1 and the DCT transformer 2 are the same as those in the first embodiment, and therefore a description thereof will be omitted. Coefficients obtained after the DCT transformation are input to the class discrimination circuit 56 and the amplitude limit circuit 60 by the DCT transformer 2. In a high-efficiency encoding apparatus based on the DCT transformation in general, data in a DCT block after the DCT transformation is classified by the amplitude of the coefficient data. The classification refers to classifying the DCT blocks at the time of encoding into a plurality of predetermined classes by the maximum amplitude of the DCT coefficient data in one DCT block. The class discrimination circuit 56 detects the maximum amplitude of the DCT coefficients in an inputted DCT block, and classifies the data included in the DCT block into four predetermined classes, while sending the class information to the amplitude limit circuit 60 and to the switch 59. The amplitude limit circuit 60 divides the amplitude of the input data by a predetermined value according to the class information which has been inputted, thereby to limit the amplitude. The result of the dividing operation is input to the quantizer 3 where it is quantized. Also the class information is sent together with the encoded data.

Output of the quantizer 3 is inputted to the first data encoder 57 and to the second data encoder 58. The data inputted to the first data encoder 57 is subjected to the encoding operation similar to that of the prior art. The operation of the first data encoder 57 will be briefly described below with reference to FIG. 67. First, data which is inputted via the input terminal 61 is subjected to run-length coding with coefficient 0 in the data division circuit 7, then subjected to 2-dimensional variable-length encoding (2-dimensional Huffman encoding in this embodiment) in the variable-length encoder 4, and is outputted from the output terminal 62.

On the other hand, The inputted data to the second data encoder 58 is subjected to the encoding operation similar to that of the 12th embodiment. The operation of the second data encoder 58 will be briefly described below with reference to FIG. 68. The data which is input to the data division circuit 32 via the input terminal 63 is separated into 0-position data and coefficient data. The 0-position data which has been separated in the data division circuit 32 is inputted to the variable-length encoder 33. The variable-length encoder 33 applies run-length coding, with value 0 which has the highest frequency of occurrence, to the incoming 0-position data. The data which has undergone the run-length coding is subjected to 2-dimensional variable-length encoding and is outputted. Similarly in the variable-length encoder 34, run-length coding with value 1 which has the highest frequency of occurrence is applied to the incoming coefficient data. The result of the 1-run length coding is subjected to the variable-length encoding by means of the predetermined table data and is outputted. The outputs of the variable-length encoders 33, 34 are outputted to the data synthesis circuit 35. The data synthesis circuit 35 synthesizes the output data of the variable-length encoder 33 and the output data of the variable-length encoder 34 including the sign bits of events 1 in the coefficient data which is inputted to the variable-length encoder 34, in the unit of DCT block. During 1-run length coding in this embodiment, events +1 and −1 are not distinguished as described above. In the 16th embodiment, the content of the Huffman code of the encoding table 4b is made different among the variable-length encoders 4, 33, 34.

Outputs of the first data encoder 57 and the second data encoder 58 are fed to the switch 59 which switches between the output of the first data encoder 57 and the output of the second data encoder 58 according to the class information outputted from the classification circuit 56. When the class discrimination circuit 56 determines that a DCT block belongs to the lowest class (all coefficient data in that DCT block are smaller than a specified level), it selects the output of the first data encoder 57 and, in other cases, it selects the output of the second data encoder 58. For monotonous pictures (pictures which have small amplitudes of AC components in a DCT block, where most or all of the AC components in one DCT block are 0) in which case separation of the data during encoding in this procedure leads to an increase in the amount of encoded information, the output of the conventional encoding operation is used and, for DCT blocks where the amount of data can be reduced by division encoding, the output of the second encoder 58 is selected thereby the amount of data can be reduced effectively.

The output of the first data encoder 57 or the output of the second data encoder 58 is fed to the buffer 5 via the switch 59. Operations that follow are the same as those of the first embodiment and therefore a description thereof will be omitted.

The above operations make it possible to reduce the amount of encoded information to be transmitted without any deterioration of the picture quality compared to the case of the high-efficiency encoding apparatus of the prior art, because the amount of encoded information is reduced by means of the variable-length encoding which is a reversible process. Also because the class information is transmitted together with the encoded data, the output of the first data encoder 57 and the output of the second data encoder 58 can be switched without adding a new switching flag, making it possible to effectively reduce the amount of data.

The constitution described above makes it possible to reduce the amount of encoded information to be recorded effectively in a reversible process. This makes it possible, when this system is employed in the storage media such as digital VTR, to improve the picture quality without increasing the amount of encoded information to be recorded compared to the case of encoding by means of the high-efficiency encoding apparatus of the prior art. That is, the rate control variable K which is output from the rate control circuit 6 can be set to a smaller value, corresponding to the reduction in the amount of encoded information than that of the prior art, making it possible to improve the S/N ratio of the decoded pictures.

In the 16th embodiment, it goes without saying that a similar effect can be obtained in such a constitution that a switching flag is added only when the DCT block belongs to a particular class so that the output of the first data encoder 57 and the output of the second data encoder 58 are selected, and the output of the second data encoder 58 (or the output of the first data encoder 57) is selected in the case of other classes.

EMBODIMENT 17

Figure 69:
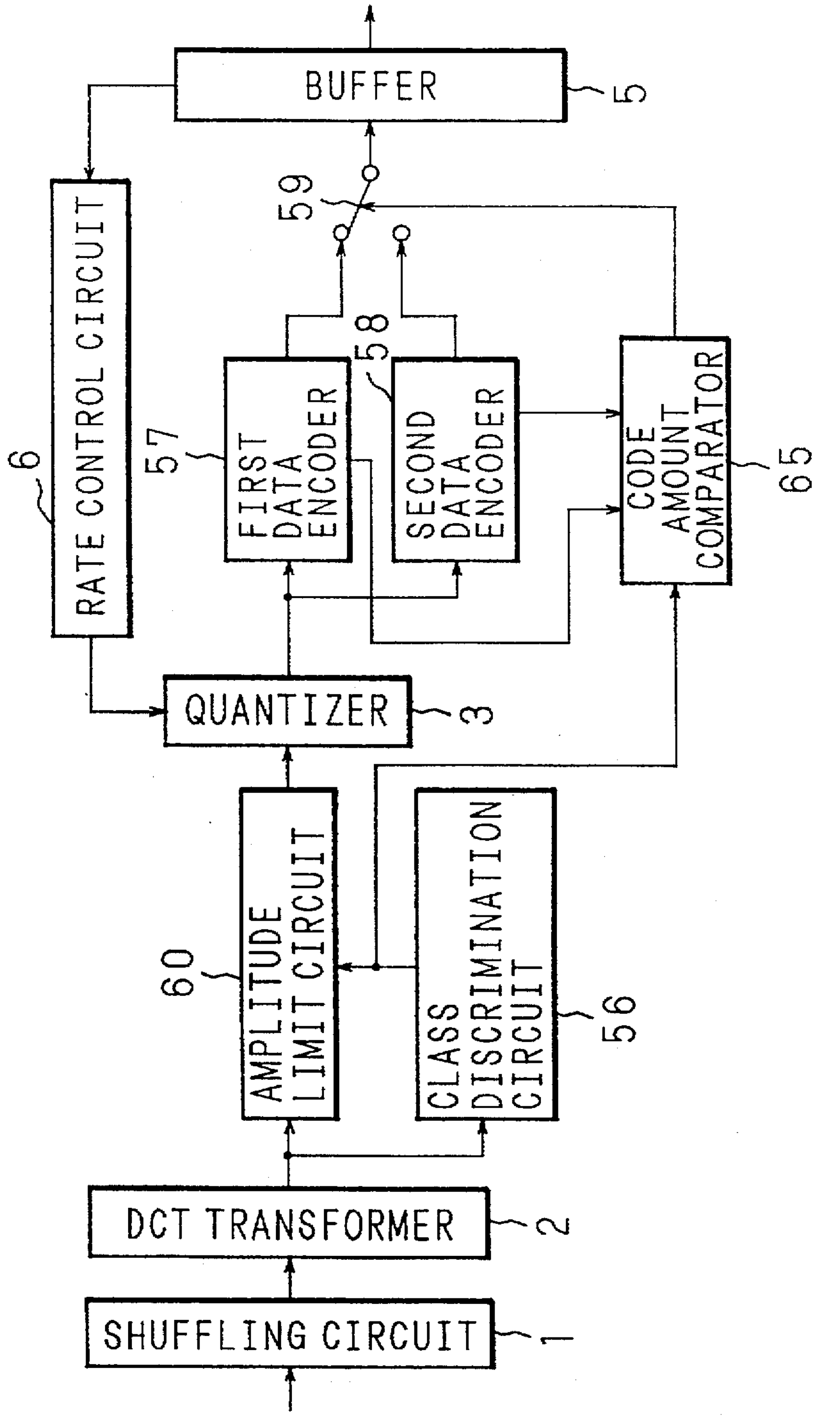
FIG. 69 is a block diagram illustrative of the high-efficiency encoding apparatus of the seventeenth embodiment of the invention.

FIG. 69 is a block diagram illustrative of the high-efficiency encoding apparatus in the 17th embodiment of the invention. In FIG. 69, components identical with those of the 16th embodiment (FIG. 66) are assigned with the same numerals. Numeral 65 denotes a code amount comparator which compares the amounts of encoded information which are outputted from the first and the second data encoders 57, 58.

The 16th embodiment described above has such a constitution that the output of the first data encoder 57 or the output of the second data encoder 58 is transmitted by selecting it by means of the switch 59 according to the class signal of the DCT coefficient, thereby minimizing the loss during division encoding. However, there may arise such a case where the output of the first data encoder 57 is selected even for a DCT block where sufficient effect of division encoding has already been obtained, leading to a loss. In an area where the AC components have small amplitudes, in particular, there exist such blocks where division encoding operation produces a satisfactory effect of reducing the amount of data, and such blocks wherein division encoding operation leads to an increase in the amount of data, both in significant proportions. The 17th embodiment has been conceived in consideration of this problem.

The operation of the 17th embodiment will be described below. Because the 17th embodiment has characteristic features in the class discrimination circuit 56, the code amount comparator 65 and the switch 59, the operations of these components will be described below. The class discrimination circuit 56 detects the maximum amplitude of the DCT coefficients in an inputted DCT block, and classifies the data included in the DCT block into predetermined four classes, while sending the class information to the amplitude limit circuit 60 and to the code amount comparator 65.

The code amount comparator 65 compares the amounts of encoded information outputted from the first data encoder 57 and the second data encoder 58 and, when the inputted DCT block belongs to a specified class (a class where the maximum amplitude of the DCT coefficient is the smallest among the classes, in the case of this embodiment), outputs such a control signal as to select the output of a data encoder with less amount of encoded information together with the selection signal. Consequently, data of the specified class is sent together with the selection signal added thereto. When the DCT block does not belong to the specified class, on the other hand, the code amount comparator 65 outputs a control signal which selects the output of the second data encoder 58 regardless of the result of comparing the amounts of encoded information. No selection signal is added for those other than the specified class. The switch 59 switches between the output of the first data encoders 57 and the output of the second data encoder 58 according to the output of the code amount comparator 65.

The above operations make it possible to reduce the amount of encoded information to be transmitted without any deterioration of the picture quality compared to the case of the high-efficiency encoding apparatus of the prior art, because the amount of encoded information is reduced by means of the variable-length encoding which is a reversible process. Also because the selection signal of the encoder is added only to the data of a particular class, the encoder can be selected efficiently without requiring much additional information, making it possible to effectively reduce the amount of data.

The constitution described above makes it possible to reduce the amount of encoded information to be recorded efficiently in a reversible process. This makes it possible, when this system is employed in the storage media such as digital VTR, to improve the picture quality without increasing the amount of encoded information to be recorded compared to the case of encoding by means of the high-efficiency encoding apparatus of the prior art. That is, the rate control variable K which is outputted from the rate control circuit 6 can be set to a smaller value than that of the prior art, corresponding to the reduction in the amount of encoded information, making it possible to improve the S/N ratio of the decoded pictures.

In the 16th and 17th embodiments, data is classified into four classes, although the number of classes is not limited to four. Although switching operation of the switch 59 is limited to the class of the least amplitude, the invention is not restricted to this scheme and produces similar effect in such a constitution as the output of the first data encoder 57 is selected in the case of another level, for example, the class of the greatest amplitude wherein the efficiency of division is not good. Although input data to the classification circuit 56 is received from the output of the DCT transformer 2, the invention is not restricted to this scheme. Also the constitution described in the fifth embodiment is used for the second data encoder 58, the invention is not restricted to this constitution and produces similar effect provided that it is different from the constitution of the first data encoder 57. Also the constitution described in the prior art is used for the first data encoder 57, although it goes without saying that the invention is not restricted to this constitution.

EMBODIMENT 18

Figure 70:
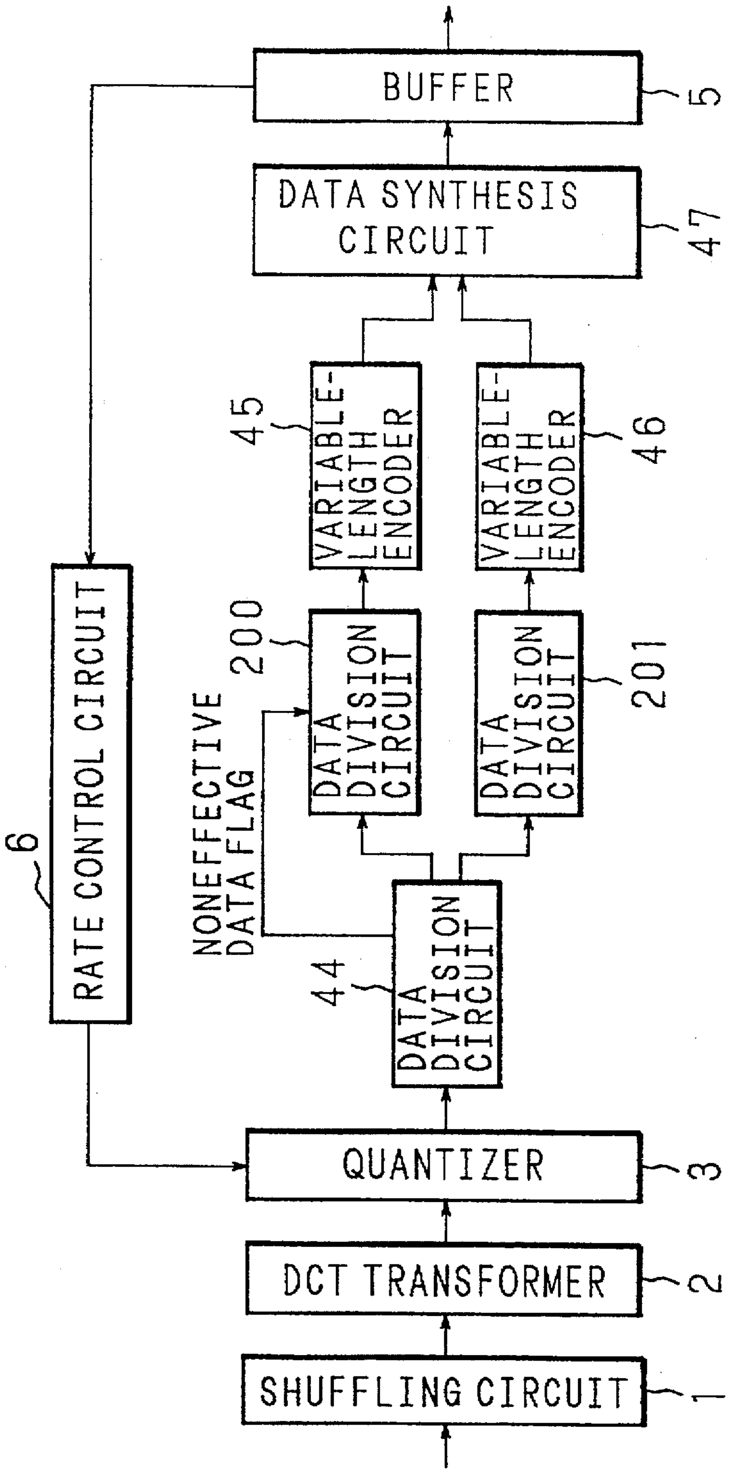
FIG. 70 is a block diagram illustrative of the high-efficiency encoding apparatus of the eighteenth embodiment of the invention.
Figure 71:
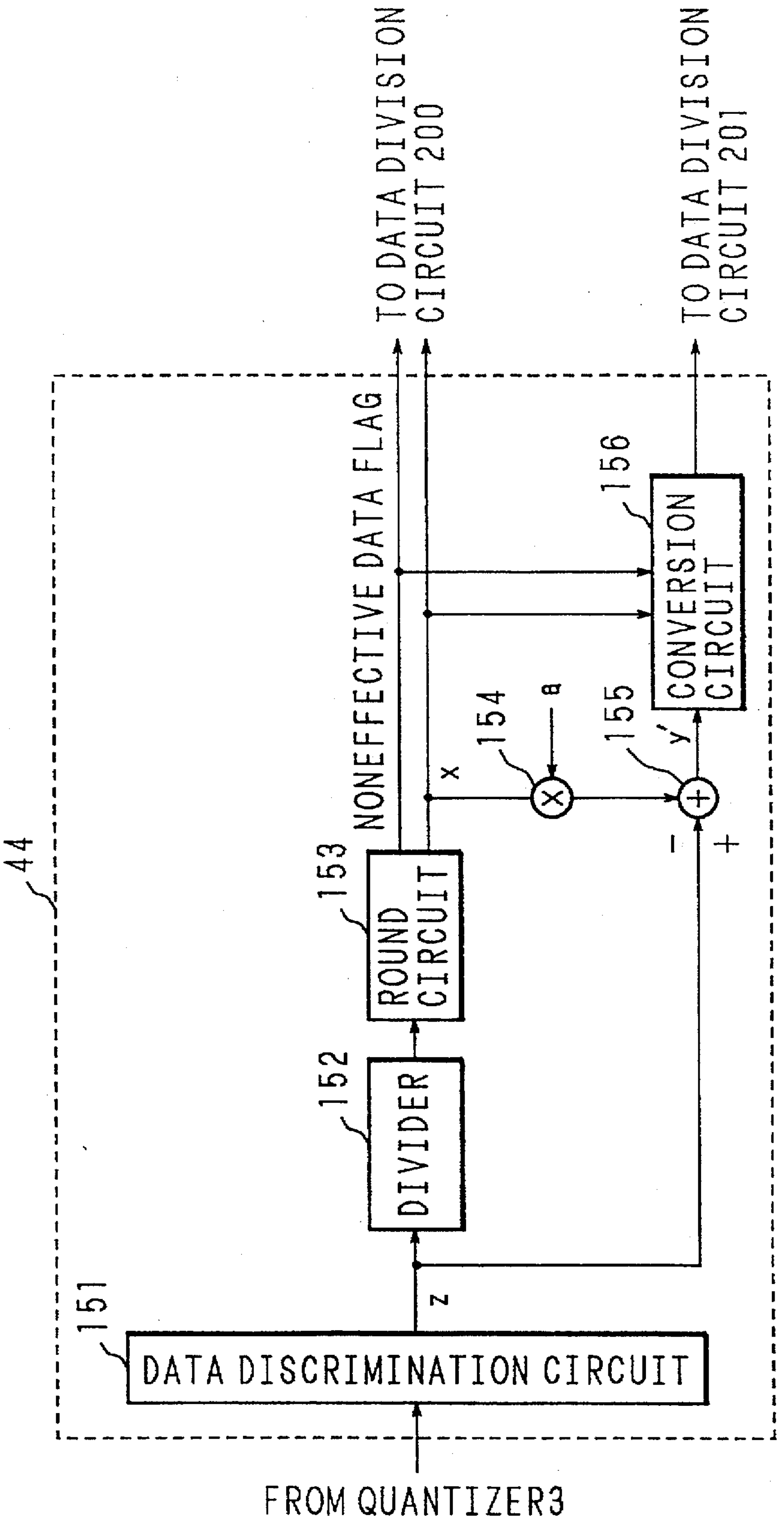
FIG. 71 is a block diagram illustrative of the data division circuit of FIG. 70.

FIG. 70 is a block diagram illustrative of the constitution of the high-efficiency encoding apparatus according to the 18th embodiment of the invention. In FIG. 70, components which are identical with those shown in FIG. 14 are denoted with the same numerals and a description thereof will be omitted. Numeral 44 denotes a data division circuit, 200 denotes a data division circuit, 201 denotes a data division circuit, 45 denotes a variable-length encoder, and 46 denotes a variable-length encoder. FIG. 71 is a block diagram illustrative of the inner constitution of the data division circuit 44 shown in FIG. 70. The data division circuit 44 comprises a data discrimination circuit 151 which determines whether an original coefficient z which has been quantized by the quantizer 3 (hereafter referred to as the original coefficient z) is 0 or not, a divider 152 which divides the original coefficient z by an integer "a" which is not less than 2, a rounding circuit 153 which adds a decimal number which indefinitely approaches 0.5 but never exceeds 0.5 (a repeating decimal having digit 4 in the first decimal place followed by 9's in the second decimal place and which will be denoted as 0.49* hereafter) to the real number x'=z/a which is outputted from the divider 152, then outputs an integer x obtained by discarding the decimal fraction of (x'+0.49*) and, when the data discrimination circuit 151 determines that the original coefficient z is 0, outputs a disable data flag, a multiplier 154 which multiplies the integer x by "a", a subtractor 155 which subtracts the result of multiplication (a×x) from the original coefficient z to give y', and a conversion circuit 156 having a conversion table to convert coefficient y' to a predetermined coefficient y.

The operation of the data division circuit 44 will be described below with reference to FIG. 71. The original coefficient z which has been quantized in the quantizer 3 is inputted to the data discrimination circuit 151 which determines whether the original coefficient z is 0 or not. When it is determined that the original coefficient z is not 0, the original coefficient z is sent to the divider 152 where it is divided by "a", an integer not less than 2, thereby to output a real number x'=z/a. The real number x' which is outputted from the divider 152 is added to 0.49* in the rounding circuit 153 which discards the decimal fraction and outputs an integer x. The integer x is fed to the data division circuit 200 and, at the same time, sent to the multiplier 154 where it is multiplied by "a" thereby to output the result of multiplication a×x, which is input to the subtractor 155 together with the original coefficient z to calculate y'=z−(a×x). The coefficient y' calculated in the subtractor 155 is input to the conversion circuit 156 where it is converted to predetermined coefficient y according to the disable data flag and the coefficient x, while the resulting coefficient y is outputted to the data division circuit 201. When the data discrimination circuit 151 determines that the original coefficient z is 0, the coefficient x is transmitted with the disable data flag being added thereto, while data 0 is transmitted after calculating the coefficient y. Detailed operation when the data discrimination circuit 151 determines that the original coefficient z is 0 will be described later.

Figure 72A:
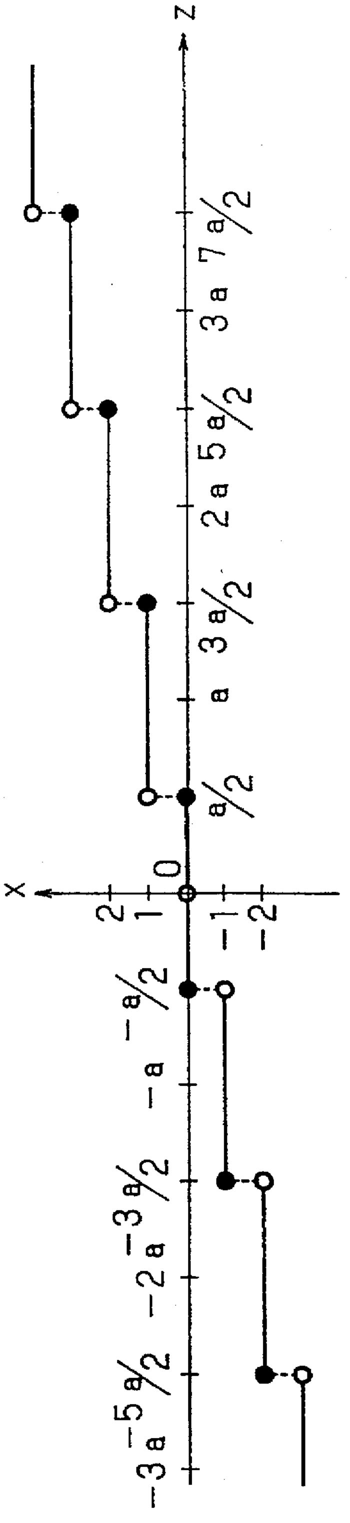
FIG. 72A, B are drawings for the explanation of the operation of the data division circuit of the eighteenth embodiment.

Now the operation of the data division circuit 44 will be described in detail below with reference to FIG. 71 and FIG. 72. FIG. 72 is a drawing explanatory of the rounding process in the rounding circuit 153 and the conversion process in the conversion circuit 156. The original coefficient z which has been quantized by the quantizer 3 in the high-efficiency encoding apparatus shown in FIG. 70 is input to the data discrimination circuit 151 in the data division circuit 44, where it is determined whether the original coefficient z is 0 or not. When the data discrimination circuit 151 determines that the original coefficient z is 0, the rounding circuit 153 to be described later adds the disable data flag to the coefficient x and outputs it. Data whose original coefficient z is 0 is transmitted with the value on coefficient y side being set to 0. The original coefficient z which has been determined whether it is 0 or not in the data discrimination circuit 151 is divided in the divider 152 by the predetermined integer "a" which is not less than 2. The real number x' obtained by the dividing operation in the divider 152 is input to the rounding circuit 153 where it is rounded off into an integer x and output. The rounding operation is carried out in a procedure as follows. The rounding operation carried out in the rounding circuit 153 will be described below with reference to FIG. 72. The real number x' which is output from the divider 152 is rounded in the rounding circuit 153 to 0 in a range where −a/2≦z≦a/2 thereby to output x=0. As described above, no data is transmitted on x side when the data discrimination circuit 151 determines that z=0 and therefore disable data flag is added. In a range where z<−a/2, the rounding circuit 153 subtracts 0.49* from the real number x'=z/a which is output from the divider 152, and outputs an integer x obtained by discarding the decimal fraction. In a range where a/2<z, the rounding circuit 153 adds 0.49* to the real number x'=z/a which is output from the divide 152, and outputs an integer x obtained by discarding the decimal fraction (refer to FIG. 72A).

Figure 72B:
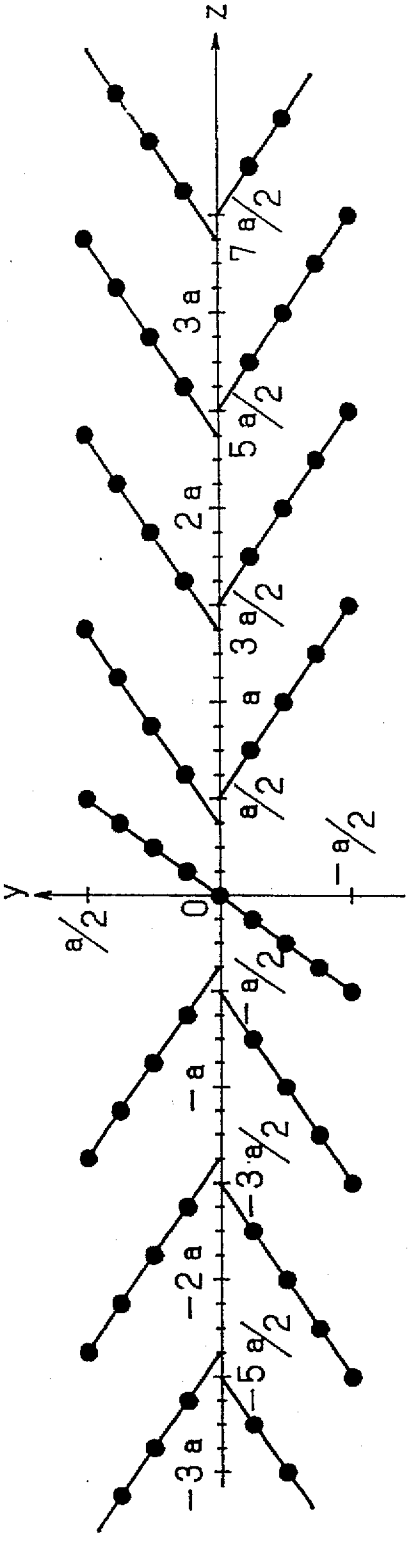

The coefficient y is obtained as shown in FIG. 72B. As shown in the drawing, y=O when z=O. As described above, y=0 because data of z=0 is transmitted on the y side. In a range of −a/2<z<a/2 excluding the point z=0, namely in the range where x=0, the coefficient y is given as the value of the original coefficient z. This means that the coefficient y is given as the residue of dividing the original coefficient z by the integer "a" which is not less than 2. Also in a range where z<−a/2, the coefficient y is converted to an integer of small absolute value such as 1, −1, 2, −2, . . . in the descending order of y' (=z−a×x). That is, in an interval where −3×a/2<z<−a/2 (an interval where x=−1), y is set to 1 when z=[−a/2−1] and thereafter y is set to −1, 2, . . . , a/2, −a/2 for z=[−a/2−2], [−a/2−3], . . . , [−a/2−a+1], [−a/2−a]. This is followed by repetition of the same conversion with the period of the interval where the coefficient x takes the same values (x=−2, −3, . . . ). A symbol [t] represents the integral part of the real number t. In an interval where a/2<z, the coefficient y' is converted to an integer of small absolute value such as 1, −1, 2, −2, . . . in the ascending order of coefficient y'(=z−a×x). That is, in an interval a/2<z<3×a/2 (an interval where x=1), y is set to 1 when z=[a/2+1] and thereafter y is set to −1, 2, . . . , a/2, −a/2 for z=[a/2+2],

[a/2+3], . . . , [a/2+a−1], [a/2+a]. This is followed by repetition of the same conversion with the period of the interval where the coefficient x takes the same values (x=2, 3, . . . ). A solid circle (●) in FIG. 72 represents a case where the value of that point is included and an empty circle (○) indicates a case where the value of that point is not included.

Figure 73A:
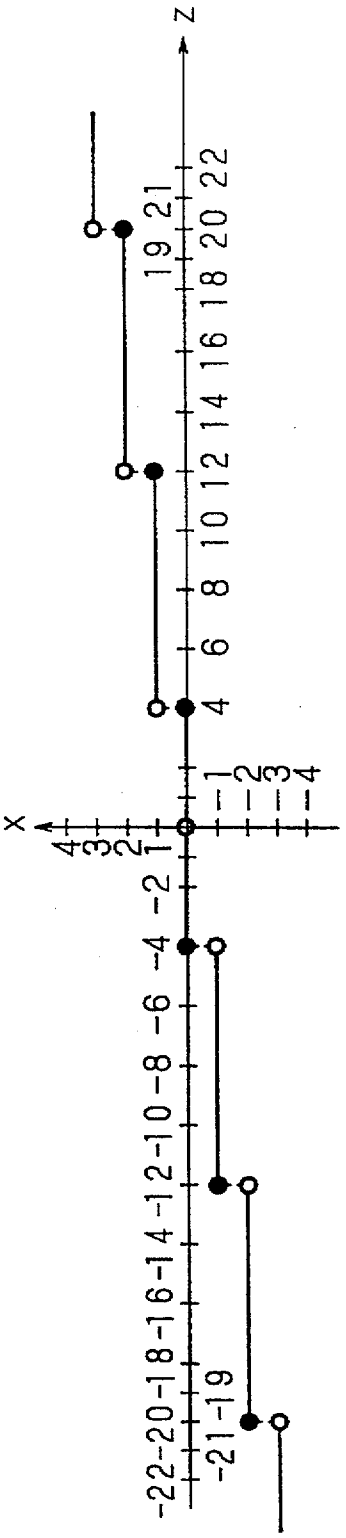
FIG. 73A, B are drawings for the specific explanation of the operation of the data division circuit of the eighteenth embodiment.

The operation of separating from the original coefficient z into coefficient x and coefficient y will be described below taking a case of a natural number a=8 with reference to FIGS.73A, B. The real number x'=z/8 which is output from the divider 152 is rounded to 0 in the rounding circuit 153 when z falls in a range where −4<z<4 excluding the point z=0, so that integer x=0 is output. In a range of −12≦z<−4, subtraction x'=z/8 minus 0.49* is rounded by discarding the decimal fraction to output integer −1 as the value of x. In a range where 4<z≦12, addition x'=z/8 plus 0.49* is rounded by discarding the decimal fraction to output integer 1 as the value of x. When z=0, the value x is output with disable data flag being added thereto.

Figure 73B:
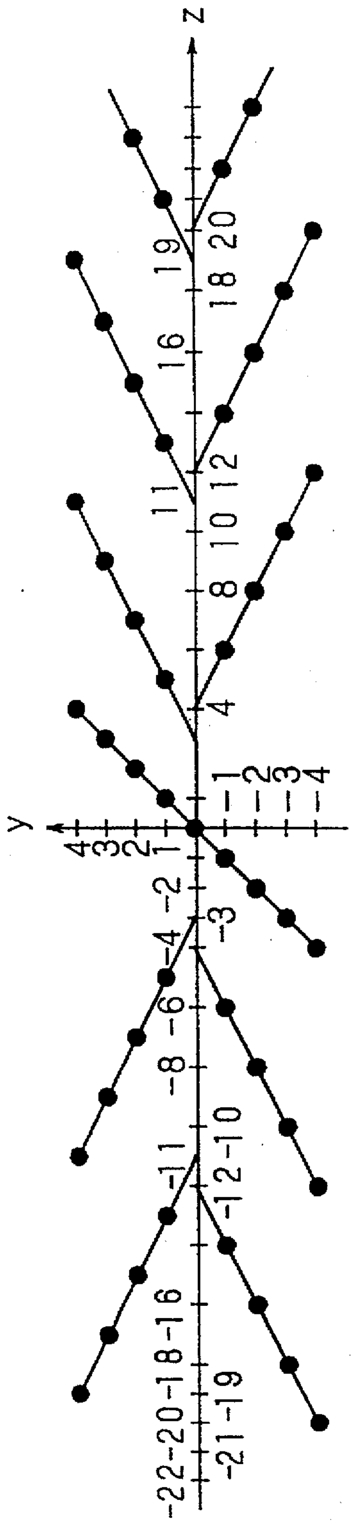

The coefficient y is obtained as shown in FIG. 73B. As shown in the drawing, y=0 when z=0. Because data of z=0 is transmitted on the y side, y=0. In a range where −4≦z≦4 excluding the point z=0, namely in the range where x=0, the coefficient y is given as the value of the original coefficient z. This means that the coefficient y is given as the residue of dividing the original coefficient z by 8. Also in a range where z<−4, the coefficient y is converted to an integer of small absolute value such as 1, −1, 2, −2, . . . in the descending order of y' (=z−8×x). That is, in an interval where −12≦z<−4 (an interval where x=−1), y is set to 1 when z=−5 and thereafter y is connected to −1, 2, −2, 3, −3, 4, −4 for z=−6, −7, −8, −9, −10, −11, −12. This is followed by repetition of the same conversion with the period of the interval where the coefficient x takes the same values (x=−2,−3, . . . ). In an interval z>4, the coefficient y is converted to an integer of small absolute value such as 1, −1, 2, −2, . . . in the ascending order of y' (=z−8×x). That is, in an interval 4<z≦12 (an interval where x=1), y is set to 1 when z=5 and thereafter y is set to −1, 2, −2, 3, −3, 4, −4 for z=6, 7, 8, 9, 10, 11, 12. This is followed by repetition of the same conversion with the period of the interval where the coefficient x takes the same values (x=2, 3, . . . ). A table for the above conversion is shown in FIG. 74. Solid circle (●) in FIG. 73 represents a case where the value of the point is included and empty circle (○) indicates a case where the value of the point is not included.

The coefficients x (the coefficient x is provided with the disable data flag added thereto as described above) and the coefficient y which have been separated in the data division circuit 44 in the above procedure are input to the data division circuit 200 and the data division circuit 201, respectively, where they are subjected to 0-run length coding and converted to events of 0-run length data and coefficient data. In this embodiment, because data on the coefficient x side is not transmitted when the original coefficient z is 0, there may arise a case where data length per one DCT block subjected to 0-run length coding is shorter than the data length per one DCT block of the original coefficient z. Because the disable data flag is added to the coefficient x which is output from the data division circuit 44 when the original coefficient z is 0, the data division circuit 200 reads the coefficient x in the unit of DCT blocks except for the portion where the disable data flag is detected, thereby to generate events of 0-run length data and coefficient data. On the other hand, data on the coefficient y side becomes the same as the data length of the original coefficient z. The coefficient x and the coefficient y which have been subjected to 0-run length coding and converted to events of 0-run length data and coefficient data are subjected to the variable length encoding in the variable-length encoder 45 and the variable-length encoder 46.

Because the variable-length encoder 45 and the variable-length encoder 46 have the same constitution and operation as those of the prior art (FIG. 6), a description of the constitution and operation thereof will be omitted. In this embodiment, the content of the Huffman code of the encoding table 4b is made different between the variable-length encoder 45 and the variable-length encoder 46. Encoded data of the coefficient x subjected to variable-length encoding in the variable-length encoder 45 and encoded data of the coefficient y subjected to variable-length encoding in the variable-length encoder 46 are output to the data synthesis circuit 47. The data synthesis circuit 47 synthesizes the outputs from the variable-length encoders 45, 46 in the unit of DCT block. The operations that follow are the same as those in the first embodiment.

As described above, while the original coefficient z is separated into the coefficient x and the coefficient y in the data division circuit 44 in the 18th embodiment, the separating operation is a reversible process and the original coefficient z can be restored from the coefficient x and coefficient y during decoding. The process of restoring the original coefficient z from the coefficient x and the coefficient y during decoding will be briefly described below. The original coefficient z is restored from a×x+y" which is obtained by adding the result of multiplication (a×x) of the coefficient x which has been separated in-the data division circuit 44 by the integer "a" which is not less than 2, and y" obtained by inverse conversion of the coefficient y which has been separated similarly in the data division circuit 44 by means of a conversion table which carries out a conversion exactly opposite to that during the encoding. The original coefficient z is restored as 0 when the coefficient y separated in the data division circuit 44 is 0. This means that, because it is specified that the coefficient y takes a values 0 only when the original coefficient z has a value 0 and the value of coefficient x is not transmitted in the above-mentioned method of separation, it can be detected that the value is not transmitted to the coefficient x side when the coefficient y is 0. Therefore, even when the data length per DCT block of the coefficient x side is shorter than the data length per DCT block of the original coefficient z side because of data on the coefficient x side which is supposed not to be transmitted by the separation in the data division circuit 44, the empty portion of the coefficient x can be detected by means of the data on the coefficient y side, data up to the same data length as the original coefficient z of one DCT block can be restored.

The constitution described above makes it possible to reduce the amount of encoded information to be recorded in a reversible process, compared to the high-efficiency encoding apparatus of the prior art. A simulation of luminance signal in the above constitution resulted in a reduction of the encoded information by about 1% compared to the high-efficiency encoding apparatus of the prior art. Also while about 140 words of Huffman code were required when carrying out Huffman encoding by means of one table of the prior art, required number of Huffman codes were reduced to about 100 words in total of two tables when carrying out the Huffman encoding with two tables in this embodiment. This makes it possible, when this system is employed in the storage media such as digital VTR, to improve the picture quality without increasing the amount of information to be recorded, compared to the case of encoding by means of the high-efficiency encoding apparatus of the prior art. More specifically, the rate control variable K can be set to a smaller value than that of the prior art, corresponding to the reduction in the amount of encoded information, making it possible to improve the S/N ratio of the decoded pictures.

In the 18th embodiment described above, conversion of y' to y in the conversion circuit 156 is carried out to obtain data of smaller absolute values in the ascending order of y' when z>0, and in the descending order of y' when z<0. This is by way of taking example of the frequency distribution of y' where values of y' are arranged in the descending order of its frequency of occurrence and data of smaller absolute values are assigned. In practice, the order of converting to data of small absolute values is not limited to the above. An example of converting y' to y (when a=8) in an order different from the above example is shown in FIG. 75 where y' is converted to y in such a manner that the positive and negative portions of y are symmetrical in FIG. 74.

EMBODIMENT 19

Figure 76:
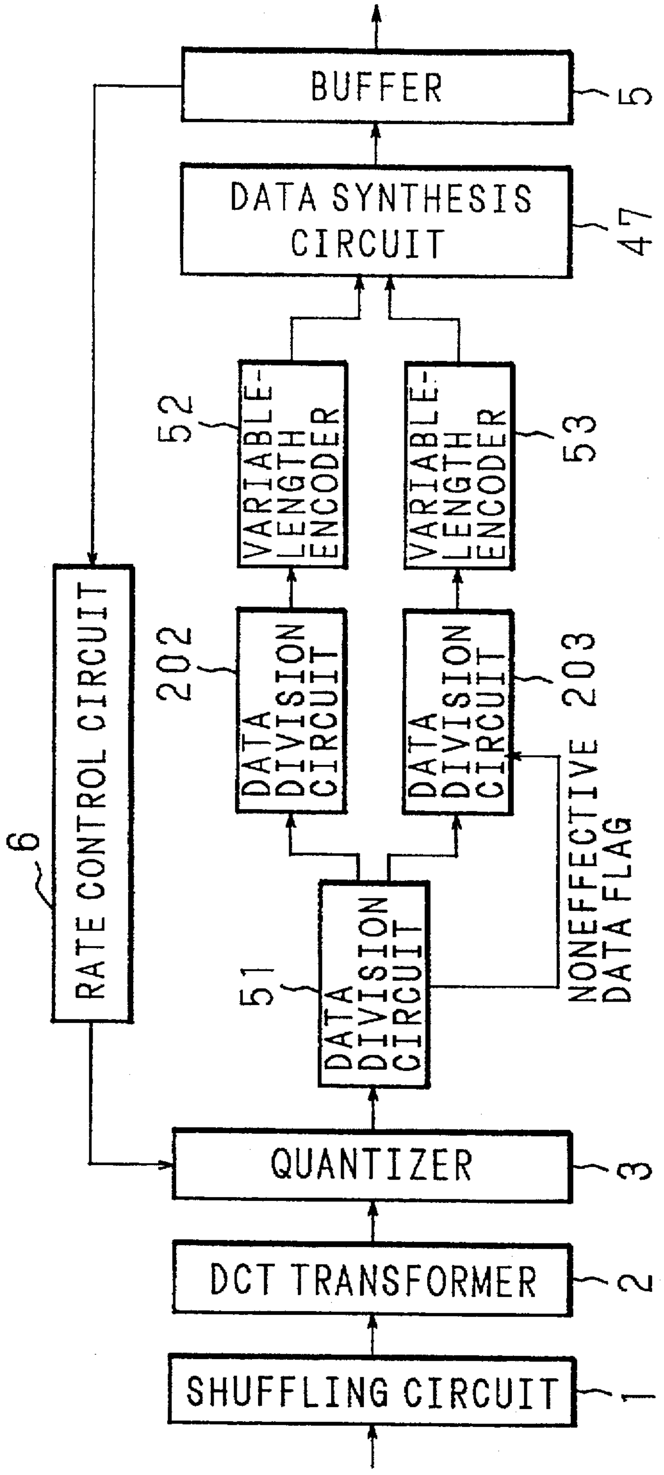
FIG. 76 is a block diagram illustrative of the high-efficiency encoding apparatus of the nineteenth embodiment of the invention.
Figure 77:
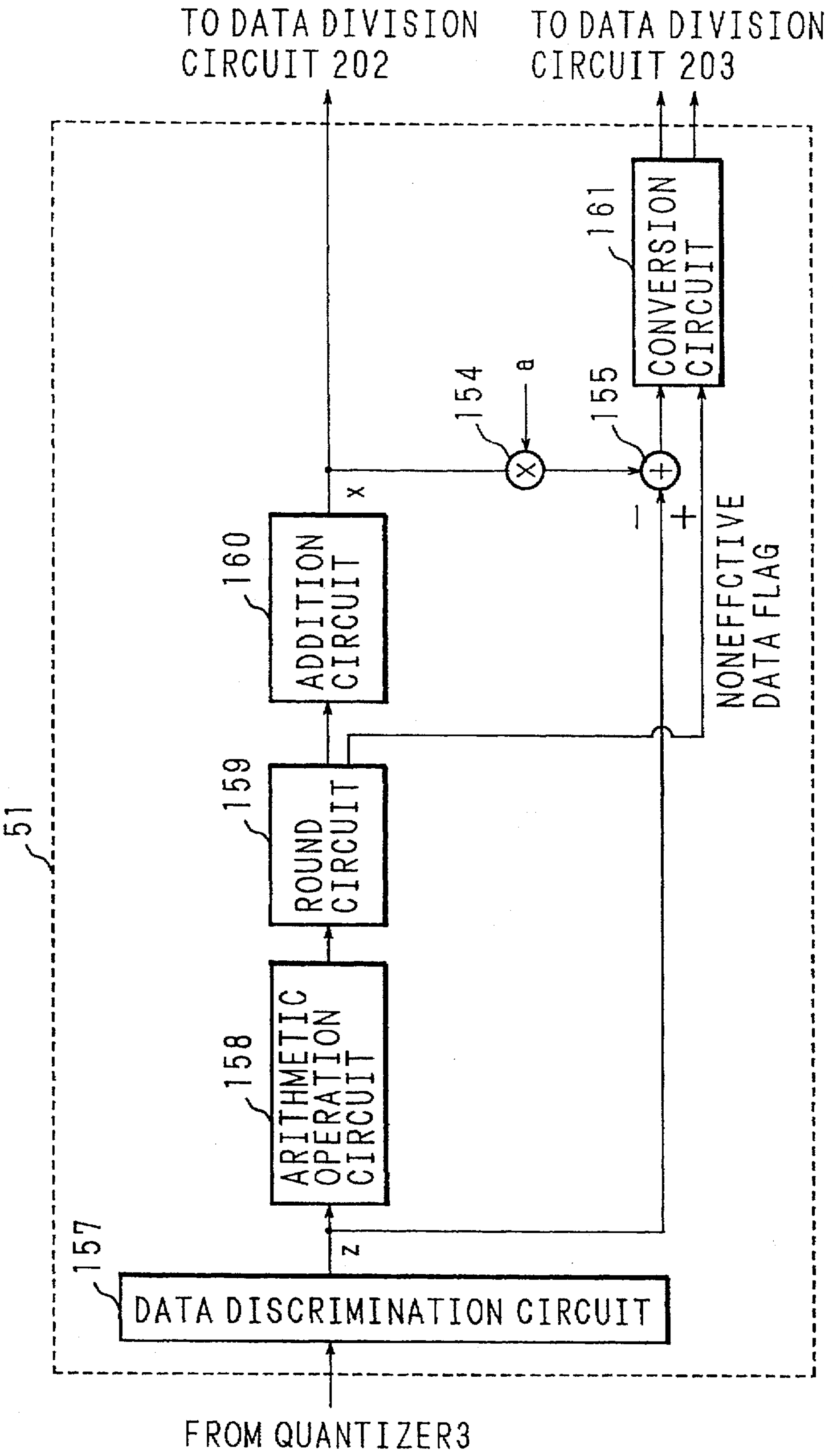
FIG. 77 is a block diagram illustrative of the data division circuit of FIG. 76.

FIG. 76 is a block diagram illustrative of the constitution of the high-efficiency encoding apparatus according to the 19th embodiment of the invention. In FIG. 76, components which are identical with those shown in FIGS.14, 70 are denoted by the same numerals and the description thereof will be omitted. Numeral 51 denotes a data division circuit, 202 denotes a data division circuit, 203 denotes a data division circuit, 52 denotes a variable-length encoder, and 53 denotes a variable-length encoder. FIG. 77 is a block diagram illustrative of the inner constitution of the data division circuit 51 shown in FIG. 76. The data division circuit 51 comprises a data discrimination circuit 157 which determines whether the original coefficient z which has been quantized by the quantizer 3 is 0 or not 0, an arithmetic operation circuit 158 which applies a specified arithmetic operation to the original coefficient z, a rounding circuit 159 which outputs an integer x obtained by rounding the real number x' which is output from the arithmetic operation circuit 158 and, when the data discrimination circuit 157 determines that the original coefficient z is 0, outputs disable data flag, an adder 160 which adds 1 or −1 to the integer x which is output from the rounding circuit 159, a multiplier 154 identical with that of the 18th embodiment, a subtractor 155, and a conversion circuit 161 which converts coefficient y', output from the subtractor 155, to a predetermined coefficient y.

The operation of the data division circuit 51 will be described below with reference to FIG. 77. The original coefficient z which has been quantized in the quantizer 3 is input to the data discrimination circuit 157 which determines whether the original coefficient z is 0 or not. When it is determined that the original coefficient z is not 0, the original coefficient z is sent to the arithmetic operation circuit 158 where it is subjected to the specified arithmetic operation thereby to output a real number x'. The real number x' which is output from the arithmetic operation circuit 158 is rounded in the rounding circuit 159 which discards the decimal fraction and outputs the integer x. The integer x is sent from the rounding circuit 159 to the adder 160 where 1 or −1 is added to the integer x. The integer x with 1 or −1 added thereto in the adder circuit 160 is sent to the data division circuit 202 and, at the same time, to the multiplier 154 where it is multiplied by "a" thereby to output the result of multiplication (a×x), which is input to the subtractor 155 together with the original coefficient z to calculate y'=z−a×x. The coefficient y' calculated in the subtractor 155 is input to the conversion circuit 161 where it is converted to the predetermined coefficient y according to the disable data flag and the coefficient x, while the resulting coefficient y is output to the data division circuit 203. When the data discrimination circuit 157 determines that the original coefficient z is 0, data on the coefficient y side is transmitted with the disable data flag being added thereto, while data 0 is transmitted on the coefficient x side. Detailed operation in the case where the data discrimination circuit 157 determines that the original coefficient z is 0 will be described later.

FIG. 78 is a drawing explanatory of the operations in the data division circuit 51, namely the arithmetic operation in the arithmetic operation circuit 158, the rounding operation in the rounding circuit 159, the adding operation in the adder circuit 160 and the conversion in the conversion circuit 161. The original coefficient z which has been quantized by the quantizer 3 in the high-efficiency encoding apparatus shown in FIG. 76 is input to the data discrimination circuit 157 in the data division circuit 51. When the data discrimination circuit 157 determines that the original coefficient z is 0, the rounding circuit 159 to be described later adds the disable data flag to the data on the coefficient y side and transmits the data while setting the value on the coefficient x side to 0. When the data discrimination circuit 157 determines that the original coefficient z is not 0, the coefficient x is subjected to the following arithmetic operation by equation 1, according to whether the original coefficient z has positive or negative value determined in the data discrimination circuit 157. Equation 1

$$x=[(z-1)/a]+1 \text{ when } z>0, \text{ or } x=[(z+1)/a]-1 \text{ when } z<0$$

where "a" is a positive odd number and [t] is the integral part of real number t.

Figure 78A:
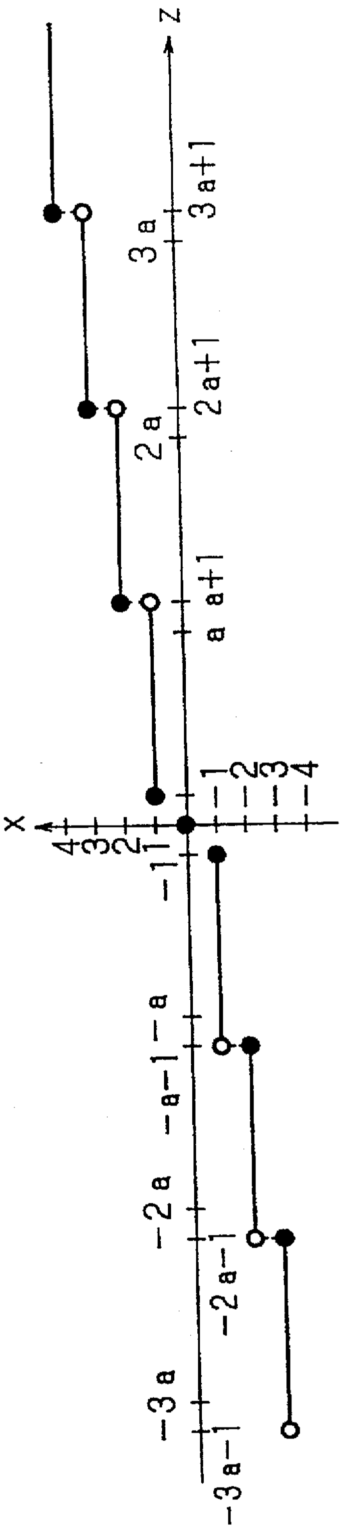
FIG. 78A, B are drawings for the explanation of the operation of the data division circuit of the nineteenth embodiment.

The process to determine the original coefficient z and the coefficient x by the equation 1 in the arithmetic operation circuit 158, the rounding circuit 159 and the adder circuit 160 will be described below. The data discrimination circuit 157 checks the original coefficient z to determine whether z=0, z>0 or z<0. When the data discrimination circuit 157 determines that z equals 0, the rounding circuit 159 adds the disable data flag to the data on the coefficient y side and outputs it. Data whose original coefficient z is 0 is transmitted with the value on the coefficient x side being set to 0. When z>0, the original coefficient z is input to the arithmetic operation circuit 158 where z−1 is divided by a predetermined integer "a" which is not less than 2, thereby to calculate ((z−1)/a). Real number x' which is output from the arithmetic operation circuit 158 after the dividing operation is input to the rounding circuit 159 where decimal fraction of the real number x' is discarded and the integral part thereof is output. The integer which is output from the rounding circuit 159 is with 1 added thereto in the adder circuit 160 and is output to the data division circuit 202. When z<0, on the other hand, the original coefficient z is input to the arithmetic operation circuit 158 where z+1 is divided by a predetermined integer "a" which is not less than 2 to calculate ((z+1)/a). The real number x' which is output from the arithmetic operation circuit 158 after the dividing operation is input to the rounding circuit 159 where decimal fraction of the real number x' is discarded and the integral part is output. The integer which is from the rounding circuit 159 is added to −1 in the adder circuit 160 and is output to the data division circuit 202. The coefficient x thus obtained is shown in FIG. 78A.

Figure 78B:
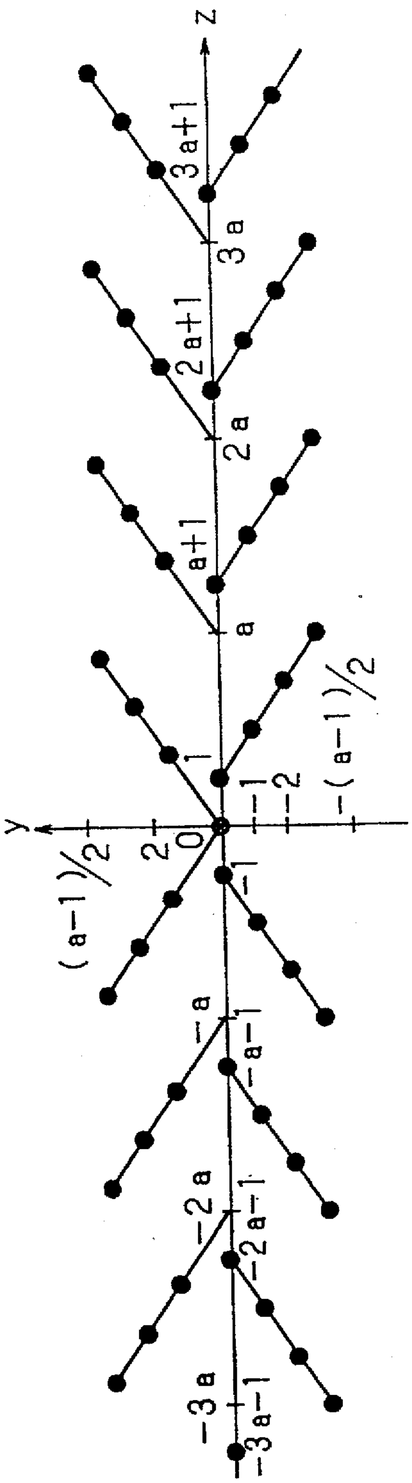

On the other hand, the coefficient y is obtained as shown in FIG. 78B. The disable data flag is added to y when z=0. As described above, data of z=0 is transmitted as x=0 on the x side.

In a range where 1≦z, the coefficient y is converted to an integer of small absolute value such as 0, 1, −1, 2, −2, . . . in the ascending order of y' (=z−a×x). That is, in an interval where 1≦z<a+1 (an interval where x=1), y is set to 0 when z=1 and thereafter y is set to 1, −1, . . . , (a−1)/2, −(a−1)/2 for z=2, 3, . . . , (a−1), a. In a range where z≧a+1, the coefficient y is converted to an integer of small absolute value such as 0, 1, −1, 2, −2, . . . in the ascending order of y' (=z−a×x). That is, in an interval where a+1≦z<2*a*+1 (an interval where x=2), y is set to 0 when z=a+1 and thereafter y is set to 1, −1, . . . , (a−1)/2, −(a−1)/2 for z=a+2, a+3, . . . , 2*a*−1, 2*a*. This is followed by a repetition of the same conversion with a period of the interval where coefficient x takes the same value (x=3, 4, . . . ).

In a range where z≦−1, the coefficient y is converted to integers of small absolute values 0, 1, −1, 2, −2, . . . in the descending order of y' (=z−a×x). That is, in an interval −a−1<Z≦−1 (an interval where x=−1), y is set to 0 when z=−1 and thereafter y is set to 1, −1, . . . ,(a−1)/2, −(a−1)/2 for z=−2, −3, . . . , −a+1, −a. Further in a range of z≦−a−1, the coefficient y is converted to an integer of small absolute value such as 0, 1, −1, 2, −2, . . . in the descending order of y' (=z−a×x). That is, in an interval where −2*a*−1<z S≦−a−1 (an interval where x=−2), y is set to 0 when z=−a−1 and thereafter y is set to 1, −1, . . . , (a−1)/2, −(a−1)/2 for z=−a−2, −a−3, . . . , −2*a*+1, −2*a*. This is followed by a repetition of the same conversion with a period of the interval where coefficient x takes the same value (x=−3, −4, . . . ). A solid circle (●) in FIG. 78 represents a case where the value of that point is included and an empty circle (○) indicates a case where the value of that point is not included.

Figure 79A:
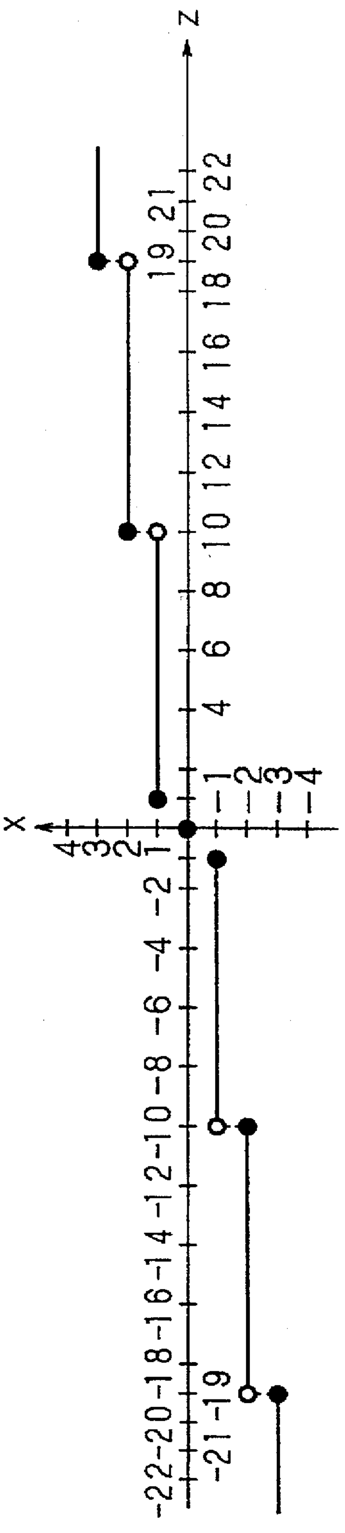
FIG. 79A, B are drawings for the specific explanation of the operation of the data division circuit of the nineteenth embodiment.

The operation of separating from the original coefficient z into the coefficient x and the coefficient y by equation 1 will be described below taking a case of a natural number a=9 with reference to FIGS. 79A, B. As shown in FIG. 79A, when the data discrimination circuit 157 checks the original coefficient z and determines whether z=0, z>0 or z<0, the coefficient x=0 is output as described above if z=0. When z falls within a range 1≦z<10, the arithmetic operation circuit 158 calculates x'=(z−1)/9. The real number x' which is output from the arithmetic operation circuit 158 after the dividing operation is input to the rounding circuit 159 where decimal fraction of the real number x' is discarded and the integral part is output. In an interval where 1≦z<10, x'=0. The integer which is output from the rounding circuit 159 is added to 1 in the adder circuit 160 to be x=1 in an interval where 1≦z<10. The coefficient x is determined similarly also in a range where z≧10. When z falls within a range where −10<z≦−1, the arithmetic operation circuit 158 calculates x'=(z+1)/9. The real number x' which is output from the arithmetic operation circuit 158 after the dividing operation is input to the rounding circuit 159 where the decimal fraction of the real number x' is discarded and the integral part thereof is output. In an interval where −10<z≦−1, x'=0. The integer which is from the rounding circuit 159 is added with −1 in the adder circuit 160 to be x=−1 in interval where −10<z≦−1. The coefficient x is determined similarly also in a range where z≦−10.

On the other hand, the coefficient y is obtained as shown in FIG. 78B. The disable data flag is added to y when z=0. As described above, data of z=0 is transmitted as x=0on the x side.

In a range where 1≦z, the coefficient y is converted to an integer of small absolute value such as 0, 1, −1, 2, −2, . . . in the ascending order of y' (=z−9×x). That is, in an interval where 1≦z<10 (an interval where x=1), y is set to 0 when z=1 and thereafter y is set to 1, −1, 2, −2, 3, −3, 4, −4 for z=2, 3, 4, 5, 6, 7, 8, 9. In a range where z ≧10, the coefficient y is converted to integers of small absolute values 0, 1, −1, 2, −2, . . . in the ascending order of y' (=z−9×x). That is, in an interval where 10≦z<19 (an interval where x=2), y is set to 0 when z=10 and thereafter y is set to 1, −1, 2, −2, 3, −3, 4, −4 for z=11, 12, 13, 14, 15, 16, 17, 18. This is followed by a repetition of the same conversion with a period of the interval where the coefficient x takes the same value (x=3, 4, . . . ).

Figure 79B:
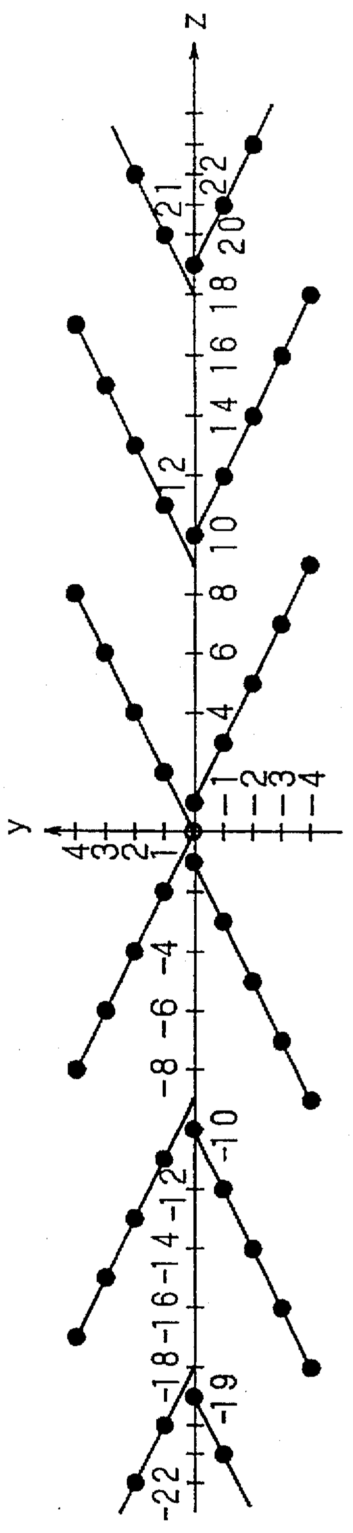

In a range where z≦−1, the coefficient y is converted to an integer of small absolute value such as 0, 1, −1, 2, −2, . . . in the descending order of y'(=z−9×x). That is, in an interval −10<z≦−1 (an interval where x=−1), y is set to 0 when z=−1 and thereafter y is set to 1, −1, 2, −2, 3, −3, 4, −4 for z=−2, −3, −4, −5, −6, −7, −8, −9. Further in a range where z≦−10, the coefficient y is converted to an integer of small absolute value such as 0, 1, −1, 2, −2, . . . in the descending order of y' (=z−9×x). That is, in an interval where −19<z≦−10 (an interval where x=−2), y is set to 0 when z=−10 and thereafter y is set to 1, −1, 2, −2, 3, −3, 4, −4, . . . , for z=−11, −12, −13, −14, −15, −16, −17, −18. This is followed by a repetition of the same conversion with a period of the interval where the coefficient x takes the same value (x=−3, −4, . . . ). A table for above conversion is shown in FIG. 80. A solid circle (●) in FIG. 79 represents a case where the value of the point is included and an empty circle (○) indicates a case where the value of the point is not included.

The coefficient x and the coefficient y (coefficient y includes the disable data flag added thereto as described above) which have been separated in the data division circuit 51 in the above procedure are input to the data division circuit 202 and the data division circuit 203, where they are subjected to 0-run length coding and turned into events of 0-run length data and coefficient data. Because data on the coefficient y side is not transmitted when the original coefficient z is 0 in the nineteenth embodiment, unlike the eighteenth embodiment, there may arise a case where data length per one DCT block subjected to 0-run length coding is shorter than the data length per one DCT block of the original coefficient z. Because the disable data flag is added to the coefficient y which is separated and output from the data division circuit 51 when the original coefficient z is 0, the data division circuit 203 reads the coefficient y in the unit of DCT block except for the portion where the disable data flag is detected, thereby to generate events of 0-run length data and coefficient data. On the other hand, data on the coefficient x side becomes the same as the data length of the original coefficient z. The coefficient x and the coefficient y which have been subjected to 0-run length coding and converted to events of 0-run length data and coefficient data are subjected to the variable-length encoding in the variable-length encoder 52 and the variable-length encoder 53.

Because the variable-length encoder 52 and the variable-length encoder 53 have the same constitution and the operation as those of the prior art (FIG. 6), a description thereof will be omitted. In this embodiment too, the content of the Huffman code of the encoding table **4*b* is made different between the variable-length encoder 52 and the variable-length encoder 53. The encoded data of the coefficient x which has undergone the variable-length encoding in the variable-length encoder 52 and the encoded data of the coefficient y which has undergone the variable-length encoding in the variable-length encoder 53 are output to the data synthesis circuit 47. The data synthesis circuit 47 synthesizes the outputs from the variable-length encoders 52, 53** in the unit of DCT block. The operations that follow are the same as those in the first embodiment.

As described above, while the original coefficient z is separated into the coefficient x and the coefficient y in the data division circuit 51 in the nineteenth embodiment, the separating operation is a reversible process and the original coefficient z can be restored from the coefficient x and the coefficient y during decoding. The process of restoring the original coefficient z from the-coefficient x and the coefficient y will be briefly described below. The original coefficient z is restored from a×x+y" which is obtained by adding the result of multiplication (a×x) of the coefficient x which has been separated in the data division circuit 51 by the integer "a" which is not less than 2, and adding y" obtained by inverse conversion of the coefficient y which has been separated similarly in the data division circuit 51 by means of a conversion table which carries out a conversion exactly opposite to that carried out during the encoding. The original coefficient z is restored as 0 when the coefficient x separated in the data division circuit 51 is 0. This means that, because it is specified that the coefficient x takes a value 0 only when the original coefficient z has a value 0 and the value of the coefficient y is not transmitted in the above method of separation, the data can be restored by a conversion exactly opposite to that carried out during the encoding. This means that, because it is specified that the coefficient x takes a values 0 only when the original coefficient z has a value 0 and the value of the coefficient y is not transmitted in the above method of separation, it can be detected that value is not transmitted to the coefficient y side when coefficient x is 0. Therefore, even when the data length per DCT block of the coefficient y side is shorter than the data length per DCT block of the original coefficient z side because of data on the coefficient y side which is not supposed to be transmitted by the separation in the data division circuit 51, an empty portion of the coefficient y can be detected by means of the data on the coefficient x, and therefore data up to the same data length as the original coefficient z of one DCT block can be restored.

The constitution described above makes it possible to reduce the amount of encoded information to be recorded in a reversible process compared to the high-efficiency encoding apparatus of the prior art. A simulation of Y signal in the above constitution resulted in a reduction of the encoded information by about 1% compared to the high-efficiency encoding apparatus of the prior art. Also while about 140 words of Huffman code were required when carrying out Huffman encoding by means of one table of the prior art, the required number of Huffman code were reduced to about 100 words in total of two tables when carrying out the Huffman encoding with two tables in this embodiment. This makes it possible, when this system is employed in the storage media such as digital VTR, to improve the picture quality without increasing the amount of information to be recorded compared to the case of encoding by means of the high-efficiency encoding apparatus of the prior art. More specifically, the rate control variable K can be set to a smaller value than that of the prior art, corresponding to the reduction in the amount of encoded information, making it possible to improve the S/N ratio of the decoded pictures.

In the nineteenth embodiment described above, conversion of y' to y in the conversion circuit 161 is carried out to obtain data of smaller absolute values in the ascending order of y' when z<0, and in the descending order of y' when z<0. This is by way of taking an example of the frequency distribution of y' where values of y' are arranged in the descending order of its frequency of occurrence and data of smaller absolute values are assigned. In practice, the order of converting to data of small absolute values by arranging the values of y' in the descending order of its frequency of occurrence is not limited to the above. An example of converting y' to y (when a=9) in an order different from the above example is shown in FIG. 81 where y' is converted to y in such a manner that the positive and negative portions of y are symmetrical in FIG. 80.

EMBODIMENT 20

Figure 82:
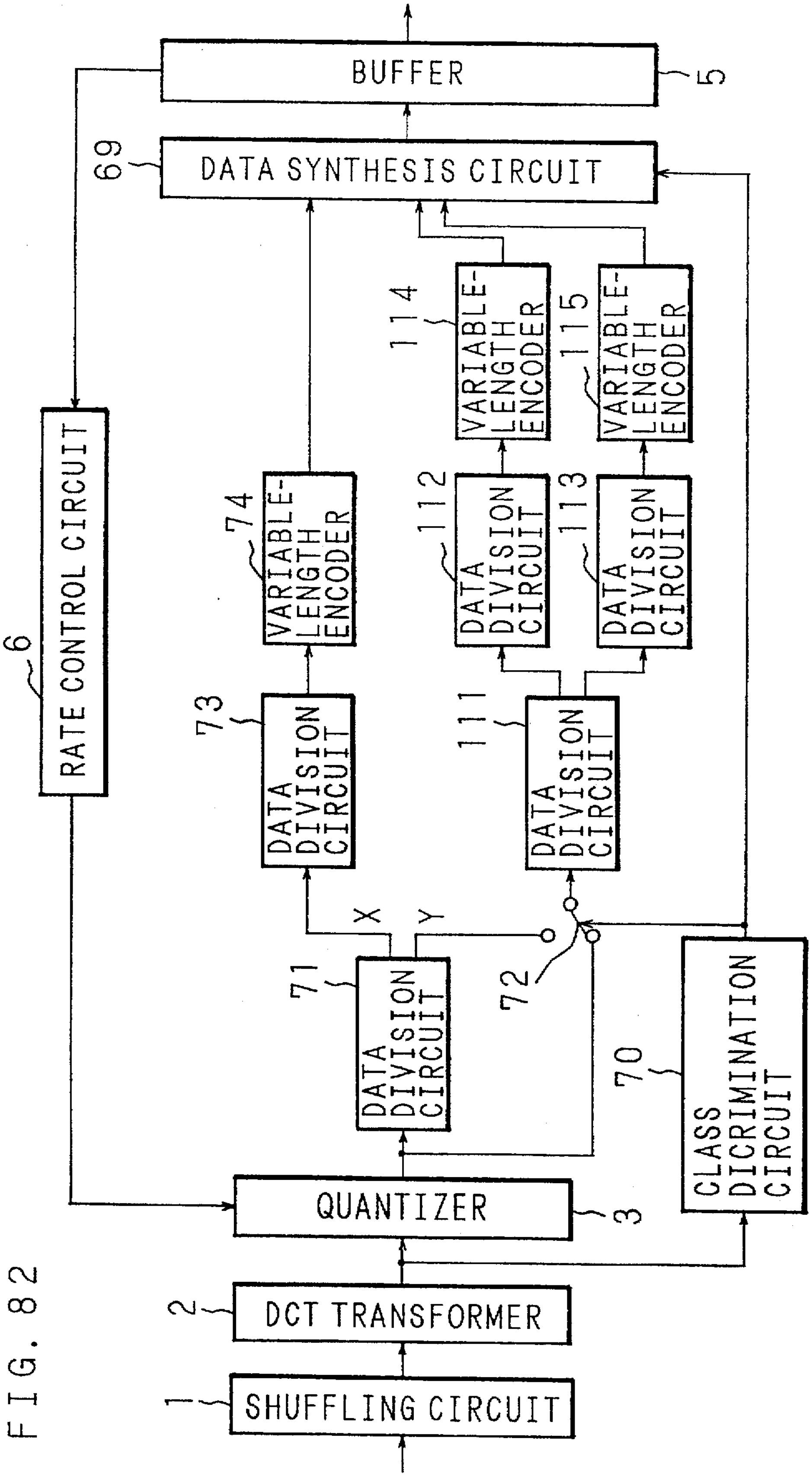
FIG. 82 is a block diagram illustrative of the high-efficiency encoding apparatus of the twentieth embodiment of the invention.

FIG. 82 is a block diagram illustrative of the high-efficiency encoding apparatus in the 20th embodiment of the invention. In FIG. 82, numerals 1, 2, 3, 5, 6 denote a shuffling circuit, a DCT transformer, a quantizer, a buffer and a rate control circuit, respectively, which are similar to those of the first embodiment. Numerals 111, 112, 113, 114, 115 denote a data division circuit, a data division circuit, a data division circuit, a variable-length encoder and a variable-length encoder, respectively, which are similar to those of the fifth embodiment. Numeral 70 denotes a class discrimination circuit which detects the maximum amplitudes of the AC coefficients in the DCT coefficient data output from the DCT transformer 2, and classifies the coefficients by the amplitudes into predetermined classes. Numeral 71 denotes a data division circuit, 72 denotes a switch, 73 denotes a data division circuit, 74 denotes a variable-length encoder and 69 denotes a data synthesis circuit.

Figure 83:
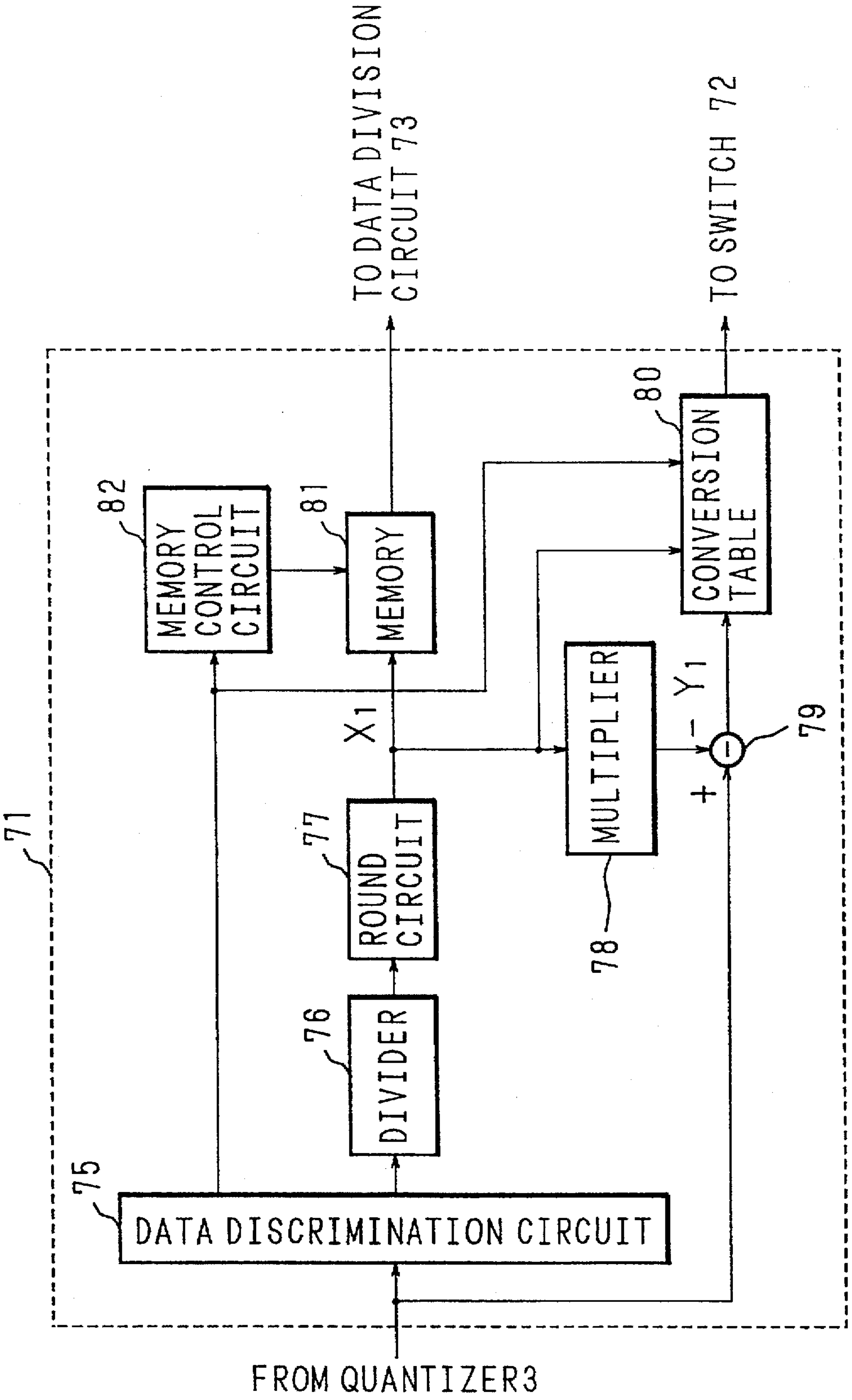
FIG. 83 is a block diagram illustrative of the data division circuit of FIG. 82.

FIG. 83 is a block diagram illustrative of the inner constitution of the data division circuit 71 shown in FIG. 82. The data division circuit 71 has a data discrimination circuit 75 which detects 0 data in the input data, a divider circuit 76 which divides the data supplied from the data discrimination circuit 75 by a constant "a", a rounding circuit 77 which rounds off the result of the dividing operation supplied from the divider circuit 76, a multiplication circuit 78 which multiplies the data supplied from the rounding circuit 77 by the constant "a", a subtractor 79, a conversion table 80 to convert the output of the subtractor 79 into a predetermined value, a memory 81, and a memory control circuit 82 which controls writing of data onto the memory 81 and reading of data from the memory 81 according to the result of data detection which is output from the data discrimination circuit 75.

Now the operation of the high-efficiency encoding apparatus of the 20th embodiment will be described after describing the method of data division in the data division circuit 71. The data division circuit 71 of the 20th embodiment changes the data array when applying the Huffman encoding by dividing the incoming data in the direction of amplitude, thereby efficiently applying the Huffman encoding and reducing the amount of data. The principle of the operation of the data division circuit 71 will be described below with reference to FIG. 82, FIG. 83.

The original coefficient z which has been quantized in the quantizer 3 is separated into X data and Y data in the data division circuit 71. First, the original coefficient z is separated into two variables X1 and Y1 by the following equations.

$$X1=[z/a+0.49^*]$$

$$Y1=z-a\times X1$$

when 0≦z, or $$X1=[z/a-0.49^*]$$

$$Y1=z-a\times X1$$

when 0>z

The constant "a" in the above equation is a predetermined integer not less than 2. The decimal number 0.49* is a repeating decimal having 9 in every digit in and after the second decimal place. A symbol [t] denotes the integral part of real number t.

Encoding X1 and Y1 which are separated in the above equations leads to transmitting data of z=0 with both X1 and Y1 which results in very low efficiency. Taking this fact into consideration, data of z=0 which has been input from the quantizer 3 is transmitted on Y side only in the data division circuit 71, thereby improving the efficiency of division. It has been confirmed in a simulation that a similar effect can be obtained also by transmitting z=0 with X1 only.

A method of conversion in the case where the above dividing operation is carried out by means of a constant "a" will be briefly described below. First, a method of calculating integer X will be described. The data discrimination circuit 75 determines whether the input data is 0 or not, and the result is input to the memory control circuit 75 and the conversion table 80. The divider circuit 76 divides the input data by the constant "a". When the original coefficient z falls within a range where $-a/2 \leqq z \leqq a/2$, X1 is rounded to 0 so that X1=0 is output. In a range where $z < -a/2$, the rounding circuit 77 subtracts the decimal number x'=z/a which is supplied from the divider circuit 76 by 0.49* and discards the decimal fraction to obtain an integer X1. In a range where $z > a/2$, the rounding circuit 77 adds the decimal number x'=z/a which is supplied from the divider circuit 76 to 0.49* and discards the decimal fraction to obtain an integer X1. From X1 which is obtained in the above operation, X1=0 at the time of z=0 is removed thereby to generate X.

Method of calculating the integer Y will be described below. Because 0 data of original coefficient z is transmitted only on Y side as described above, Y1 calculated by the above equation is processed in the conversion table 80 so that Y=0 is output in the case of z=0 according to the result of 0 detection. In a range where $-a/2 \leqq z \leqq a/2$ excluding z=0, namely in a range where X1=0, Y is given with the value of the original coefficient z. That is, Y is given as the residue of dividing the original coefficient z by the integer "a" which is not less than 2. In a range where $z < -a/2$, Y is converted to integers of small absolute values +1, −1, +2, −2, . . . (or −1, +1, −2, +2, . . . , whichever order may be employed provided that the positive and negative signs are attached to correspond one-on-one to the integer Y1), in the descending order of integer Y1 obtained by Y1=z−a×X1. That is, Y is set to 1 when z=−a/2−1, followed by −1, 2, −2, . . . , (a/2)−1, −((a/2)−1), a/2, −a/2 from Y1=z−a×X1 as the value of the original coefficient z decreases in a range where $z \geqq -3 \times a/2$, namely in a range where X1 takes the same value. The same conversion is repeated thereafter with a period wherein the value of the original coefficient z decreases by "a", namely the interval where X1 takes the same value.

In a range where $z > a/2$, the coefficient Y is converted to integers of small absolute values +1, −1, +2, −2, . . . (or may be in the order of −1, +1, −2, +2, . . . ) in the ascending order of the integer Y1 obtained by Y1=z−a×X1. That is, Y is set to 1 w en z=a/2+1, followed by −1, 2, −2, . . . , (a/2)−1, −((a/2)−1), a/2, −a/2 from Y1=z−a×X1 as the value of the original coefficient z increases in a range $z \leqq 3 \times a/2$, namely in a range where X1 takes the same value. The same conversion is repeated thereafter with a period wherein the value of the original coefficient z increases by "a", namely the interval where X1 takes the same value.

The output data of the rounding circuit 77 is multiplied by the constant "a" in the multiplier circuit 78. The result of the multiplication is subtracted by input data in the subtractor 79 with the result being input to the conversion table 80. When the data discrimination circuit 75 detects 0, the conversion table 80 outputs 0 regardless of other inputs. For data wherein 0 is not detected in the data discrimination circuit 75, output data from the subtractor 79 is directly output only in the case of X1=0. In other cases, output data from the subtractor 79 is converted in the above procedure.

Figure 85A:
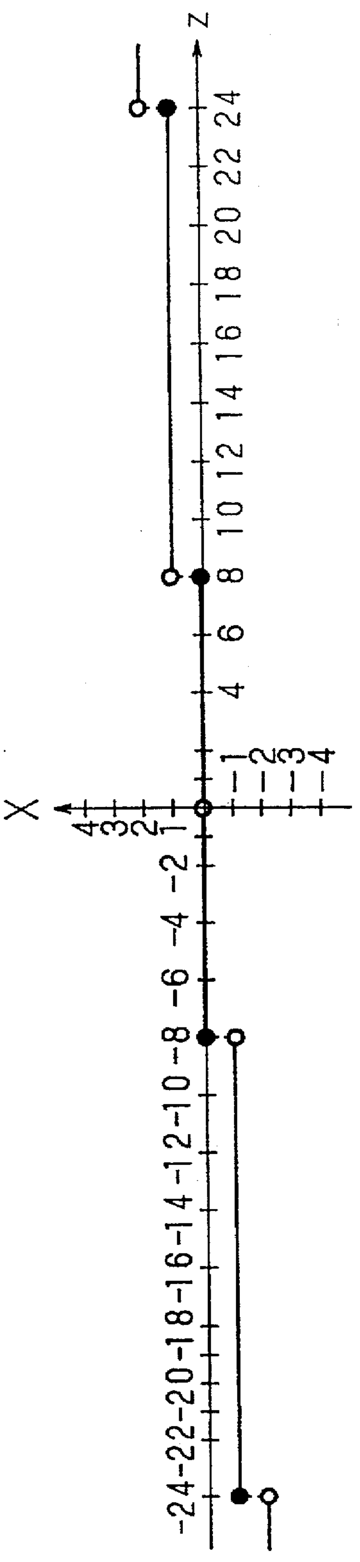
FIG. 85A, B are drawings for the specific explanation of the operation of the data division circuit of the twentieth embodiment.

A case of a=16 will be taken as an example in the description that follows. FIG. 84 shows an example of dividing X1, Y1, Y and Y in the case of a=16. According to the above equation, the division is carried out as X1=1, Y1=−7 when z=9, or X1=1, Y1=0 when z=16. In order to transmit the data of z=0 on Y side as described above, it is necessary to distinguish the natural value of 0 for z=0 and the 0 of Y1 in the case of z=16. Although X1=1 and Y1=1 when z=17, it is more efficient to transmit Y with Y=1 rather than with Y1=−7 when z=9, and to transmit Y with Y=5 rather than Y1=1 when z=17, in consideration of the array of the original coefficient z. This is because the probability of occurrence of z=9 is higher than z=17. FIG. 85A, B show graphs of the data separation by the data division circuit 71 with the original coefficient z plotted along the abscissa and division coefficient X, Y plotted along the ordinate. The solid circle (●) in FIG. 85A, B represents a case where the value of that point is included and the empty circle (○) indicates a case where the value of that point is not included. The above method of division will be referred to as the amplitude division method.

Decimal number data (the result of division) x'=z/16 which is output from the divider circuit 76 is rounded to 0 in the rounding circuit 77 in a range where $-8 \leqq z \leqq 8$ excluding z=0, thereby to output an integer X=0. In a range where $z < -8$, 0.49* is subtracted from x'=z/16 and the decimal fraction is discarded to output an integer X. In a range where $z > 8$, 0.49* is added to x'=z/16 and the decimal fraction is discarded to output an integer X. Output data from the rounding circuit 77 is input to the memory 81. The memory control circuit 82 controls the memory 81 so that data other than z=0 is written onto the memory 81 according to the result of checking 0 which is detected by the data discrimination circuit 75. Data of z=0 is removed at this stage. In this embodiment, it is assumed that the memory 81 comprises two memory blocks and, while X data is generated in one memory block, generated data is read from another memory block. In order to simplify the control operations in latter stages, it is assumed that all the contents of the memory block wherein the data is generated is reset to 0 at the head of the DCT block.

For Y, on the other hand, Y=0 when z=0, and the value of the original coefficient z is given as it is for Y in a range where $-8 \leqq z \leqq 8$ except for z=0, namely in a range where X1=0. This means that the coefficient Y1 is given as the residue when the original coefficient z is divided by the integer "a" which is not less than 2. In a range where $z < -8$, Y is converted to integers of small absolute values 1, −1, 2, −2, . . . in the descending order of the integer Y1 obtained by Y1=z−16×X1. That is, Y is set to 1 when z=−9, and thereafter converted to −1, 2, −2, 3, −3, 4, −4, 5, −5, 6, −6, 7, −7, 8, −8 from Y1=z−16×X1 as the value of the original coefficient z decreases in a range $z \geqq -24$, namely in a range where X1=−1. The same conversion is repeated thereafter with a period wherein the value of the original coefficient z decreases by 16, namely the interval where X1 takes the same value.

In a range of $z > 8$, the coefficient Y is converted to an integer of small absolute value such as +1, −1, +2, −2, . . .

in the ascending order of the integer Y1 obtained by Y1=z−16×X. That is, Y is set to 1 when z=9, followed by −1, 2, −2, 3, −3, 4, −4, 5, −5, 6, −6, 7, −7, 8, −8 from Y1=z−16×X1 as the value of the original coefficient z increases in a range z≦24, namely in a range where X1=1. The same conversion is repeated thereafter with a period wherein the value of the original coefficient z increases by 16, namely the interval where X1 takes the same value.

The operation in the 20th embodiment will be described below with reference to the encoding algorithm shown in FIG. 86. Incoming digital video data is, after being subjected to DCT transformation, checked to detect the maximum amplitude of the AC coefficients in a DCT block thereby to determine the classification. Classified DCT coefficient data is zig-zag scanned to change the order of output, then quantized.

Now the classification will be described-briefly below. Generally in a high-efficiency encoding apparatus based on DCT transformation, DCT blocks which have undergone the DCT transformation are classified by the amplitude of the coefficient. Classification here refers to grouping of the DCT blocks into the predetermined number of classes by the maximum amplitude of the DCT coefficients (AC coefficient data in this embodiment) included in each DCT block, at the time of encoding. The class discrimination circuit 70 detects the maximum amplitude of the DCT coefficients in the incoming DCT block and classifies the data included in a DCT block into four predetermined classes, while sending the class information to the switch 72 and to the data synthesis circuit 69. The quantizer 3 divides the amplitude of the DCT coefficient which is input by the class information by a predetermined constant to limit the amplitude, then quantizes the data according to the rate control variable K, although detail of the operation will not be given here. The class information is transmitted together with the encoded data.

When dividing the quantized data, the amplitude division method is used in combination with the run-length division method, for data having a great amplitude which results in lower efficiency of dividing with the 1-run 0-run run-length dividing method described in the fifth embodiment. Thus data which has been determined by the class discrimination circuit 70 to have amplitude not less than a specified class is divided into X and Y by the amplitude division method. In this embodiment, those having maximum amplitude whose absolute value is within 8 is classified into class 0, those over 8 up to 16 into class 1, those over 16 up to 24 into class 2, and those over 24 is classified into class 3. A method of dividing the data is switched at level 1 (indicated by b in FIG. 86). That is, coefficients of DCT blocks belonging to classes 1, 2 and 3 are first divided into X and Y data by the amplitude dividing method.

X data divided by the amplitude division method is subjected to 0-run length coding and 2-dimensional variable-length encoding. Y data also divided is mixed with data of a class lower than a specified level, then subjected to 1-run 0-run run-length coding. Specifically, data which is input first is subjected to 1-run length coding with the run of 1, then the run data is subjected to 0-run length coding with the run of 0, then subjected to 2-dimensional variable-length encoding. Coefficient data is also subjected to 0-run length coding with the run of 0, then subjected to the 2-dimensional variable-length encoding. Data which has been divided by the 1-run 0-run run-length coding and subjected to 2-dimensional variable-length encoding is synthesized, then the amount of encoded information is calculated thereby to output the rate control variable K.

Figure 86:
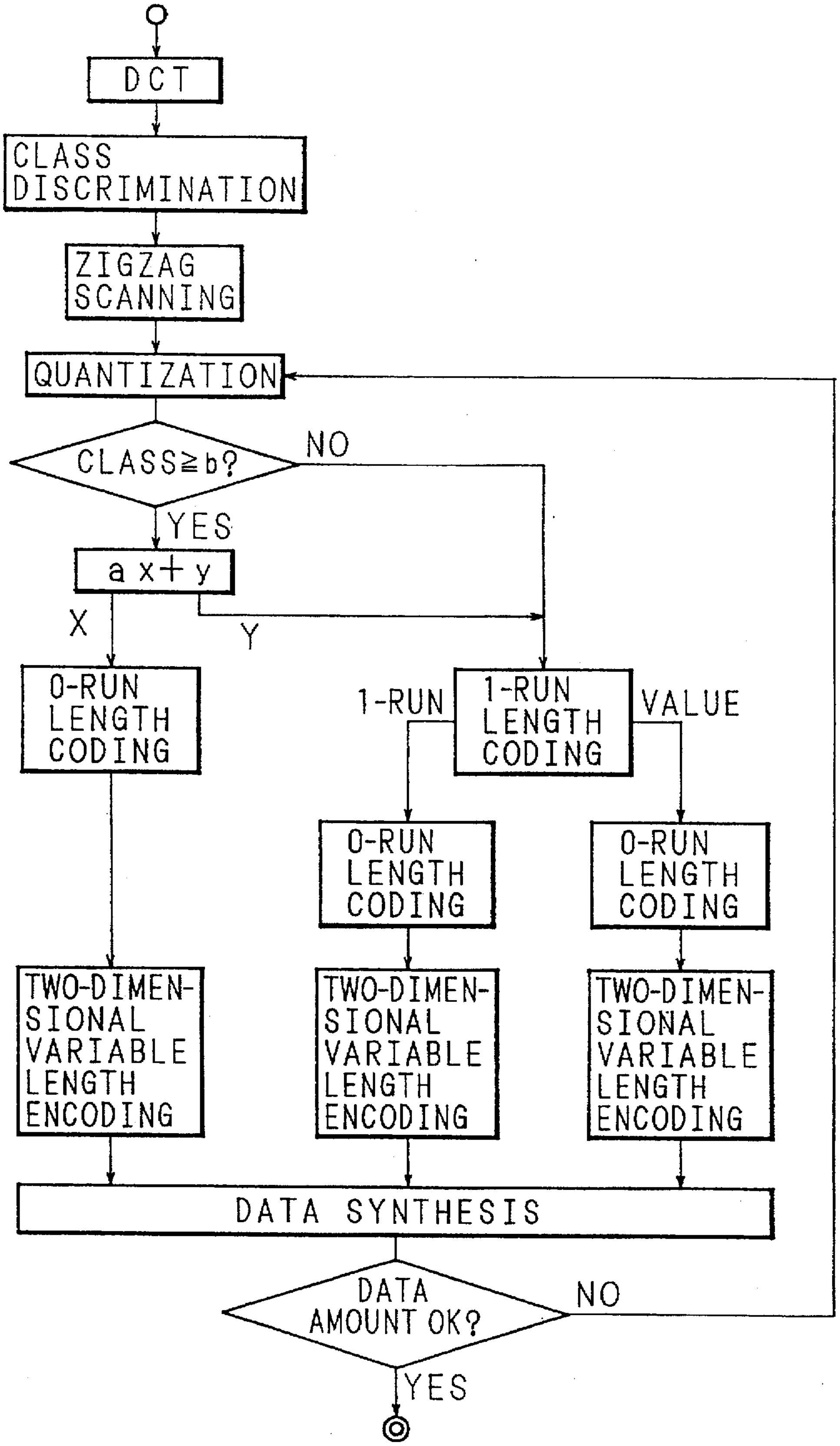
FIG. 86 is a drawing illustrative of the encoding algorithm in the twentieth embodiment.

Computer simulation by the algorithm shown in FIG. 86 showed a reduction of about 4% in the entire amount of data. During run-length coding of the data with value 1, events +1 and −1 are not distinguished while the data resulting from 1-run length coding and the same number of code bits as the number of +1 and −1 events are transmitted. In this simulation, only the AC coefficients in the DCT blocks were handled.

The operation of the 20th embodiment will be described in detail below, with the above description as the basis. The operations of the shuffling circuit 1 and the DCT transformer 2 are the same as those of the first embodiment. Output of the DCT transformer 2 is input to the class discrimination circuit 70 where it is classified in the above procedure, while the class information is being outputted. The data which has been quantized in the quantizer 3 is supplied to the data division circuit 71 and the switch 72.

The input data to the data division circuit 71 is checked in the data discrimination circuit 75 to determine whether it is 0 or not, while 0-discrimination signal of the original coefficient z is input to the conversion table 80 and to the memory control circuit 82. Data which has been determined to be 0 in the data division circuit 71 is transmitted on Y side without sending data on X side, as described above. Output data from the data discrimination circuit 75 is divided by a predetermined constant "a" (the constant "a" is assumed to be 16 as described above in the description that follows) by the equation described above in the divider 76. The result of the dividing operation output from the divider circuit 76 is provided with an offset of 0.49* when the input data is not less than 0 or −0.49 when the input data is negative, then rounded to an integer to calculate the above-mentioned X1 and Y1 which are output to the multiplier 78 and the memory 81.

Figure 85B:
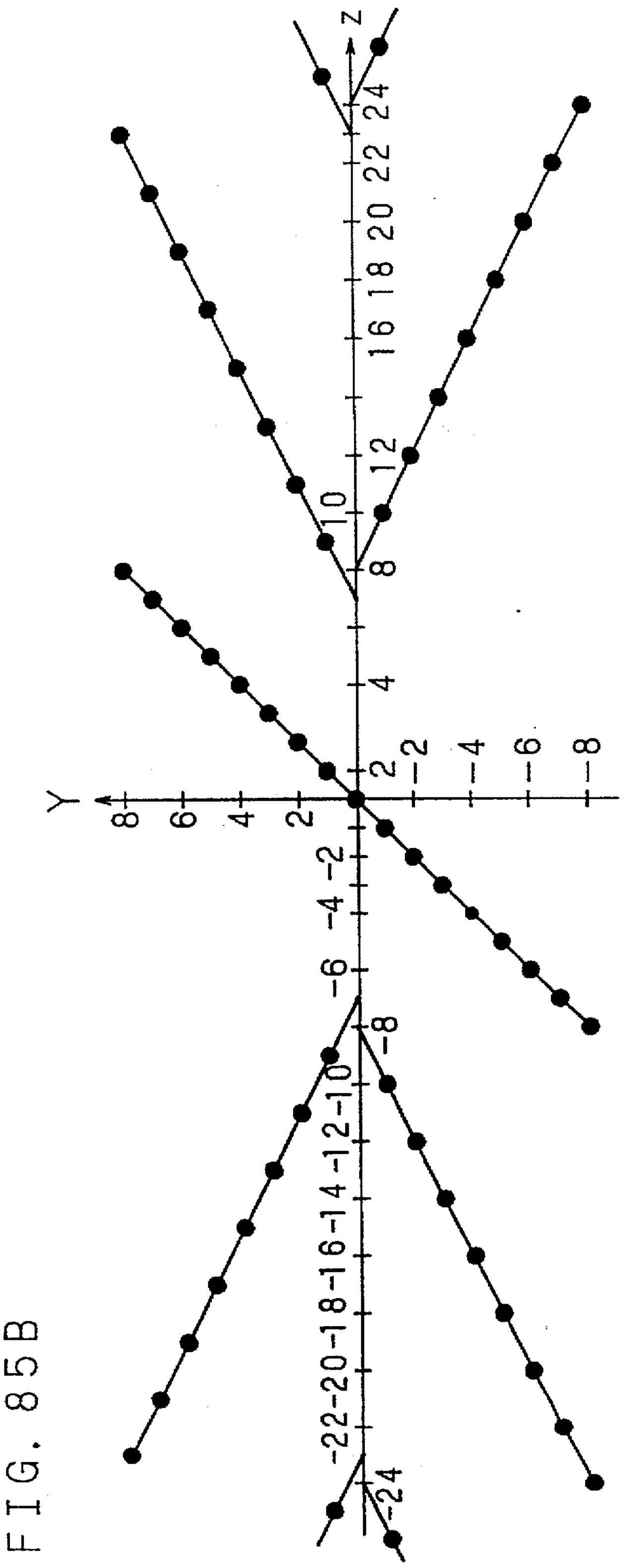

The multiplier 78 multiplies the input data by the constant "a". Output data from the quantizer 3 is input to the subtractor 79 where it is subtracted by the result of multiplication. Output (X1) from the rounding circuit 77, the result of the subtraction (Y1) and the result of 0 discrimination are input to the conversion table 80, so that the integer Y is output in the procedure described above (FIG. 84, FIG. 85). On the other hand, the memory control circuit 82 controls so that only the X1 data is written onto the memory 81 when z≠0 based on the result of 0discrimination which is output from the data discrimination circuit 75. By the above operation, data which is read from the memory 81 excluding 0 data at the time of z=0 is output.

X data which is output from the data division circuit 71 is subjected to 0-run length coding in the data division circuit 73, and subjected to 2-dimensional variable-length encoding in the variable-length encoder 74. The operation of the variable-length encoder 74 will be described in detail later. The Y data which has been separated in the data division circuit 71 is supplied to the switch 72. The switch 72 switches between the data which is out putted from the quantizer 3 and the Y data, according to the result of class discrimination by the classification circuit 70. Output of the switch 72 is input to the data division circuit 111 where it is subjected to 1-run length coding. The 1-run length data separated in the data division circuit 111 is subjected to 0-run length coding in the data division circuit 112, then to the 2-dimensional variable-length encoding in the variable-length encoder 114. Similarly, coefficient data separated in the data division circuit 111 is subjected to 0-run length coding in the data division circuit 113, then to 2-dimensional variable-length encoding in the variable-length encoder 115. The content of the Huffman code of the encoding table **4*b* is made different between the variable-length encoder 74, the variable-length encoder 114 and the variable-length encoder 115**.

Outputs of the variable-length encoder 74, the variable-length encoder 114 and the variable-length encoder 115 are input to the data synthesis circuit 69, which determines whether or not to synthesize the output of the variable-length encoder 74 according to the class information supplied from the class discrimination circuit 70. Because reduction in the amount of encoded information by means of the amplitude division cannot be expected for data of class 0 because of smaller amplitude of input to the quantizer 3 as described above, division-encoding is carried out only by the 1-run 0-run run-length division method. For data of a specified class or higher, the data synthesis circuit 69 synthesizes the outputs of the variable-length encoder 74, the variable-length encoder 114 and the variable-length encoder 115 and, when the data is below the specified level, synthesizes the outputs of the variable-length encoder 114 and the variable-length encoder 115 only, thereby reducing the amount of information. The operation of the data synthesis circuit 69 will be described in detail later. The operations that follow are the same as those of the first embodiment, and therefore a description thereof will be omitted.

The constitution and the operation of the variable-length encoder 74 in the 20th embodiment will be described below. The variable-length encoder is related to the constitution of the Huffman code table used to apply 2-dimensional variable-length encoding to the divided data in a high-efficiency encoding apparatus employing the amplitude division-encoding method, 1-run 0-run run-length coding and classifying encoding method. The encoding method of this embodiment described above will be referred to as the first division-encoding method hereafter.

Figure 87:
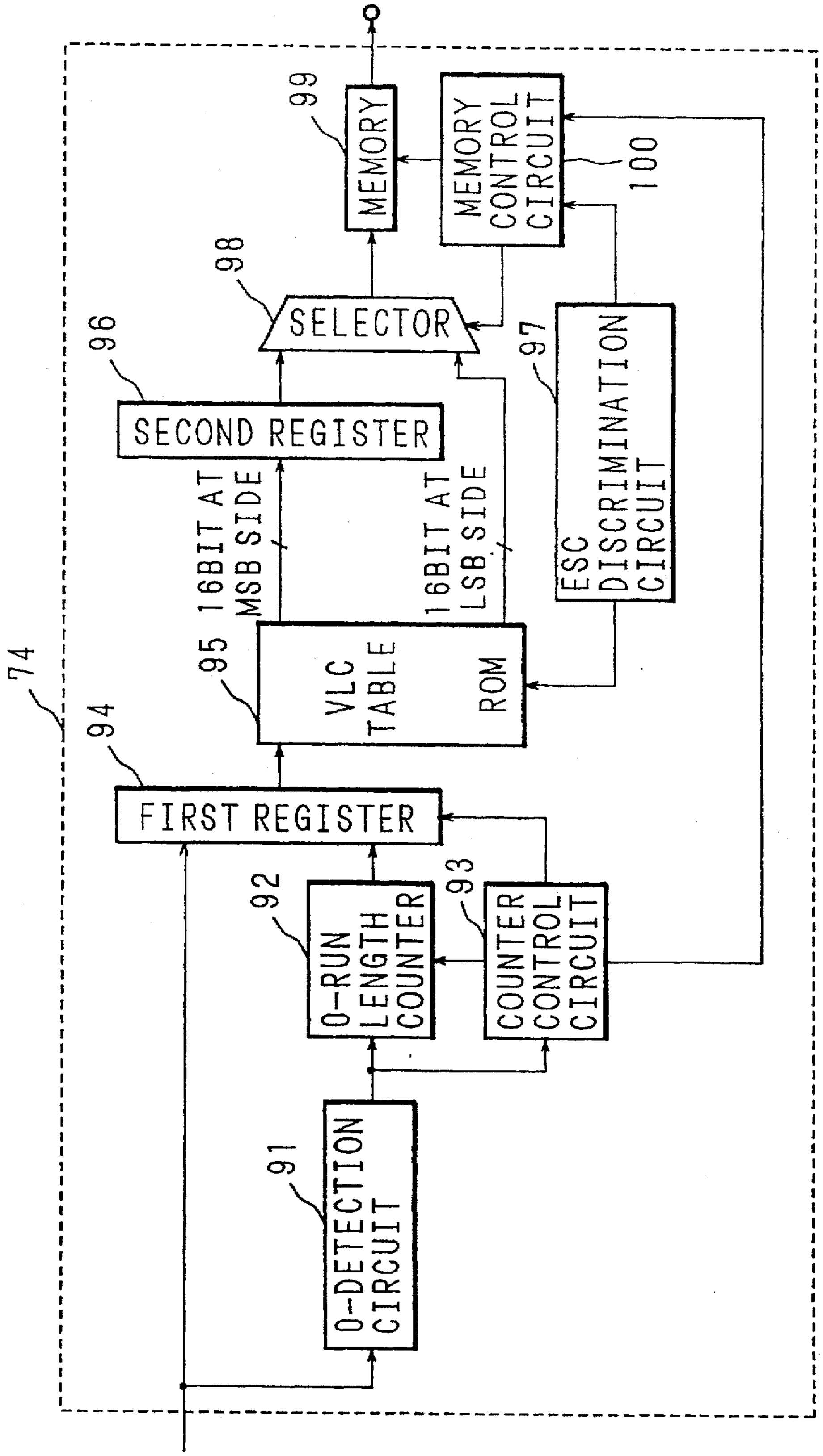
FIG. 87 is a block diagram illustrative of the variable-length encoder of FIG. 82.

FIG. 87 is a block diagram illustrative of the inner constitution of the variable-length encoder 74 shown in FIG. 82. The variable-length encoder 74 has a 0-detection circuit 91 which determines whether the input digital data is 0 or not, a 0-run length counter 92 which counts the 0-run length which is detected in the 0-detection circuit 91, a counter control circuit 93 which controls the 0-run length counter 92, a first register 94 which holds the sets of 0-run length data and coefficient data comprising 0-run length data and data other than 0 (coefficient data) following the 0-run length, a VLC table 95 which assigns predetermined Huffman codes to data (0-run length data and coefficient data) output from the first register 94, a second register 96 which holds 16 bits on the MSB (most significant bits) side of the output from the VLC table 95, an ESC discrimination circuit 97 which discriminate escape code (abbreviated as ESC hereafter) in the output data of the VLC table 95, a selector 98 which selects the output code according to the ESC detection which is output from the ESC discrimination circuit 97, a memory 99 wherein the code selected by the selector 98 is written, and a-memory control circuit 100 which controls the write/read access of the code to the memory 99. When generating the above Huffman codes, the Huffman codes are assigned according to the frequency of the event. At this time, it is possible not to assign the Huffman codes directly to events of low frequency of occurrence but to directly transmit the run length data and coefficient data after the predetermined ESC, thereby to reduce the number of Huffman codes. In this embodiment, ESC is assigned to events of lower frequency of occurrence.

Now the operation of the variable-length encoder 74 will be described below. Data 0 is detected in the incoming digital data in the 0-detection circuit 91. The 0-run length counter 92 counts the 0-run length based on data 0 which is detected in the 0-detection circuit 91. Upon detection of numerical data other than 0 in the 0-detection circuit 91, the counter control circuit 93 sends a counter control signal to the 0-run length counter 92 to set the count of the 0-run length counter 92 to 0 while the values of the coefficient data and the 0-run length are latched in the first register 94.

Based on the output data (0-run length data, coefficient data) from the first register 94, the VLC table 95 outputs predetermined Huffman codes. The VLC table 95 outputs Huffman codes of up to 16 bits on the MSB side and 16 bits on LSB side. The number of output bits and the constitution of the memory will be described later. The MSB data from the VLC table 95 is temporarily latched in the second register 96.

On the other hand, the output data on LSB side from the VLC table 95 is input to the ESC discrimination circuit 97 which determines whether the data is ESC or not. When the ESC discrimination circuit 97 does not ascertain that the data is ESC, the selector 98 selects the output on the MSB side held in the second register 96 and writes them onto the memory 99. When the ESC discrimination circuit 97 ascertains that the data is ESC, the selector 98 first selects the output on the LSB side then selects the output on the MSB side, and writes them onto the memory 99. The memory control circuit 100 generates a write control signal for the memory 99 according to the write enable signal which is sent from the counter control circuit 93 and the result of ESC detection which is output from the ESC discrimination circuit 97, and writes the code onto the memory 99. The detailed operation of writing the code onto the memory 99 will be described later. The code which is read from the memory 99 is output.

The operation of writing the code onto the memory 99 will be described in detail below taking a specific example with reference to FIG. 88 through FIG. 91. In the 2-dimensional Huffman encoding, as mentioned in conjunction with the prior art, DCT coefficient data which has been read from the DCT transformer 2 in zig-zag scanning and quantized is rearranged into sets of 0-run length data and coefficient data, and encoded by assigning short Huffman codes to events of high probability of occurrence and long Huffman codes to events of low probability of occurrence.

FIG. 88, FIG. 89, FIG. 90 show examples of the first VLC code length table, the second VLC code length table and the third VLC code length table generated by determining the probability of occurrence of actual data (0-run length data, coefficient data) for three groups of data which have been divided by applying the first division encoding operation to a plurality of kinds of video data, and determining the Huffman code length to be assigned to each event.

The meaning of the VLC table will be described below. FIG. 88 shows the first VLC code length table which gives the code length of the Huffman code used in the variable-length encoder 74. Numbers 0 through 63 from top to bottom of the drawing represent the code lengths of the 0-run length data and coefficient data obtained by applying 0-run length encoding to data X, and numbers 1 through 16 from left to right represent the coefficient data. The code length does not include sign bits.

FIG. 89 shows the second VLC code length table which gives the code length of the Huffman code used in the variable-length encoder 114. Numbers 0 through 63 from top to bottom of the drawing represent the 0-run lengths of the 0-run length data and coefficient data obtained by applying 0-run length encoding to the 1-run length data of data Y, and numbers 1 through 63 from left to right represent the coefficient data. The variable-length encoder 114 applies 0-run length encoding to the 1-run length data during 1-run length encoding, where only coefficients of positive values exist.

FIG. 90 shows the third VLC code length table which gives the code length of the Huffman code used in the variable-length encoder 115. Numbers 0 through 63 from top to bottom of the drawing represent the 0-run length values of the 0-run length data and coefficient data obtained by applying 0-run length encoding to data Y, and numbers 2 through 255 from left to right represent the coefficient data. The code length does not include a sign bit. The coefficient data in the third VLC code length table does not include 1, because 0-run length encoding is applied to coefficient data obtained by applying the 1-run length encoding to the data Y and therefore no coefficient having a value 1 exists.

In the first through the third VLC code length tables, occurrence probability of events is low in a portion where code length is not assigned to the events of 0-run length data and coefficient data and, when events of this portion take place, ESC which has been encoded beforehand, actual 0-run length data and coefficient data are sent with fixed length. The first VLC code length table requires 7 bits for ESC, 6 bits and 4 bits for 0-run length data and coefficient data, respectively in fixed length. Adding the sign bit to the above, ESC code requires 18 bits in all.

The second VLC code length table requires 8 bits for ESC, 6 bits and 6 bits for 0-run length data and coefficient data, respectively in fixed length. ESC code requires 20 bits in all.

In the third VLC code length table, two ESC codes, ESC1 and ESC2 are provided. ESC1 and ESC2 are defined as the ESC of the events in two portions (indicated as ① and ② ) given by separating the portion not assigned with the code length of the third VLC code length table as shown in FIG. 90. Thus the third VLC code length table requires 9 bits for ESC1, 6 bits and 3 bits for 0-run length data and coefficient data, respectively in fixed length. Adding the sign bit to the above, ESC1 code requires 19 bits in all for the portion ①. In the portion ②,9 bits for ESC2, 6 bits and 8 bits for 0-run length data and coefficient data, respectively in fixed length, and adding the sign bit to the above, 24 bits in all is required in the case of ESC2.

When the class information is processed properly, all the data subjected to 1-run length coding all fall within 8 and the Huffman code for the portion ② is not necessary. However, in the case of consumer digital VTR, reproduced picture quality may be improved by decreasing the class information of the DCT blocks such as red portions and contours of image where deterioration of the picture quality tends to be pronounced, thus decreasing the amplitude limitation level in the quantizer 3. In such a case amplitude of data subjected to 1-run length coding may sometimes exceed 8, making it necessary to assign the Huffman code to the portion ②. Usually, probability of occurrence of events of portion ① is higher than that of ②.

In the case where two ESC codes are not provided, for example when one 7-bit codes is provided for ESC instead of providing ESC1 and ESC2 both 9-bit long, the code length for ESC becomes always 23 bits (8 bits for ESC plus 6 bits of fixed length 0-run length data plus 8 bits of fixed length coefficient data plus 1 bit of code), resulting in excessive amount of data. Thus providing two ESCs as in this example makes it possible to efficiently reduce the amount of data.

Figure 91:
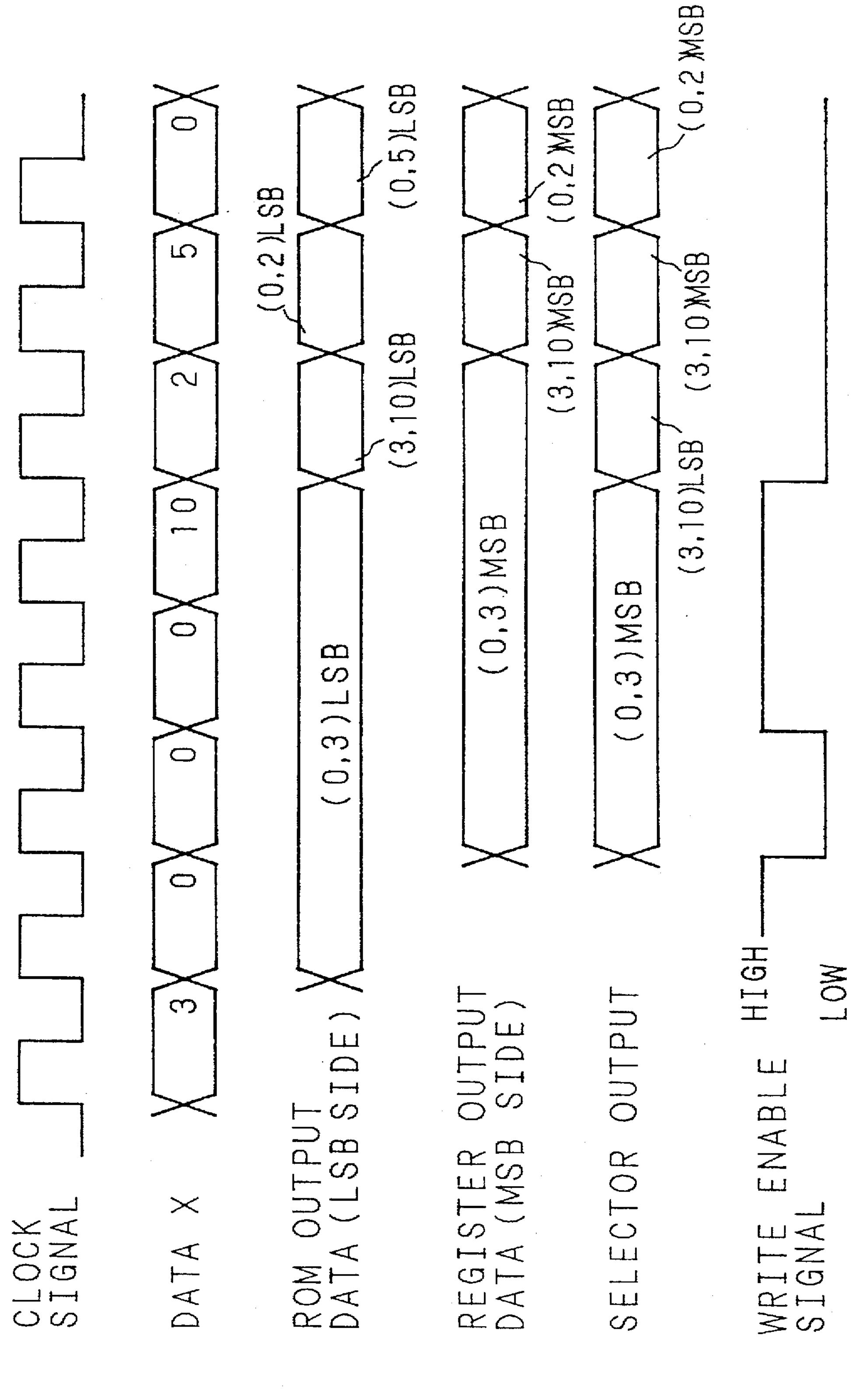
FIG. 91 is a timing chart explanatory of the operation of the variable-length encoder in the twentieth embodiment.

The operation of writing coefficient data X onto the memory 79 in the variable-length encoder 74 will be described below with reference to FIG. 91. Data X is input with one coefficient in one clock period as 3, 0, 0, 0, 10, 2, 5, 0, 0, 0, as shown in FIG. 91. The input data X is checked by the 0-detection circuit 91 to determine whether it is 0 or not. During 0-detection in the 0-detection circuit 91, the 0-run length counter 92 applies 0-run length coding by counting the 0-run length.

Specifically, events (0, 3), (3, 10), (0, 2), (0, 5), . . . are constructed and output to the first register 94. The VLC table 95 assigns predetermined Huffman codes to the sets of 0-run length data and coefficient data which are output from the first register 94. Code lengths assigned by the first VLC code length table shown in FIG. 88 at this time are 9 bits, 18 bits, 7 bits, 18 bits and so on including the sign bits, in order. The VLC table 95 outputs Huffman codes of up to 16 bits on the MSB side and up to 16 bits on the LSB side.

Output data on the MSB side (register output data) from the VLC table 95 is temporarily held in the second register 96. On the other hand, the VLC table 95 sends an ESC detection signal to the ESC detection circuit 97, where it is determined whether it is ESC or not. When the ESC discrimination circuit 97 does not ascertain that the data is ESC, the selector 98 selects the output data on the MSB side held in the second register 96 as shown in FIG. 91 and writes them onto the memory 99. When the ESC discrimination circuit 97 ascertains that the data is ESC, the selector 98 first selects both the ROM output on the LSB side and the register output on the MSB side, and the memory control circuit 100 controls so that they are written onto the memory 99 in the order of LSB and MSB when the write enable signal generated by the counter control circuit 93 is low.

Specifically, because the first event (0, 3) in the data X described above is not ESC, register output data (9 bits) on MSB side is selected and written onto the memory 99. The next event (3, 10) is ESC and therefore the selector 98 selects the ROM output on the LSB side (16 bits) and the register output on the MSB side (9 bits) and writes them onto the memory 99. With regards to the timing of writing data onto the memory, a period of three clock cycles is available for the operation of writing the data because there are three 0-run lengths between the preceding event (0, 3) and the event (3, 10), thus allowing to write both LSB side data of 93, 10) and the MSB side data of 93, 10) in the memory 99. The event (0, 2) that follows the 93, 10) is not ESC, and therefore the register output (7 bits) on the MSB side is written in the memory 99.

Figure 92:
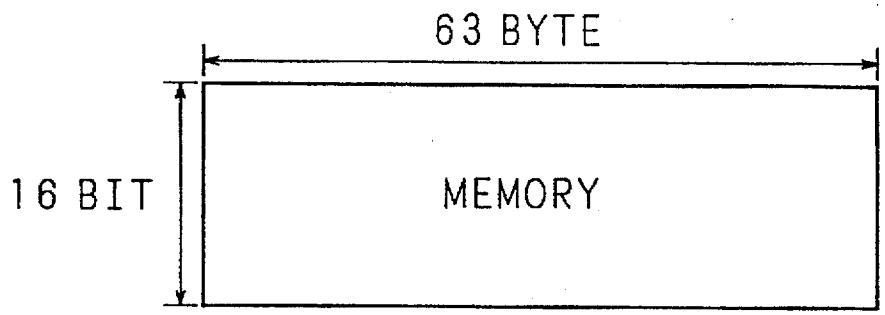
FIG. 92 is a drawing illustrative of the memory used in the variable-length encoder of the twentieth embodiment.

FIG. 92 shows the constitution of the memory 99 used in the variable-length encoder 74. As shown in FIG. 92, the memory 99 comprises 63 bytes which corresponds to the number of AC coefficients in one DCT block, each byte consisting of 16 bits.

Figure 93:
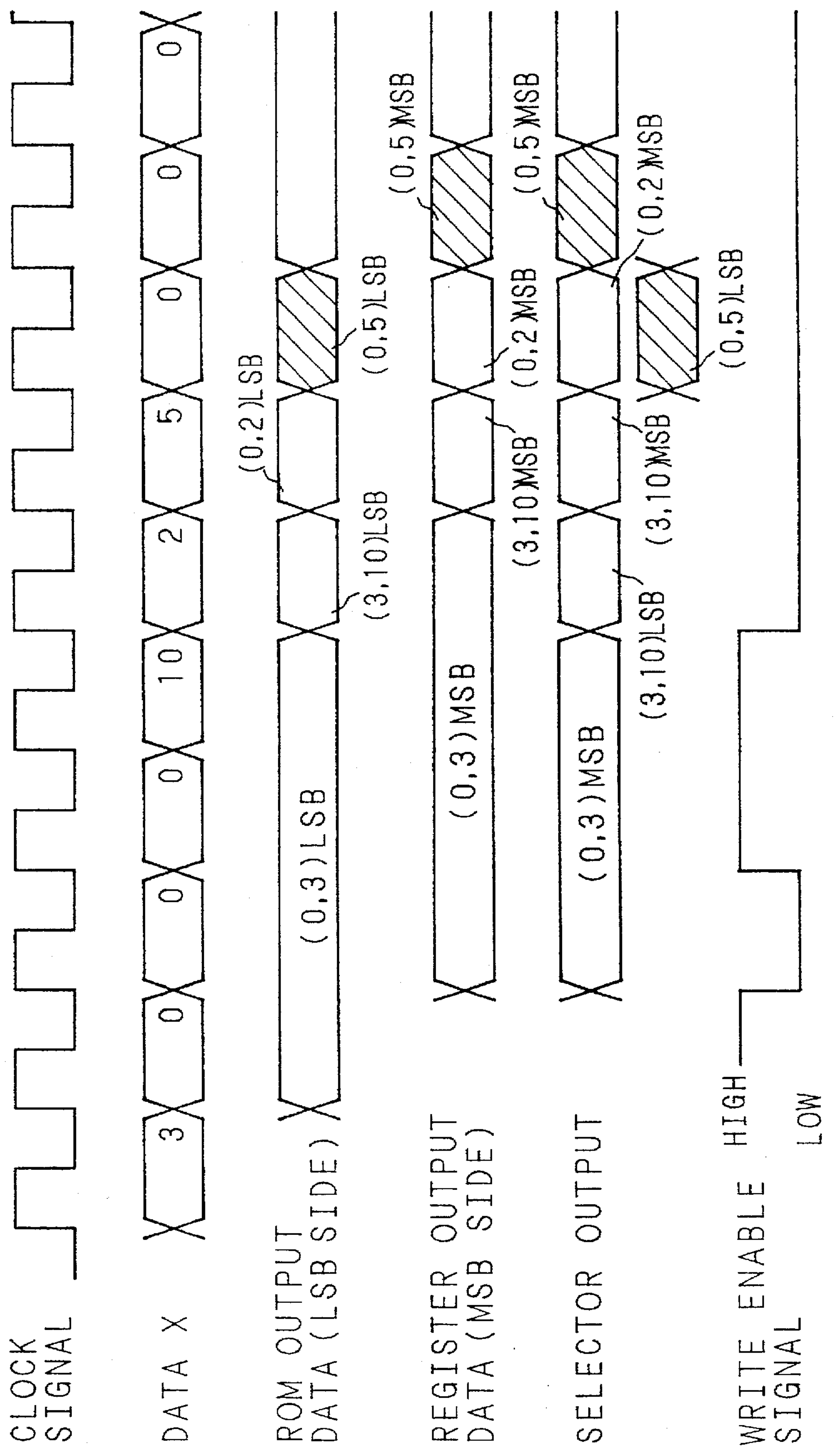
FIG. 93 is a timing chart explanatory of the operation of the variable-length encoder of the twentieth embodiment.

The rest of the operation of writing the coefficient data X shown in FIG. 91 in the memory 99 will be described below with reference to FIG. 93. The events (0, 3), 93, 10), (0, 2) are written in the memory 99 as described above. The next event (0, 5) which is ESC is written as follows. While the selector 98 selects the ROM output data (16 bits) on the LSB side and the register output data (16 bits) on the MSB side, the event (0, 5) has 0-run length of 0 and data corresponding to only one clock cycle can be written and therefore only the 16 bits of the register output data on the MSB side can be written. Consequently, 18-bit Huffman code cannot be written leading to a failure of writing in the memory 99.

Figure 94:
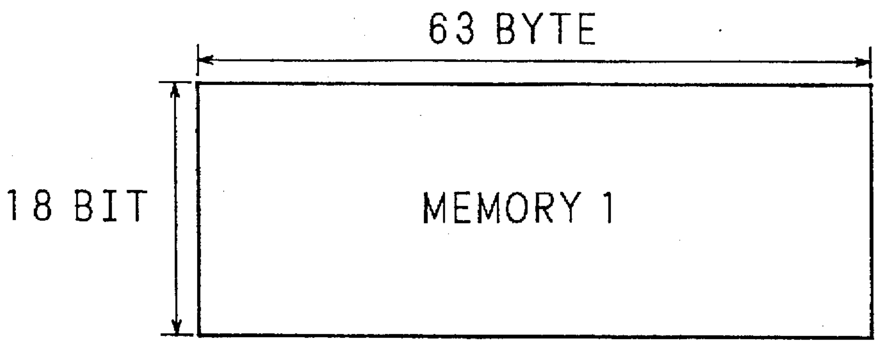
FIG. 94 is a drawing illustrative of the memory used in the variable-length encoder of the twentieth embodiment.

Such a failure in writing in the memory 99 may be avoided by employing such a constitution as shown in FIG. 94 for the memory 99. That is, use of 18-bit memory corresponding to the maximum code length (in the case of ESC) used in the VLC table 95 makes it possible to output up to 18-bit data on both the LSB side and MSB side, thereby allowing to write 18-bit Huffman code (ESC) on MSB side alone without failure, even when ESC follows events whose 0-run length is 0.

However, memories in common use are of 16-bit or 32-bit constitution. A memory of 18-bit constitution is not common and a 32-bit memory has twice the storage capacity and is too expensive. In a high-efficiency encoding apparatus employing division encoding process as in this embodiment, in particular, it is important to reduce the memory capacity.

Figure 95:
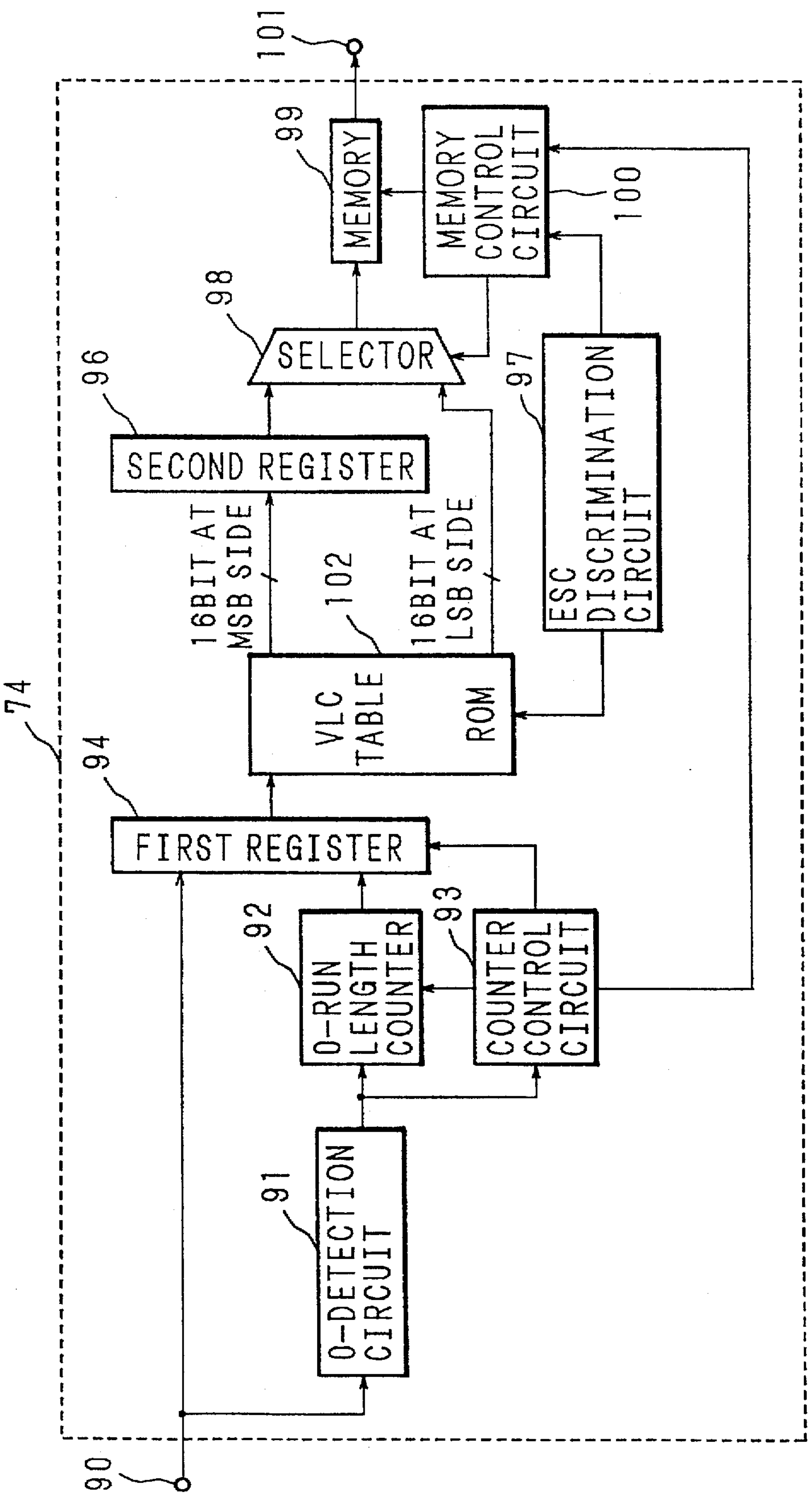
FIG. 95 is a block diagram illustrative of the variable-length encoder of FIG. 82.

Solving such a problem requires to review the constitution of the VLC table. FIG. 95 shows a block diagram illustrative of the other inner constitution of the variable-length encoder 74. The constitution shown in FIG. 95 is the same as that shown in FIG. 87 except for replacing the VLC table 95 with the VLC table 102.

FIG. 96, FIG. 97, FIG. 98 show the code lengths of the fourth through sixth Huffman codes used in the variable-length encoder 74 of such a constitution as shown in FIG. 95. The fourth VLC code length table, the fifth VLC code length table and the sixth VLC code length table are shown which are constituted so that probability of occurrence of actual events (0-run length data and coefficient data) is determined for three groups of data divided by the first division encoding method, and the code length including the sign bit becomes within 16 bits for events whose 0-run length is 0.

FIG. 96 shows the fourth VLC code length table used in the variable-length encoder 74. FIG. 97 shows the fifth VLC code length table used in the variable-length encoder 114. FIG. 98 shows the sixth VLC code length table used in the variable-length encoder 115. The meaning of the fourth through sixth VLC code length tables will be described below.

In the first through third VLC code length tables, ESC code length is determined to be a fixed length based on the code length of one ESC which is encoded in advance, actual 0-run length data and coefficient data. In the fourth through sixth VLC code length tables, two codes are provided as the ESC. One is ESCI which is ESC on the 0-run length side, and another is ESC2 which is ESC on the coefficient data side. In the fourth VLC code length table shown in FIG. 96, numbers 0 through 61 from top to bottom represent the 0-run length values of the data (0-run length data, coefficient data) obtained by applying 0-run length encoding to the data X, and numbers 0 through 16 from left to right represent coefficient data. A string of 0's in the coefficient data (portion indicated as 14, 14, . . . , 14 vertically in the drawing) indicates the code length of ESC on the 0-run length data side at the time of ESC (code length of ESC1(8 bits)+fixed length of 0-run length (6 bits)).

The method of adding ESC code indicated with * in FIG. 96, FIG. 97, FIG. 98 will be described below. ESC is generated as follows. In the fourth VLC code length table, ESC is represented by two kinds of codes; a code ((each 0-run length data)−1, coefficient data 0) and a code (0-run length data 0, each coefficient data). The code length indicated in FIG. 96, FIG. 97, FIG. 98 does not include sign bits.

In the fifth VLC code length table of FIG. 97 which shows the code length of Huffman code used in the variable-length encoder 114, numbers 0 through 61 from top to bottom represent the 0-run length values of the event (0-run length data, coefficient data) obtained by applying 0-run length encoding to the 1-run length data side of the data Y, and numbers 0 through 63 from left to right represent coefficient data. The method of generating the string of 0's in the coefficient data (the portion indicated as 15, 15, . . . , 15 vertically in the drawing) and ESC is the same as that in the case of the fourth VLC code length table, and a description thereof will be omitted.

In the sixth VLC code length table of FIG. 98 which shows the code length of Huffman code used in the variable-length encoder 115, numbers 0 through 61 from top to bottom represent the 0-run length values of the event (0-run length data, coefficient data) obtained by applying 0-run length encoding to the data Y, and numbers 0 and 2 through 255 from left to right represent coefficient data. The method of generating the string of 0's in the vertical direction (the portion indicated as 15, 15, . . . , 15 vertically in the drawing) and ESC is the same as that in the case of the fourth VLC code length table, and a description thereof will be omitted. The coefficient data in the sixth VLC code length table does not include 1, because 0-run length encoding is applied to coefficient data obtained by applying the 1-run length encoding to the data Y and therefore no coefficient data having a value 1 exists.

The operation of writing coefficient data X onto the memory 99 in the variable-length encoder 74 of such a constitution as shown in FIG. 95 will be described below. The data X is input one coefficient in one clock period as 3, 0, 0, 0, 10, 2, 5, 0, 0, 0, as shown in FIG. 93. Input data X is checked by the 0-detection circuit 91 to determine whether it is 0 or not. The 0-run length counter 92 counts the 0-run length based on 0 detected by the 0-detection circuit 91.

Upon detection of numerical data other than 0 in the 0-detection circuit 91, the counter control circuit 93 sends a counter control signal to the 0-run length counter 92 and outputs a latch control signal to the first register 94. The coefficient data and the 0-run length are latched in the first register 94 based on the latch control signal. Specifically, events (0, 3), 93, 10), (0, 2), (0, 5), are output from the first register 94. The VLC table 102 assigns predetermined Huffman codes to the events (0-run length data and coefficient data) which are output from the first register 94. Code lengths assigned by the first VLC code length table shown in FIG. 96 at this time are 9 bits, 27 bits (14 bits on the 0-run length data side plus 13 bits on the coefficient data side in the coordinate), 7 bits, 13 bits and so on including the sign bits, in order.

The VLC table 102 outputs Huffman codes of up to 16 bits on the MSB side and up to 16 bits on the LSB side. Data on the MSB side which is output from the VLC table 102 is temporarily held in the second register 96. On the other hand, the VLC table 102 sends ESC discrimination signal to the ESC discrimination circuit 97, where it is determined whether it is ESC or not. When the ESC discrimination circuit 97 does not ascertain that the data is ESC, the selector 98 selects the register output data on the MSB side held in the second register 96 as shown in FIG. 93 and writes them onto the memory 99.

When the ESC discrimination circuit 97 ascertains that the data is ESC, the selector 98 selects both the ROM output on the LSB side and the register output on the MSB side, and the memory control circuit 100 controls so that they are written onto the memory 99 in the order of LSB and MSB when the write enable signal generated by the counter control circuit 93 is low.

Specifically, because the first event (0, 3) in the data X described above is not ESC, register output data (9 bits) on the MSB side is selected and written onto the memory 99. The next event 93, 10) is ESC and therefore the selector 98 selects the ROM output on the LSB side (16 bits) and the register output on the MSB side (16 bits) in this order and writes them onto the memory 99. With regards to the timing of writing data onto the memory 99, a period of three clock cycles is available for the operation of writing the data because there are three 0-run lengths between the preceding event (0, 3) and the event 93, 10), thus allowing to write both LSB side data of 93, 10) and MSB side data of 93, 10) in the memory 99. The event (0, 2) that follows the 93, 10) is not ESC, and therefore the register output (7 bits) on the MSB side is written in the memory 99.

The next event (0, 5) which is ESC is written as follows. This event is ESC in the VLC table 95 described above. While the selector 98 selects the ROM output (16 bits) on the LSB side and the register output (16 bits) on the MSB side, the preceding event (0, 2) has 0-run length of 0 and data corresponding to only one clock cycle can be written and therefore only the 16 bits of the register output data on the MSB side can be written. Consequently, 18-bit Huffman code cannot be written resulting in a failure of writing in the memory 99. However, Huffman code length of the event (0, 5) is limited to 12 bits (13 bits including the sign bit) in the VLC table 102, and such a failure of memory writing operation is not caused with the 16-bit memory constitution shown in FIG. 92 even when the preceding event has 0-run length of 0. Thus normal operation of writing onto 16-bit memory is made possible even when events having 0-run length of 0 occur successively, by limiting the code length of events whose 0-run length is 0 within 16 bits.

The constitution of th e variable-length encoder 114 and the variable-length encoder 115 in the high-efficiency encoding apparatus of this embodiment is the same as that of the variable-length encoder 74, and the operation is also the same, therefore a description of the constitution and operation will be omitted.

The operation of the data synthesis circuit 69 will be described in detail below. FIG. 99A shows an output (X) of the variable-length encoder 74, FIG. 99B shows an output (R) of the variable-length encoder 114 and FIG. 99C shows an output (V) of the variable-length encoder 115. FIG. 99D shows the result of synthesis in the prior art, and FIG. 99E shows the synthesized output of the data synthesis circuit 69. FIG. 99 shows an example where the data is determined to belong to a class of the specified level or higher. Thus all outputs of the three variable-length encoders 74, 114, 115 are synthesized. In the prior art, outputs of the three variable-length encoders 74, 114, 115 are synthesized by means of time division multiplexing as shown in FIG. 99D. A sign bit of 1-run length during 1-run length coding is transmitted together with a variable length code word in the variable-length encoder 114 as described above.

In the data synthesis circuit 69 of this embodiment, on the other hand, outputs of the three variable-length encoders 74, 114, 115 are synthesized alternately as shown in FIG. 99E. Specifically, the first data (X0 data) which is output from the variable-length encoder 74, the first data (R0 data) which is output from the variable-length encoder 114 and the first data (V0 data) which is output from the variable-length encoder 115 which follow are synthesized. This is followed by similar processes by repeating the synthesis of the second data (X1 data) which is output from the variable-length encoder 74, the second data (R1 data) which is output from the variable-length encoder 114 and the second data (V1 data) which is output from the variable-length encoder 115, and so on (FIG. 99E). The order of synthesizing the data is not limited to that shown in FIG. 99E but may be arbitrary, provided that the outputs of the three variable-length encoders 74, 114, 115 are synthesized alternately.

In the case where data in the variable-length encoder 74 is emptied, for example, during synthesis, outputs of the variable-length encoder 114 and the variable-length encoder 115 are synthesized alternately. Also when data in two variable-length encoders is emptied, data from the remaining variable-length encoder is synthesized by time division multiplexing. FIG. 99 shows an example where data of the variable-length encoder 115 has the greatest length.

Figures 100A, 100B:
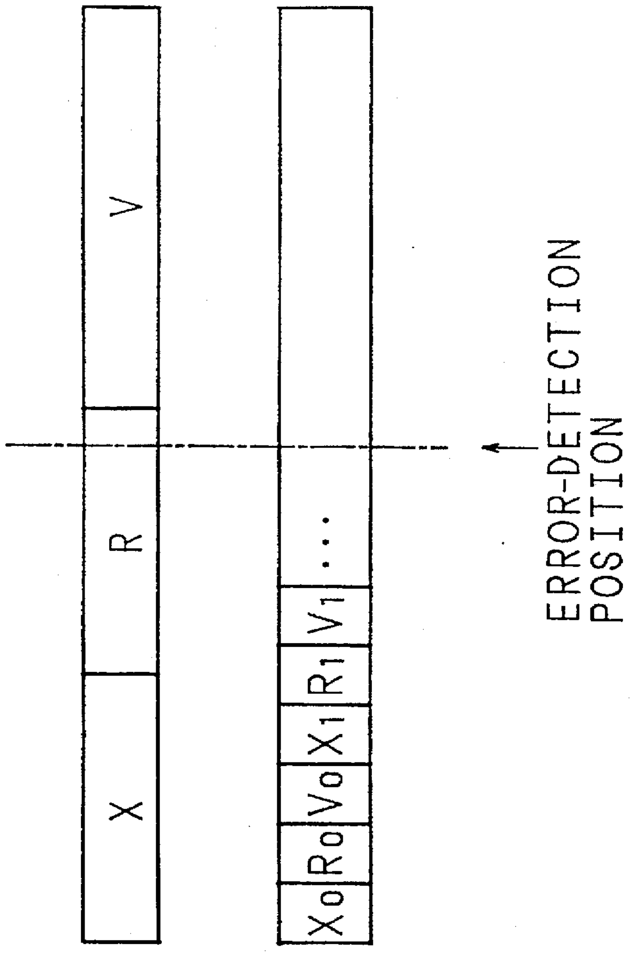
FIG. 100A, B are drawings for the explanation of the operation of the data synthesis circuit in the twentieth embodiment.

During recording of data in storage media such as digital VTR or transmission via radio, error correction codes are added to the data to correct errors generated during reception. A description of error correction codes will be omitted because it has no direct relevance to the spirit of the present invention. FIG. 100 shows the position of an error detected by the error correction code. In the case of Huffman code in general, when an error is detected in the reproduced signals, it is made impossible to reproduce the following data. That is, data that follows the point where the error has been detected cannot be decoded in FIG. 100. In the case of FIG. 100A, all the output data from the variable-length encoder 74 and most of the output data from the variable-length encoder 114 can be decoded, though data that follows the point where the error has been detected cannot be decoded, thus part of the output data from the variable-length encoder 114 and all of the output data from the variable-length encoder 115 cannot be decoded.

In a system where data is recorded or transmitted by dividing it into three parts as in this embodiment, data cannot be decoded at all unless three parts of the data are available during decoding. Consequently, with the conventional method of synthesis shown in FIG. 100A, an error taking place at such a position as shown in the drawing makes decoding of the data in this DCT block impossible at all.

With an output of the data synthesis circuit 69 as shown in FIG. 100B, on the other hand, data X0X1, . . . , R0R1, . . . , V0V1, . . . can be reproduced even when an error takes place at the same position as shown in FIG. 100A. In this case, although data of the high-frequency components in the DCT block cannot be reproduced by decoding the three parts of data through the use of reproducible data thereby synthesizing them, data in the low-frequency region can be reproduced. To what extent the data can be decoded depends on the shortest sequence of the result of decoding in the three results of decoding which have been possible. For example, when X lasts for 12 sequences, R lasts for 10 sequences and V lasts for 6 sequences, decoding of 1 run length is carried out for data of 6 sequences. When data of 9 sequences can be decoded, decoding is carried out using the data of the 9 sequence and X data of 9 sequence.

When the high-efficiency encoding system is used in a digital VTR or a digital recording disk player, data is reproduced intermittently during a special reproducing (especially high-speed reproducing) operation, and therefore such a case occurs frequently as the reproduction of data becomes impossible amid the DCT block as shown in FIG. 100. In such a case, data in the DCT block cannot be decoded making it impossible to synthesize good reproduced pictures. On the other hand, with the output of the data synthesis circuit 69, reproduced pictures can be constructed from the low-frequency components only although the high-frequency components in the DCT block cannot be reproduced, thus good special reproducing (especially high-speed reproducing) pictures can be obtained.

Because the amount of encoded information is reduced by means of variable-length encoding which is a reversible process in the above operation, it is made possible to reduce the encoded information to be transmitted without being accompanied by any deterioration of the picture quality in comparison to the high-efficiency encoding apparatus of the prior art. Also because classified data is transmitted together with the encoded data and the amplitude division encoding method is employed without adding a selection flag, amplitude division is not carried out in a portion of small amplitude where no effect of reducing the amount of data can be obtained with the amplitude division encoding method. In a DCT block having great amplitudes of DCT coefficients which do not ensure high efficiency of division by means of the 1-run 0-run run-length division method, the amplitude division encoding method is also employed together, thereby enabling it to efficiently reduce the amount of data.

Use of the division encoding method also makes it possible to reduce the total number of 3-table Huffman codes compared to a case where only the 1-run 0-run run-length division method is employed independently. The simulation showed that the number of codes can be reduced by about 66%.

The constitution described above makes it possible to effectively reduce the amount of encoded information to be recorded in a reversible process. This makes it possible, when this system is employed in the storage media such as digital VTR, to improve the picture quality without increasing the amount of encoded information to be recorded compared to the case of encoding by means of the high-efficiency encoding apparatus of the prior art. More specifically, the rate control variable K which is output from the rate control circuit 6 can be set to a smaller value than that of the prior art, corresponding to the reduction in the amount of encoded information, making it possible to improve the S/N ratio of the decoded pictures. Also it is made possible to obtain an effective variable-length encoder without increasing the memory capacity, resulting in cost reduction.

Although a case where data is classified into four classes in the 20th embodiment, the invention is not limited to this scheme. Also switching is carried out for data belonging to the lowest class of amplitude, the invention is not limited to this scheme and provides similar effect in such a constitution as the output of the data division circuit 71 is selected when the data is at other level, for example when classified into a class of the greatest amplitude which results in lower efficiency of division. Division of the data in the direction of amplitude is carried out according to the class information in this embodiment, the invention is not limited to this scheme and selection flag may be added according to the amplitude after quantization. It goes without saying that similar effects can be obtained with such a constitution as the selection flag is added only when the data is classified into a particular class.

Although 16-bit memory is used for the memory 99 in this embodiment, the invention is not limited to this scheme and 8-bit, 18-bit, 24-bit or other memory can be used to obtained the similar effects. FIG. 74 shows an example of division table in the case of employing 8-bit memory for the memory 99, for reference. The relationship between the original coefficient z and the separated coefficients X, Y is s imilar to that of the z and x, y shown in FIG. 73.

Although an input of the class discrimination circuit 70 is obtained from the output of the DCT transformer 2, the invention is not limited to this arrangement. Although the data division circuit 71 is constituted as shown in FIG. 83, the invention is not limited to this arrangement and another constitution may be employed. Although 0 data of the original coefficient z is transmitted on the Y side, the invention is not limited to this scheme and provides similar effect when data on the X side is run-length encoded and transmitted.

EMBODIMENT 21

Another method of synthesis in the data synthesis circuit 69 (a method of synthesizing data in a high-efficiency encoding apparatus employing 1-run 0-run run-length encoding) will be described below for the 21st embodiment of the invention. As mentioned in conjunction with the prior art, DCT transformed data has power spectrum concentrated in the low-frequency region. Namely, data of higher amplitudes is concentrated in the low-frequency region. When applying variable-length encoding to data which has been separated by means of 1-run 0-run run-length encoding system, consecutive 0's are found in a region where the frequency is relatively low with respect to the run-length data. This is because the power spectrum is concentrated in the low-frequency region. Therefore, a plurality of DCT sequences can be transmitted with the variable-length code of one code. On the other hand, consecutive coefficients other than 0 are found in the low frequency region with respect to the coefficient data. Consequently, such cases frequently arise where only one sequence can be transmitted with the variable-length code of one code.

Figure 101A:
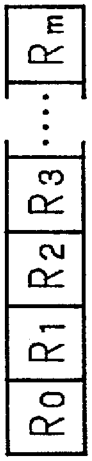
FIG. 101A, B, C are drawings for the explanation of the operation of the data synthesis circuit in the twenty-first embodiment.
Figure 101B:
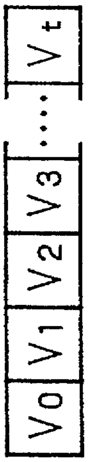
Figure 101C:
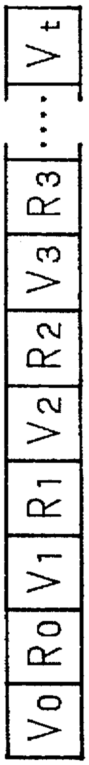

A data synthesis method appropriate for the 1-run 0-run run-length encoding system based on the above consideration will be described below. FIG. 101 is a drawing explanatory of the function of this data synthesis method. Specifically, FIG. 101A shows a data stream obtained by applying 2-dimensional variable-length encoding to the 1-run length side, FIG. 101B shows a data stream obtained by applying 2-dimensional variable-length encoding to the coefficient data side, and FIG. 101C shows the output from the data synthesis circuit 69 of this example. Data is synthesized alternately from the top of the variable-length encoded data of the coefficient side as shown in FIG. 101C. When an error occurs in the reproduced signals, it is necessary to synthesize the data of the DCT block by using the earlier data before the detection of the error. At this time, the quality of the reproduced picture in the DCT block is determined by the result of decoding the data which is reproduced without errors. When synthesizing the data, data up to the shorter result of decoding is used in decoding. For example, in case 1-run length can be decoded up to 12th sequence and coefficients can be decoded up to 7th sequence, the first seven sequences of both groups of data are used during decoding of the DCT data.

As described above, because power spectrum of the DCT transformed data is concentrated in the low-frequency region and the coefficients have shorter run lengths in the low-frequency region, only one or two sequences can be decoded with one code. Although there exists 2 or longer run lengths, they hardly appear in the low-frequency region. In contrast, because 1-run length data includes relatively long succession of 0's in the low-frequency region, several sequences can be decoded with one code. This is because the decisive factor which determines the reproduced picture quality of DCT block in the presence of errors is ho w much of the coefficient data can be reproduced in most pictures. The data synthesis method shown in FIG. 101C gives priority to the synthesis of the coefficient data and therefore has better efficiency of reproducing the coefficient data than the above-mentioned method of synthesis (a method of recording giving priority to 1-run length), and is capable of improving the reproduced picture quality. A simulation showed improvement in the reproduction efficiency by two to three sequences. In this simulation, after high-efficiency encoding of the data in all DCT blocks in one frame, the number of sequences which could be decoded was calculated by decoding with a specified number of bits (60 bits, for example) being used.

This method of synthesis is capable of synthesizing data efficiently without increasing the circuit size in comparison to the synthesizing method giving priority to the synthesis of 1-run length data, and is also capable of improving the quality of the reproduced picture in the presence of errors or during special reproduction (especially during high-speed reproduction).

Similar effect can be obtained also with 0-run 1-run run-length encoding wherein 0-run length coding is applied to separate the data into run-length data and coefficient data, then 0-run length coding is applied to the run-length data for variable-length encoding, while 1-run length coding with 1 run is applied to the coefficient data to carry out variable-length encoding. Although data is synthesized by giving priority to the coefficient data and synthesizing alternately with the 1-run length data, the invention is not limited to this scheme and provides similar effects when B codes of 1-run length data are synthesized for A codes of coefficient data (A>B, for example A=2, B=1).

EMBODIMENT 22

Figure 102:
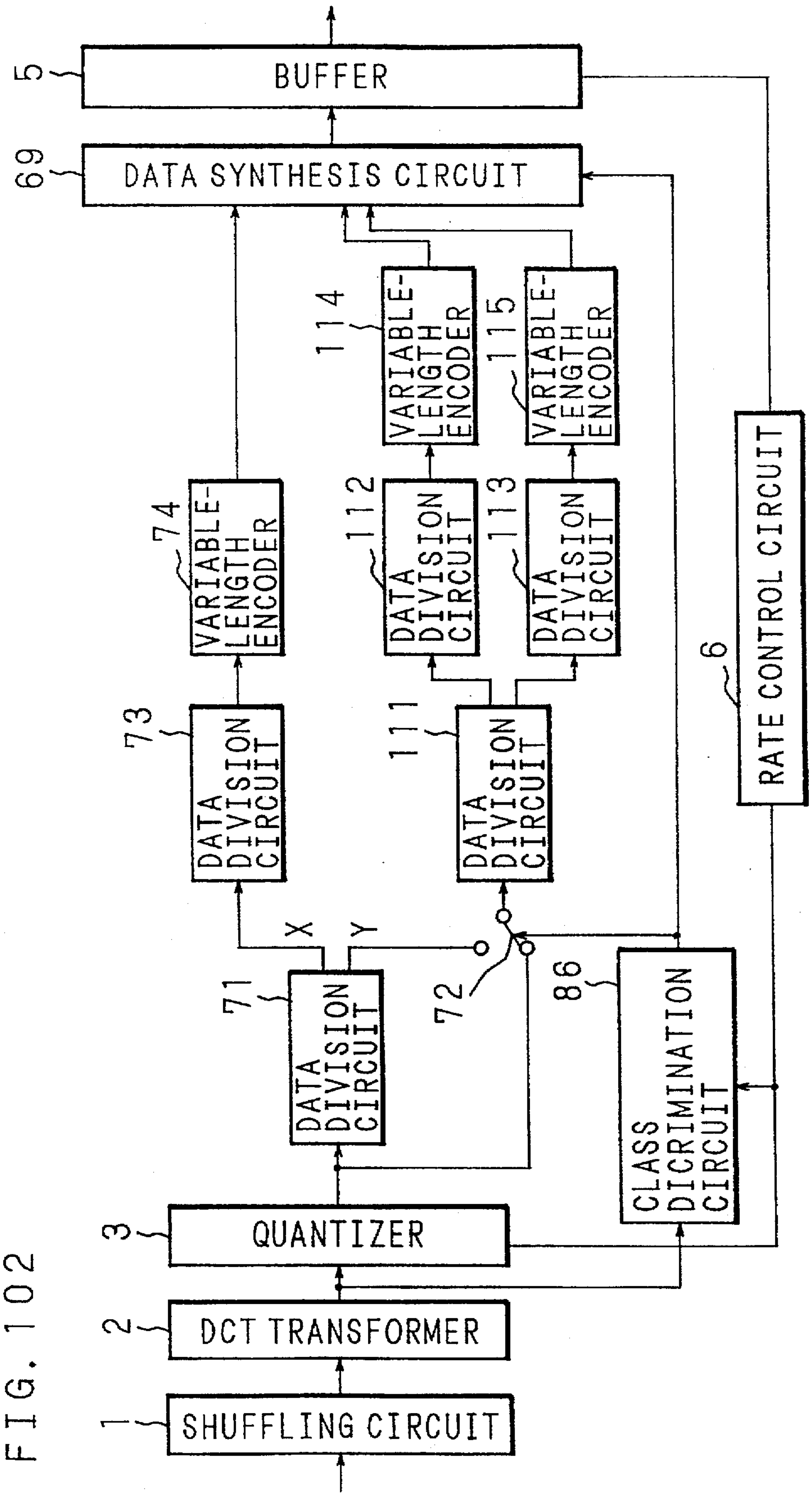
FIG. 102 is a block diagram illustrative of the high-efficiency encoding apparatus of the twenty-second embodiment of the invention.

FIG. 102 is a block diagram illustrative of the constitution of the high-efficiency encoding apparatus in the 22nd embodiment of the invention. In FIG. 102, components identical with those of the 20th embodiment (FIG. 82) are denoted with the same numerals and a description thereof will be omitted. Numeral 86 denotes a class discrimination circuit.

While the method of division encoding is selected according to the class information of the DCT coefficient in the 20th embodiment, switching of the dividing means is controlled by means of the rate control variable K which is used during quantization in addition to the class information in the 22nd embodiment. The principle of the 20th embodiment will be briefly described below. Output data of the DCT transformer 2 is limited as to the amplitude thereof according to the amount of encoded information in the quantizer 3. Therefore there arises such a case where the amplitude after DCT transformation does not belong to class 0, although the amplitude after quantization is small because of large quantization value, thereby resulting in larger amount of data due to the amplitude division method, contrary to the intention. For this reason, the method of division is switched by using the rate control variable K in addition to the class information in order to minimize the loss due to the amplitude division method during division encoding in the 22nd embodiment. With this constitution, amplitude division is not performed in the case of a large rate control variable K even for a block which would be subjected to amplitude division if class information is used, thereby carrying out the dividing operation efficiently.

The operation of the 22nd embodiment based on the above-mentioned principle will be described below. The operations of the shuffling circuit 1 and the DCT transformer 2 are the same as those of the first embodiment. An output of the DCT transformer 2 is input to the class discrimination circuit 86 where the data is classified. The class discrimination circuit 86 estimate the maximum amplitude in the input DCT block by means of the result of class discrimination and the rate control variable K supplied from the rate control circuit 6. An example of such a case will be described below where up to level 8 is classified into class 0, levels 9 through 16 belong to class 1, levels 17 through 32 belong to class 2, and levels 33 and over belong to class 3. When quantization value is 0.25 (this means that the input data is divided by 4 (16×0.25) as in the prior art) in a DCT block which is classified into class 2, the maximum amplitude becomes less than the maximum amplitude 32 of class 2 divided by 4. Thus the maximum amplitude in this block is determined to be 8 or less. In this case, division in the direction of amplitude may result in increased amount of data contrary to the intention. In this embodiment, the maximum value of data for switching the division encoding method is 8.

The maximum amplitude estimated by using the class information and rate control variable K in the above procedure is output to the switch 72 and the data synthesis circuit 69. On the other hand, the quantizer 3 determines the quantization scale according to the value of the rate control variable K and quantizes the data. Quantized data is supplied to the data division circuit 71 and the switch 72. In the 22nd embodiment, the switch 72 is operated by means of the control signal output from the class discrimination circuit 86, so that the output of the quantizer 3 is selected when the maximum amplitude of the quantized data is within a specified level, and the output of the data division circuit 71 is selected when the maximum amplitude is over the specified level. Other operations are the same as those of the 20th embodiment, and a description thereof will be omitted.

Because the amount of encoded information is reduced by means of variable-length encoding which is a reversible process in the above operation, it is made possible to reduce the encoded information to be transmitted without being accompanied by any deterioration of the picture quality in comparison to the high-efficiency encoding apparatus of the prior art. Also because classified data and the rate control variable K, are transmitted together with the encoded data and amplitude division encoding method is employed without adding a selection flag, amplitude division is not carried out in a portion of small amplitude where no effect of reducing the amount of data can be obtained with the amplitude division encoding method. In a DCT block having great amplitudes of DCT coefficients which do not ensure high efficiency of division by means of the 1-run 0-run run-length division method, the amplitude division encoding method is also employed together, thereby enabling it to efficiently reduce the amount of data.

Use of the division encoding method described above also makes it possible to reduce the total number of 3-table Huffman codes compared to a case where only the 1-run 0-run run-length division method is employed independently.

The constitution described above makes it possible to effectively reduce the amount of encoded information to be recorded in a reversible process. This makes it possible, when this system is employed in the storage media such as digital VTR, to improve the picture quality without increasing the amount of encoded information to be recorded compared to the case of encoding by means of the high-efficiency encoding apparatus of the prior art. More specifically, the rate control variable K which is output from the rate control circuit 6 can be set to a smaller value than that of the prior art, corresponding to the reduction in the amount of encoded information, making it possible to improve the S/N ratio of the decoded pictures.

Although a case where data is classified into four classes is described in the 22nd embodiment, the invention is it limited to this scheme. Although the method of division encoding is switched at the amplitude level 8, the invention is not limited to this scheme.

EMBODIMENT 23

Figure 103:
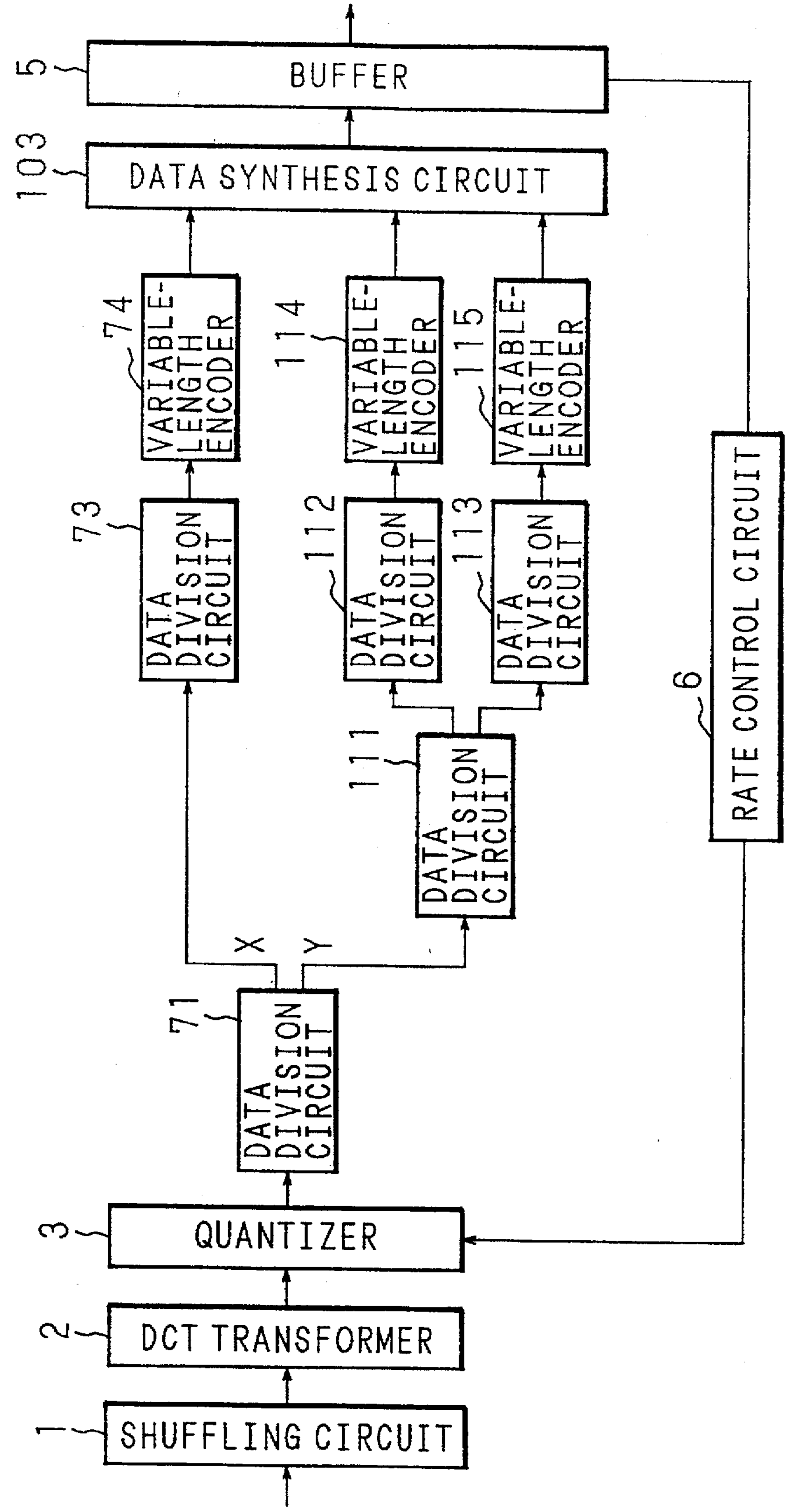
FIG. 103 is a block diagram illustrative of the high-efficiency encoding apparatus of the twenty-third embodiment of the invention.

FIG. 103 is a block diagram illustrative of the constitution of the high-efficiency encoding apparatus in the 23rd embodiment of the invention. In FIG. 103, components identical with those of the 20th embodiment (FIG. 82) are denoted with the same numerals and a description thereof will be omitted. Numeral 103 denotes a data synthesis circuit.

The amplitude division encoding method or the 1-run 0-run run-length division encoding method described in the 20th embodiment is capable of reducing the amount of data through division as described above. However, when encoding by the 1-run 0-run run-length division encoding method, expected effect of reducing the amount of data can not be obtained for a picture which includes data of AC components of large amplitudes. Also when encoding by the amplitude division encoding method, monotonous pictures result in small amplitudes of AC components in the DCT block and, when amplitudes of most of or all of the AC components in the DCT block is 0, application of the division encoding described above may result in an increase in the amount of data contrary to the intention. For this reason, the class switching encoding method is described in the 20th and 22nd embodiments, wherein the division encoding is carried out by efficiently switching the amplitude division encoding method or the 1-run 0-run run-length division encoding method.

Figure 104:
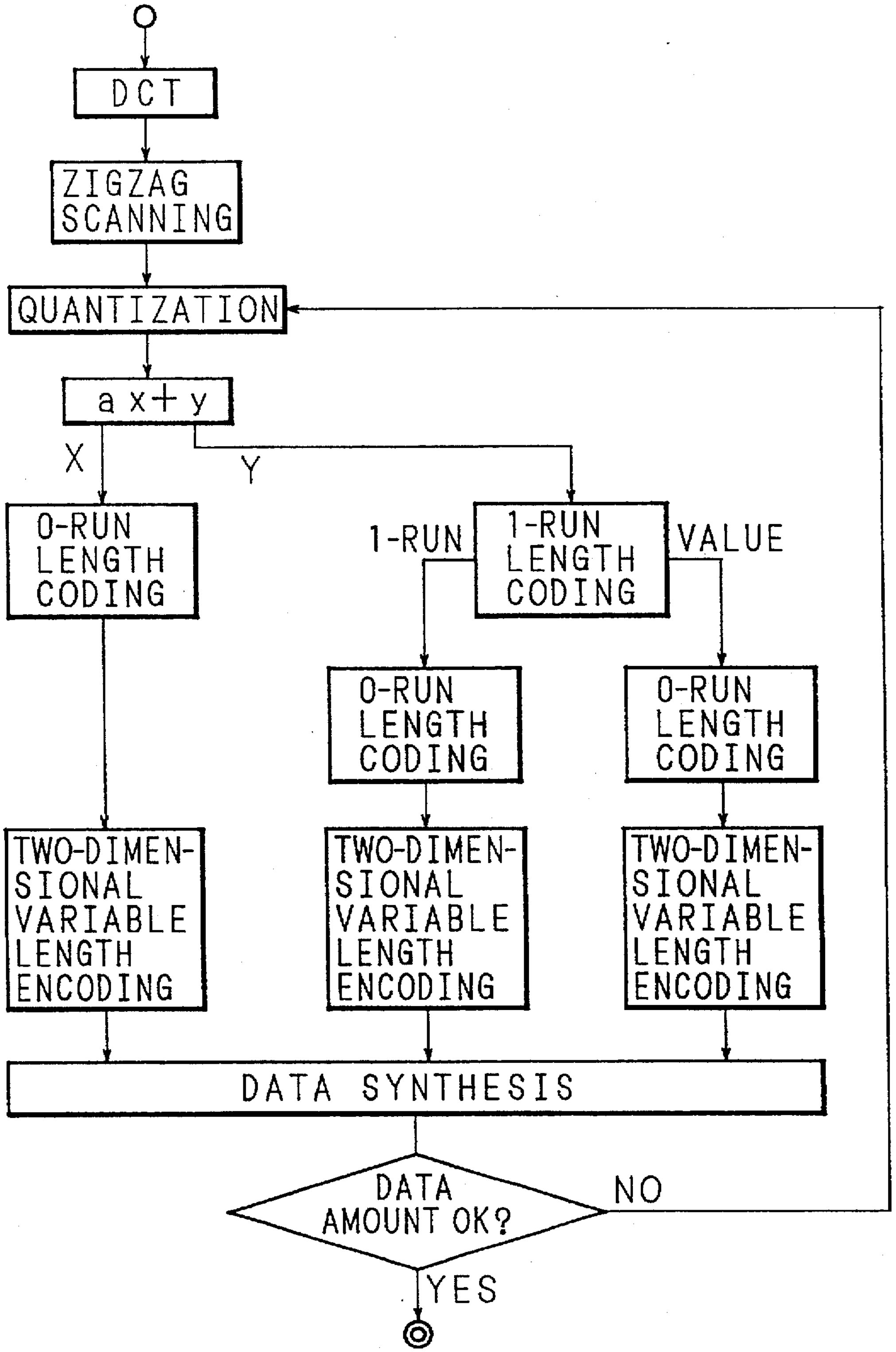
FIG. 104 is a drawing illustrative of the encoding algorithm in the twenty-third embodiment.

In the 23rd embodiment, the class switching encoding method is not employed in the encoding algorithm of the 20th embodiment, that is, the amplitude division encoding method and the 1-run 0-run run-length division encoding method are combined and applied to all data regardless of the amplitude of the AC components in the DCT block, thereby reducing the amount of data. FIG. 104 shows the encoding algorithm in the 23rd embodiment. Incoming digital data is DCT transformed, then zig-zag scanned to change the order of output and quantized.

Quantized data is divided into X and Y by the amplitude division encoding method. X data which has been divided by the amplitude division encoding method is subjected to 0-run length coding then to 2-dimensional variable-length encoding. Y data which has been divided is subjected to the 1-run 0-run run-length division encoding method. That is, first input data is subjected to 1-run length coding with run of 1 followed by 0-run length coding with run of 0 for the run-length data, and subjected to 2-dimensional variable-length encoding. Coefficient data is similarly subjected to 0-run length coding with run of 0 and subjected to 2-dimensional variable-length encoding. Data which has been-divided by the 1-run 0-run run-length division encoding method and subjected to the 2-dimensional variable-length encoding is synthesized, while the amount of encoded information is calculated and the rate control variable K is output.

A computer simulation by the algorithm shown in FIG. 104 showed a reduction of about 3.2% in the total amount of data. During run-length coding of the data with value 1, events +1 and −1 are not distinguished while the data resulting from 1-run length coding is followed by the same number of sign bits as the number of +1 and −1 terms as additional bits. In this simulation, only the AC coefficients in the DCT blocks were handled.

The operation of the 23rd embodiment will be described below. The operations of the shuffling circuit 1, the DCT transformer 2 and quantizer 3 are the same as those of the first embodiment. Quantized data is supplied to the data division circuit 71 where it is divided into X data and Y data. This operation of the data division circuit 71 is similar to that of the 20th embodiment, and a description thereof will be omitted.

X data which has been separated in the data division circuit 71 is subjected to 0-run length coding in the data division circuit 73 similarly to the 20th embodiment, and is subjected to 2-dimensional variable-length encoding in the variable-length encoder 74. Y data which has been separated in the data division circuit 71 is also subjected to 1-run length coding in the data division circuit 111 similarly to the 20th embodiment. Run-length data separated in the data division circuit 111 is subjected to 0-run length coding in the data division circuit 112 and is subjected to 2-dimensional variable-length encoding in the variable-length encoder 114. Similarly the coefficient data which has been separated in the data division circuit 111 is subjected to 0-run length coding in the data division circuit 113 and is subjected to 2-dimensional variable-length encoding in the variable-length encoder 115. Outputs of the variable-length encoders 74, 114, 115 are input to the data synthesis circuit 103 and synthesized. The operations of the buffer 5 and the rate control circuit 6 that follow are the same as those in the first embodiment.

Because the amount of encoded information is reduced by means of variable-length encoding which is a reversible process in the above operation, it is made possible to reduce the amount of encoded information to be transmitted without being accompanied by any deterioration of the picture quality in comparison to the high-efficiency encoding apparatus of the prior art. Also because class switching encoding method is not employed, the amount of data can be reduced in a simpler constitution compared to the 20th embodiment.

Now the high-efficiency decoding apparatus of the invention will be described below in the 24th through 26th embodiments.

EMBODIMENT 24

Figure 105:
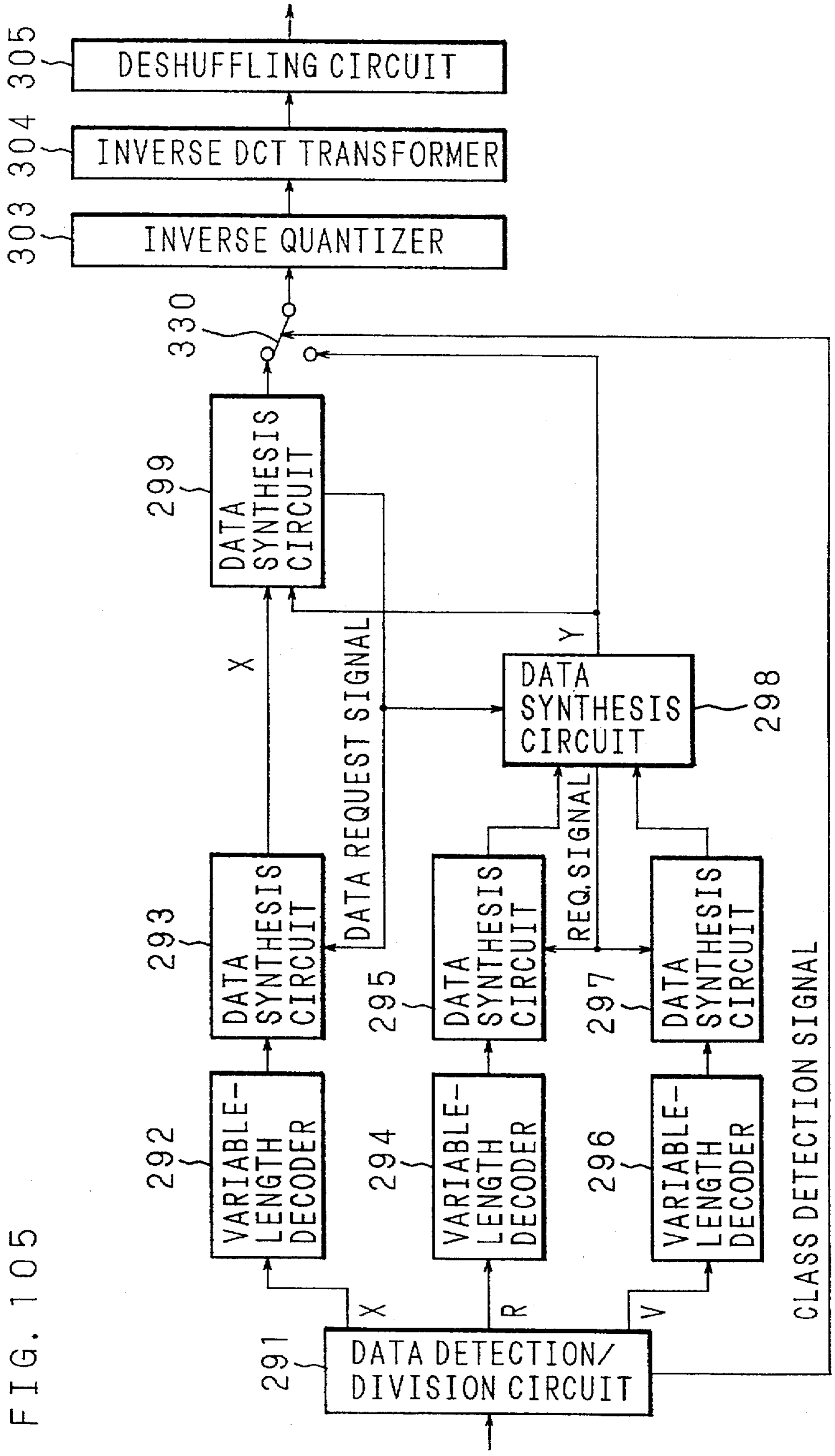
FIG. 105 is a block diagram illustrative of the high-efficiency decoding apparatus of the twenty-fourth embodiment of the invention.

FIG. 105 is a block diagram illustrative of the high-efficiency decoding apparatus according to the 24th embodiment of the invention. The high-efficiency decoding apparatus according to the 24th embodiment is a decoding apparatus which corresponds to the high-efficiency encoding apparatus of the 20th embodiment. In FIG. 105, numeral 291 denotes a data detection/division circuit which separates three parts of data divided from the input data, detects class information which has been added during recording (transmission) and outputs class information for the switching of a switch 330, while the separated data X, R, V are output to variable-length decoders 292, 294, 296, respectively. The variable-length decoders 292, 294, 296 output run length data obtained by applying variable-length decoding to the input data and coefficient data to corresponding data synthesis circuits 293, 295, 297, respectively. The data synthesis circuit 293 synthesizes the input data and outputs it to a data synthesis circuit 299. The data synthesis circuits 295, 297 synthesize the input data and output it to a data synthesis circuit 298. The data synthesis circuit 298 synthesizes the input data and outputs it to a data synthesis circuit 299 and one input terminal of the switch 330. The data synthesis circuit 299 synthesizes the input data and outputs it to another input terminal of the switch 330. The switch 330 selects only one of the input signals according to the class detection signal from the data detection/division circuit 291 and outputs the selected signal to an inverse quantizer 303. The inverse quantizer 303 applies inverse quantization to the input data (DCT data) and outputs the DCT coefficients to an inverse DCT transformer 304. The inverse DCT transformer 304 applies inverse DCT transformation to the DCT coefficients and outputs the original video data to a deshuffling circuit 305. The deshuffling circuit 305 restores the DCt blocks into the original order and outputs the original video signals.

Figure 106:
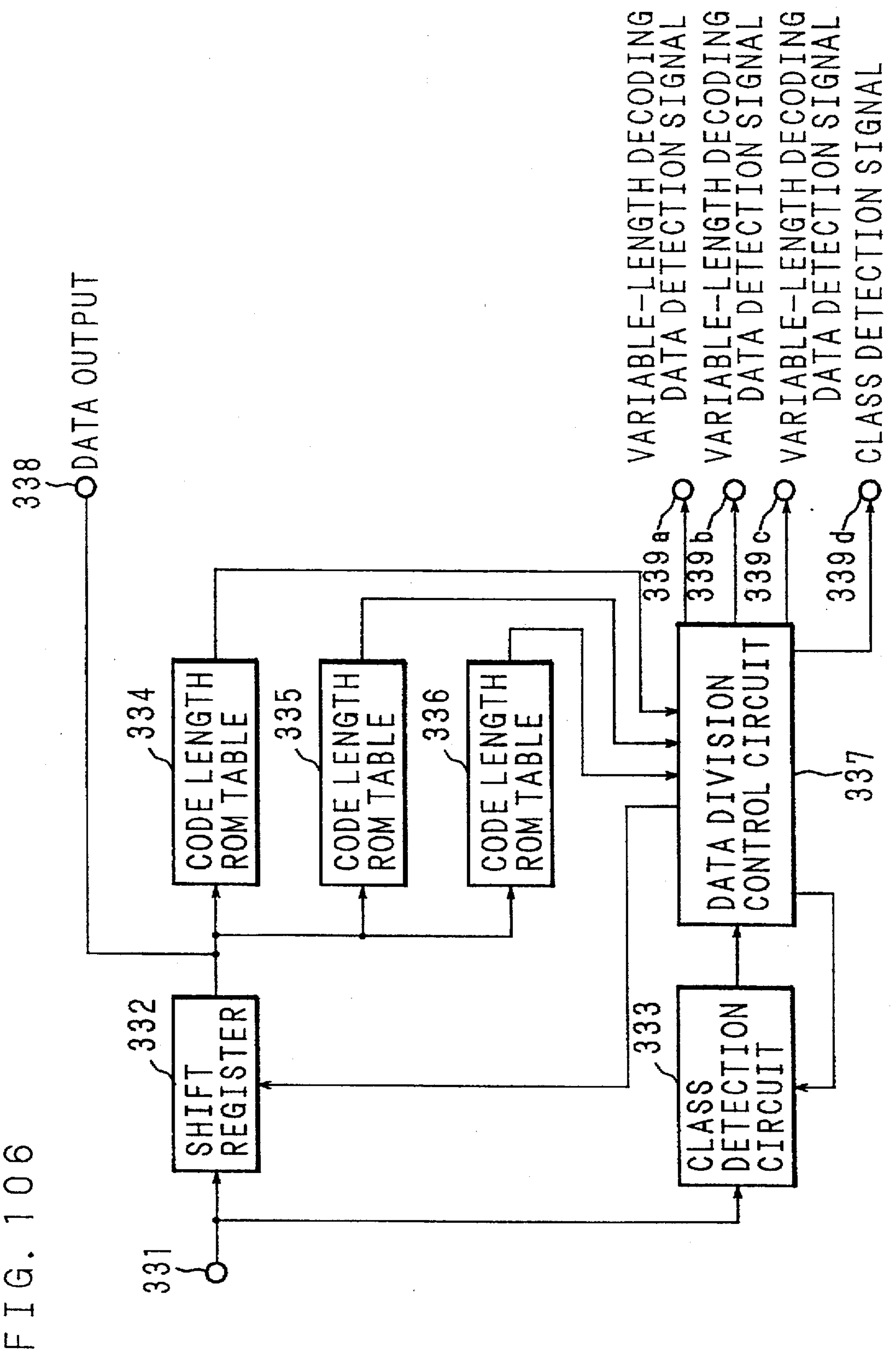
FIG. 106 is a block diagram illustrative of the data detection/division circuit of FIG. 105.

FIG. 106 is a block diagram illustrative of the inner constitution of the data detection/division circuit 291. The data detection/division circuit 291 has an input terminal 331, a shift register 332, a class detection circuit 333, a code length ROM table 334 which stores the code length of data which is encoded by the variable-length encoder 74 (FIG. 82), a code length ROM table 335 which stores the code length of data which is encoded by the variable-length encoder 114 (FIG. 82), a code length ROM table 336 which stores the code length of data which is encoded by the variable-length encoder 115 (FIG. 82), data division control circuit 337, an output terminal 338 which outputs data of the shift register, output terminals 339*a*, 339*b*, 339*c* for the signals detected by the variable-length decoders and an output terminal 339*d* for the class detection signal.

Figure 107:
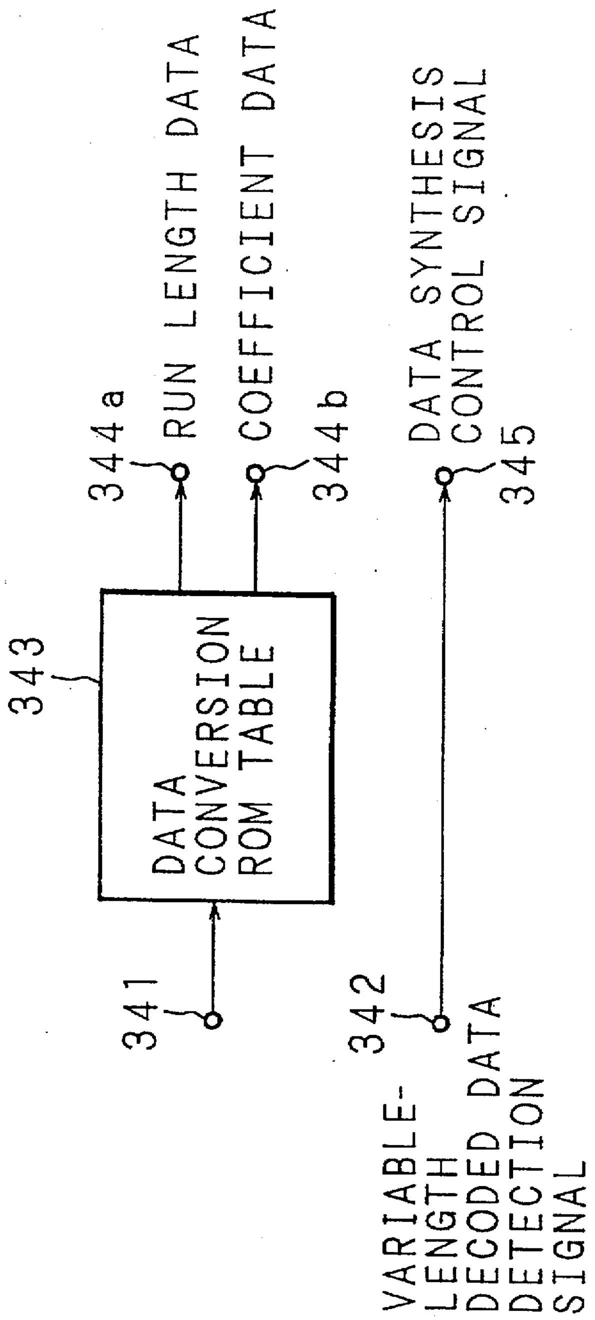
FIG. 107 is a block diagram illustrative of the variable-length decoder of FIG. 105.

FIG. 107 is a block diagram illustrative of the inner constitution of the variable-length decoders 292, 294, 296 shown in FIG. 105. Each of the variable-length decoders 292, 294, 296 has a data input terminal 341, an input terminal 342 for variable-length decoded data detection signal, a data conversion ROM table 343, an output terminal 344*a* for run-length data, an output terminal 344*b* for coefficient data and an output terminal 345 for data synthesis control signal.

Figure 108:
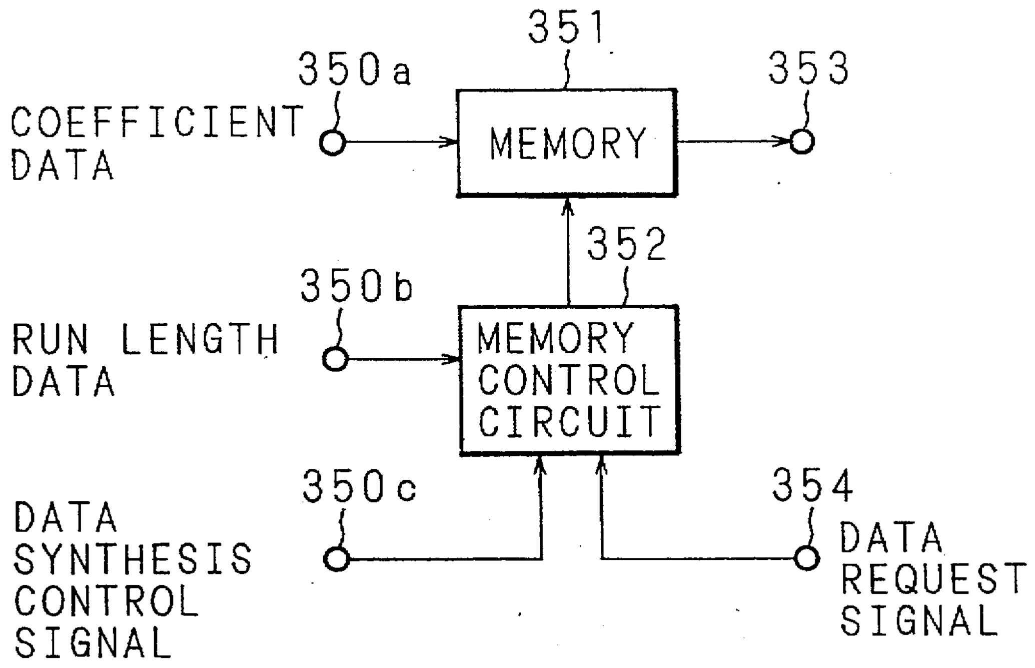
FIG. 108 is a block diagram illustrative of the data synthesis circuit of FIG. 105.

FIG.108 is a block diagram illustrative of the inner constitution of the data synthesis circuits 293, 295, 297 shown in FIG.105. Each of the data synthesis circuits 293, 295, 297 has a data input terminal 350a for coefficient data, an input terminal 350b for run-length data, an input terminal 350*c* for data synthesis control signal, a memory 351, a memory control circuit 352 which controls the write/read access of data to the memory 351, an output terminal 353 for data from the memory 351 and an input terminal 354 for data request signal.

Figure 109:
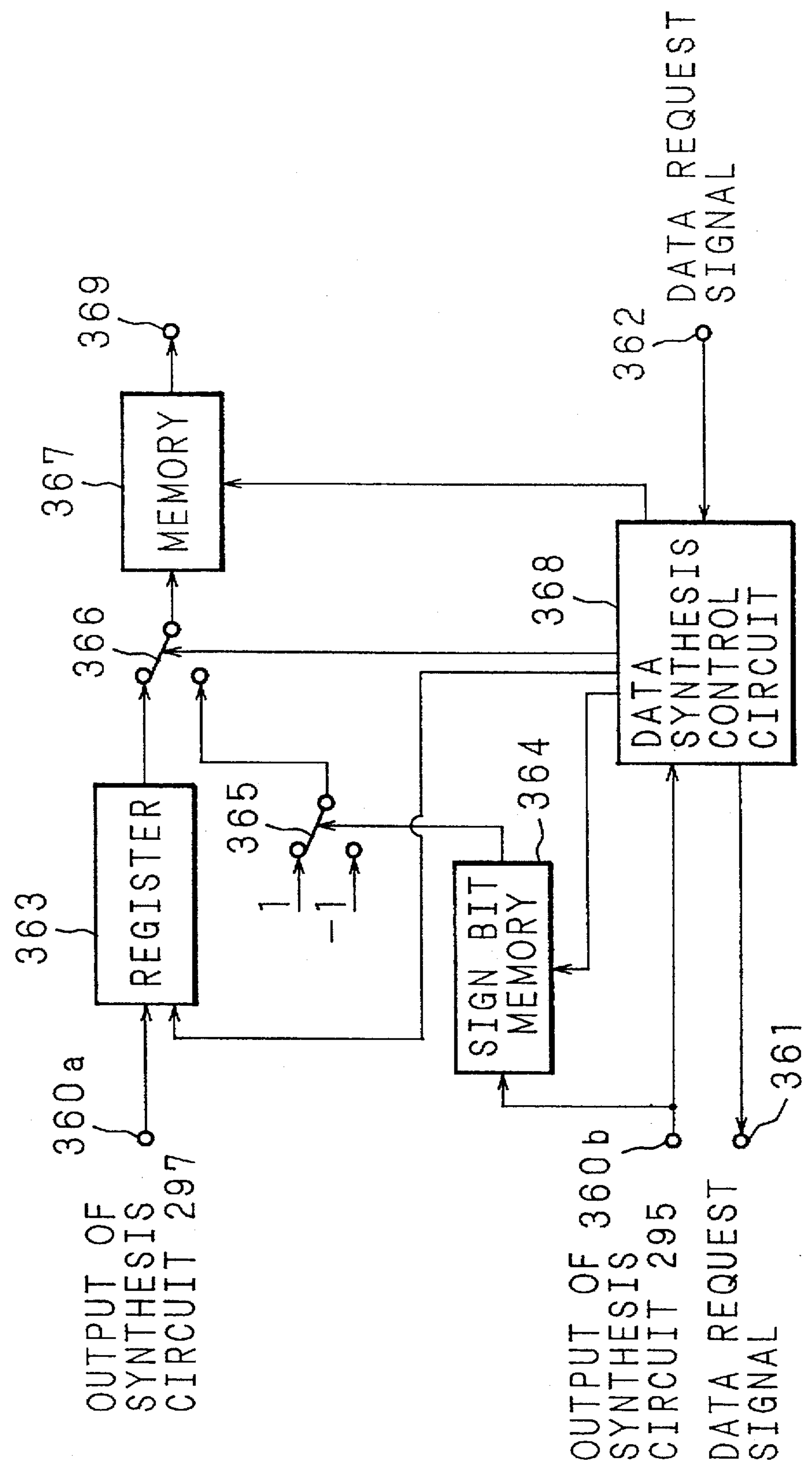
FIG. 109 is a block diagram illustrative of the data synthesis circuit of FIG. 105.

FIG. 109 is a block diagram illustrative of the inner constitution of the data synthesis circuit 298 shown in FIG. 105. The data synthesis circuit 298 has a input terminal 360*a* for data from the data synthesis circuit 297, an input terminal 360*b* for data from the data synthesis circuit 295, an output terminal 361 for data request signal, an input terminal 362 for the data request signal, a register 363, a sign bit memory 364 to store the sign bit of 1-run length data, a switch 365 which switches between 1 and −1 and outputs it, a switch 366 which switches between the output of the register 363 and the output of the switch 365, a memory 367, a data synthesis control circuit 368 and an output terminal 369 for data.

Figure 110:
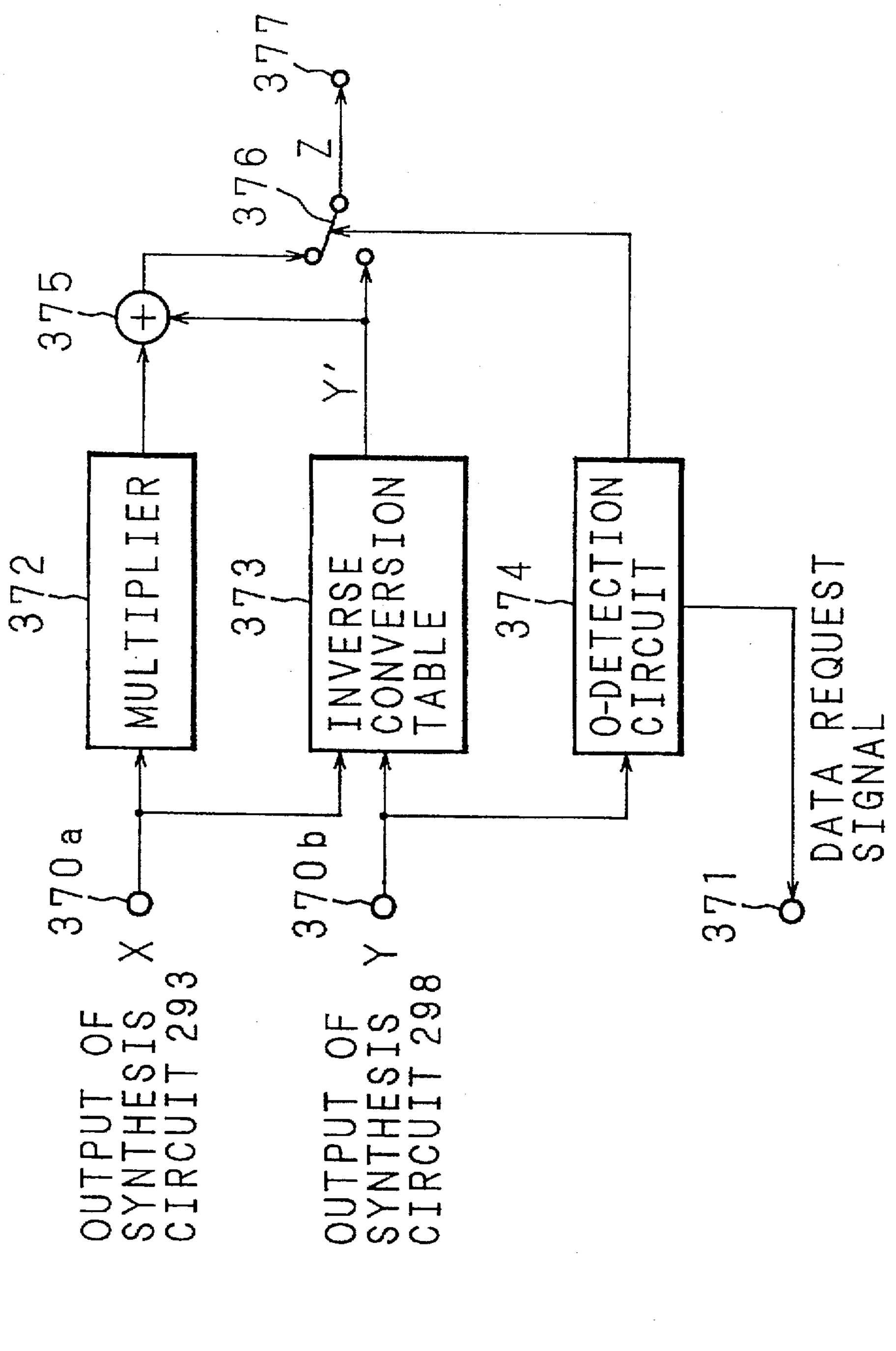
FIG. 110 is a block diagram illustrative of the data synthesis circuit of FIG. 105.

FIG. 110 is a block diagram illustrative of the inner constitution of the data synthesis circuit 299 shown in FIG. 105. The data synthesis circuit 299 has an input terminal 370*a* for the output data X of the data synthesis circuit 293, an input terminal 370*b* for the output data Y of the data synthesis circuit 298, an output terminal 371 to output the data request signal and request signal for the head data of DCT block, a multiplier 372 to multiply by a constant "a", an inverse conversion table 373, a 0-detection circuit 374 to detect 0 in the input Y data, an adder 375 which adds the outputs of the multiplier 372 and of the inverse conversion table 373, a switch 376 to select either the output of the inverse conversion table 373 or the output of the adder 375 and an output terminal 377. The content of the inverse conversion table 373 in the case of a=16 is shown in FIG. 111.

The operation of the high-efficiency decoding apparatus of the 24th embodiment will be described below. A 1-bit serial data stream is input to the data detection/division circuit 291. The operation of the data detection/division circuit 291 will be described below with reference to FIG. 106. The bit serial data which is input via the input terminal 331 is input to the shift register 332 and the class detection circuit 333. The class detection circuit 333 detects the class information which is added to the head of each DCT block (this embodiment assumes that the class information is stored at the head of each DCT block) according to the DCT block head information which is output from the data division control circuit 337. On the other hand, 1-bit serial data which is input via the input terminal 331 is converted to parallel data (parallel data not shorter than the maximum code length of the three variable-length codes) in the shift register 332. Output of the shift register 332 is input to the code length ROM tables 334, 335, 336. The code length ROM tables 334, 335, 336 detect the code length of the variable-length code which is output from the shift register 332. The code length of the variable-length code detected in the code length ROM tables 334, 335, 336 is output to the data division control circuit 337. The data division control circuit 337 determines whether the input bit stream is divided into three parts (X, R, V) or divided into two parts (R, V) according to the result of class detection and accordingly separates the variable-length code words from the data stream. In this embodiment, the data stream which is output from the data synthesis circuit 69 (FIG. 82) is assumed to be that shown in FIG. 99D for the simplicity of description.

A control operation in the case where it is found that the bit stream has been divided into three parts based on the class detection will be described below. When it is determined that the bit stream has been divided into three parts based on the class detection, the data division control circuit 337 first outputs a shift amount control signal in order to shift the shift register 332 by the specified amount. A shift operation is carried out because the class information is added at the head of the bit stream. Upon completion of the shift operation of the shift register 332, a variable-length decoded data detection signal corresponding to the code length ROM table 334 is output. Also a shift amount control signal to control the amount of shift in the shift register 332 is output according to the data code length information which is output from the code length ROM table 334. Upon completion of the shift control of the shift register 332, a variable-length decoded data detection signal corresponding to the code length ROM table 334 is output. When end data (Xn data in FIG. 99) is detected in the code length ROM table 334, a shift control signal corresponding to the code length of the end data is output to the shift register 332 and, thereafter, the ROM table for variable code length detection is switched to the output of the code length ROM table 335. Upon completion of the shift operation of the code length of the Xn data, the data division control circuit 337 outputs a variable-length decoded data detection signal corresponding to the code length ROM table 335, and outputs a shift amount control signal to control the amount of shift in the shift register 332 according to the data code length information which is output from the code length ROM table 335. Upon completion of the shift control of the shift register 332, a variable-length decoded data detection signal corresponding to the code length ROM table 335 is also output. Similarly, when end data (Rm data in FIG. 99) is detected in the code length ROM table 335, a shift control signal corresponding to the code length of Rm is output to the shift register 332 and, thereafter, the ROM table for data length detection is switched to the code length ROM table 336. Upon completion of the shift operation of the code length of the Rm data, the data division control circuit 337 outputs a variable-length decoded data detection signal corresponding to the code length ROM table 336, and outputs a shift amount control signal to control the amount of shift in the shift register 332. Upon completion of the shift control of the shift register 332, a variable-length decoded data detection signal corresponding to the code length ROM table 336 is also output. When end data (Vt data in FIG. 99) is detect ed in the code length ROM table 336, a variable-length decoded data detection signal corresponding to the code length ROM table 336 is output and, at the same time, data is shifted by the amount of the code length of V1 data to locate the head position of the DCT block and the DCT block head signal is output to the class detection circuit 333.

A control operation in the case where it is found that the bit stream has been divided into two parts based on the class detection will be described below. When it is determined that the bit stream has been divided into two parts based on the class detection, the data division control circuit 337 first outputs a shift amount control signal in order to shift the shift register 332 by the specified amount. Upon completion of the shift operation of the shift register 332, a variable-length decoded data detection signal corresponding to the code length ROM table 335 is output. A shift amount control signal to control the amount of shift in the shift register 332 is output according to the code length information which is output from the code length ROM table 335. Upon completion of the shift control of the shift register 332, a variable-length decoded data detection signal corresponding to the code length ROM table 335 is output. When end data (Rm data in FIG. 99) is detected in the code length ROM table 335, a shift amount control signal corresponding to the code length of Rm is output to the shift register 332 and, thereafter, ROM table used in the control of the data length detection is switched to the output of the code length ROM table 336 and a shift amount control signal is output to control the amount of shift in the shift register 332. Upon completion of the shift control of the shift register 332, a variable-length decoded data detection signal corresponding to the code length ROM table 336 is also output. Similarly, when end data (V1 data in FIG. 99) is detected in the code length ROM table 336, a variable-length decoded data detection signal corresponding to the code length ROM table 336 is also output and, at the same time, data is shifted by the amount of the code length of V1 data to locate the head position of the DCT block and the DCT block head signal is output to the class detection circuit 333.

When such a data stream as shown in FIG. 99E is synthesized, the code length ROM tables are alternately switched after determining the number of divisions based on the result of class detection until the end data is detected. For example, in the case of data which has been divided into three parts, after controlling the amount of shift of the shift register 332 for the code located at the head (at least the amount of shift corresponding to the class information is required), a variable-length decoded data detection signal corresponding to the code length ROM table 334 is output and the code length is detected by using the code length information which is output from the code length ROM table 334 and thereby a shift amount control signal for the shift register 332 is output. The shift register 332 shifts the data according to the shift amount control signal. Upon completion of the data shift, the data division control circuit 337 outputs a variable-length decoded data detection signal corresponding to the code length ROM table 335 and detects the code length by using the code length information which is output from the code length ROM table 335 and thereby outputs a shift amount control signal for the shift register 332. The shift register 332 shifts the data according to the shift amount control signal. Upon completion of the data shift, the data division control circuit 337 outputs a variable-length decoded data detection signal corresponding to the code length ROM table 336 and detects the code length by using the code length information which is output from the code length ROM table 336 and thereby outputs the shift amount control signal for the shift register 332. This operation is repeated until the end data of the DCT block is detected. When end data is detected in the course of the data division operation, for example in the code length ROM table 334, thereafter division of the data is carried out by alternately switching the code length ROM table 335 and the code length ROM table 336. When the end data is detected in the code length ROM table 335, thereafter the data is divided by using the code length ROM table 336 when the end data is detected in the code length ROM table 336, therefore the head position of the next DCT block is located. In such a case where it is determined that the data being transmitted has been divided into two parts, the above operation is repeated by alternately switching the code length ROM table 335 and the code length ROM table 336.

In this embodiment, the variable-length decoded data detection signal which is output from the data division control circuit 337 is assumed to have such a characteristic as enters the state "L" for one clock cycle when the data shift operation of the shift register 332 is completed. Thus this control signal remains "H" in all other periods. The DCT block head signal which detected as described above is output together with the variable-length decoded data detection signal via the output terminals 339*a*, 339*b*, 339*c*.

The variable length codes which are divided as described above are sent, together with the above-mentioned control signal, to the variable-length decoder 292, the variable-length decoder 294 and the variable-length decoder 296. Variable-length decoding operations of the variable-length decoders 292, 294, 296 will be described below with reference to FIG. 107. The variable-length decoder 292 which has a code table to decode the output of the variable-length encoder 74, the variable-length decoder 294 which has a code table to decode the output of the variable-length encoder 114 and the variable-length decoder 296 which has a code table to decode the output of the variable-length encoder 115 are made in the same constitution except that the content of the data conversion ROM table 343 is different. An output of the shift register 332 which is input via the input terminal 341 is input to the data conversion ROM table 343 where it is converted to run-length data and coefficient data. On the other hand, the variable-length decoded data detection signal and the DCT block head signal which are input via the input terminal 342 are output from the output terminal 345. This output signal will be called a data synthesis control signal, same as in the prior art, hereafter.

Data which has been subjected to variable-length decoding is sent to the data synthesis circuit 293, the data synthesis circuit 295 and the data synthesis circuit 297. The data synthesis operation in the data synthesis circuits will be described below with reference to FIG. 108, FIG. 13. All data in a specified memory block of the memory 351 is set to 0 according to the DCT block head signal included in the data synthesis control signal which is input via the input terminal 350*c*. In this embodiment, the memory 351 is assumed to comprise a plurality of pairs of 64-byte memory blocks. In general, the same number of pairs as the number of DCT blocks to be controlled for the amount of encoded information are provided. Because the amount of encoded information is controlled in the unit of frame in this embodiment, memory capacity is required to accommodate two frames. This is because variable-length encoding is employed for the high-efficiency encoding system and therefore the amount of data is different from individual DCT blocks and finally the amount of data in one frame is restricted within a certain value, resulting in the necessity of the memory capacity described above during decoding. Two memory blocks are paired so that, when data of one DCT block is synthesized in one memory block, synthesized data can be read from another memory block.

Figures 13A, 13B:
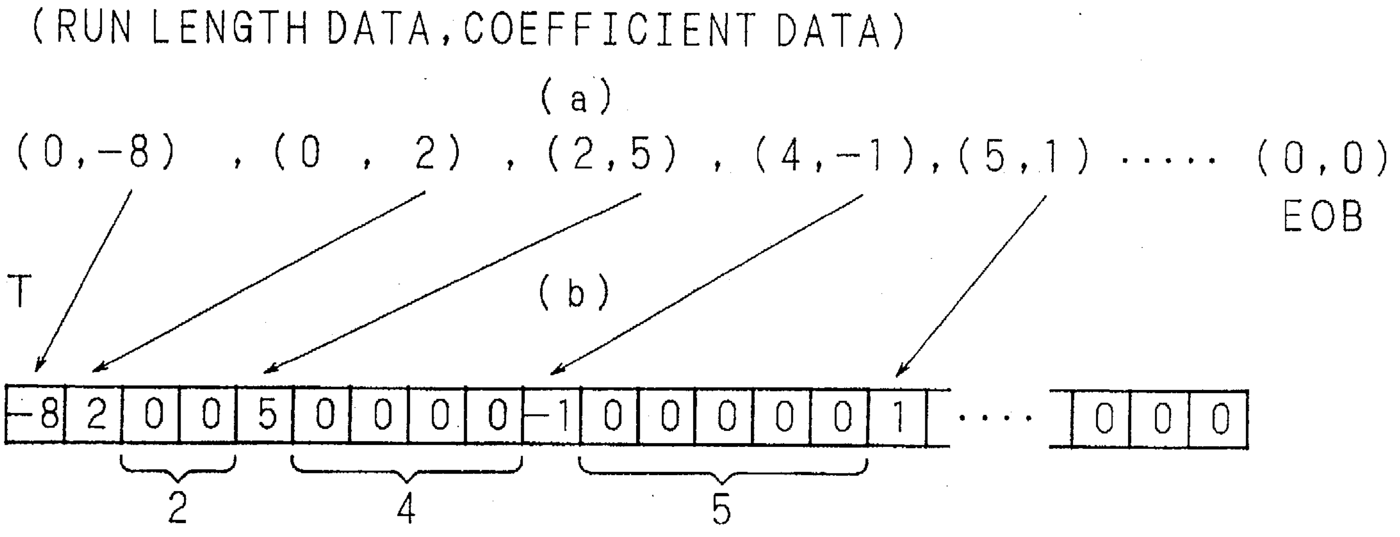
FIG. 13A, B are drawings explanatory of the variable-length decoding operation of the prior art.

The memory control circuit 352 writes the coefficient data at the address indicated by the run-length data according to the data enable area signal which is input via the input terminal 350*c*, similarly to the prior art. FIG. 13 shows data of DCT block being synthesized. FIG. 13A shows sets of run length data and coefficient data, and FIG. 13B shows the result of synthesizing the data stream shown in FIG. 13A by using the memory 351. As shown in the drawing, the memory control circuit 352 carries out the decoding operation by generating the address for writing the coefficient data other than 0 shown in FIG. 13B according to the incoming run-length data. Reading of data from the memory 351, on the other hand, is carried out according to the data request signal which is input via the input terminal 354. That is, every time the data request signal is input, the memory control circuit 352 increments the read address by 1 so that one piece of data is read from the memory 351. Outputs of the data synthesis circuits 295 and 297 are input to the data synthesis circuit 298.

The operation of the data synthesis circuit 298 will be described below with reference to FIG. 109. 1-run length data (an output from the data synthesis circuit 295) and coefficient data (an output from the data synthesis circuit 297) which have been synthesized in the above procedure are subjected to 1-run length decoding in the data synthesis circuit 298. The data synthesis circuits 295, 297 output the decoded data successively starting with the data located at the head of the DCT block, according to the DCT head signal and the data request signal which are supplied via the output terminal 361.

Upon input of the data, the data synthesis control circuit 368 writes the sign bit of 1-run length in the 1-run length data (sign bit existing in one code) onto the sign bit memory 364. Upon completion of writing the sign bit of 1-run length, the sign bits are read starting at the head. At the same time, a write address and a control signal for writing in the memory 367 are generated. Also a control signal is output so that the switch 366 selects the output of the switch 365. This operation is repeated until all sign bits stored in the memory are read out. An output of the sign bit memory 364 is supplied to the switch 365. The switch 365 selects 1 when the sign bit data is positive and −1 when the sign bit data is negative.

After writing ±1 data in the memory 367, coefficient data stored in the register 363 is written following the 1-run length data in the above procedure. When this operation is completed, the data synthesis control circuit 368 outputs the data request signal and receives the next sequence data from the data synthesis circuits 295, 297. Thereafter this operation is repeated to decode the data of one DCT block (all data of 64 sequences). When decoding of the data of one DCT block is completed, a head data request signal for the DCT block is output from the output terminal 361. In this embodiment, a memory capacity of the memory 367 is set to accommodate two DCT blocks. Thus the memory is made in such a constitution that the data of one DCT block is synthesized in the above procedure while data from another memory is output to the subsequent stage. Reading of data from the memory 367 is controlled in such a manner that the data is read from the memory 367 consecutively starting at the DC data when the DCT block head data request signal is received via the input terminal 362.

Data synthesized in the data synthesis circuit 293 and the data synthesis circuit 298 is input to the data synthesis circuit 299. The operation of the data synthesis circuit 299 will be described below with reference to FIG. 110 and FIG. 111. An Output of the data synthesis circuit 298 which is input via the input terminal 370*b* is input to the inverse conversion table 373 and the 0-detection circuit 374. The 0-detection circuit 374 determines whether the incoming Y data is 0 or not. When the 0-detection circuit 374 detects 0, a data request signal which is output to the data synthesis circuit 293 is turned to "H" and reading of the next data from the memory is temporarily halted. Upon detection of 0, the 0-detection circuit 374 outputs a control signal to select output Y' of the inverse conversion table 373 to the switch 376. This is required because data of z=0 is transmitted upon Y=0 only (not transmitted on the X side) during data division. When Y≠0, a data request signal ("L") is sent to the data synthesis circuit 293 so that the next data is read from the memory. In this embodiment, reading of data from the memory is requested when the data request signal is "L", and reading of data is halted when "H". As for Y data, because the entire data (data of 64 sequences) in the DCT block is transmitted, when requesting the head data of the DCt block, the control signal thereof (DCT block head data request signal) is output from the 0-detection circuit 374 as the data request signal. The DCT block head data request signal is also output to the data synthesis circuit 293. Consequently, two control signals, namely the data request signal and the DCT block head data request signal are output, are sent from the 0-detection circuit 374 to the data synthesis circuit 293.

On the other hand, X data which is the output of the data synthesis circuit 293 and is supplied via the input terminal 370*a* is supplied to the multiplier 372 and the inverse conversion table 373. The inverse conversion table 373 outputs Y' data based on the X data and the Y data which have been input. The content of the inverse conversion table 373 in case of a=16 is shown in FIG. 111. As shown in FIG. 111, the inverse conversion has an exactly opposite characteristic to the conversion table shown in FIG. 84. When data of Y=0 is input, the inverse conversion table 373 outputs Y'=0 regardless of the input value of X.

The multiplier 372 multiplies the input X data by the constant "a". The result of the multiplication is input to the adder 375 which adds the result to the output Y' of the inverse conversion table 373, thereby to restore the original coefficient z. An output of the adder 375 is supplied to the switch 376. The switch 376 selects Y' (=0) which is output from the inverse conversion table 373 when the 0-detection circuit 374 detects 0, or selects the output of the adder 375 thereby to restore the original coefficient z when 0 is not detected.

An output of the data synthesis circuit 299 is supplied to the switch 330. The switch 330 switches between the output of the data synthesis circuit 298 and the output of the data synthesis circuit 299 according to the result of class detection which is output from the data detection/division circuit 291. In practice, because data of the DCT block is delayed by the data synthesis circuit, the result of class detection is output with a specified amount of delay provided by the data detection/division circuit 291. Specifically, when the class information indicates a class not lower than a specified level, the data detection/division circuit 291 outputs the class detection signal so that the output of the data synthesis circuit 299 is selected. When the class information indicates a class lower than a specified level, the data detection/division circuit 291 outputs the class detection signal so that the output of the data synthesis circuit 298 is selected.

The DCT data synthesized in the switch 330 is subjected to inverse quantization in the inverse quantizer 303 similarly to the prior art (the rate control variable K (a quantization factor) is generally transmitted together with the DCT data), then subjected to inverse DCT transformation in the inverse DCT transformer 304 thereby to restore the original video data. The deshuffling circuit 305 deshuffles the incoming DCT blocks to cancel the block structure and outputs the video signals.

Because the constitution described above provides a high-efficiency decoding apparatus which is capable of decoding the output of the high-efficiency encoding apparatus capable of further reducing the amount of encoded information, it is made possible to reduce the transmission cost corresponding to the reduction in the amount of data transmitted when transmitting the data reduced by means of the high-efficiency encoding apparatus over media such as telephone line, compared to the prior art. A simulation showed the capability of reducing the amount of data by about 2 to 5% depending on the type of video data to be encoded.

Figure 10:
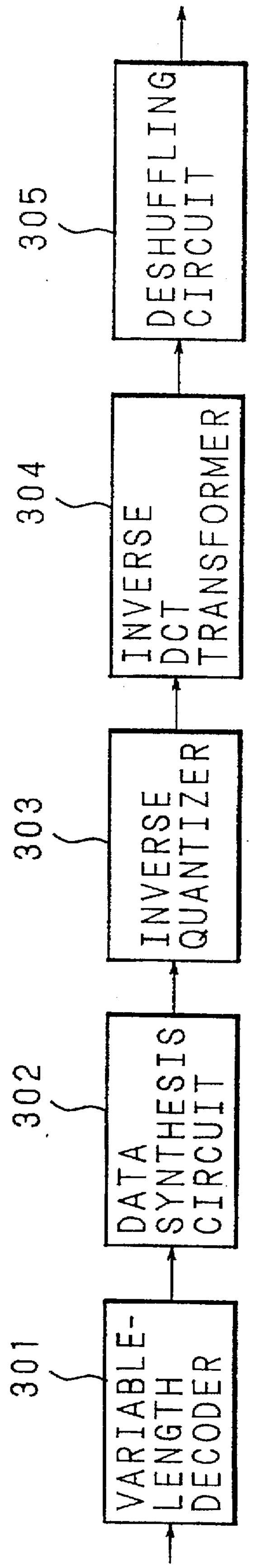
FIG. 10 is a block diagram illustrative of the high-efficiency decoding apparatus of the prior art.

Although description of this embodiment assumes the constitution of the high-efficiency decoding apparatus as shown in FIG. 107, the invention is not limited to this scheme and provides similar effects when the data conversion ROM table 343 is constituted with random logic, for example. Although the constitution of the data synthesis circuit 299 is shown in FIG. 110, the invention is not limited to this scheme and all of it may be constituted with ROMs. The constitution and control method of the data synthesis circuit 298 are also not limited to those described above. It goes without saying that similar effects can be obtained when, for example, an exclusive memory for synthesizing the positive and negative sign bits is prepared and, when the first signal of the DCT block is input, the memory 367 sets all data to 1 and synthesizes the data of the DCT block by using the run length data and coefficient data in the procedure described in conjunction with the data synthesis circuit 302 (FIG. 10) of the prior art, while synthesizing the sign bits separately.

Figure 11:
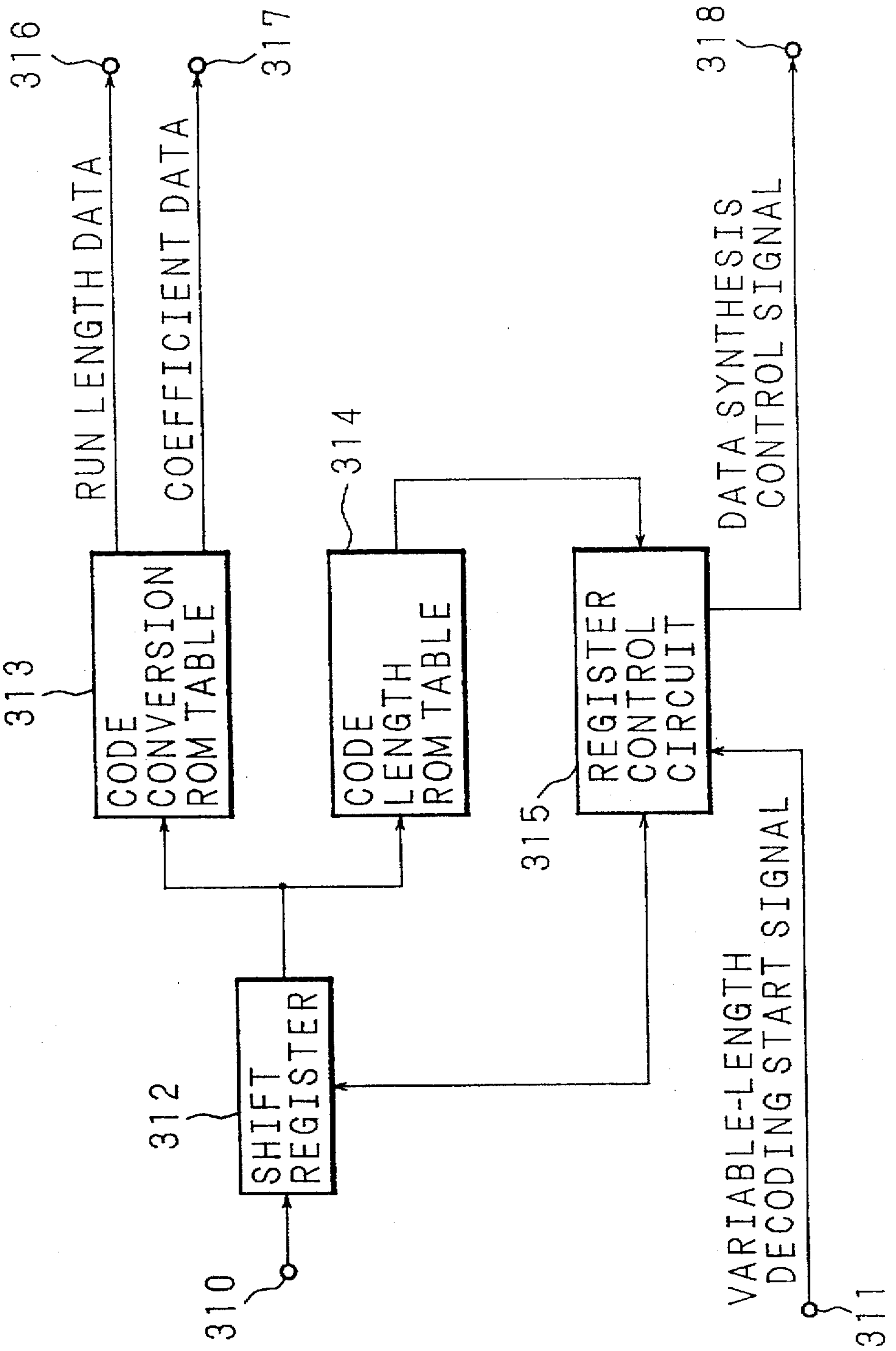
FIG. 11 is a block diagram illustrative of the variable-length decoder shown in FIG. 10.
Figure 12:
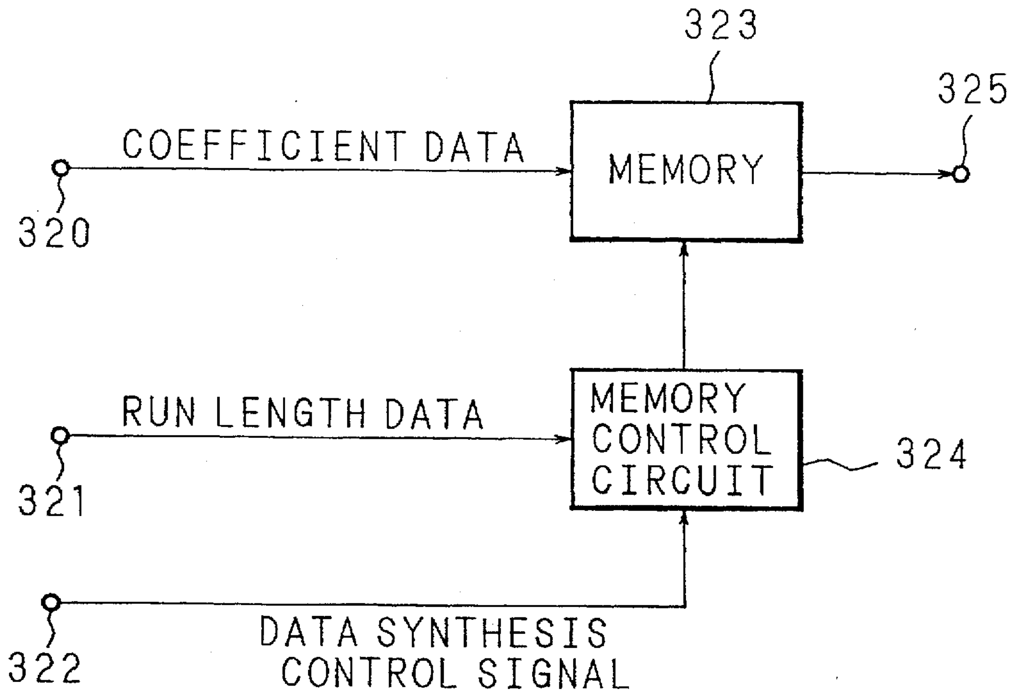
FIG. 12 is a block diagram illustrative of the data synthesis circuit decoder shown in FIG. 10.

Although the data detection/division circuit 291 and the variable-length decoders 292, 294, 296 are constituted separately in this embodiment to make the description readily understood, in general, three conversion tables (the code conversion ROM table 313 and the code length ROM table 314 (FIG. 11)) are prepared for the variable-length decoding to switch among these ROM tables so that the data division operation and the variable-length decoding operation are carried out simultaneously. It is a matter of course that such a constitution provides similar effects.

Also the constitution of the high-efficiency decoding apparatus is not limited to that described above, and the memory arrangement, in particular, may not necessarily be arranged as described above.

Although the method of high-efficiency encoding for transmitting data by dividing and encoding it in this embodiment is described by taking a case of switching between the amplitude division encoding method and the 1-run 0-run run-length division method by means of the class information, it goes without saying that high-efficiency decoding by employing the amplitude division method independently or the 1-run 0-run run-length division method independently can be carried out by using the corresponding data synthesis circuit. Although the class information is used for switching, the invention is not limited to this scheme and the class information and the quantization factor (the rate control variable) may be used. Also such a case where the encoding methods described above are not switched can be accommodated by omitting the switch 330. It is needless to say that encoded data by 1-run length division method, n-run length division method or the like can be decoded by the use of the configuration shown in FIG. 109.

EMBODIMENT 25

The high-efficiency decoding apparatus of the 25th embodiment will be described below. In the high-efficiency decoding apparatus of the 24th embodiment, capacity requirement for memories used in the data synthesis circuit 293, the data synthesis circuit 295 and the data synthesis circuit 297 becomes as large as three times the 2-frame memory capacity as described above. This is caused by the fact that the amount of encoded information is controlled for each frame and data of one DCT block is transmitted by dividing it into three parts.

Decoding and storing data which is divided and high-efficiency encoded as described above generally require very large amount of memory capacity, because high-efficiency encoding increases the redundancy of data. In the case of division encoding method described in the 20th embodiment, for example, the data encoded in the variable-length encoder 74 is the low-frequency components of the DCT block and the high-frequency components are hardly encoded. This means that most of the data in the high-frequency region are turned into 0 when decoded. In the high-efficiency decoding apparatus of the 24th embodiment, a vast amount of memory capacity is required because a memory to store these 0 data is provided. In the 25th embodiment, when storing data of one frame in the memory, memory capacity requirement is reduced by storing the data in the form of run length data and coefficient data before synthesized.

Figure 112:
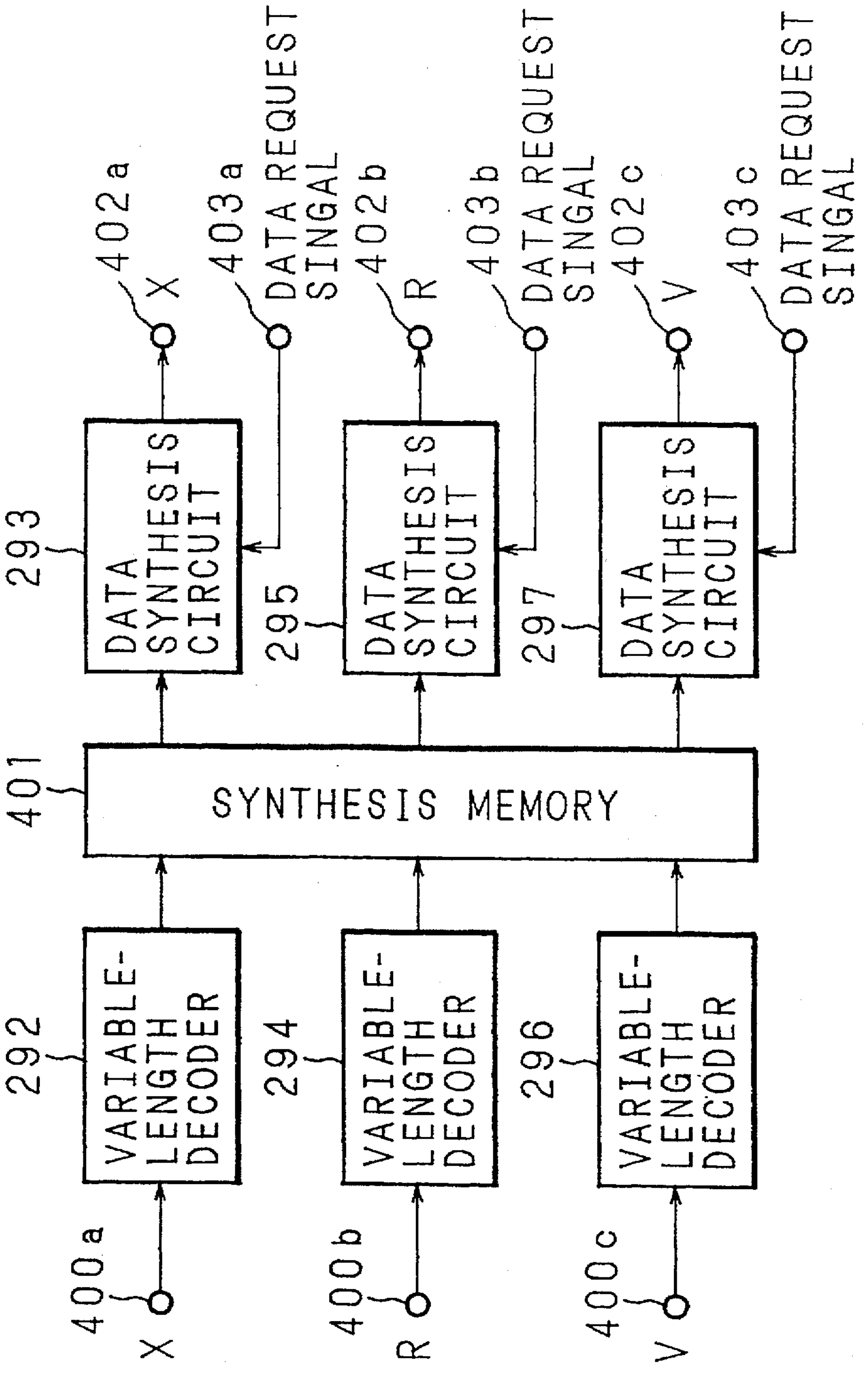
FIG. 112 is a block diagram illustrative of the constitution of the high-efficiency decoding apparatus of the twenty-fifth embodiment of the invention.

FIG. 112 is a block diagram illustrative of the high-efficiency decoding apparatus of the 25th embodiment. In FIG. 112, components which are identical with those of the 24th embodiment (FIG. 105) will be denoted by the same numerals and a description thereof will be omitted. Numerals **400*a*, 400*b*, 400*c* denote input terminals for X data, R data and V data, 401 denotes a synthesis memory, 402*a*, 402*b*, 402*c* denote output terminals and 403*a*, 403*b*, 403*c*** denote input terminals for data request signals.

The storage capacity of the synthesis memory 401 will be briefly described below. Video data is generally compressed to about ⅛ to 1/10, to reduce the amount of data. Consequently, assuming the average code length of variable-length encoded data to be 5 bits, for example, the ratio of the number of codes to be variable-length encoded to the number of pixels becomes from about ⅕ to ⅙. Also in the case where data is reduced by means of the high-efficiency encoding method described in the 20th embodiment, a simulation showed that the minimum code length for the variable-length code is roughly 4 bits in the variable-length encoder 74, 3 bits in the variable-length encoder 114 and 3 bits in the variable-length encoder 115 (EOB excluded).

Therefore, assuming compression to about 1/9 (transmission of signal at a rate of about 1 bit per pixel), the number of codes of variable-length decoded output data of the variable-length decoder 292 becomes about 1/4 of a frame in the worst case. However, because it is necessary to increase the size of one byte of memory by the amount of run-length data (6 bits) when storing the run length data and coefficient data in the memory, actual memory capacity requirement becomes about 1/2. Similarly, to handle the output data of the variable-length decoder 294 makes the memory capacity requirement to about 2/3. Handling the output data of the variable-length decoder 296 also makes the memory capacity requirement to about 2/3. Thus the constitution described above makes it possible to reduce the memory capacity requirement by about 7/6 times 2 frames.

Now the operation of the 25th embodiment will be described below with reference to FIG. 112. Data which is input via the input terminals 400*a*, 400*b*, 400*c* are subjected to variable-length decoding in the variable-length decoders 292, 294, 296 and decoded into sets of 0-run length data and coefficient data. Outputs from these variable-length decoders 292, 294, 296 are input to the synthesis memory 401 having such a storage capacity as described above, where data for one frame is temporarily stored. When all data of one frame has been written in the synthesis memory 401, data is read together with the data synthesis control signal and the DCT block head signal at a specified timing. Last information of the DCT block is detected in the synthesis memory 401 to organize the specified timing. While data of one frame is being read from one memory block, output data from the variable-length decoders 292, 294, 296 is being written in another memory block.

Data read from the synthesis memory 401 is converted by the data synthesis circuits 293, 295, 297 into data of DCT block. The constitution of the data synthesis circuits 293, 295, 297 is the same as that of the 24th embodiment (FIG. 108), and a description thereof will be omitted. The memory 351 comprises two 64-byte memory blocks. In this constitution, data is synthesized in one memory block while synthesized data is being read from another memory block. Outputs of the data synthesis circuits 293, 295, 297 are output from the output terminals 402*a*, 402*b*, 402*c*.

The constitution described above enables it to effectively reduce the memory capacity in the high-efficiency decoding apparatus and reduce the circuit size. Although data is divided into three parts in this embodiment, the invention is not limited to this scheme and is capable of reducing the memory capacity requirement by about one third by storing the data in the form of run-length data and coefficient data after variable-length decoding, even when applied to the high-efficiency decoding apparatus of the prior art. That is, when decoding data which has been 2-dimensional variable-length encoded, total memory capacity requirement can be reduced by storing the data in the form of sets of run-length data and coefficient data.

EMBODIMENT 26

Figure 113:
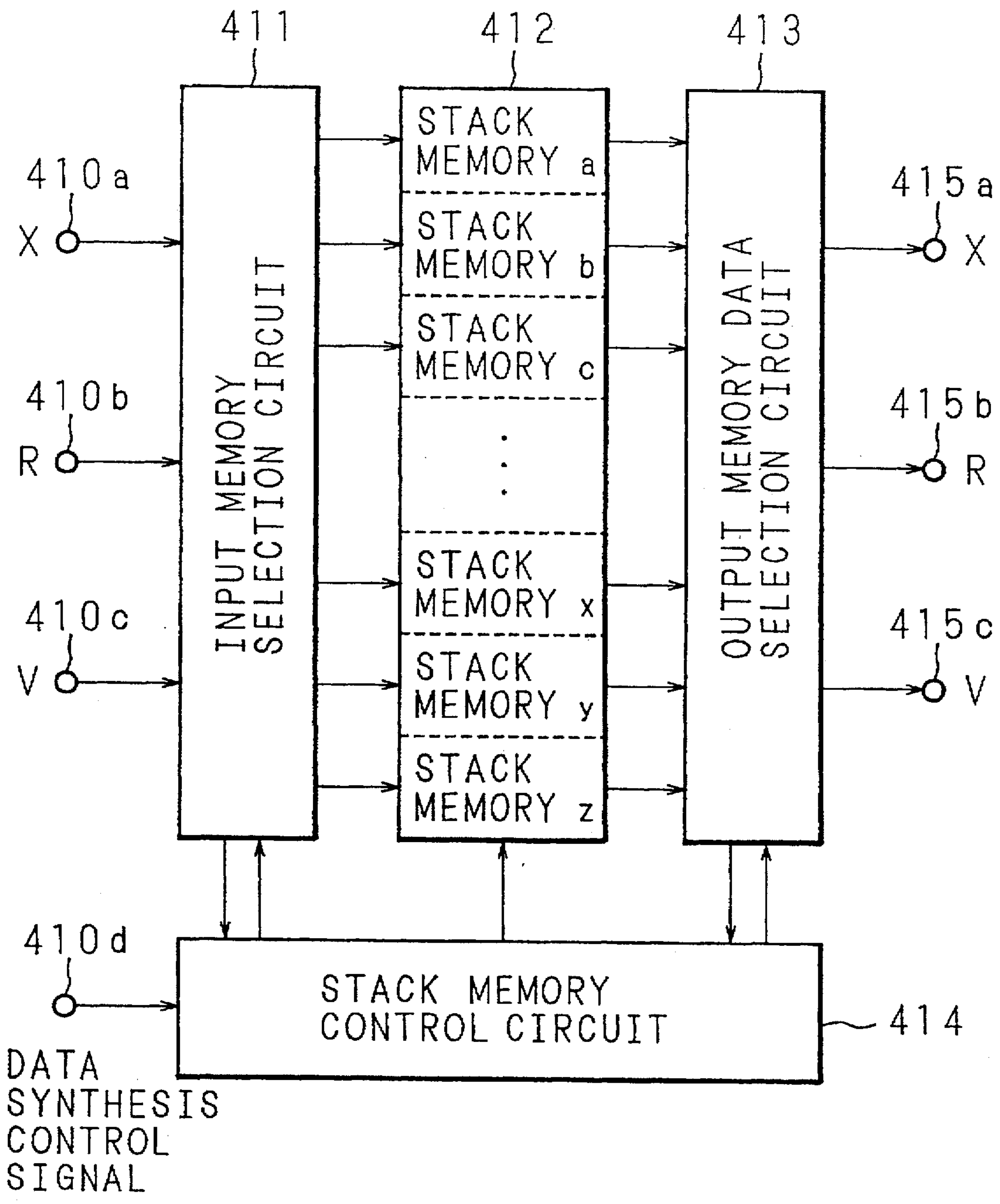
FIG. 113 is a block diagram illustrative of the main memory used in the high-efficiency decoding apparatus of the twenty-sixth embodiment of the invention.

FIG. 113 is a block diagram illustrative of the constitution of the main memory used in the high-efficiency decoding apparatus of the 26th embodiment of the invention, The main memory in the 26th embodiment corresponds to the synthesis memory 401 in the 25th embodiment. In FIG. 113, numerals 410*a*, 410*b*, 410*c*, 410*d* denote input terminals, 411 denotes an input memory selection circuit, 412 denotes a stack memory, 413 denotes an output memory data selection circuit, 414 denotes a stack memory control circuit, 415*a*, 415*b*, 415*c* denote output terminals for data.

The synthesis memory 401 shown in the 25th embodiment is made to have such a memory capacity that will not be overflowed even in the worst case for each part of the divided data. However, in the case of the high-efficiency encoding system as described in the 20th embodiment, very small number of codes can be processed in the variable-length encoder 74. Therefore, in practice, the memory which stores data encoded by the variable-length encoder 74 in the synthesis memory 401 is not effectively utilized. Similarly other memories also have a lot of empty spaces.

The 26th embodiment will be described below with the above consideration. In the 26th embodiment, the main memory is constituted by assembling a plurality of unit stack memories having a specified storage capacity. Data input to the input terminals 210*a*, 210*b*, 210*c* during data decoding is written onto the unit stack memory block indicated by the stack memory circuit 214. When the selected unit stack memory block becomes full of data during writing of data, another unit stack memory block which is not currently used is selected to write data therein. The above operation is repeated until all the data of one frame has been written. In this procedure, less memory space is assigned to X data which involves relatively less number of codes, and sufficient memory space is assigned effectively to R data and V data which involve larger number of codes. For pictures which includes great amount of X data, a lot of memory space is assigned to X data while less memory space is assigned to R data and V data. Because rate control is carried out so that the amount of data per frame is constant, the amount of R and V data decreases when the amount of X data is greater.

The storage capacity of the stack memory 412 will be described below. It is assumed that the data compression ratio and the code length of the minimum variable-length code are the same as those of the 25th embodiment. When the stack memory is used, memory capacity requirement of divided data which requires the greatest amount of memory in the worst case can be satisfied by providing unit stack memories in the number of the data divisions. Thus providing three units of stack memory for the storage requirement of about 2/3 frames is sufficient in this embodiment. The operation of circuits in the 26th embodiment will be described below with reference to FIG. 113 with the above consideration. Data which is input through the input terminals 410*a*, 410*b*, 410*c* is input to the input memory select circuit 411. The input memory select circuit 411 controls so that the input data is written in the unit stack memory output by the stack memory control circuit 414. The stack memory control circuit 414 generates the write address for each unit stack memory which is selected according to the data synthesis control signal which is input. When the unit stack memory which is currently selected for writing is filled up, the memory control circuit 414 commands the input memory select circuit 411 to select a unit stack memory currently not in use. At this time, memory selection log data is written in the memory selection information register provided in the stack memory control circuit 414. The above operation is repeated until all the data for one frame has been stored.

Upon completion of writing data of one frame, data is read at a specified timing by the control of the output memory data select circuit 413 according to the log data written in the memory selection information register. The stack memory control circuit 414 also output the read address of the above-mentioned unit stack memory 412. End data of the DCT block is detected by the output memory data select circuit 413 and is output to the stack memory control circuit 414.

In the constitution described above, it is made possible to effectively reduce the memory capacity requirement in the high-efficiency decoding apparatus, thereby reducing the circuit size. In the case where the data in one DCT block is divided into a plurality of parts and encoded as in this embodiment, although the amount of data for the specified number of blocks is controlled to be constant, and therefore the memory capacity requirement can be reduced effectively by using such stack memories as described above. When divided into two parts, increase in the amount of data on one side automatically leads to decrease in the amount of data on another side, resulting in less memory capacity requirement. In the above embodiment, a case where the data is divided into three parts and encoded is described, although the invention is not limited to this scheme, and a system of dividing data into a plurality of parts and encoding them is capable of effectively reducing the total memory capacity requirement resulting in cost reduction.

Although discrete cosine transformation (DCT transformation) is used for the band compression system (high-efficiency encoding system) in the embodiments described above, the invention is not limited to this scheme and provides similar effects by employing orthogonal transformation (1-dimensional or 3-dimensional orthogonal transformation) represented by the DCT transformation, predictive encoding (DPCM), motion compensation, KL transformation or ADRC, or a combination of these transformation methods, provided that variable-length encoding is applied to the data which has been subjected to rearrangement in 2-dimension or higher dimension.

Although the embodiments are described taking the result of simulation of luminance signals as an example, the invention is not limited to this scheme and provides similar effects on two kinds of color difference signals.

Further, although simulation is described in the case of component signal, though similar effects can be obtained by applying the simulation to composite signals such as NTSC, PAL and SECOM or high definition television signals.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A high-efficiency encoding apparatus which applies high-efficiency encoding to digital data organized into blocks, comprising:

data dividing means for dividing the digital data into run length data and coefficient data through 1-dimensional scanning;

first encoding means for run-length encoding the divided run-length data employing data having a high probability of occurrence as a first run; and second encoding means for run-length encoding the divided coefficient data employing the data having a high probability of occurrence as a second run.

2. The high-efficiency encoding apparatus of claim 1, wherein run-length encoding with value 0 is performed on the run-length data and run-length encoding with value 1 is performed on the coefficient data.

3. The high-efficiency encoding apparatus of claim 1, wherein when variable-length encoding the run-length data and the coefficient data, table data of a variable-length encoding table applied to the run-length data and table data of a variable-length encoding table applied to the coefficient data are different.

4. The high-efficiency encoding apparatus of claim 1, further comprising third encoding means for run-length encoding the run-length data, which has been divided by said first encoding means and/or said second encoding means, by employing the data having a high probability of occurrence as a third run; and fourth encoding means for run-length encoding the coefficient data, which has been divided by said first encoding means and/or said second encoding means, by employing the data having a high probability of occurrence as a fourth run.

5. The high-efficiency encoding apparatus of claim 1, wherein when said first encoding means performs run-length encoding on the run-length data, the run-length encoding is carried out by inverting an order of scanning the run-length data.

6. A high-efficiency encoding apparatus which applies an orthogonal transformation to blocked digital data, comprising;

data dividing means for dividing the blocked digital data into position data at a time of 1-dimensional scanning of data having a high probability of occurrence and coefficient data by applying 1-dimensional scanning to the blocked digital data;

first variable-length encoding means for variable-length encoding the divided position data; and second variable-length encoding means for variable-length encoding the divided coefficient data.

7. The high-efficiency encoding apparatus of claim 6, wherein said second variable-length encoding means performs 2-dimensional variable-length encoding after run-length encoding to the coefficient data with value 1 as a run.

8. The high-efficiency for detecting apparatus of claim 6, further comprising detecting means for detecting horizontal and vertical correlation of data in a block based on a data layout of the divided position data; and order changing means for changing a scanning order of the divided coefficient data according to a result of said detecting means;

wherein said second variable-length encoding means performs 1-dimensional scanning on the divided coefficient data according to an output of said order changing means, and carries out run-length encoding employing data of high frequency of occurrence as a run.

9. A high-efficiency encoding apparatus which applies an orthogonal transformation to blocked digital data, comprising:

data dividing means for dividing the blocked digital data into position data at a time of 1-dimensional scanning of coefficient data order other than 0 and coefficient data other than 0 by applying 1-dimensional scanning to the blocked digital data;

first variable-length encoding means for variable-length encoding the divided position data; and second variable-length encoding means for variable-length encoding the divided coefficient data.

10. A high-efficiency encoding apparatus which applies high-efficiency encoding to digital data organized into blocks, comprising:

a first data dividing circuit for dividing the digital data into first 0-run length data and first coefficient data through 1-dimensional scanning;

a second data dividing circuit for dividing the first 0-run length data into second 0-run length data and second coefficient data;

a third data dividing circuit for dividing the first coefficient data into first 1-run length data and third coefficient data;

a fourth data dividing circuit for dividing the second 0-run length data into third 0-run length data and fourth coefficient data;

a fifth data dividing circuit for dividing the second coefficient data into second 1-run length data and fifth coefficient data;

a sixth data dividing circuit for dividing the first 1-run length data into fourth 0-run length data and sixth coefficient data;

a seventh data dividing circuit for dividing the third coefficient data into first 2-run length data and seventh coefficient data;

at least one encoder for variable-length encoding the third 0-run length data, the fourth coefficient data, the second 1-run length data, the fifth coefficient data, the fourth 0-run length data, the sixth coefficient data, the first 2-run length data and the seventh coefficient data; and a data synthesis circuit for arranging outputs of said at least one encoder in a predetermined order.

* * * * *